US007054770B2

(12) United States Patent
Swarztrauber et al.

(10) Patent No.: US 7,054,770 B2
(45) Date of Patent: May 30, 2006

(54) SYSTEM AND METHOD FOR ON-LINE MONITORING AND BILLING OF POWER CONSUMPTION

(75) Inventors: Sayre A. Swarztrauber, New York, NY (US); Doron Shafrir, Suffern, NY (US); Stanley C. Lo, Fresh Meadows, NY (US); Michael Newsome, Newport, VA (US); Eric Jacobson, Bayside, NY (US)

(73) Assignee: Quadlogic Controls Corporation, New York, NY (US)

( * ) Notice: Subject to any disclaimer, the term of this patent is extended or adjusted under 35 U.S.C. 154(b) by 0 days.

(21) Appl. No.: 11/030,417

(22) Filed: Jan. 6, 2005

(65) Prior Publication Data

US 2005/0137813 A1 Jun. 23, 2005

Related U.S. Application Data

(62) Division of application No. 09/795,838, filed on Feb. 28, 2001, now Pat. No. 6,947,854.

(60) Provisional application No. 60/185,832, filed on Feb. 29, 2000.

(51) Int. Cl.
*G06F 19/00* (2006.01)

(52) U.S. Cl. .......................... 702/62; 702/57; 702/122; 702/188; 369/47.5; 324/110; 340/870.01; 379/106.01; 705/63; 705/400

(58) Field of Classification Search ................. 702/57, 702/60–62, 122, 188–189; 369/47.5; 324/110; 340/870.01; 379/106.01; 705/63, 400
See application file for complete search history.

(56) References Cited

U.S. PATENT DOCUMENTS

| | | | | |
|---|---|---|---|---|
| 4,783,748 | A * | 11/1988 | Swarztrauber et al. | 702/62 |
| 5,940,009 | A * | 8/1999 | Loy et al. | 340/870.02 |
| 6,232,886 | B1 * | 5/2001 | Morand | 340/870.02 |
| 6,529,883 | B1 * | 3/2003 | Yee et al. | 705/63 |
| 6,628,207 | B1 * | 9/2003 | Hemminger et al. | 340/870.02 |

OTHER PUBLICATIONS

Dick et al., 'Revenue Protection in a Competitive Supply Environment', Jan. 1999, IEEE Article, pp. 229-233.*
Summers, 'Integrated Semiconductor Solutions for Metering and Telemetering Applications', Apr. 1990, IEEE Article, pp. 116-120.*

(Continued)

*Primary Examiner*—Marc S. Hoff
*Assistant Examiner*—Elias Desta
(74) *Attorney, Agent, or Firm*—Morgan, Lewis & Bockius LLP; Steven D. Underwood, Esq.

(57) ABSTRACT

The present invention comprises systems and methods related to monitoring of energy usage on a power line. In a preferred embodiment, this system comprises (a) an electronic microprocessor-controlled digital electricity metering device coupled to the power line and comprising a non-volatile non-battery-powered data-storage device, wherein the metering device is capable of interval metering and of receiving a data request and transmitting data in response to the request over the power line; and (b) a data collector (preferably, a transponder) coupled to the metering device via the power line. The data collector is preferably capable of (i) receiving data from and transmitting data to the metering device over the power line, (ii) storing data received from the metering device over the power line, and (iii) receiving data from and transmitting data to a remotely located computer (preferably, a billing computer).

7 Claims, 176 Drawing Sheets

OTHER PUBLICATIONS

Singhal, 'The Role of Metering in Revenue Protection', May 1999, IEEE Article, pp. 223-228.*

Dick et al., 'Revenue Protection in a Competitive Supply Environment', May 1999, IEEE Publication, Conference Publication No. 462, pp. 229-233.*

* cited by examiner

A7-CONCENTRATOR/SIGNAL UNIT DIAGRAM

| | | |
|---|---|---|
| | FIG.9B-1 | FIG.9B-2 |
| FIG.9B-3 | FIG.9B-4 | FIG.9B-5 |
| FIG.9B-6 | FIG.9B-7 | FIG.9B-8 |
| FIG.9B-9 | FIG.9B-10 | FIG.9B-11 |

FIG. 9B

| | | |
|---|---|---|
| FIG.11A-1 | FIG.11A-2 | FIG.11A-3 |
| FIG.11A-4 | FIG.11A-5 | FIG.11A-6 |
| FIG.11A-7 | FIG.11A-8 | FIG.11A-9 |
| FIG.11A-10 | FIG.11A-11 | |

FIG.11A

| | | |
|---|---|---|
| FIG.12A-1 | FIG.12A-2 | FIG.12A-3 |
| FIG.12A-4 | FIG.12A-5 | FIG.12A-6 |
| FIG.12A-7 | FIG.12A-8 | FIG.12A-9 |

FIG.12A

| | | |
|---|---|---|
| FIG.12B-1 | FIG.12B-2 | FIG.12B-3 |
| FIG.12B-4 | FIG.12B-5 | FIG.12B-6 |
| FIG.12B-7 | FIG.12B-8 | FIG.12B-9 |

FIG.12B

•H6 IS USED AS A PORT HDR & PICCHIP TESTER

| | | |
|---|---|---|
| FIG.17A-1 | FIG.17A-2 | FIG.17A-3 |
| FIG.17A-4 | FIG.17A-5 | FIG.17A-6 |
| FIG.17A-7 | FIG.17A-8 | FIG.17A-9 |
| FIG.17A-10 | FIG.17A-11 | FIG.17A-12 |

FIG.17A

FIG.23 -THEFT DETECTION

SYSTEM AND METHOD FOR ON-LINE MONITORING AND BILLING OF POWER CONSUMPTION

CROSS-REFERENCE TO RELATED APPLICATIONS

This application is a divisional application of U.S. patent application Ser. No. 09/795,838, filed Feb. 28, 2001, now U.S. Pat. No. 6,947,854 which claims the benefit of U.S. Provisional Application No. 60/185,832, filed Feb. 29, 2000. The entire contents of each of the above-referenced applications are incorporated herein by reference.

FIELD OF THE INVENTION

The present invention relates to metering of and billing for electric power consumption, and has particular application to solid state electricity meters and powerline communication with such meters.

BACKGROUND

Submetering is the resale of electricity or allocation of costs within a multi-tenant property. Master metered apartments are units of a multi-tenant residential building without individual electric meters; the cost of electricity for each apartment is included in the rent for that apartment. Because tenants of such units typically consume up to 30% more electricity than tenants who pay a separate bill for energy consumed, there is a demand for submetering of such units.

Systems and methods for submetering are known. One such system is disclosed in U.S. Pat. No. 4,783,748, issued Nov. 8, 1988, to Swarztrauber et al. In that system, as disclosed in the patent and as developed through 1999, the submeter (known as a Transmeter®) measures electricity by connecting to the power wires to measure voltage and through current transformers to measure current. The initial Transmeters®, manufactured from 1982 through 1991, processed the voltage and current in digital form to derive the real energy. In a development effort that spanned the period from 1988 through 1992, additional parameters were added. The Transmeters manufactured from 1992 through 1999 calculate from the measured voltage and current additional parameters such as reactive and apparent energy, power factor, total harmonic distortion, peak demand, time-of-use, voltage and current. They also stored the information in CMOS ram backed up by battery to maintain an audit trail of key energy information either every day or every 15 minutes. This type of memory storage can suffer data loss through power and battery failure, data corruption due to "fast transients"—a type of interference commonly found on power lines.

The Transmeter® systems manufactured and sold through 1999 collect and deliver information from Transmeters® located in multi-tenant properties. The individual Transmeters® inject signals onto the power distribution lines (a technique known as power line communication, or "PLC") in the multi-tenant property to a more centrally located device, the Transponder. The Transponder is typically installed at the point of entry of electricity to that property. If the property has more than one electrical service, one Transponder is installed per service. The Transponders are interconnected via an RS-485 network. One of the Transponders connects by modem to a dedicated standard telephone line.

The billing computer is configured to dial any property on command of the operator. The data is processed by standard spreadsheet or database programs to generate bills in either paper or machine-readable format for use by the property management companies.

However, such systems have a number of deficiencies. One deficiency is cost: units that are too costly will not be utilized in areas where the profit margins are too small or there is a relatively high probability of theft. Another deficiency shared by many systems is that the meters communicate with a central billing office via telephone lines, thus requiring additional installation of wires in the building, or at least requiring that telephone lines be located near the power lines.

The submetering market has several requirements that often fail to be met by existing submetering systems. Such requirements include: (1) stringent metering standards found outside the United States such as those of Industry Canada and the International Electrotechnical Commission (a European standards organization with applicability to most of the world outside of North America). Not only must a submeter meet electrical standards, it must comply with strict mechanical standards as well.

(2) Communication with the submeter is required outside of densely populated urban areas, where electrical distribution transformers are not necessarily located near phone lines.

(3) There is an emerging need of electric utilities to provide on-line metering databases over the Internet. This need also includes providing this information to generation companies or Energy Service Companies (ESCOs) often located very distant from the customer. Such entities require delivery of information not available with standard electromechanical meters.

(4) Low-cost, high-volume manufacture.

SUMMARY

In one aspect, the present invention comprises a system for monitoring energy usage on a power line. Preferably, this system comprises (a) an electronic microprocessor-controlled digital electricity metering device connected to the power line and comprising a non-volatile non-battery-powered data-storage device, wherein the metering device is capable of interval metering and of receiving a data request and transmitting data in response to the request over the power line; and (b) a data collector preferably, a transponder) connected to the metering device via the power line. The data collector is preferably capable of (i) receiving data from and transmitting data to the metering device over the power line, (ii) storing data received from the metering device over the power line, and (iii) receiving data from and transmitting data to a remotely located computer (preferably, a billing computer).

In another aspect, the present invention comprises a system for monitoring energy usage, comprising: (a) one or more power lines; and (b) an electronic microprocessor-controlled digital electricity metering device connected to the power lines and comprising at least one non-volatile non-battery-powered data-storage device. Preferably, the metering device is capable of interval metering and of metering multiple billing entities.

In another aspect, the present invention comprises a power line communication system for communication between a master device and a slave device, comprising: (a) a master device connected to a power line and capable of transmitting a request for data over the power line to a slave device and of receiving data transmitted by the slave device over the power line, wherein the master device is capable of transmitting a request for data over the power line to the slave device that is at a frequency low enough to ensure reliable reception by the slave device, and wherein the request for data comprises instructions to the slave device to transmit responsive data over the power line within specific transmission parameters; and (b) a slave device connected to the power line and capable of transmitting data over the power line in response to a request for data received over the power line from a master device, wherein the slave device is capable of transmitting data over the power line within the specific transmission parameters.

In a further aspect, the present invention comprises a method of monitoring energy usage, comprising the steps of: (a) measuring energy usage using a microprocessor-controlled digital electricity metering device; (b) storing data representing measured energy usage at regular intervals of time in a non-volatile, non-battery-operated data storage device; (c) receiving a request for the stored data over a power line from a remotely located computer (preferably, a billing computer); and (d) in response to that request, transmitting the stored data over the power line to the remotely located computer.

In another aspect, the present invention comprises a method of power line communication between a master device and a slave device, comprising the steps of: (a) transmitting a request for data over a power line from a master device to a slave device, wherein the request is at a frequency low enough to ensure reliable reception by the slave device (preferably, a transponder hunts between two or more channels to avoid narrow band noise and transmits the request at a data rate (baud rate) low enough to ensure reliable reception by the slave device), and wherein the request for data comprises instructions to the slave device to transmit responsive data over the power line within a first set of specific transmission parameters; and (b) transmitting responsive data over the power line from the slave device to the master device in response to the request for data received by the slave device over the power line from the master device, wherein the responsive data is transmitted over the power line within the first set of specific transmission parameters. This method, when the situation requires, further comprises the steps of: (c) after a pre-determined period of time during which the master device has not received responsive data of acceptable quality from the slave device transmitted within the first set of specific transmission parameters, transmitting a subsequent request for data over the power line from the master device to the slave device, wherein the request is at a frequency low enough to ensure reliable reception by the slave device (again, preferably a transponder hunts between two or more channels to avoid narrow band noise and transmits the request at a data rate (baud rate) low enough to ensure reliable reception by the slave device), and wherein the request for data comprises instructions to the slave device to transmit responsive data over the power line within a second set of specific transmission parameters; and (d) transmitting responsive data over the power line from the slave device to the master device in response to the subsequent request for data received by the slave device over the power line from the master device, wherein the responsive data is transmitted over the power line within the second set of specific transmission parameters.

In still another aspect, the present invention comprises an application specific integrated circuit (ASIC) for monitoring energy usage, comprising: (a) a meter component; (b) a digital control logic component; (c) a real-time clock component; and (d) a power line communication component.

In a further aspect, the present invention comprises a device for monitoring energy usage, comprising: (a) an application specific integrated circuit (ASIC) chip connected to and capable of being controlled by a microprocessor; (b) a microprocessor connected to the ASIC chip and capable of controlling the operation of the ASIC chip; and (c) a flash memory device connected to the ASIC chip and to the microprocessor, wherein the flash memory device is capable of receiving energy usage data from the ASIC chip and capable of being controlled by the microprocessor.

Other aspects of the present invention will be apparent to those skilled in the art upon reviewing the following detailed description, attached drawings, and appended claims.

DETAILED DESCRIPTION OF PREFERRED EMBODIMENTS

Figure 1:
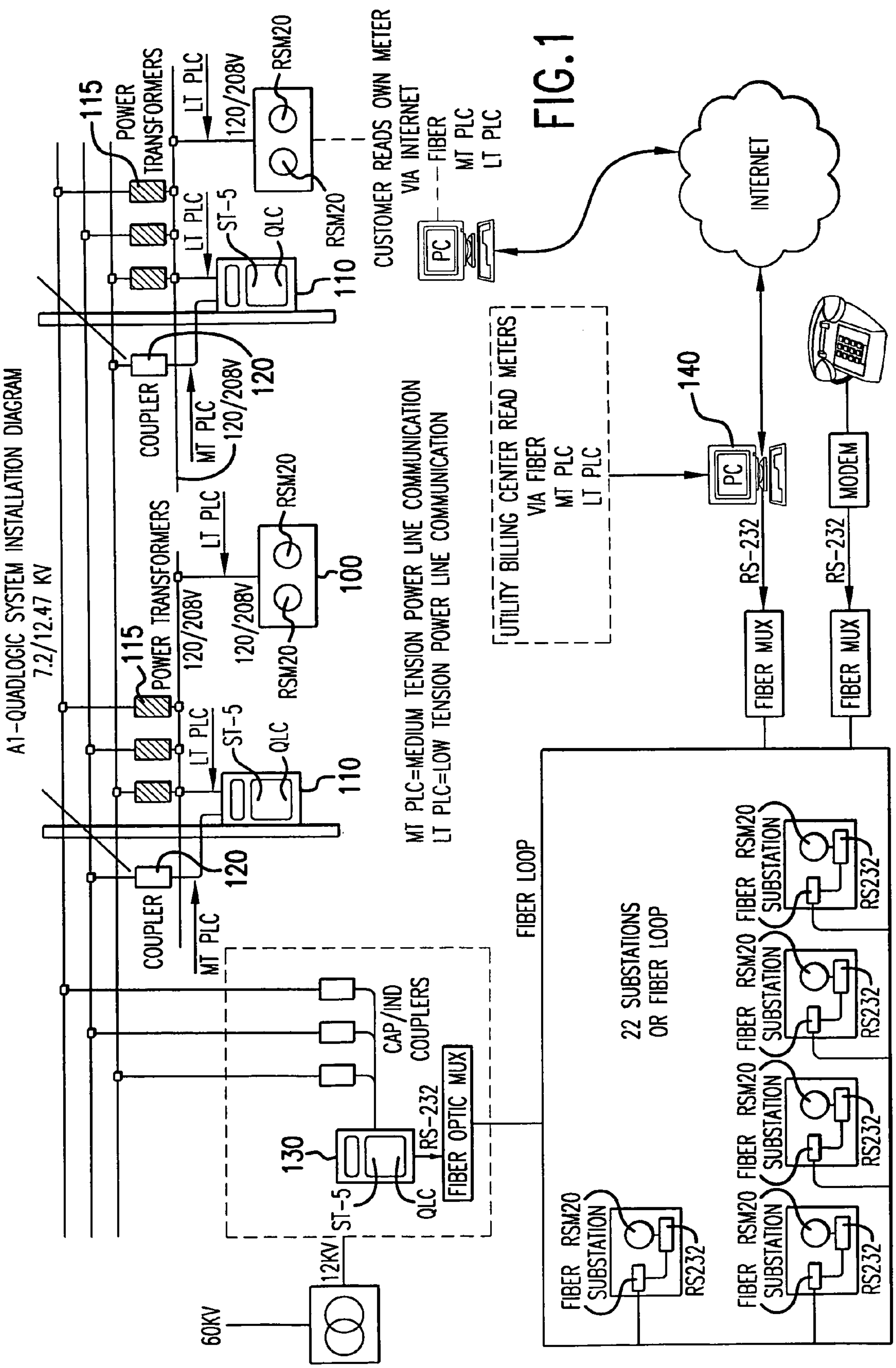
FIG. 1 is an overall installation diagram for a preferred embodiment of the present invention.
Figure 2:
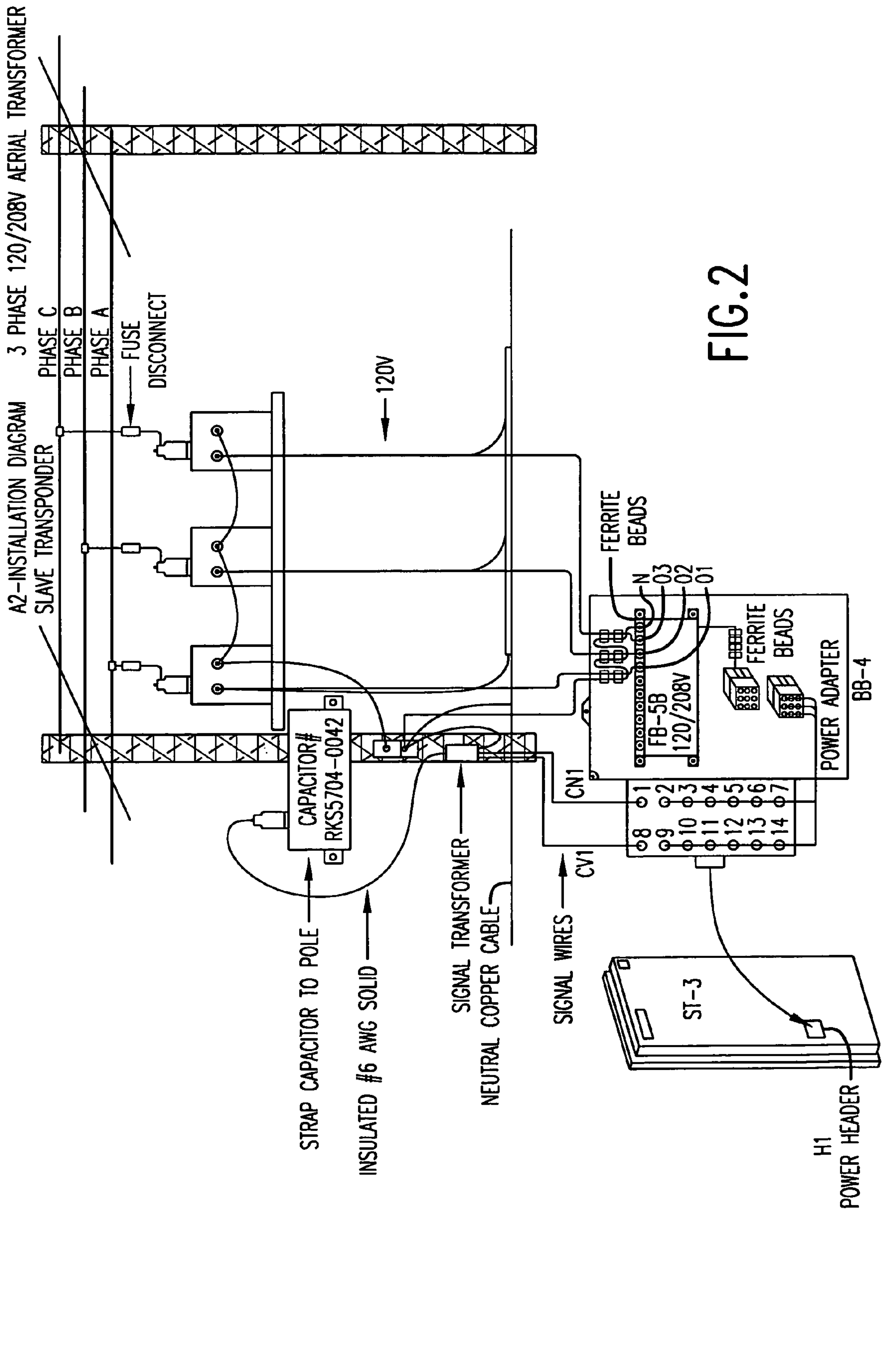
FIG. 2 is an installation diagram for a slave transponder.
Figure 3A:
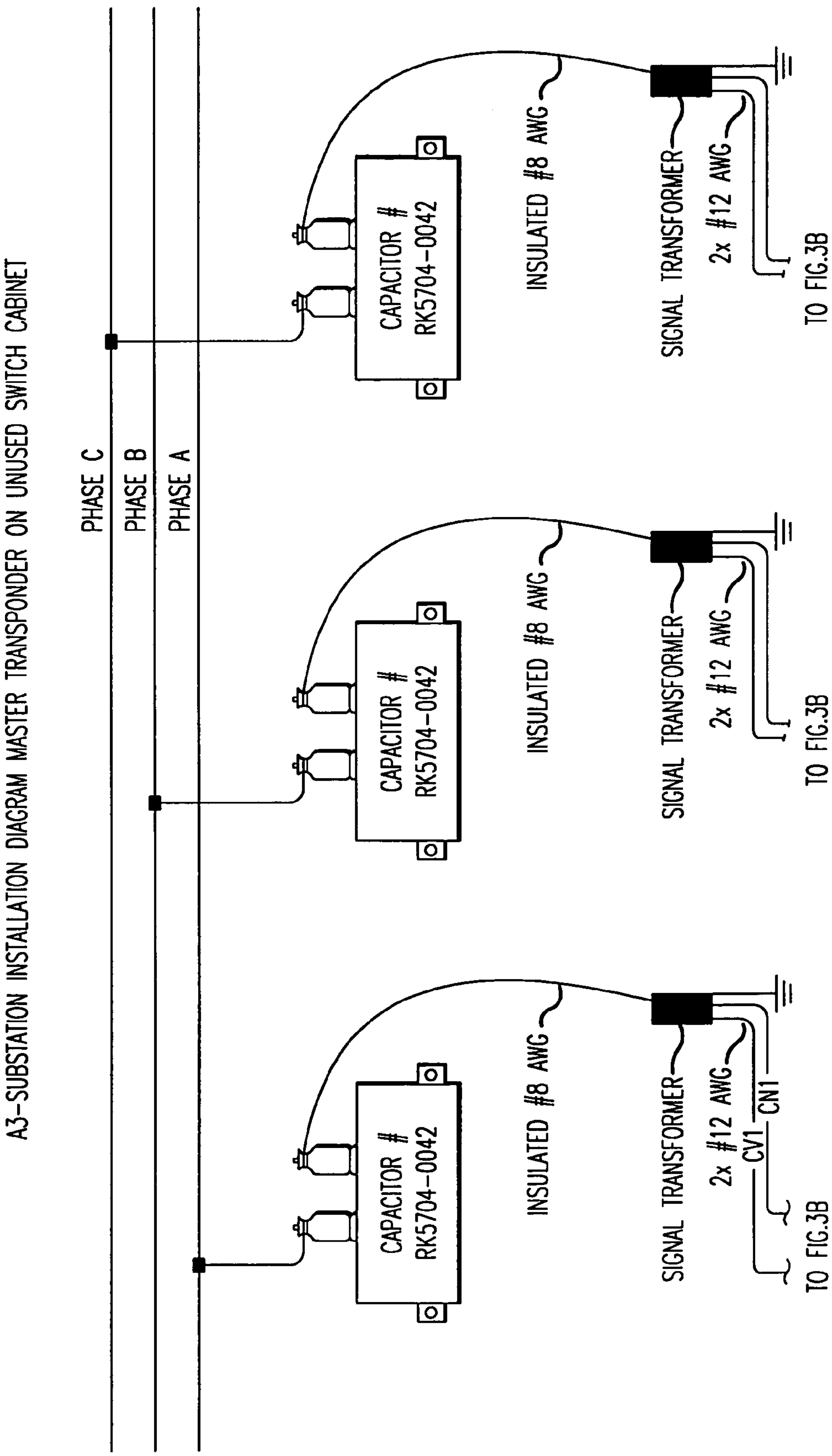
FIG. 3 is a substation installation diagram of a master transponder.
Figure 3B:
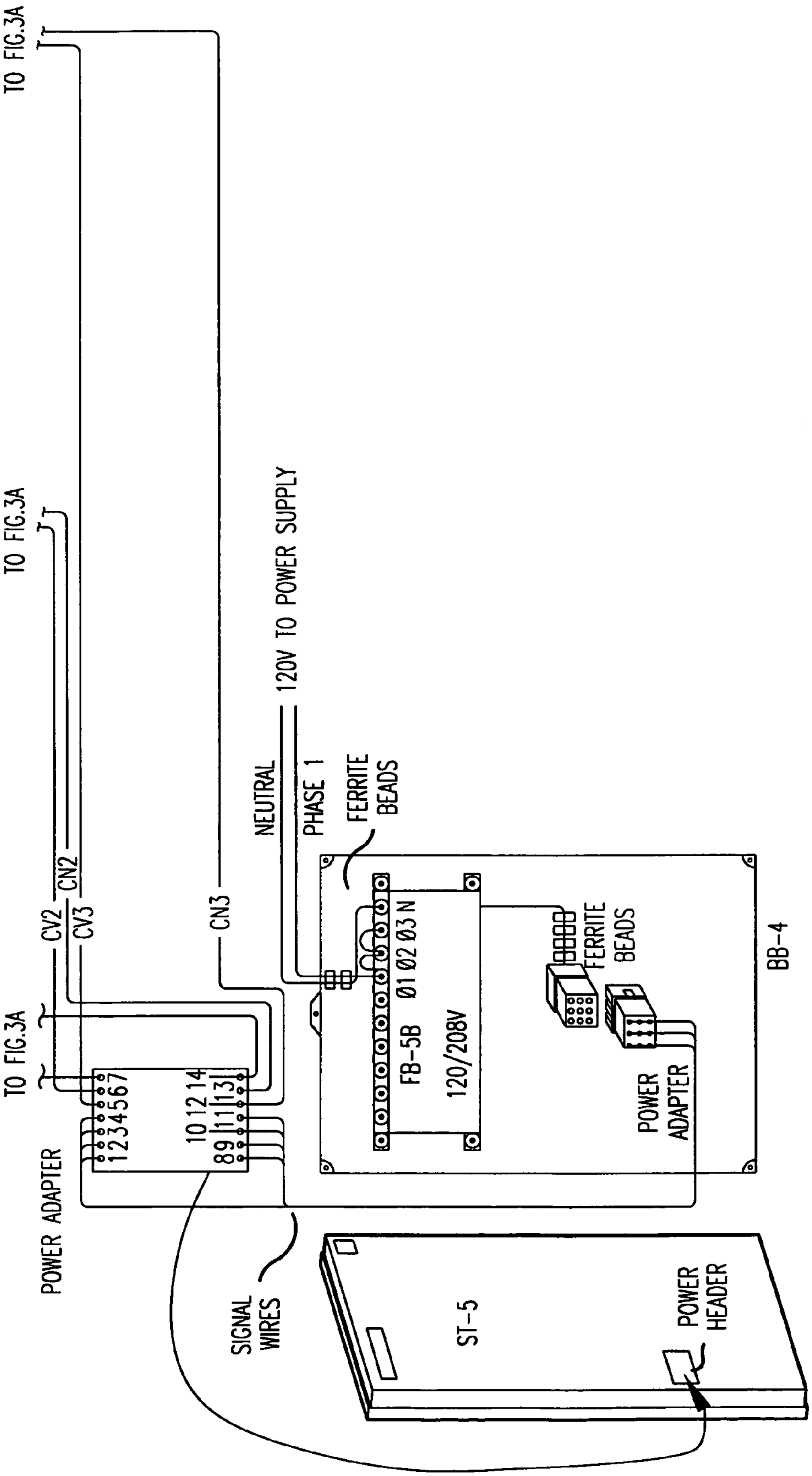
Figure 4:
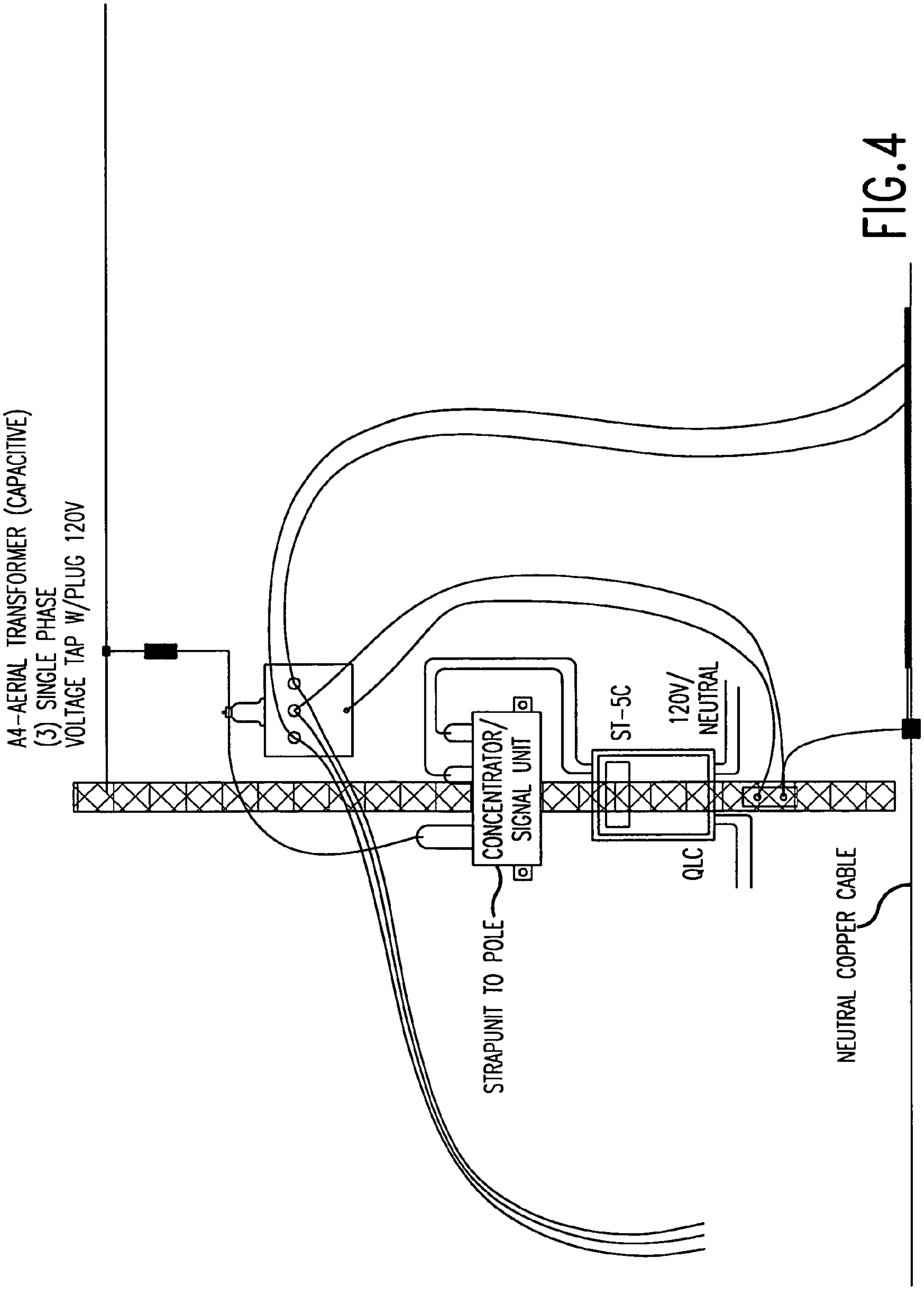
FIG. 4 is an aerial transformer and coupling diagram.
Figure 5:
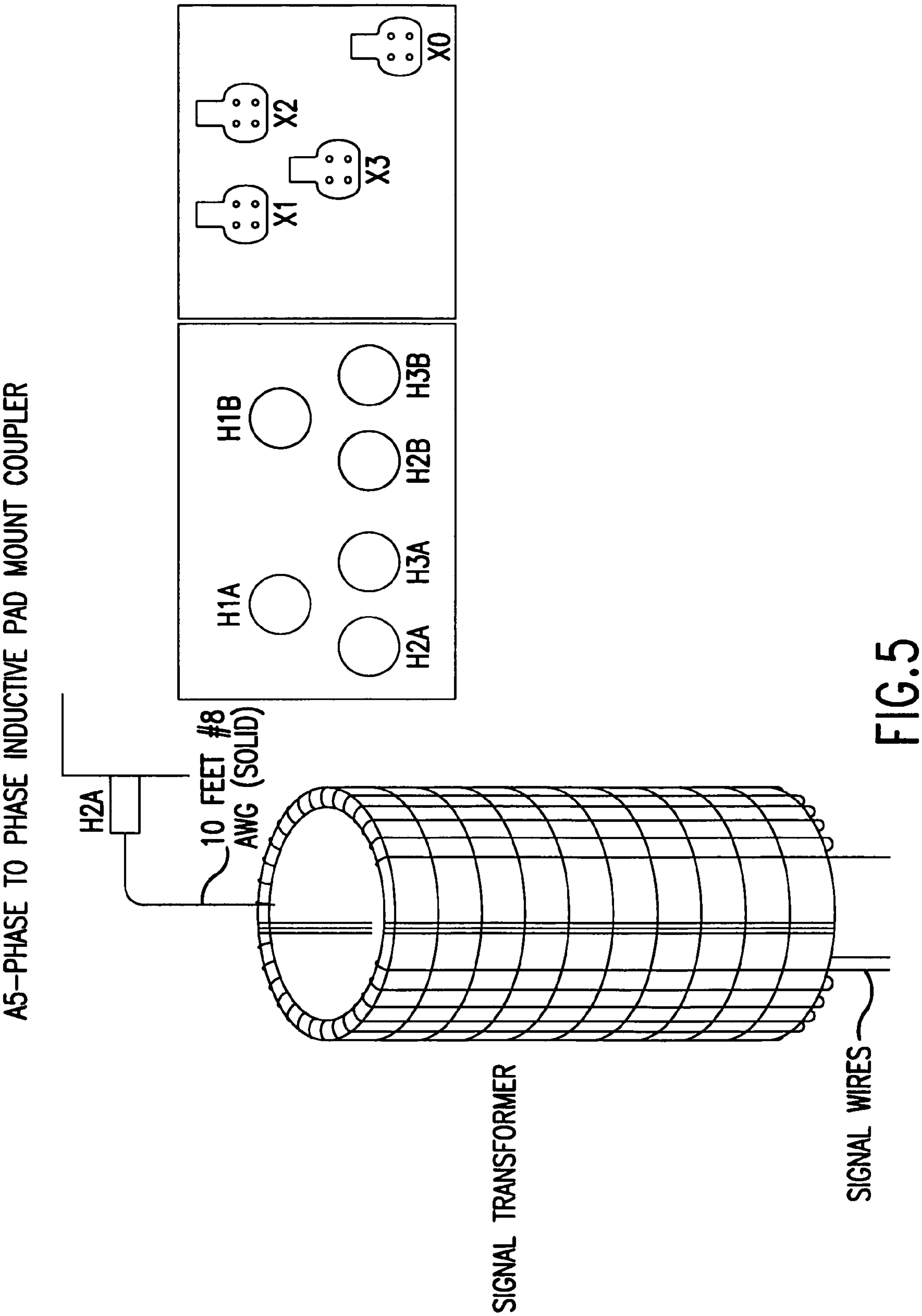
FIG. 5 is a phase-to-phase inductive pad mount coupler diagram.
Figure 6:
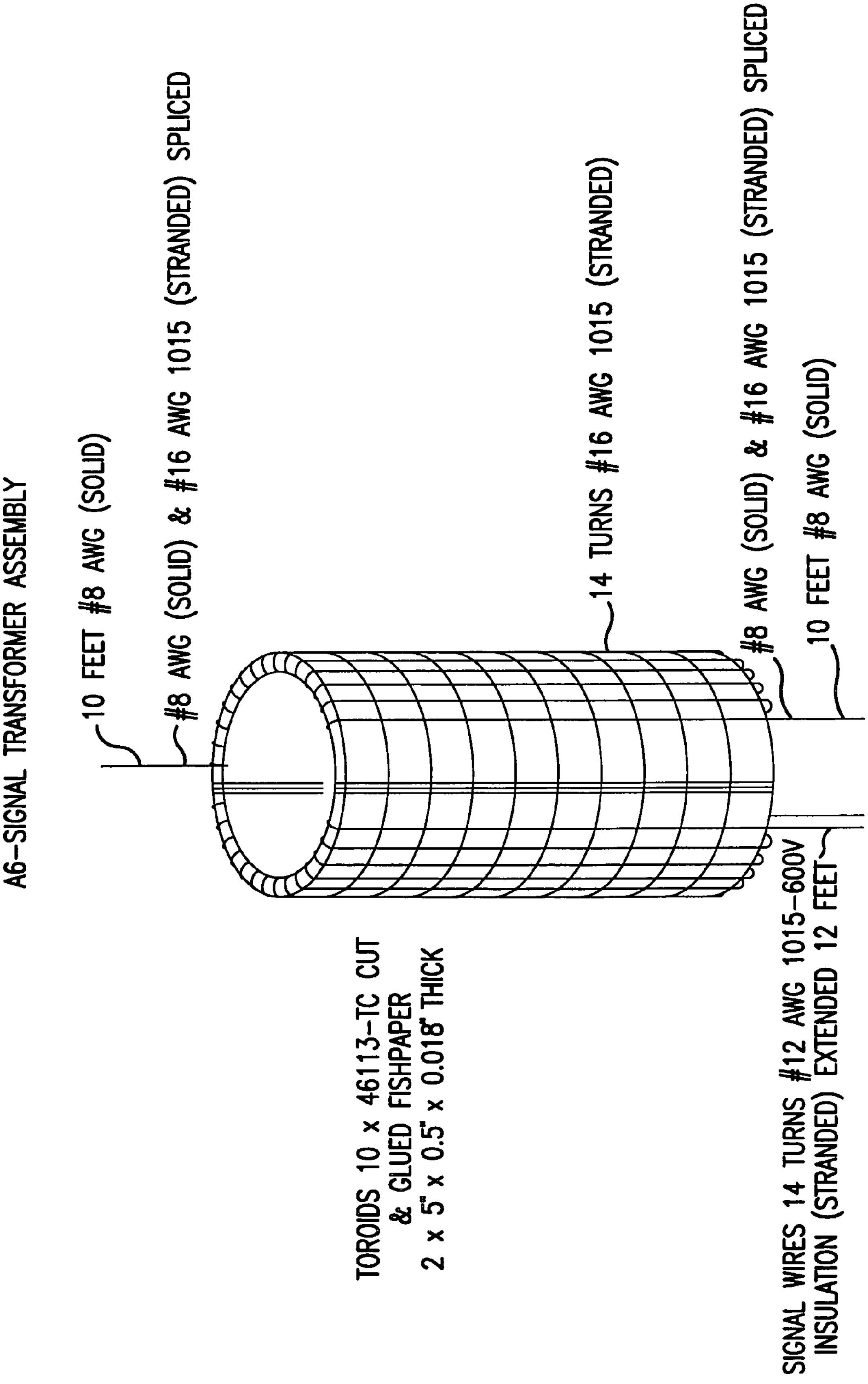
FIG. 6 is a signal transformer assembly diagram.
Figure 7:
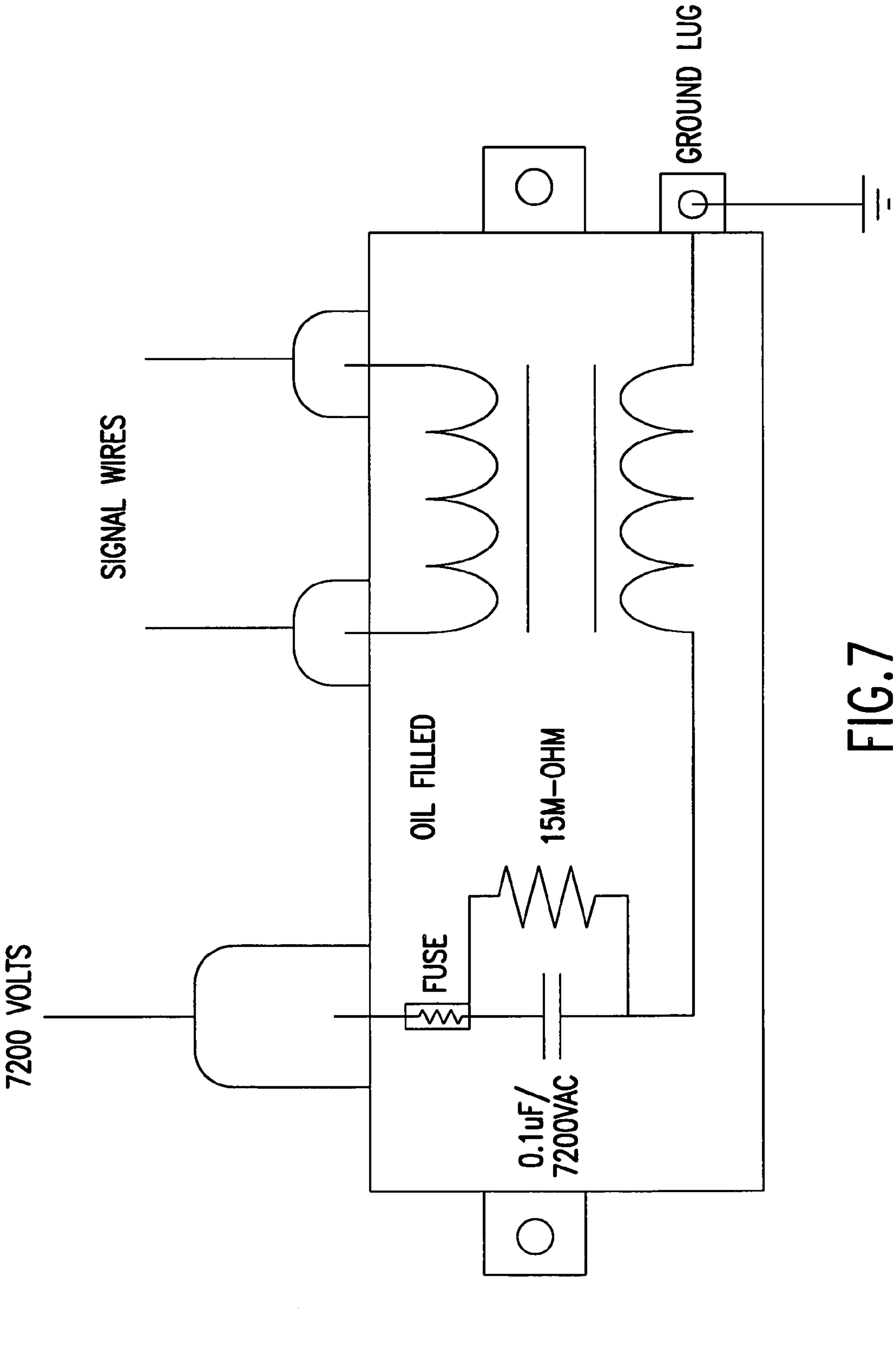
FIG. 7 is a concentrator/signal unit diagram.
Figure 8A:
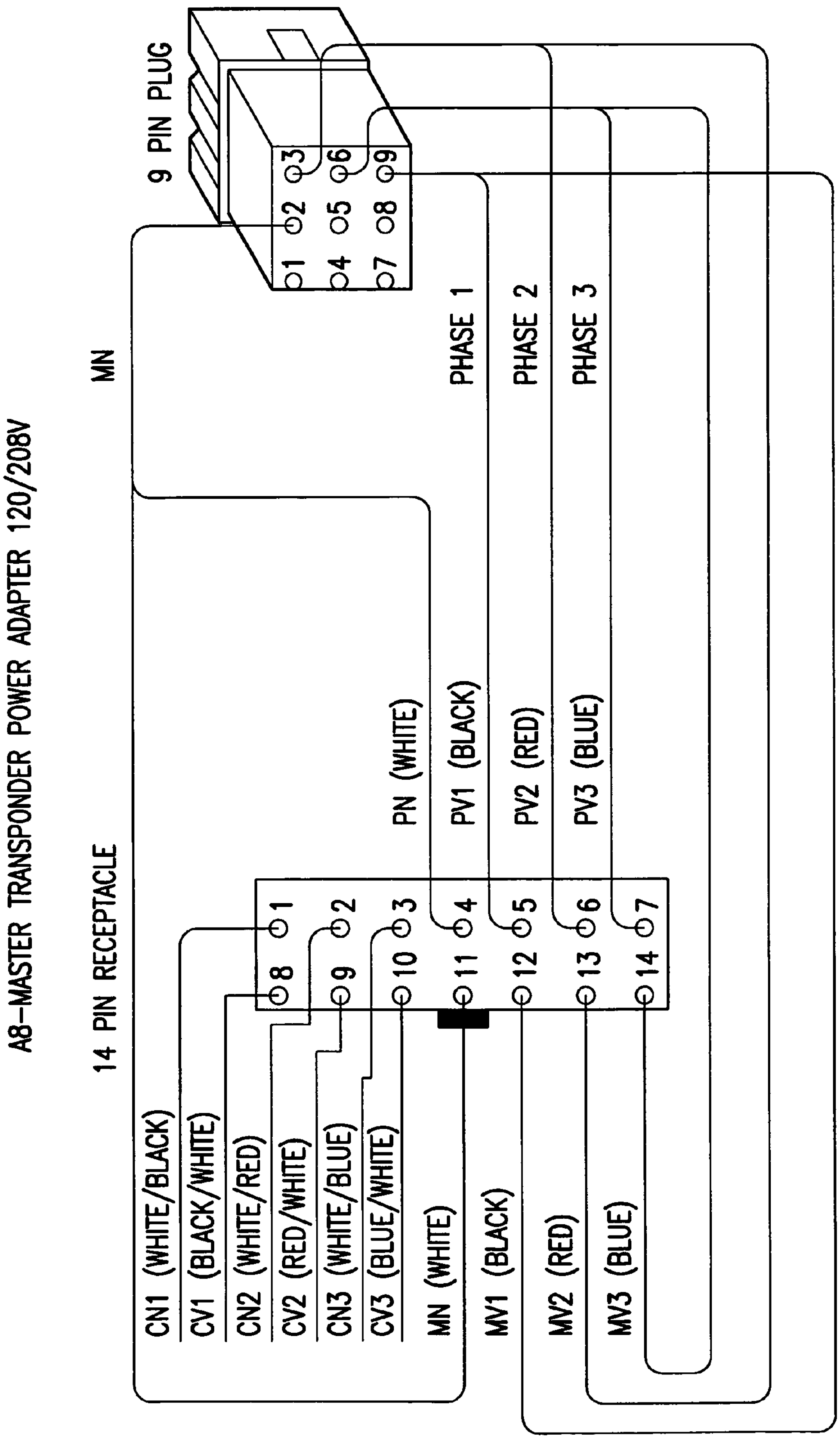
FIG. 8 is a master and slave transponder power adapter diagram.
Figure 8B:
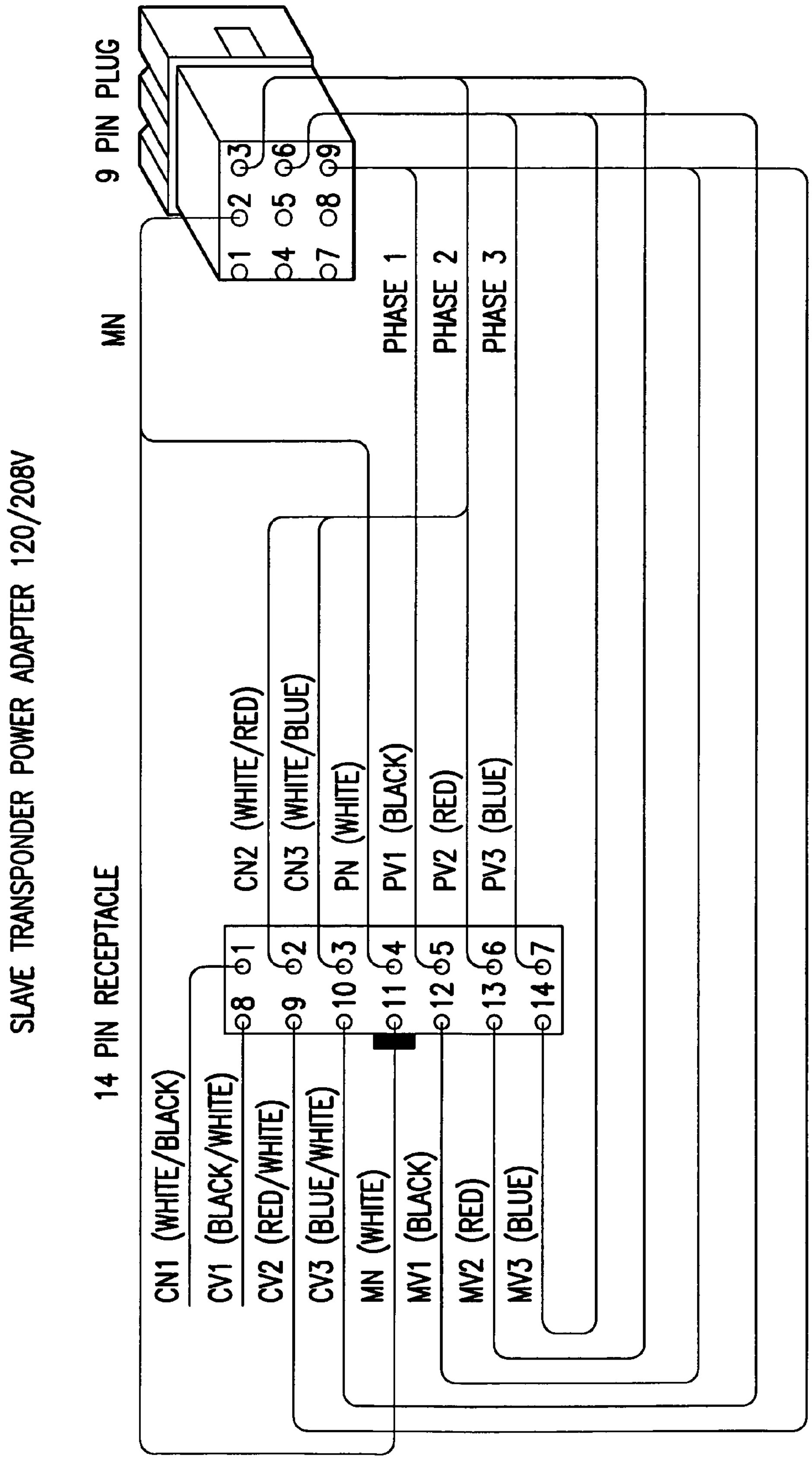
Figure 9A:
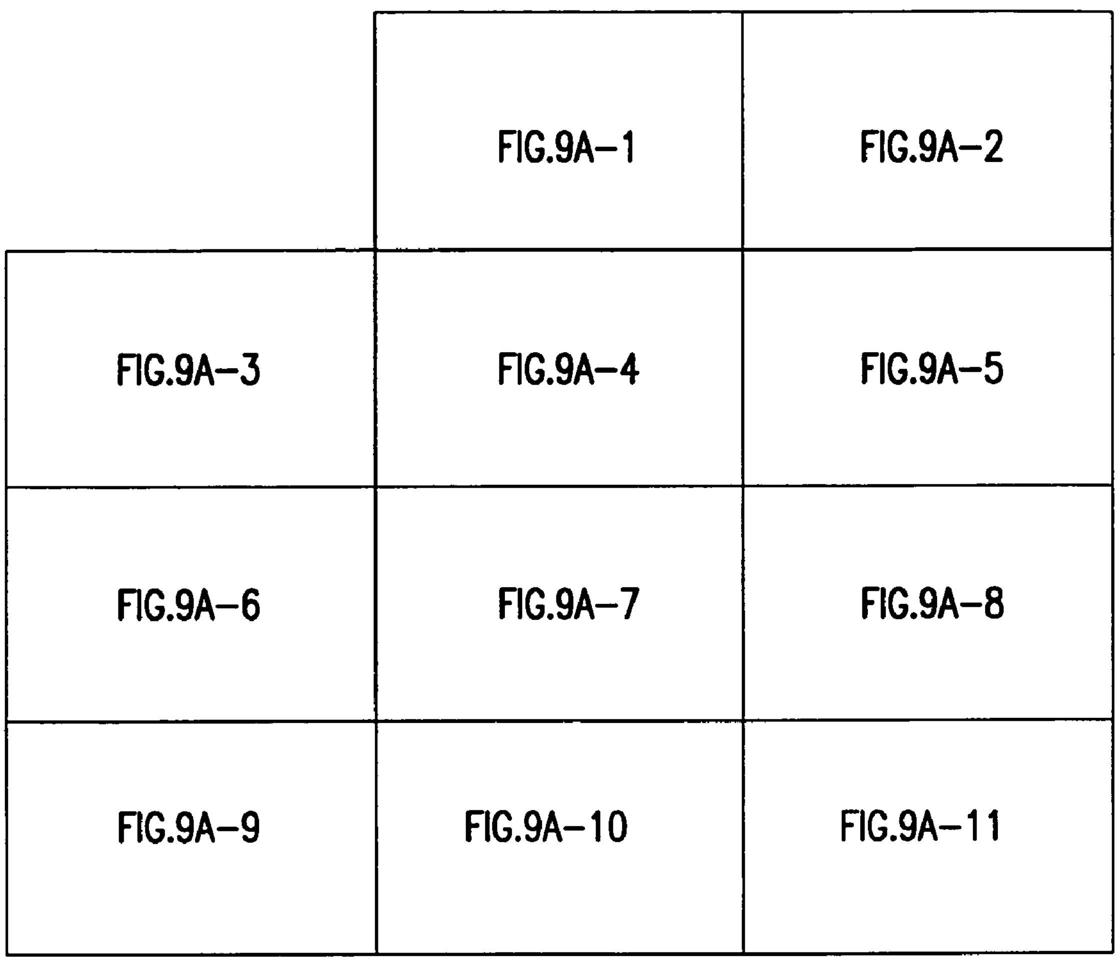
FIGS. 9A–B and 10 provide a Display Board schematic diagram.
Figures 1, 9A:
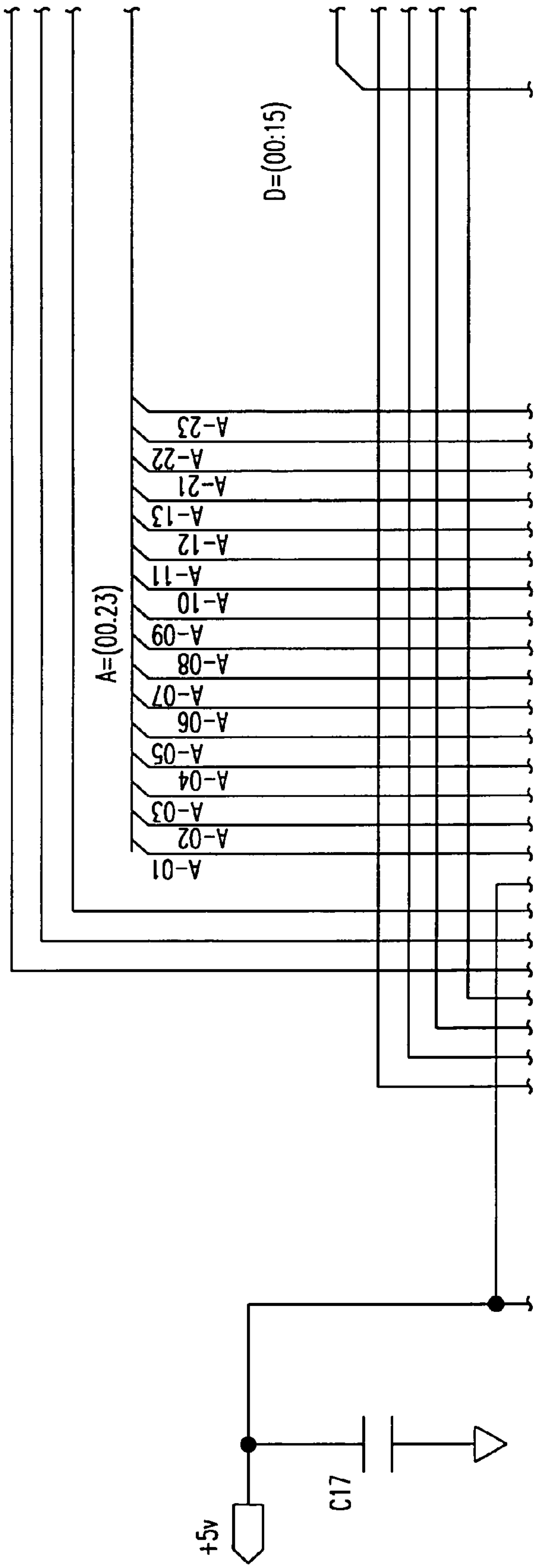
Figures 2, 9A:
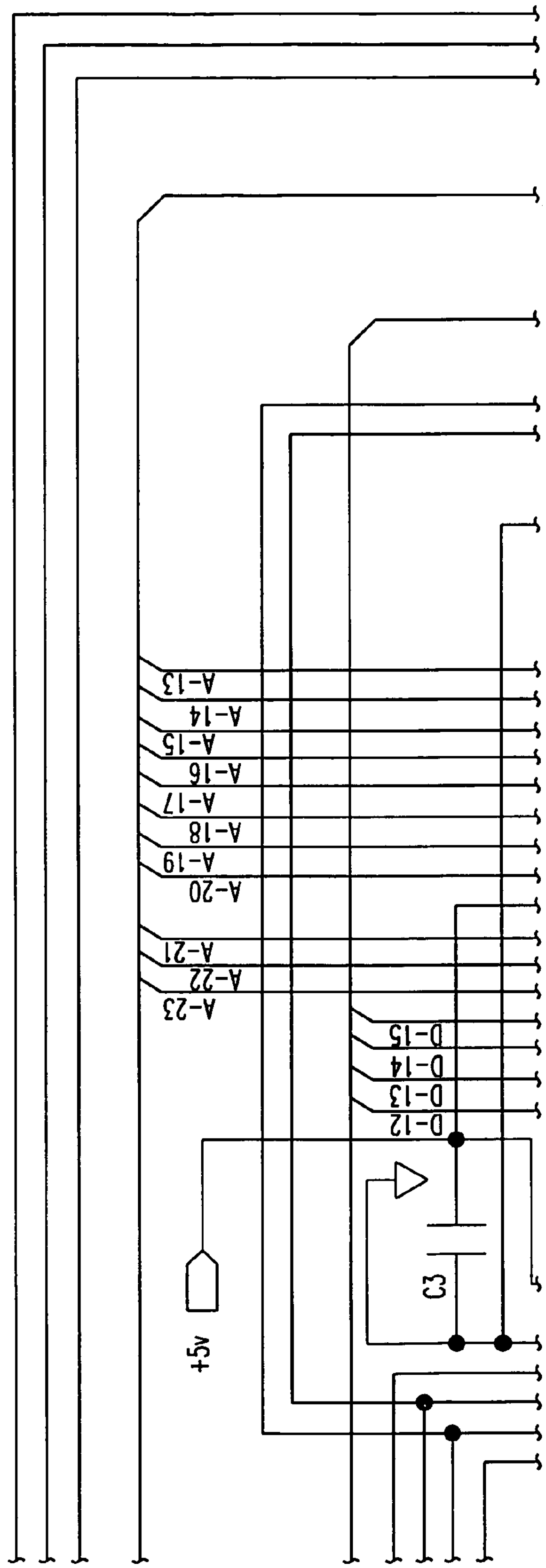
Figures 3, 9A:
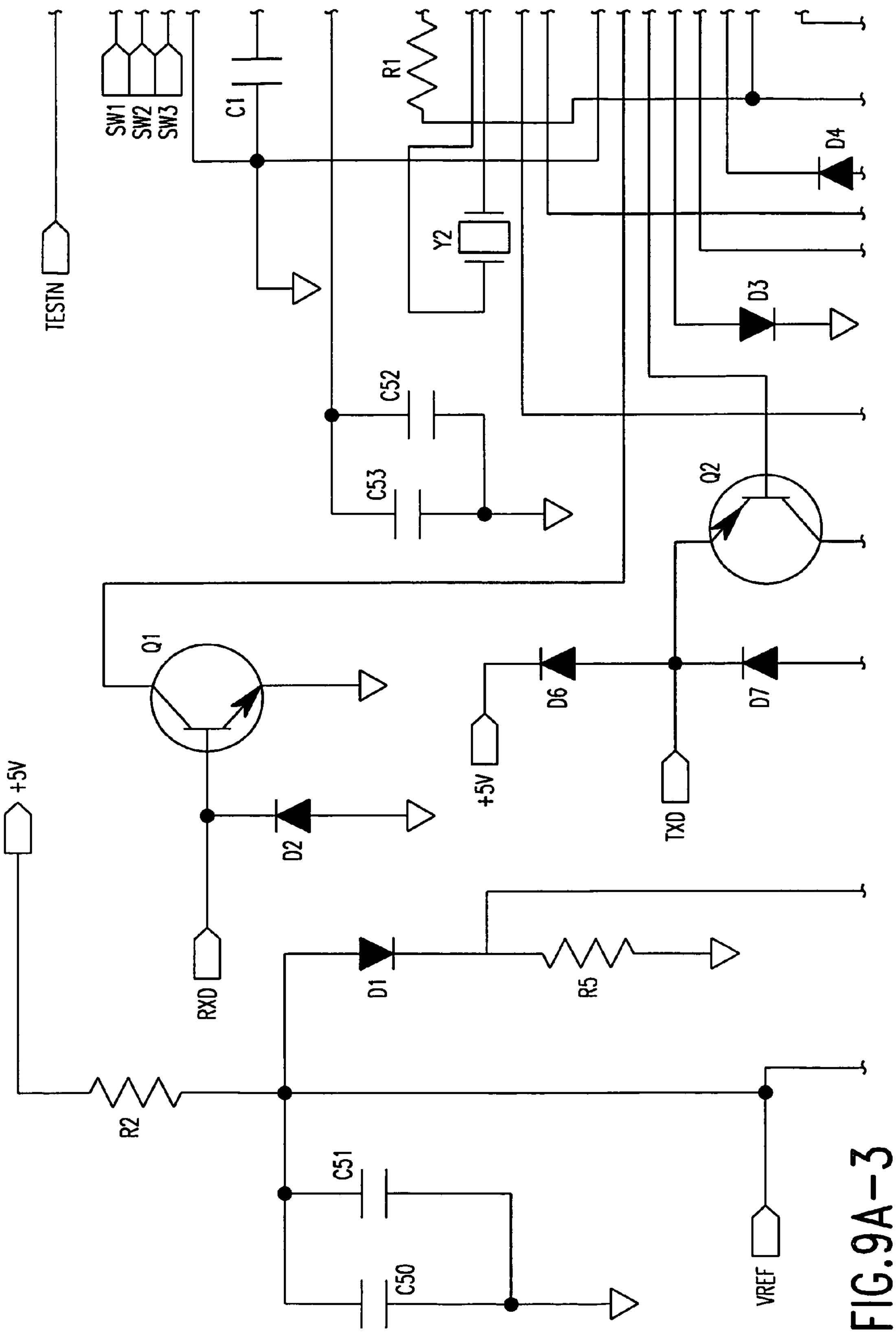
Figures 4, 9A:
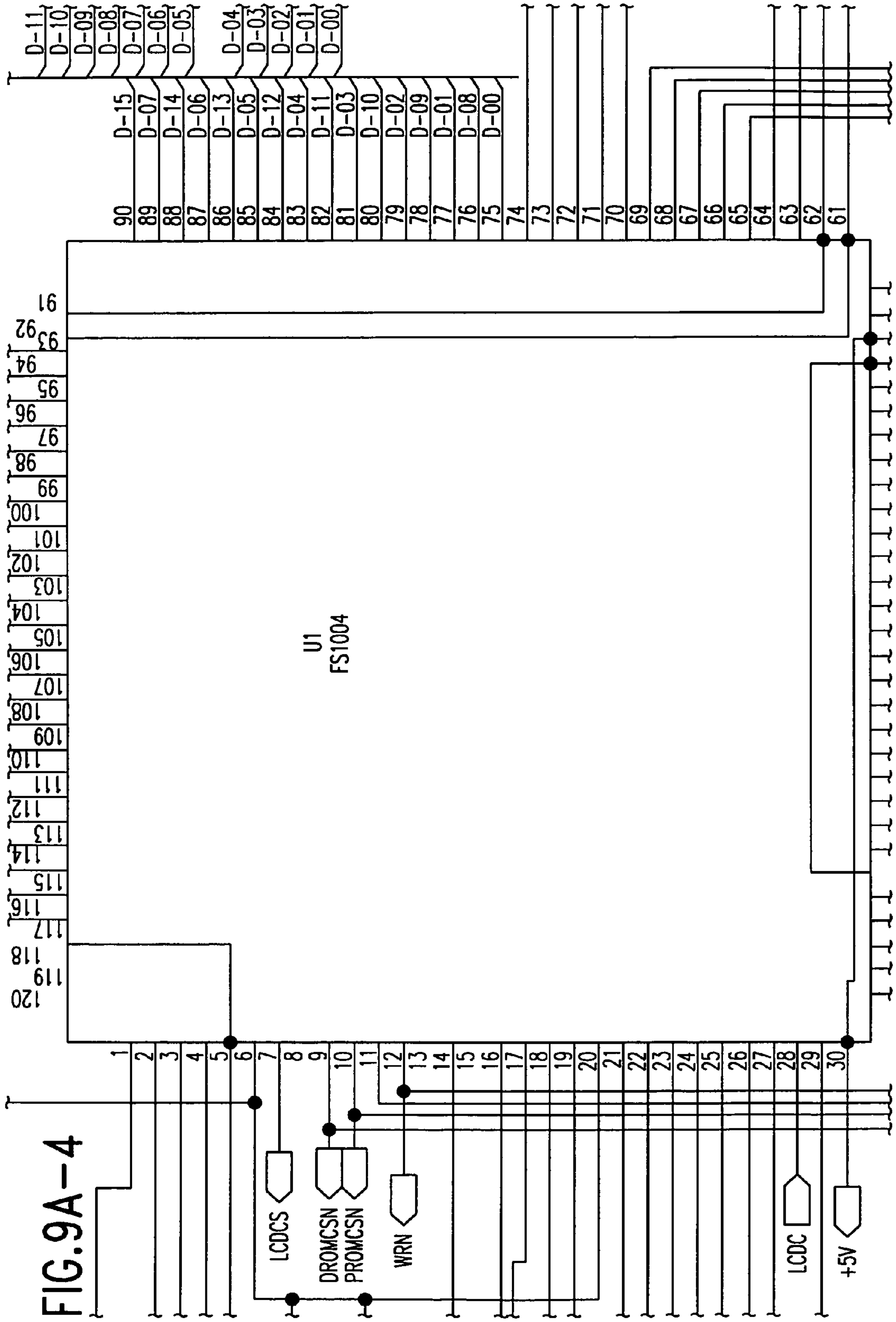
Figures 5, 9A:
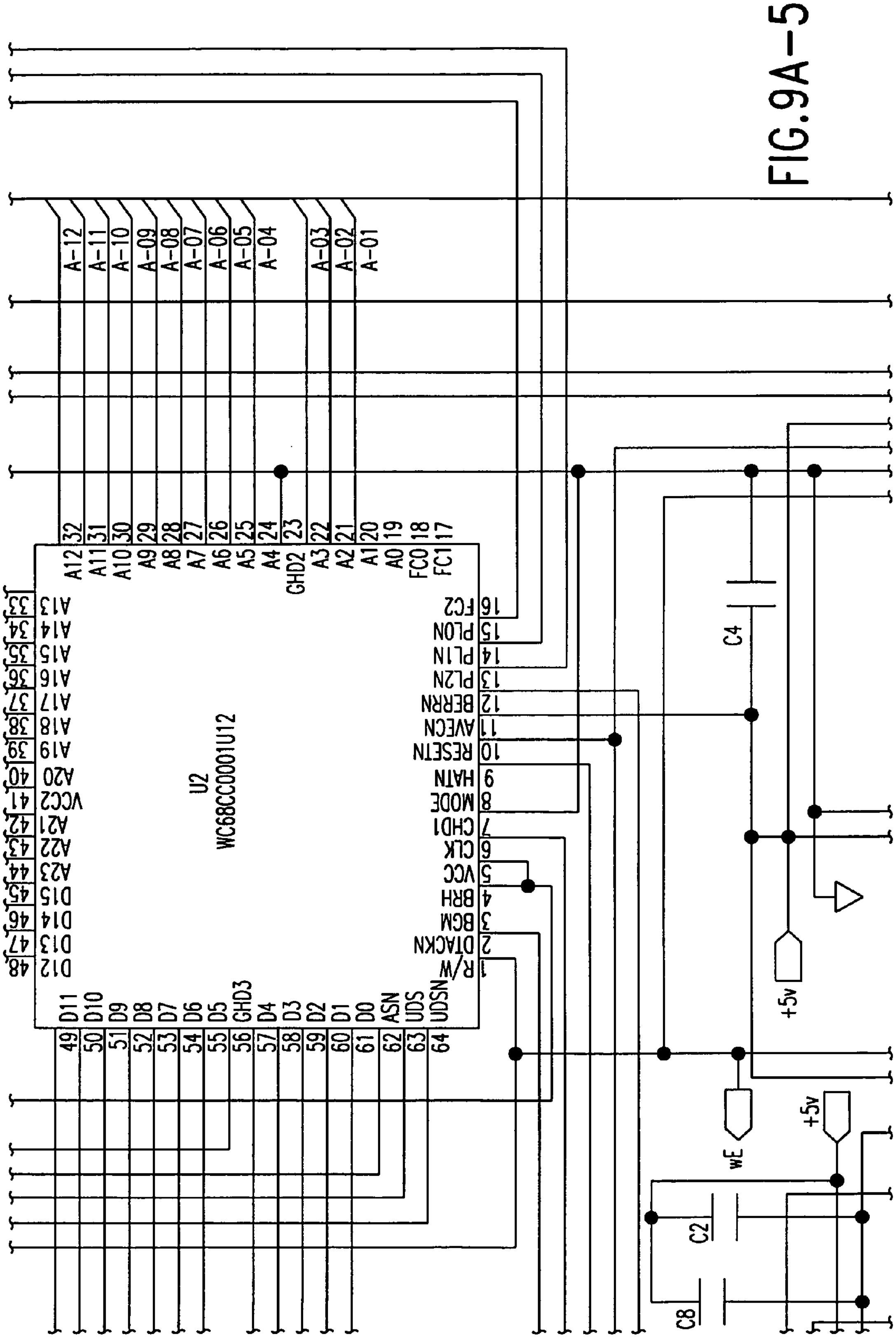
Figures 6, 9A:
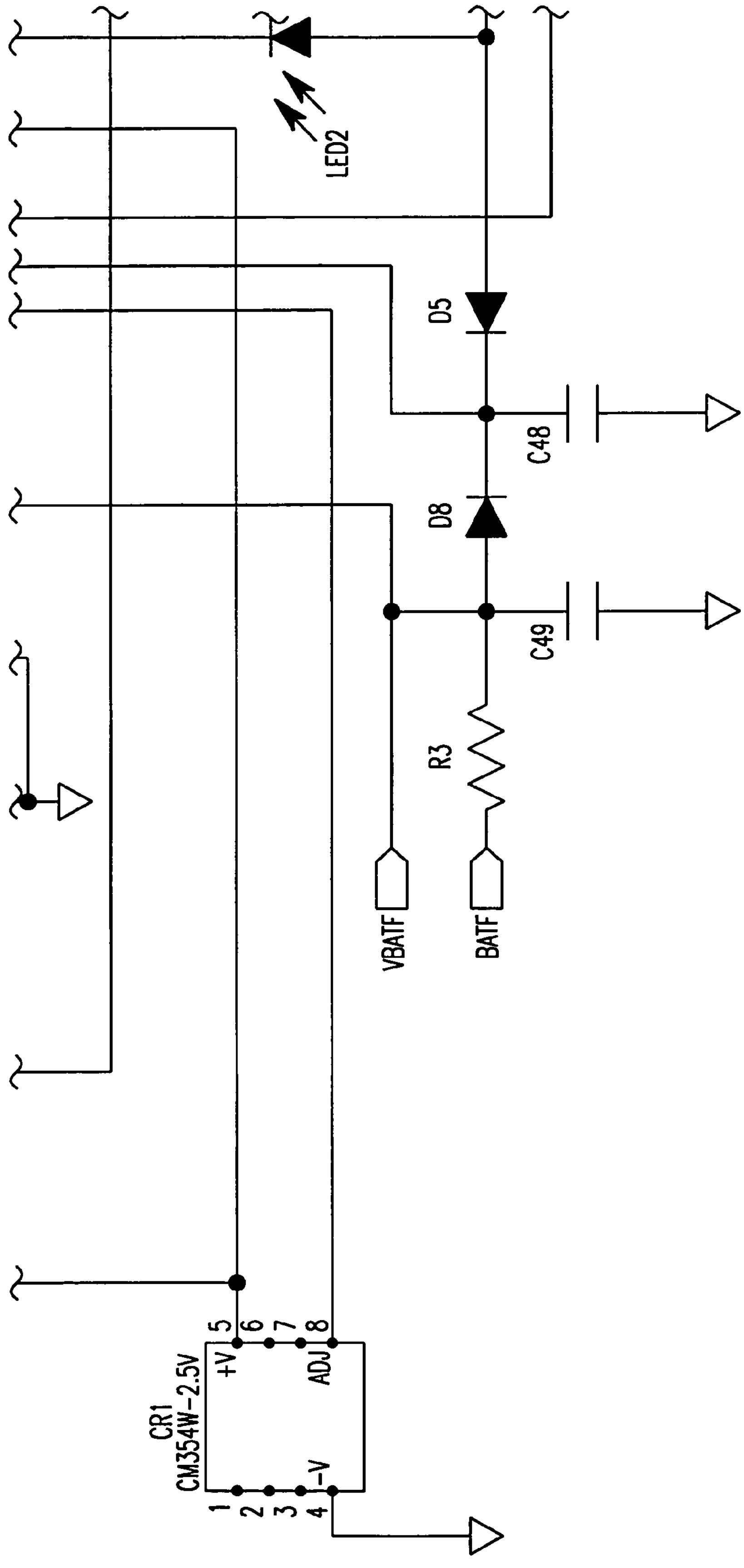
Figures 7, 9A:
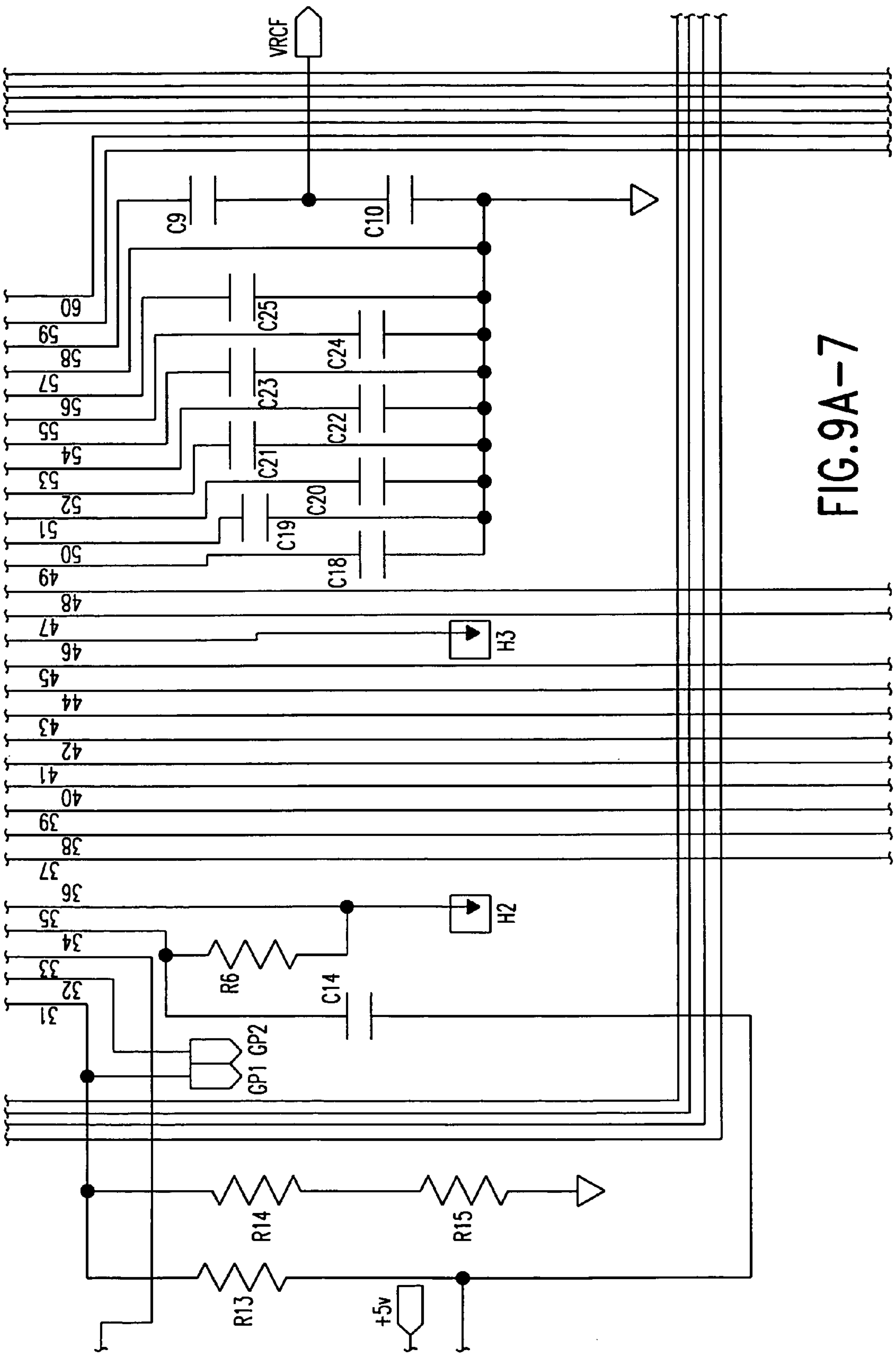
Figures 8, 9A:
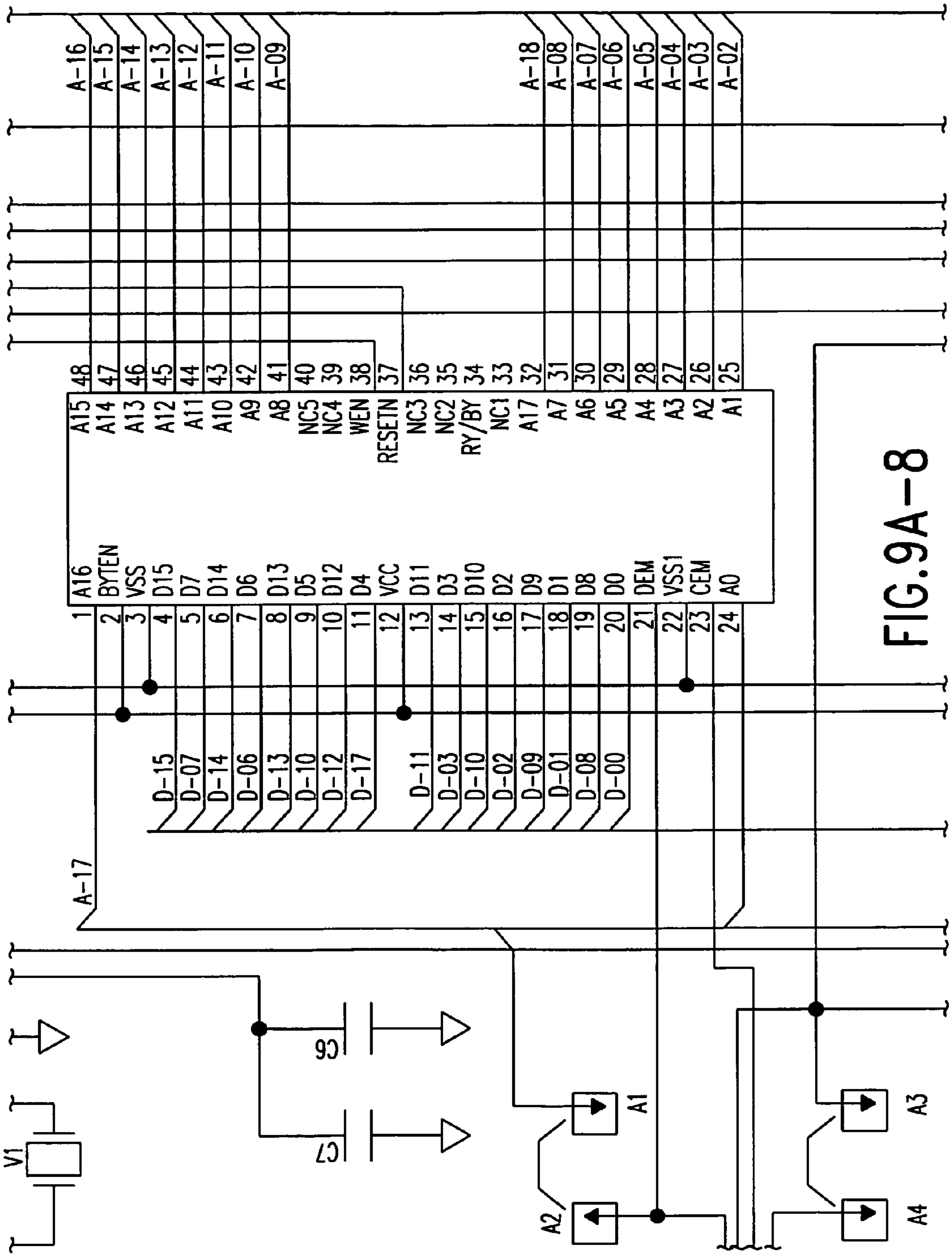
Figures 9, 9A:
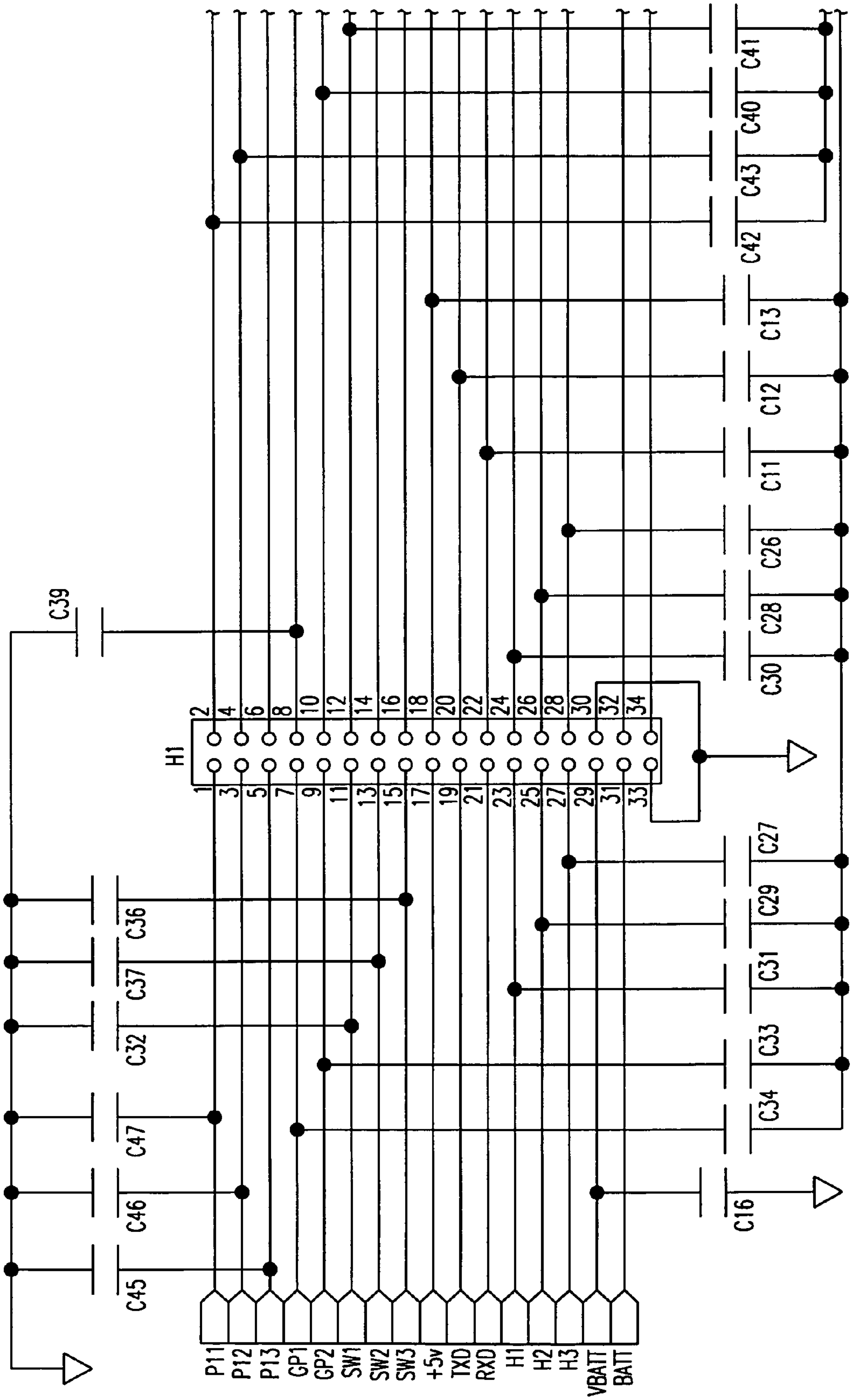

A full system drawing for a preferred embodiment of the present invention can be found in FIGS. 1–8. The system preferably reads meters using four communications media: low voltage (120 volt) power lines, medium voltage distribution lines (12,500 volt), a municipal fiber optic communications ring, and the Internet. FIG. 1 is an overall installation diagram for a preferred embodiment of the present invention. FIG. 2 is an installation diagram for a slave (low-level) transponder. FIG. 3 is a substation installation diagram of a master (high-level) transponder. FIG. 4 is an aerial transformer and coupling diagram. FIG. 5 is a phase-to-phase inductive pad mount coupler diagram. FIG. 6 is a signal transformer assembly diagram. FIG. 7 is a concentrator/signal unit diagram. FIG. 8 is a master and slave transponder power adapter diagram.

The system and method of a preferred embodiment of the present invention comprises the following components (see FIG. 1):

(1) Transmeters 100. These are the meters which monitor electricity, gas and water at the customer site.

(2) Low-level Transponders 110. Utility distribution systems have distribution transformers 115 to bring medium voltage distribution voltages (4×V through 33 kv) down to the low voltages (120–600 volt) connected to the customers. Low-level Transponders communicate with the Transmeters and with high-level Transponders 130 located at substations. Transponders of either type are referred to herein as "data collectors" or simply as "transponders." The context of usage will convey to those skilled in the art whether the transponder being discussed is a high- or low-level transponder, and whether the distinction is relevant. Referring to the embodiment illustrated in FIG. 1, high-level Transponder 130 requests data from a low-level Transponder 110, which then requests the same data from a Transmeter 100 connected to the same distribution transformer. A low-level Transponder 110 preferably communicates on the medium distribution voltage using a coupler 120, which can be either: (A) an inductive coupler: a device that replaces the cable feeding the distribution transformer with medium distribution voltage (the inductive coupler has two signal wires that connect to the low-level Transponder), or (B) a capacitive coupler: a circuit that includes a capacitor and a signal transformer. Two signal wires connect to the Transponder.

A low-level Transponder 110 may have an optional meter with 24 channels. These channels can be used to measure energy delivered on up to 24 phases of individual feeders leaving the distribution transformer. This data may be used to identify losses by comparing aggregate readings of all Transmeters 100 connected by phase and by feeder to the known reading at the low-level Transponder. These losses may be caused by theft of service. Identification of theft of service is a feature of a preferred embodiment of the present invention.

High-Level Transponders

A high-level Transponder ("Transponder 5") 130 communicates with Low-level Transponders 110, requesting specified data from specified Transmeters. The data request is made first, and then high-level Transponder 130 polls the low-level Transponder at a later time to see whether the data is ready. The high-level Transponder may request data from several low-level Transponders in sequence and poll them later. Because higher data rates are possible on the medium voltage than the low voltage, the system may thus obtain greater reading efficiency. The Transponders connect to one of several network media to communicate with the billing computer: (A) fiber optic network; (B) hard wire RS-485 network; (C) TCP/IP LAN; or (D) telephone lines.

Billing Computer

A Billing Computer 140 connects one or many communications networks to read data from many Transponders. The Billing computer is programmed to respond to requests from the utility or requests made over the Internet, and to deliver the required information in a form that is portable to whatever billing software the utility uses, typically MV-90.

Billing Computers may be interconnected over the Internet to form a WAN. The user accessing the site does not need to know which Billing Computer is requesting the information, nor the route to the high-level Transponder or low-level Transponder en route to the source of the information, the Transmeter.

Internet Interface

In a preferred embodiment, an Internet interface at the Billing Center allows the utility or its customer to access an Oracle database.

Preferred Embodiments—Common Features

Preferred embodiments of the submeter comprise a combination of a Display Board, a Power Board and a case to complete the product.

Figures 9, 9A, 10:
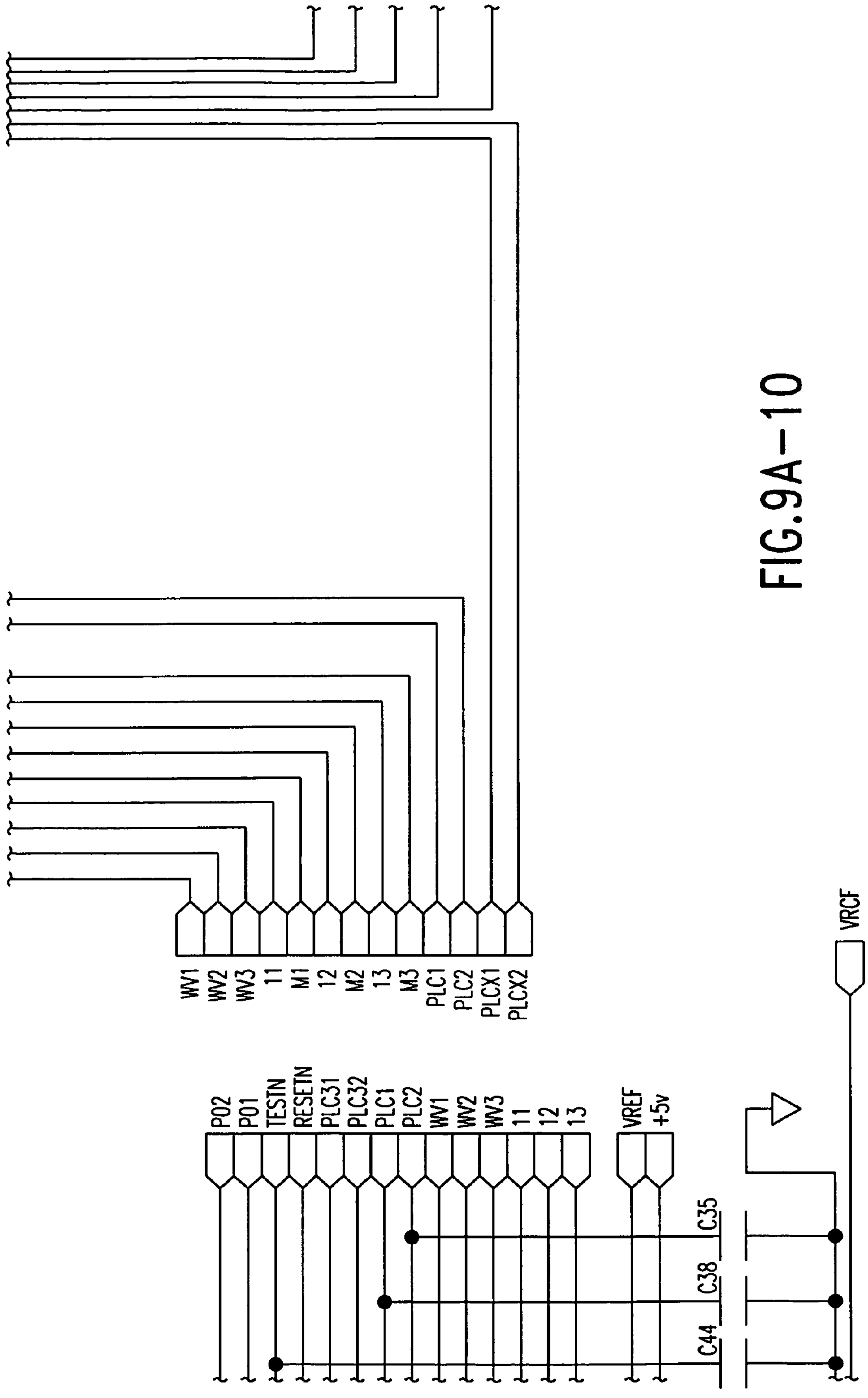
Figures 9, 9A, 10, 11:
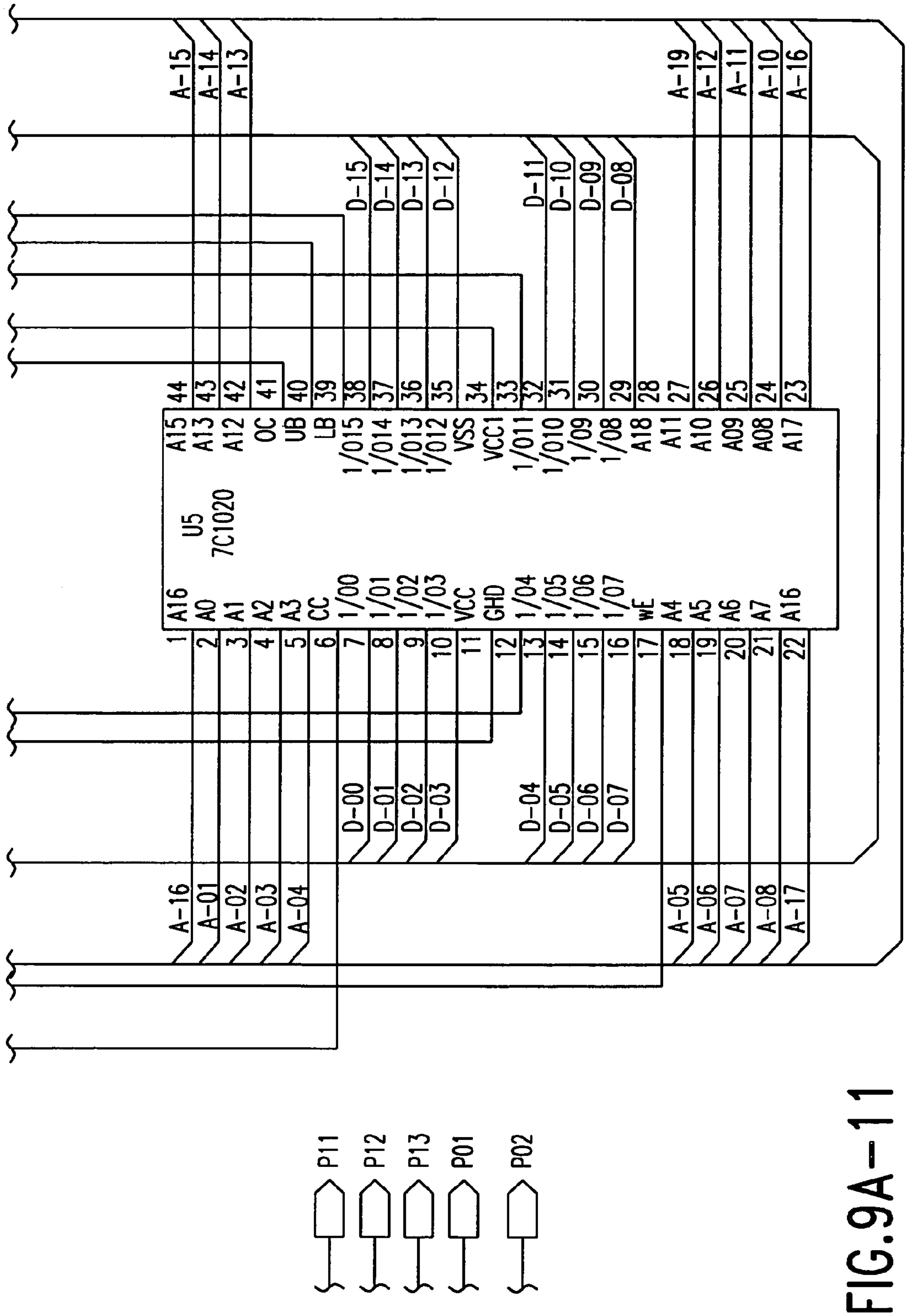
Figures 1, 9B:
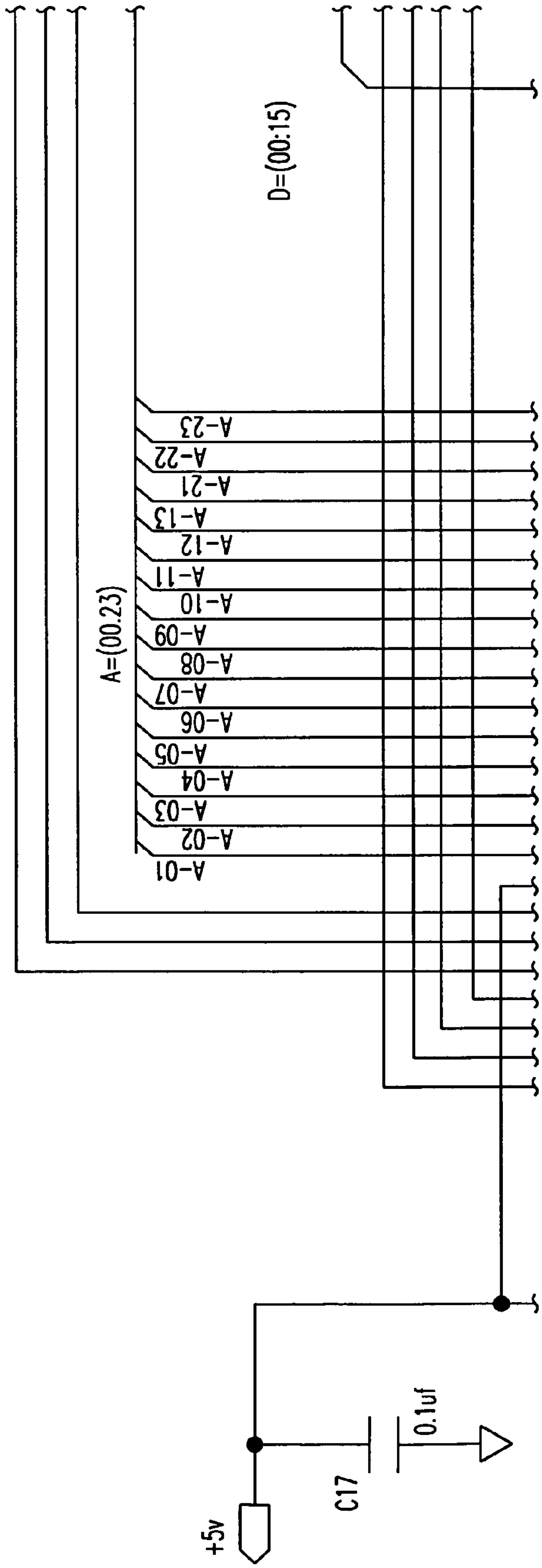
Figures 2, 9B:
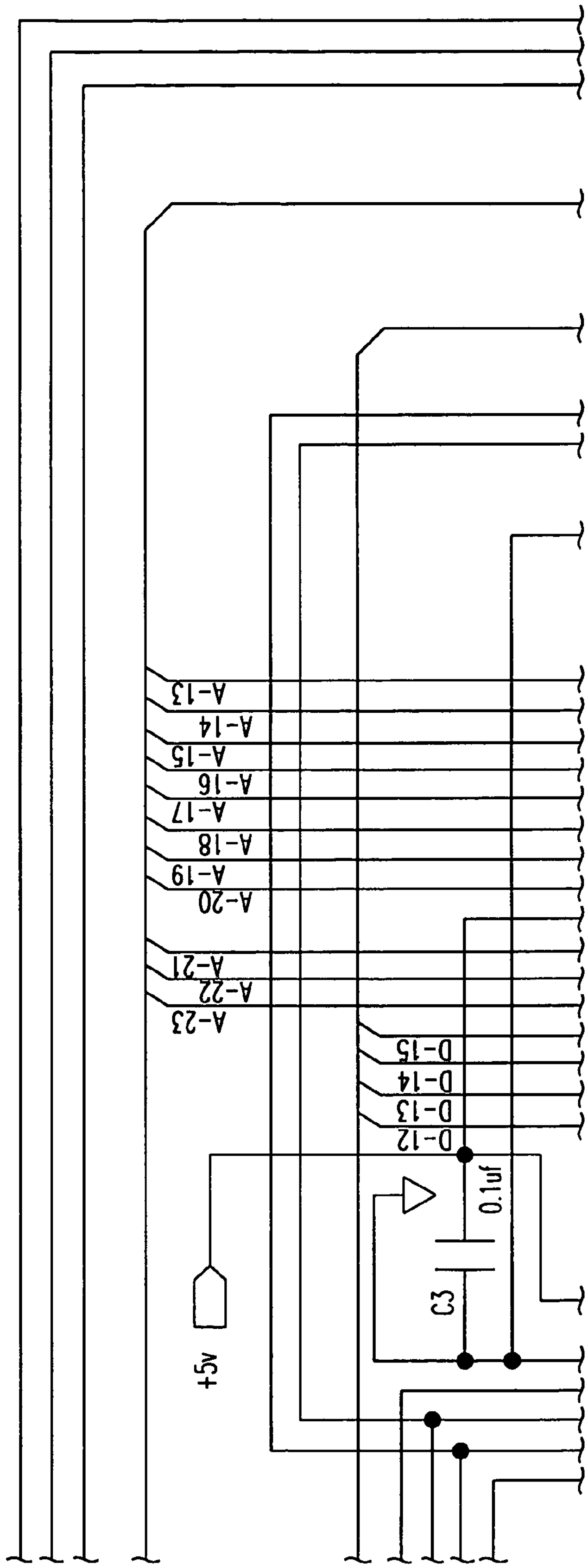
Figures 3, 9B:
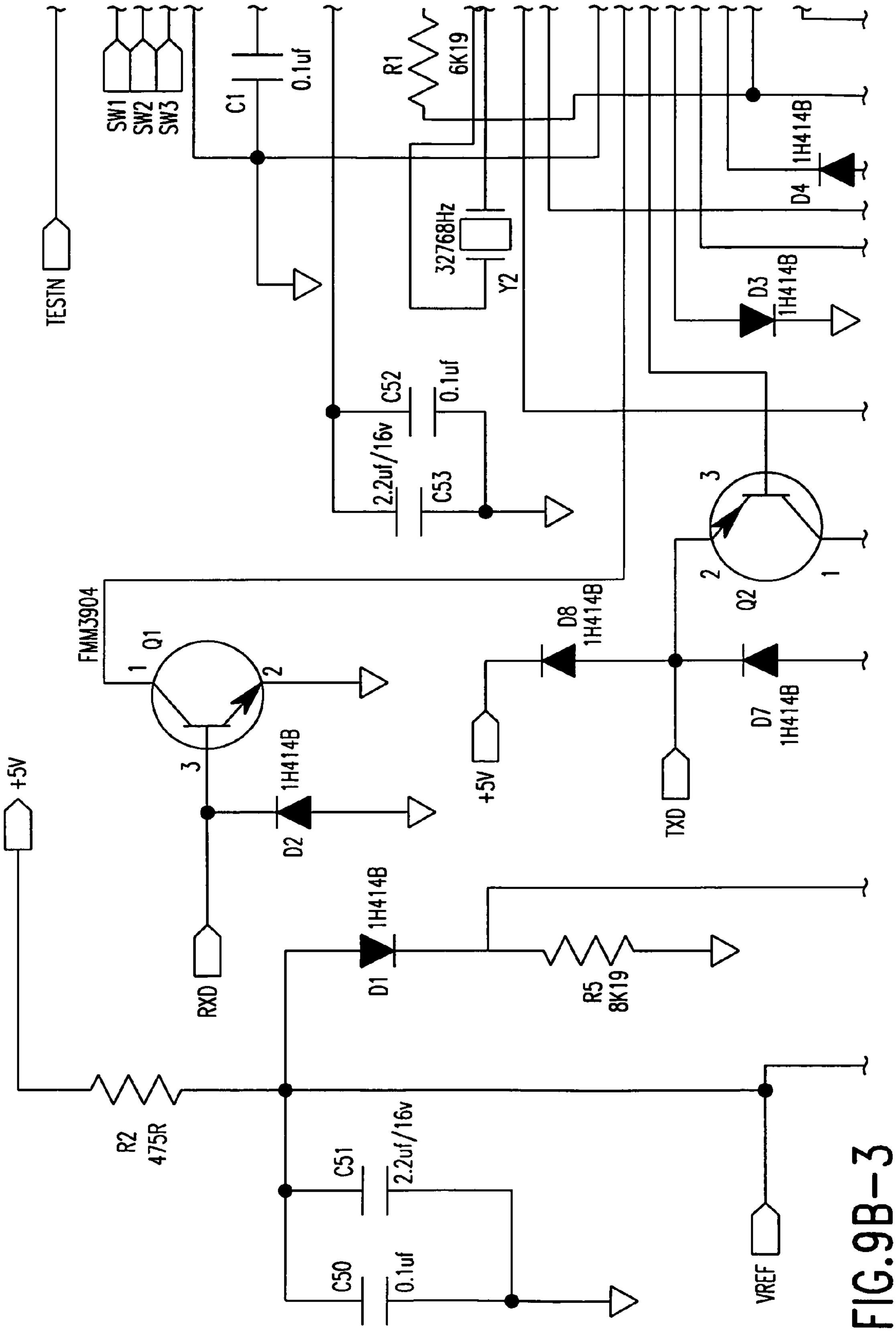
Figures 4, 9B:
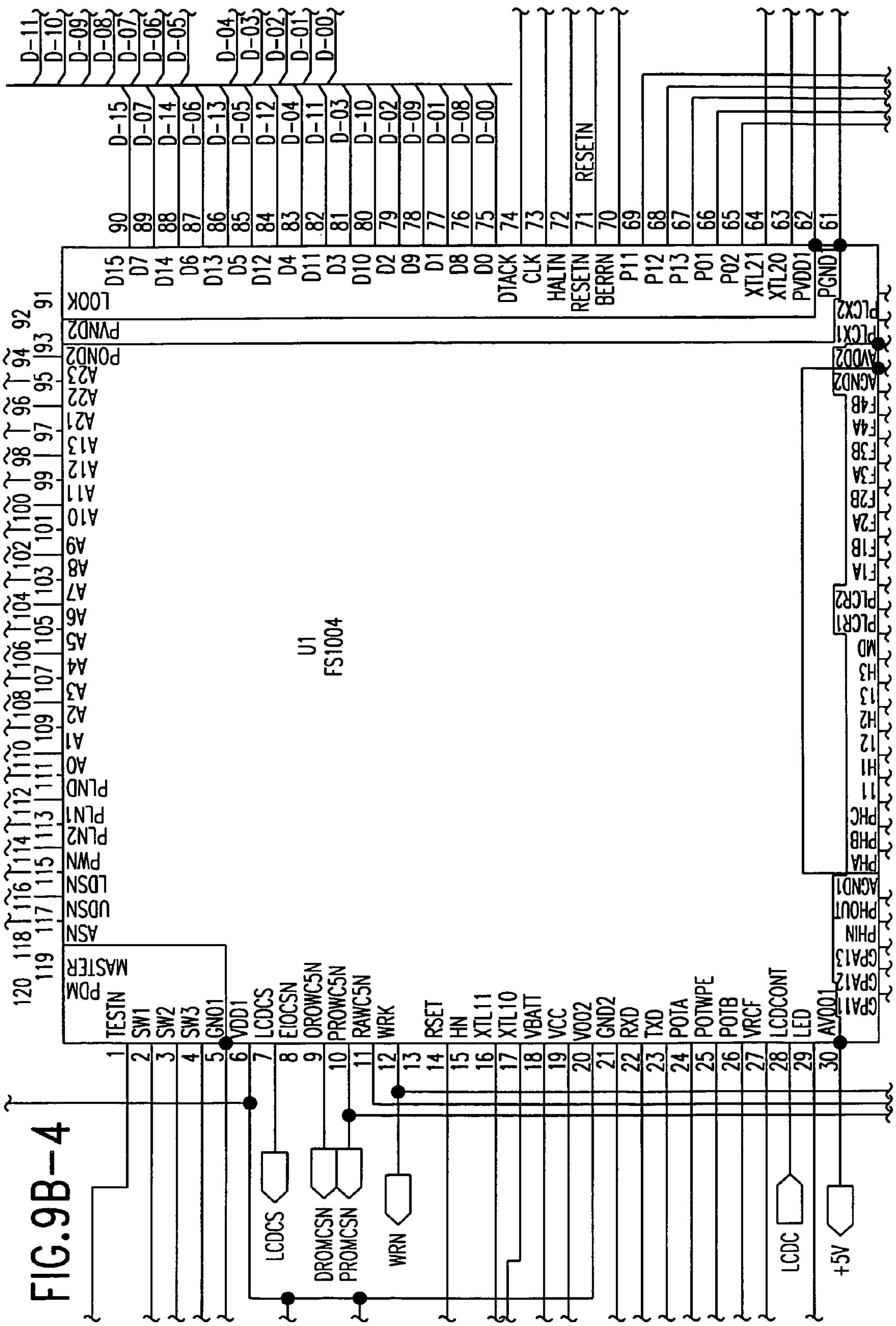
Figures 5, 9B:
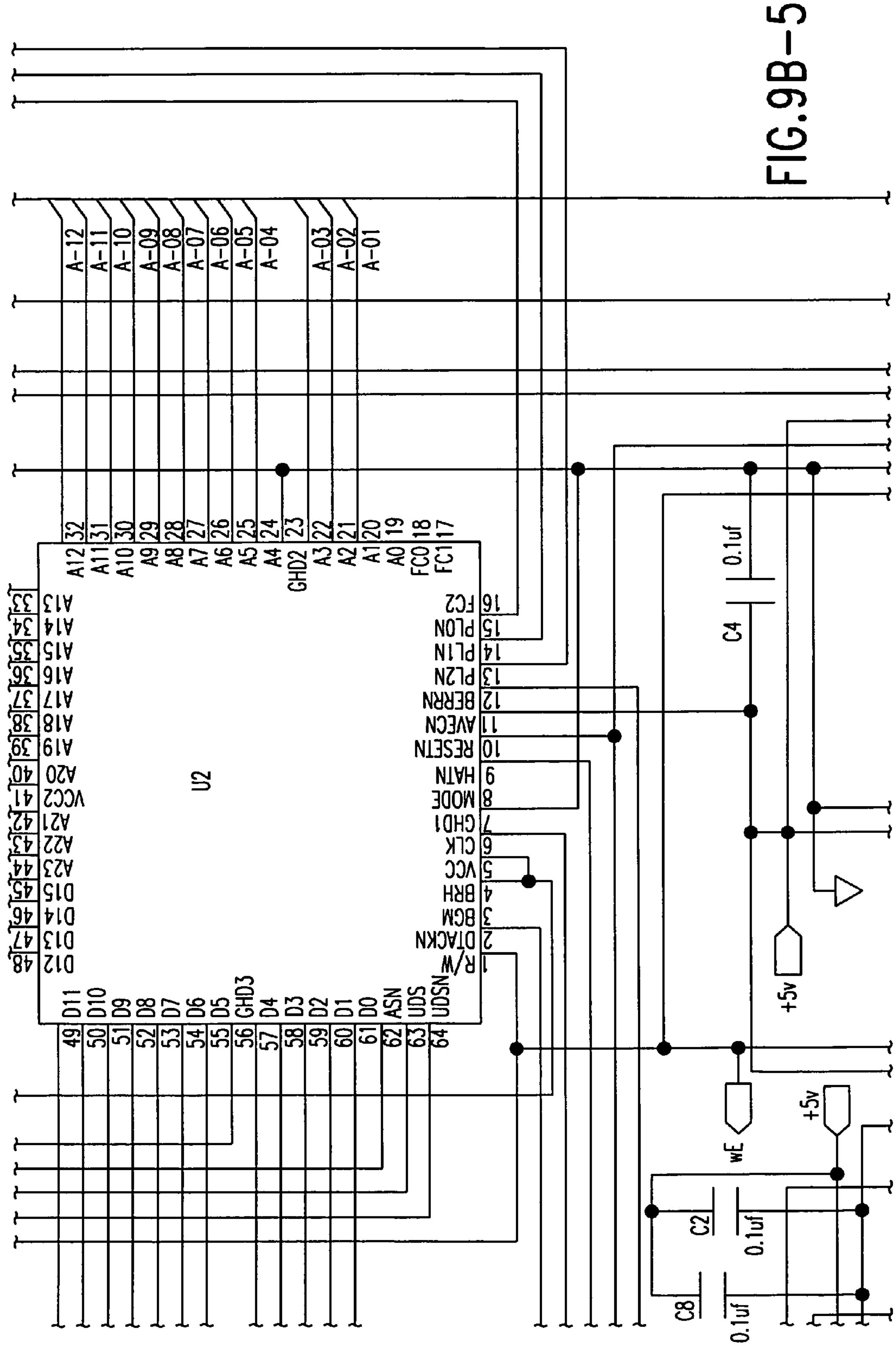
Figures 6, 9B:
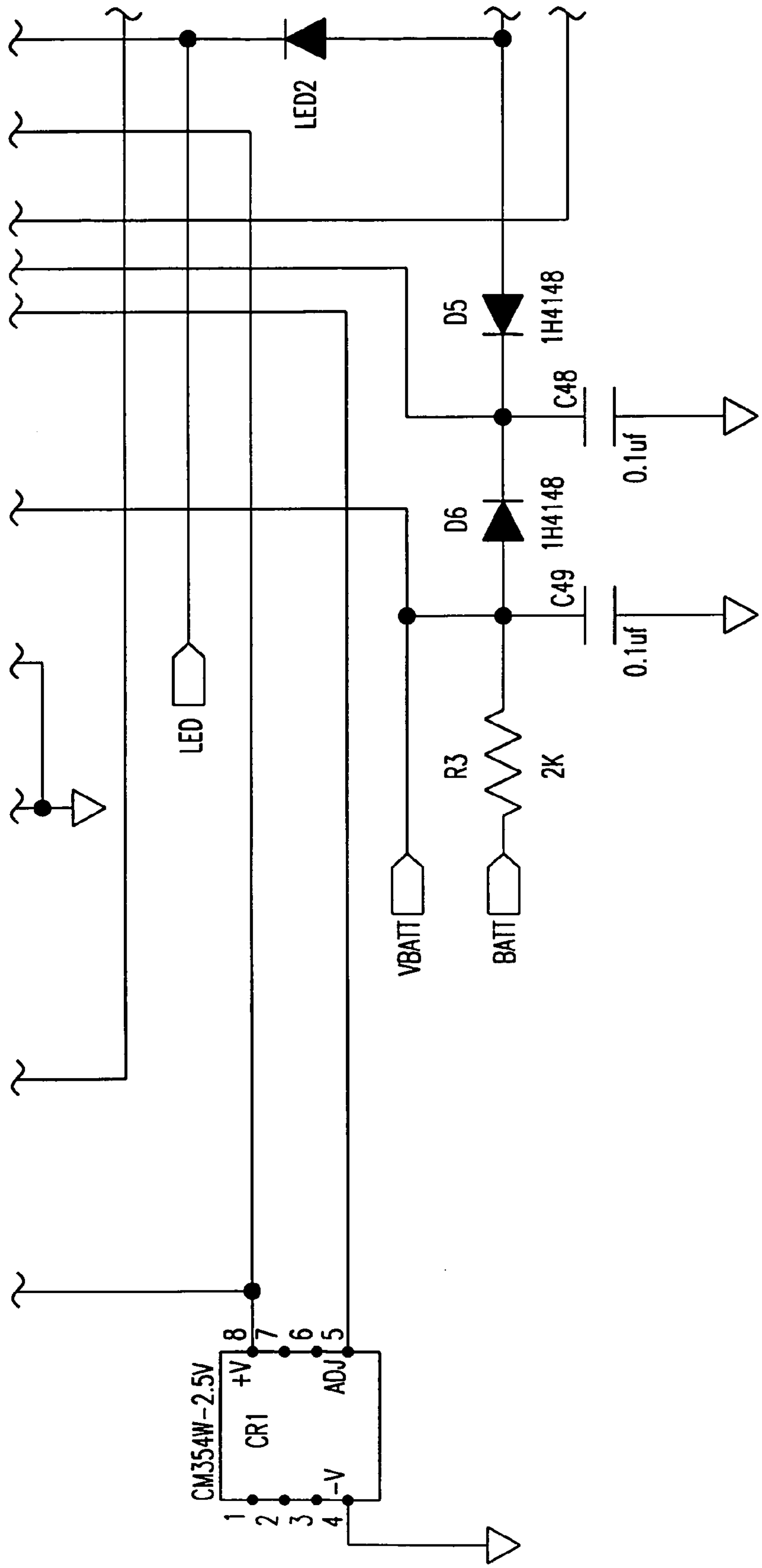
Figures 7, 9B:
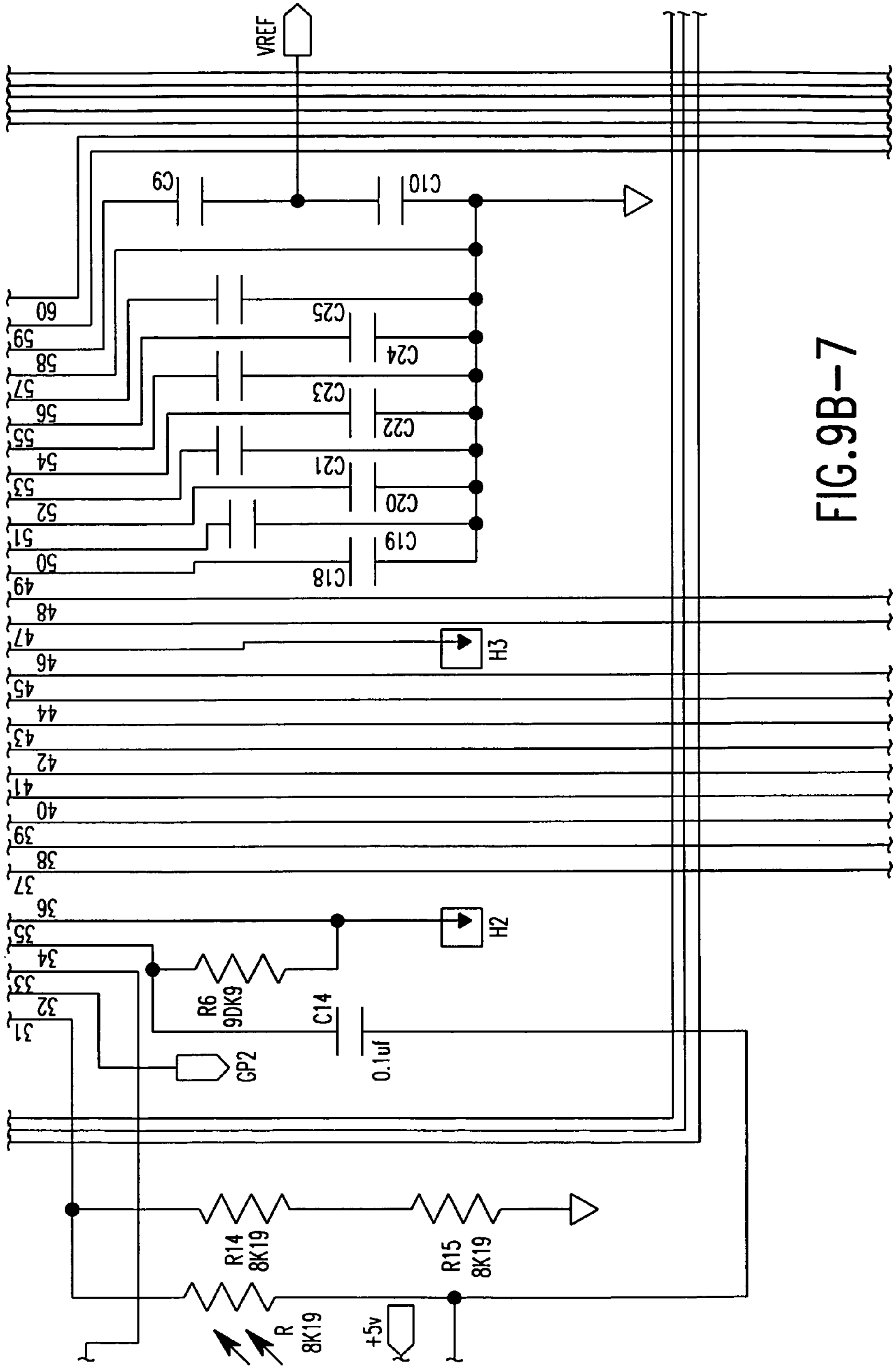
Figures 8, 9B:
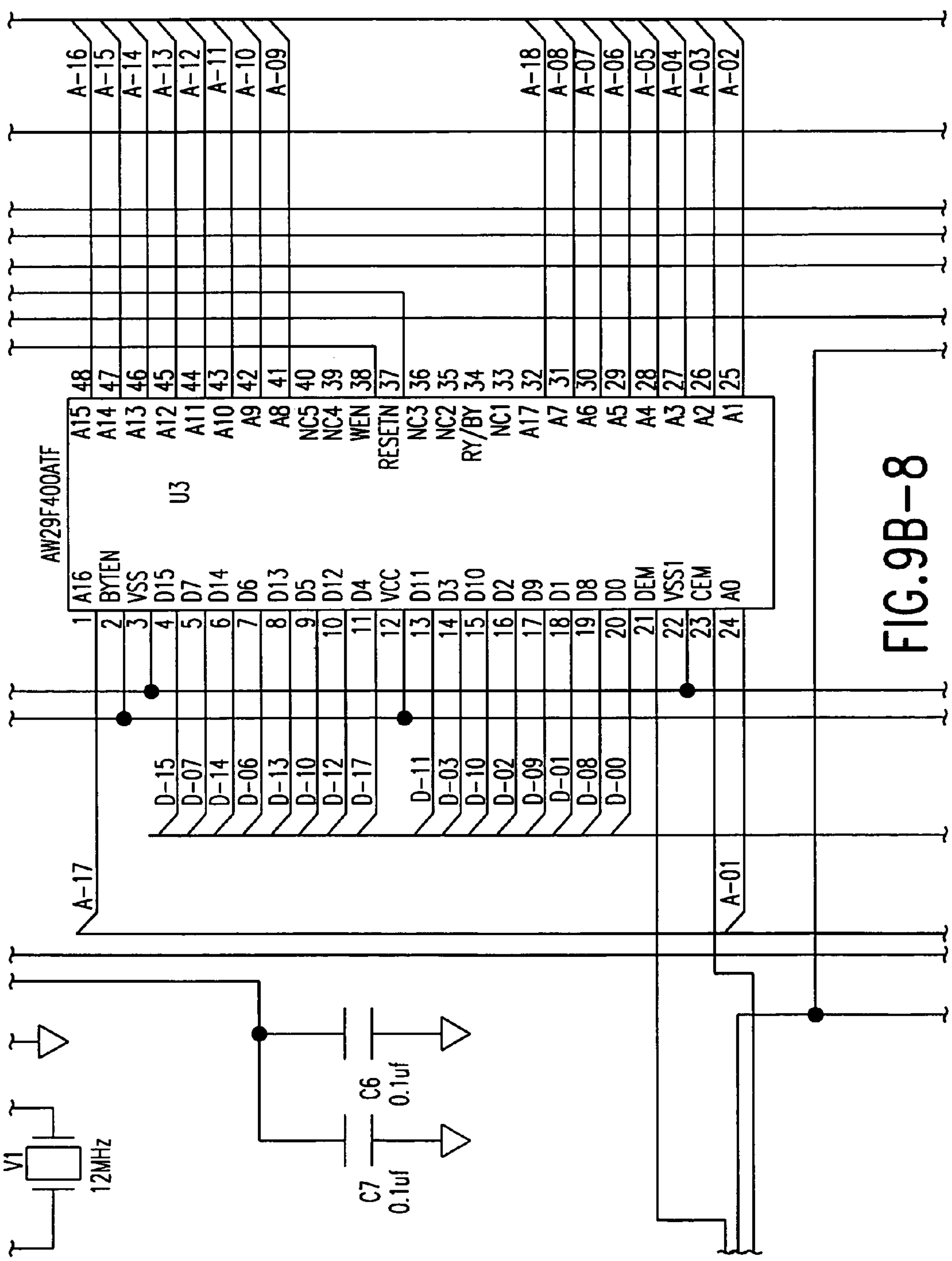
Figures 9, 9B:
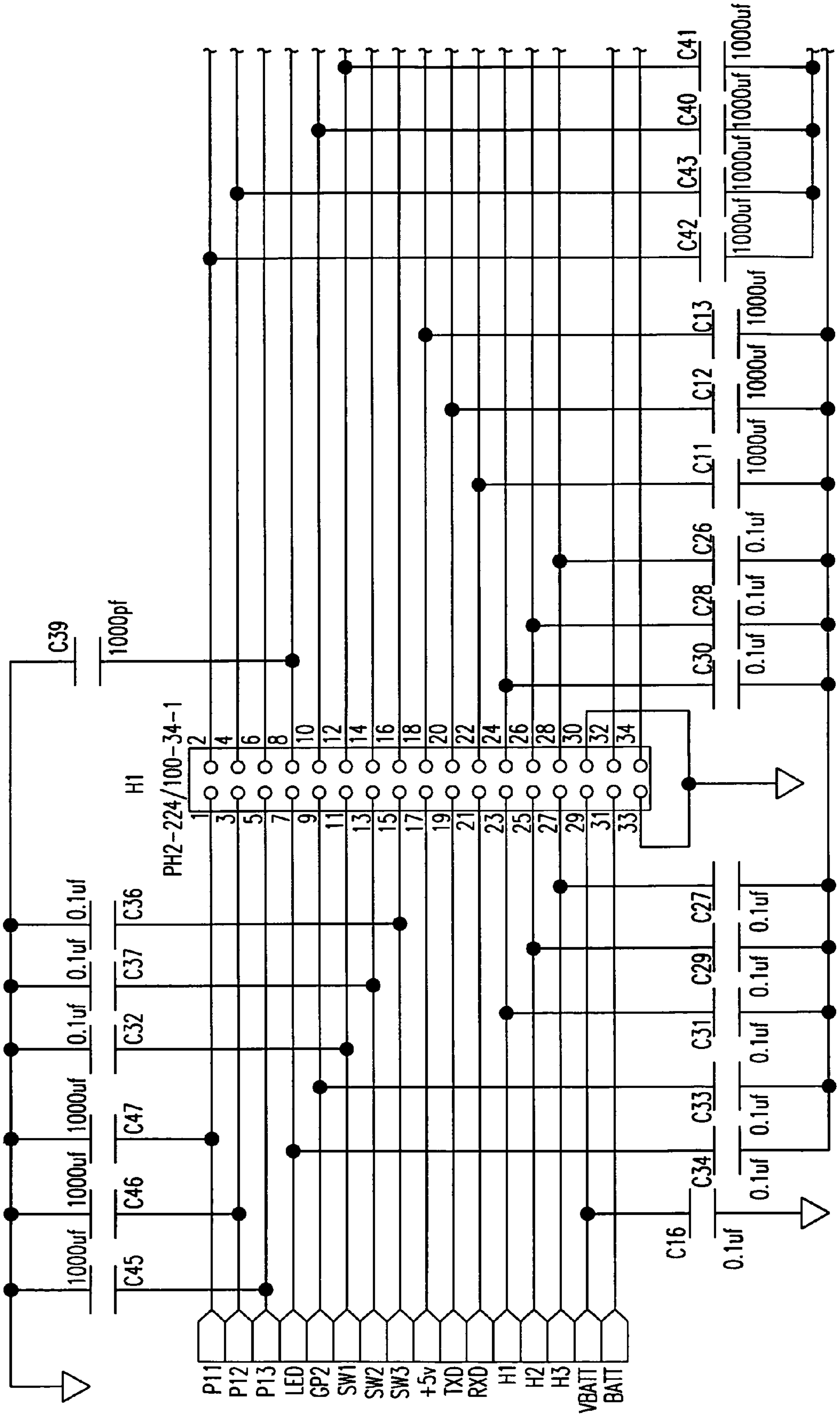
Figures 9, 9B, 10:
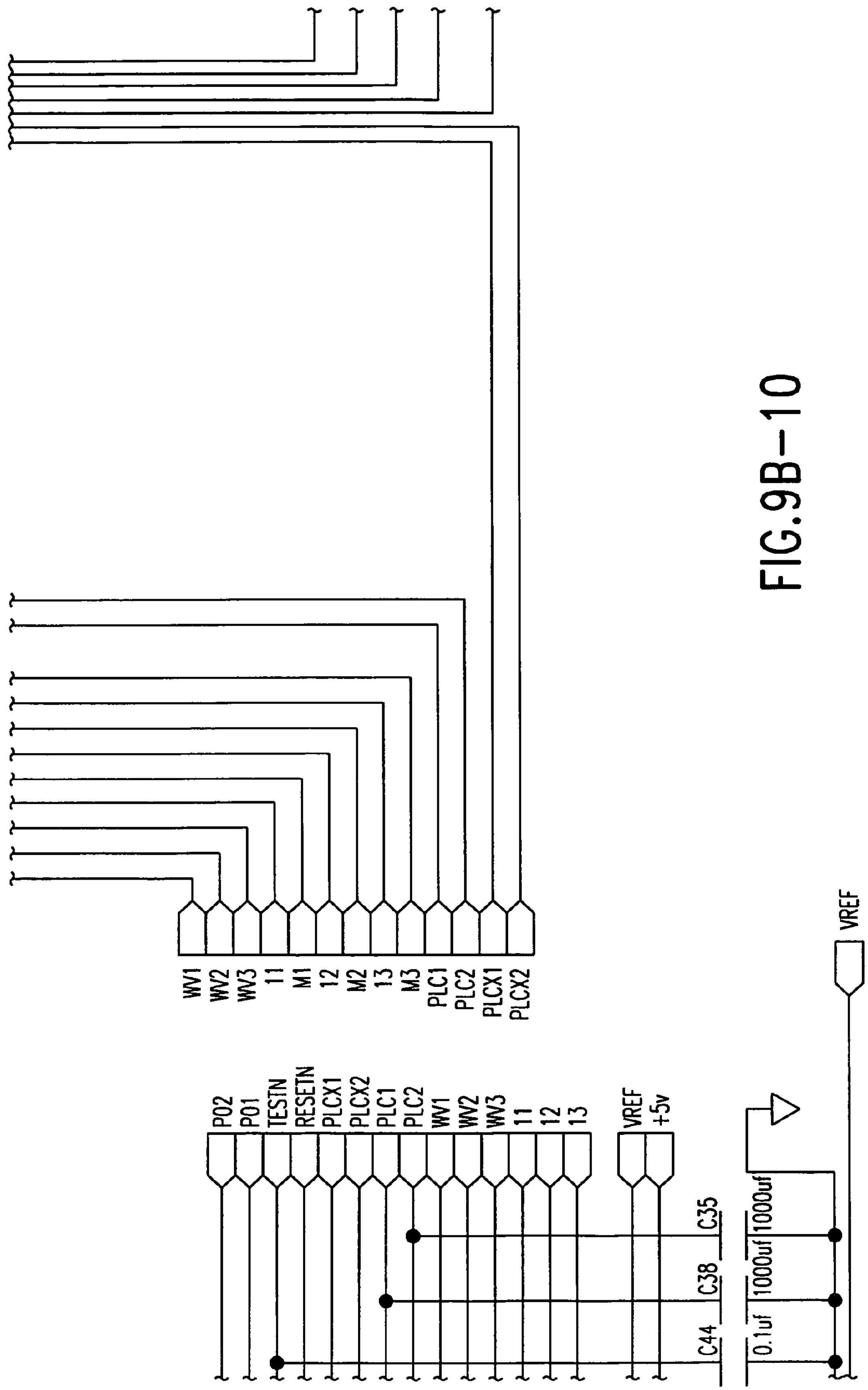
Figures 9, 9B, 10, 11:
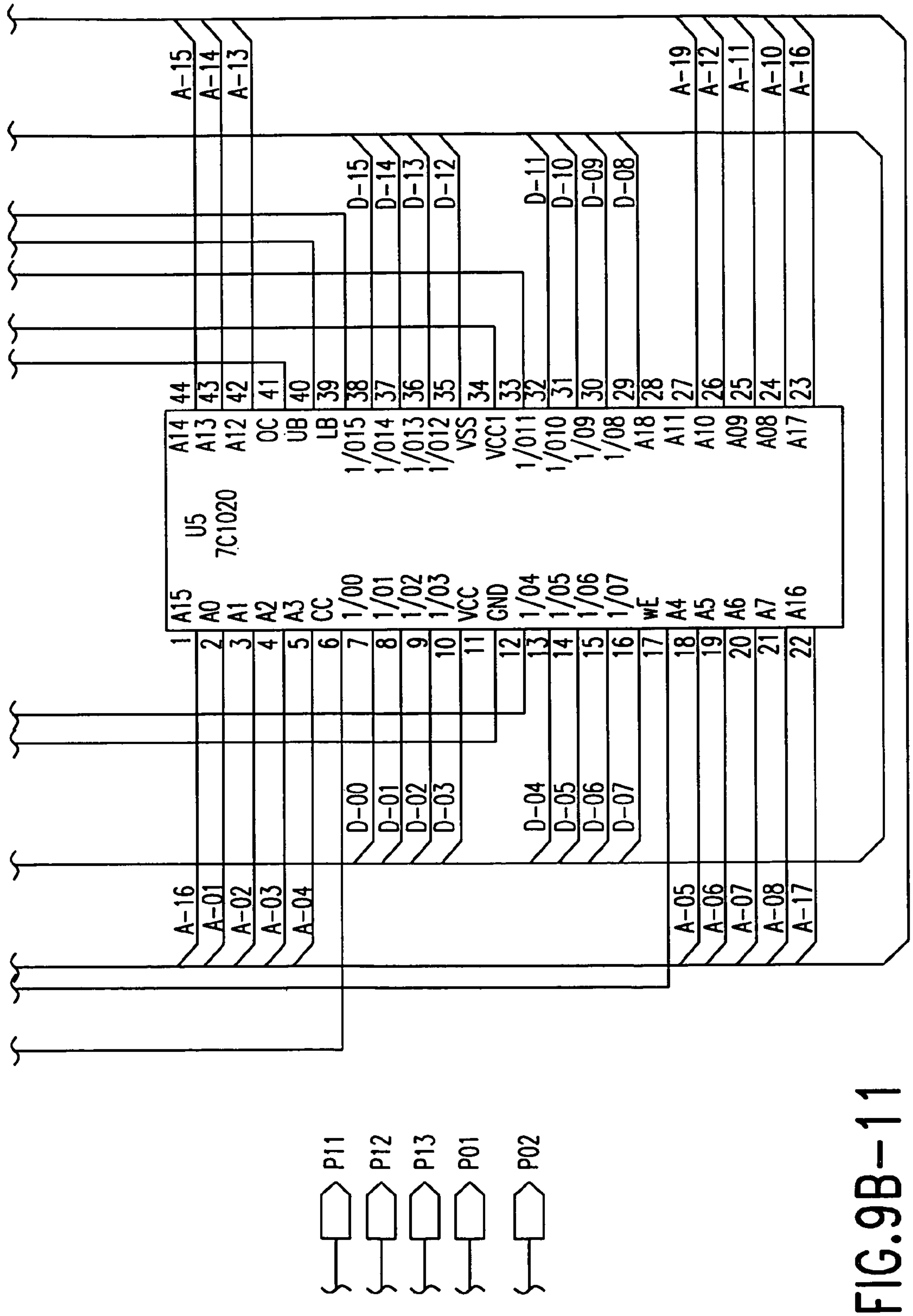
Figure 10:
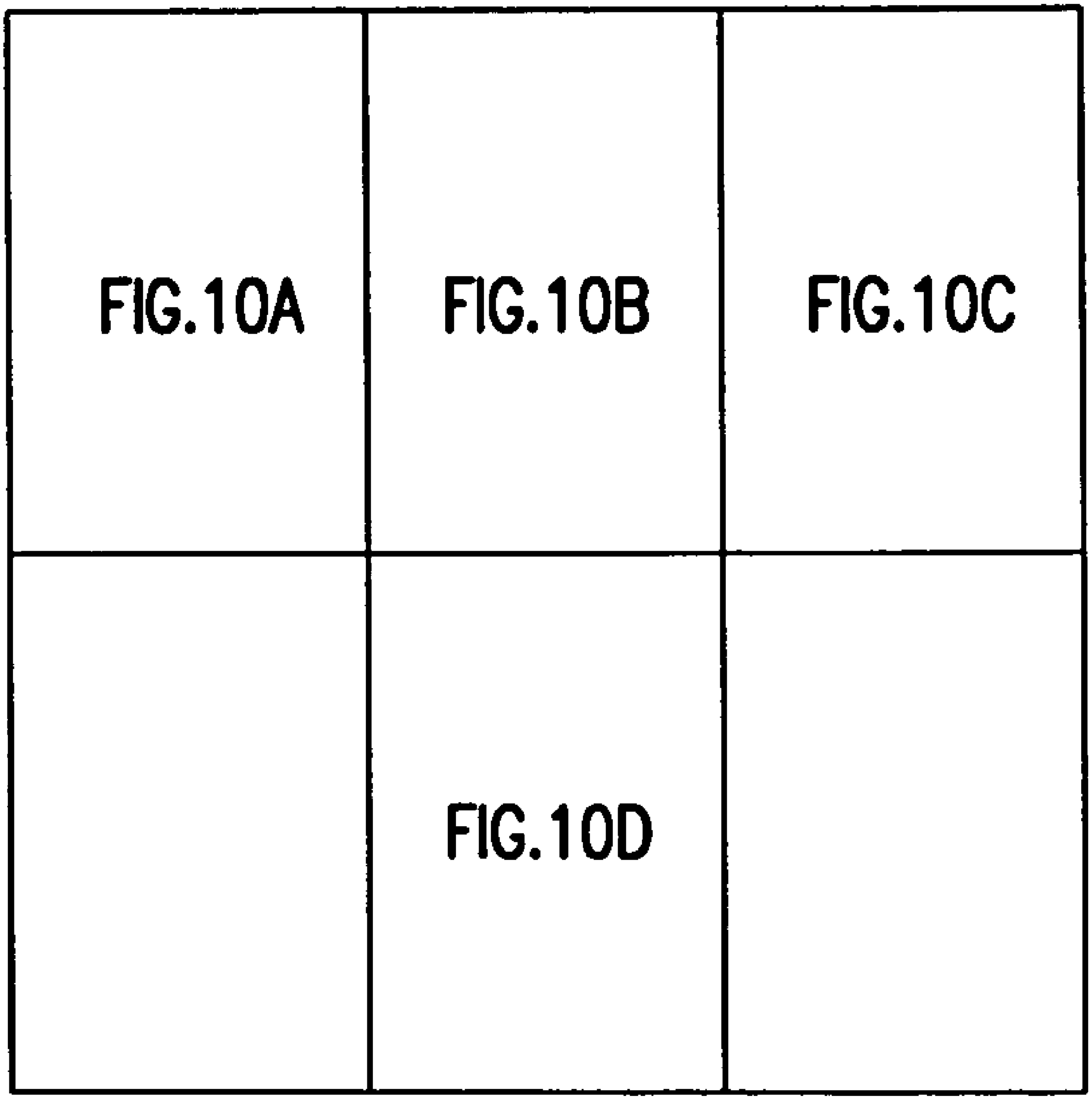
Figure 10A:
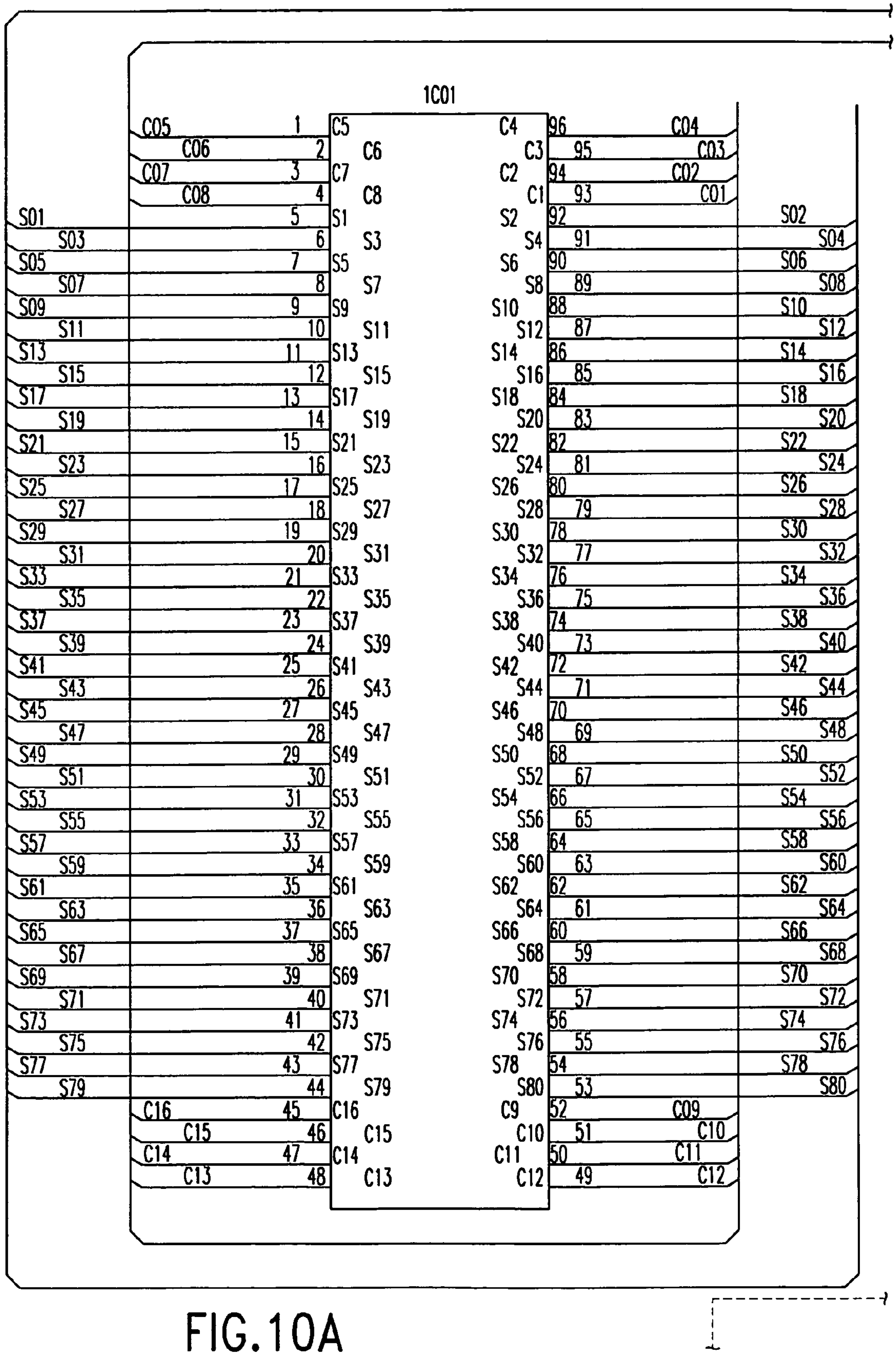
Figure 10B:
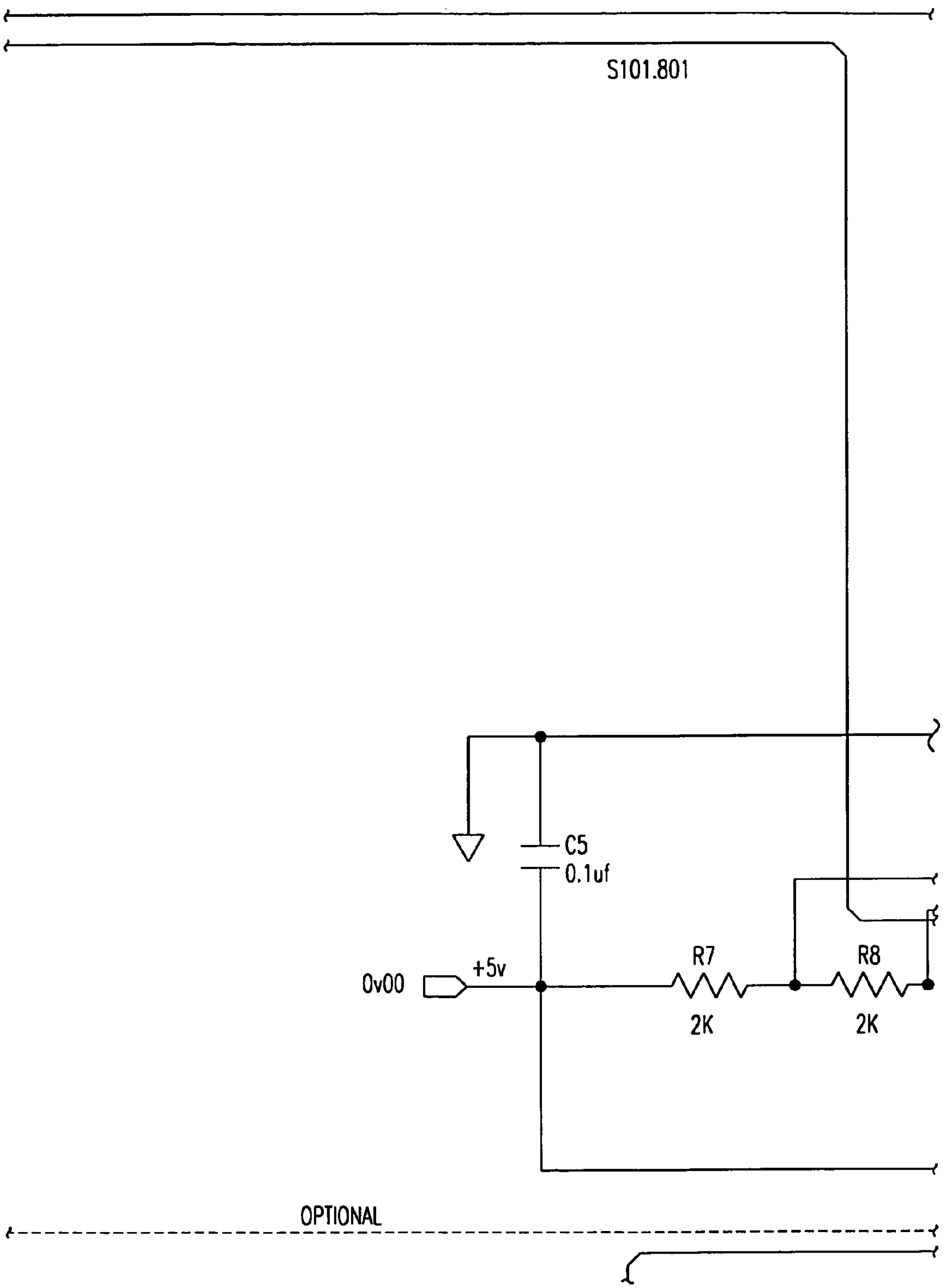
Figure 10C:
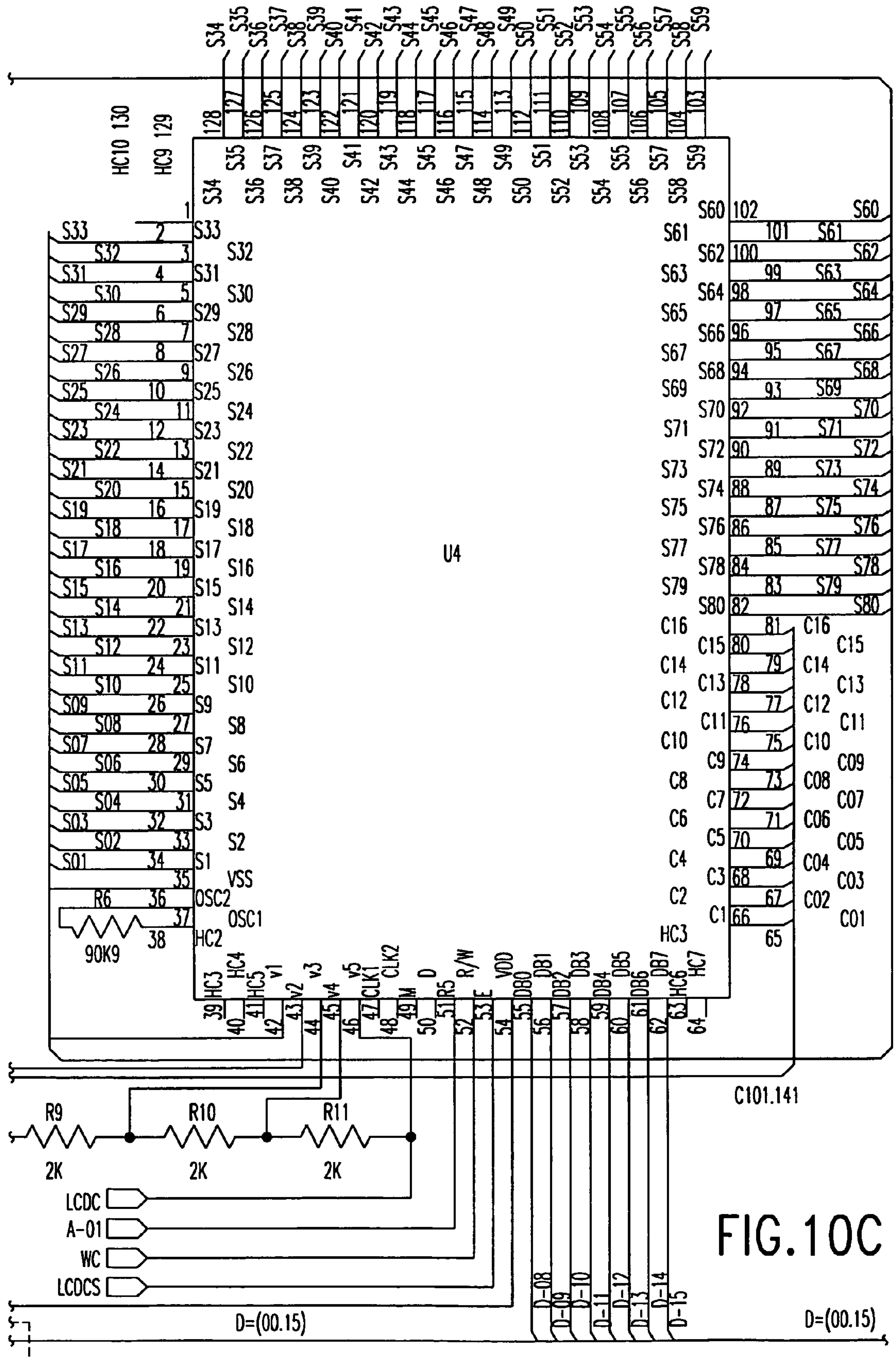
Figure 10D:
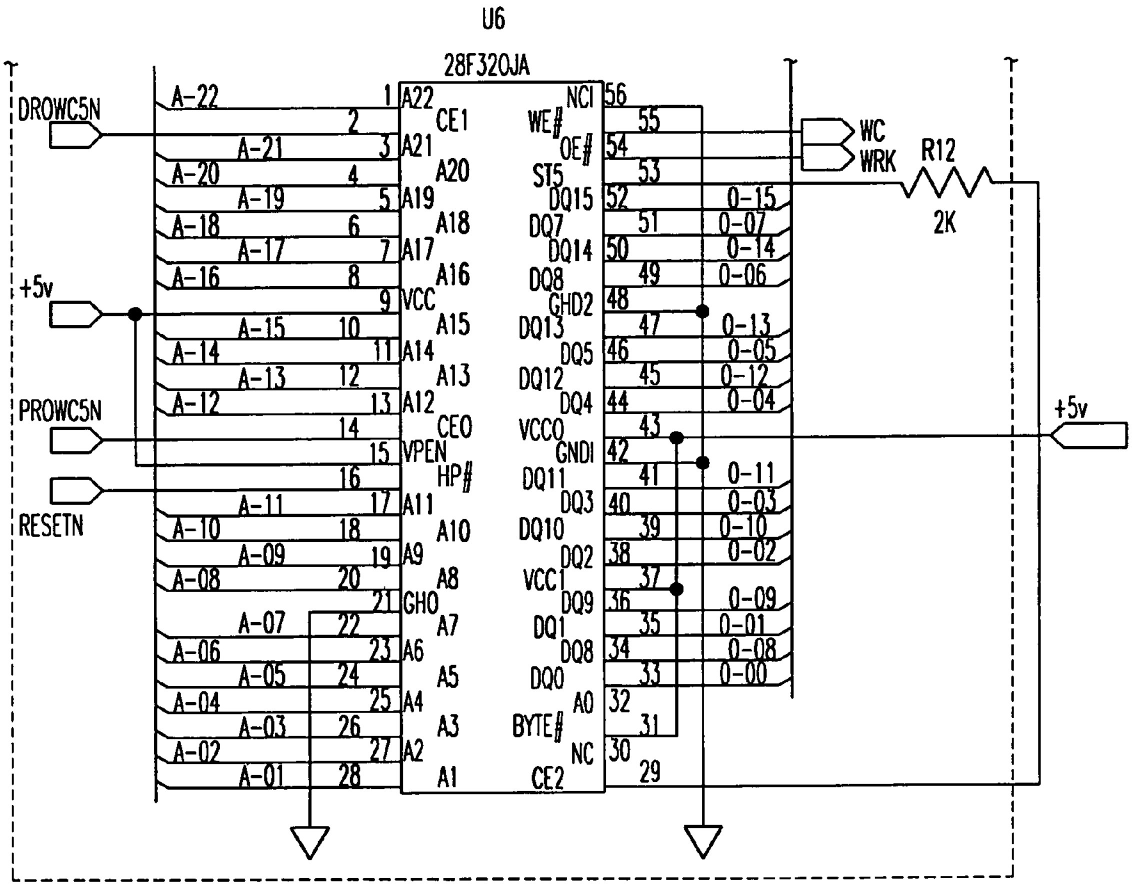

The Display Board is common to all embodiments. The Display Board schematic diagram can be found in FIGS. 9A–B and 10. The Display Board has an application-specific integrated circuit ("ASIC") U1, a Motorola 68000 microprocessor U2, an LCD driver U4 and display LCD1, a RAM memory (U3 and U6), flash memory U5 and a voltage reference CR1. The Display Board is preferably fabricated on a 5" to 2" 10 layer board with special care paid to ground planes. This affords improved protection against "fast transients," a type of interference found on power lines which often causes corruption of memory.

The Power Boards vary depending on the shape and connection requirements of the submeter. The power boards preferably contain power supply components, a battery for the real time clock, current and voltage interfaces, as well as optical, RS-232/485, modem, gas and water meter and other interfaces.

Flash memory U5 maintains an audit trail of all critical metering (electric, gas and water) and events (power outages, tamper attempts, etc.). This audit trail forms a second line of defense against "fast transient" induced memory loss. The critical data is preferably stored at least every 15 minutes. The flash memory is most useful for storing firmware or archiving data. It does not function like a RAM. Unlike RAM memories, it is not susceptible to corruption due to "fast transients." With the preferred archiving method, maximum data loss can be controlled by selecting a frequent archiving period, minimizing the commercial importance of a memory loss. The flash memory audit trail of energy usage has independent commercial value to ESCOs, generating companies, and electric utilities under deregulation: energy can be sold at varying prices during the day, even on a 15 or 5 minute basis. The electric meter monitors each phase of the incoming power: electricity measuring volts; amps; real, reactive, and apparent energy and power; power factor; total harmonic distortion; and frequency.

The algorithms in the 68000 microprocessor control the ASIC (described in detail below) and are disclosed by the S-record file 28130104.S and improved version 38230102.S in the attached Appendix.

The submeter also counts contact closure transitions emitted from water and gas meters. Preferred submeters have a liquid crystal display, an optical port, and an (optional) RS-232/485 port.

Preferred submeters feature a power-line modem to communicate over the low voltage (120 volt, 220 volt, 480 volt or 600 volt) lines to a Transponder or Low-level Transponder.

In a first preferred embodiment (the "10 series"), the system comprises a small apartment-style submeter that mounts next to a breaker panel within a wall and uses current transformers mounted on the apartment feeders to sense current.

In a second preferred embodiment (the "20 series"), the system comprises: (1) a plug-in replacement for socket-style round ANSI meters; (2) gas and water contact closure accumulators, which continue accumulating by battery even if the electric power is removed; and (3) full complex plane (amplitude and angle) calibration of internal 10, 100, or 200 amp current elements to achieve a high level of calibration.

Figures 1, 11A:
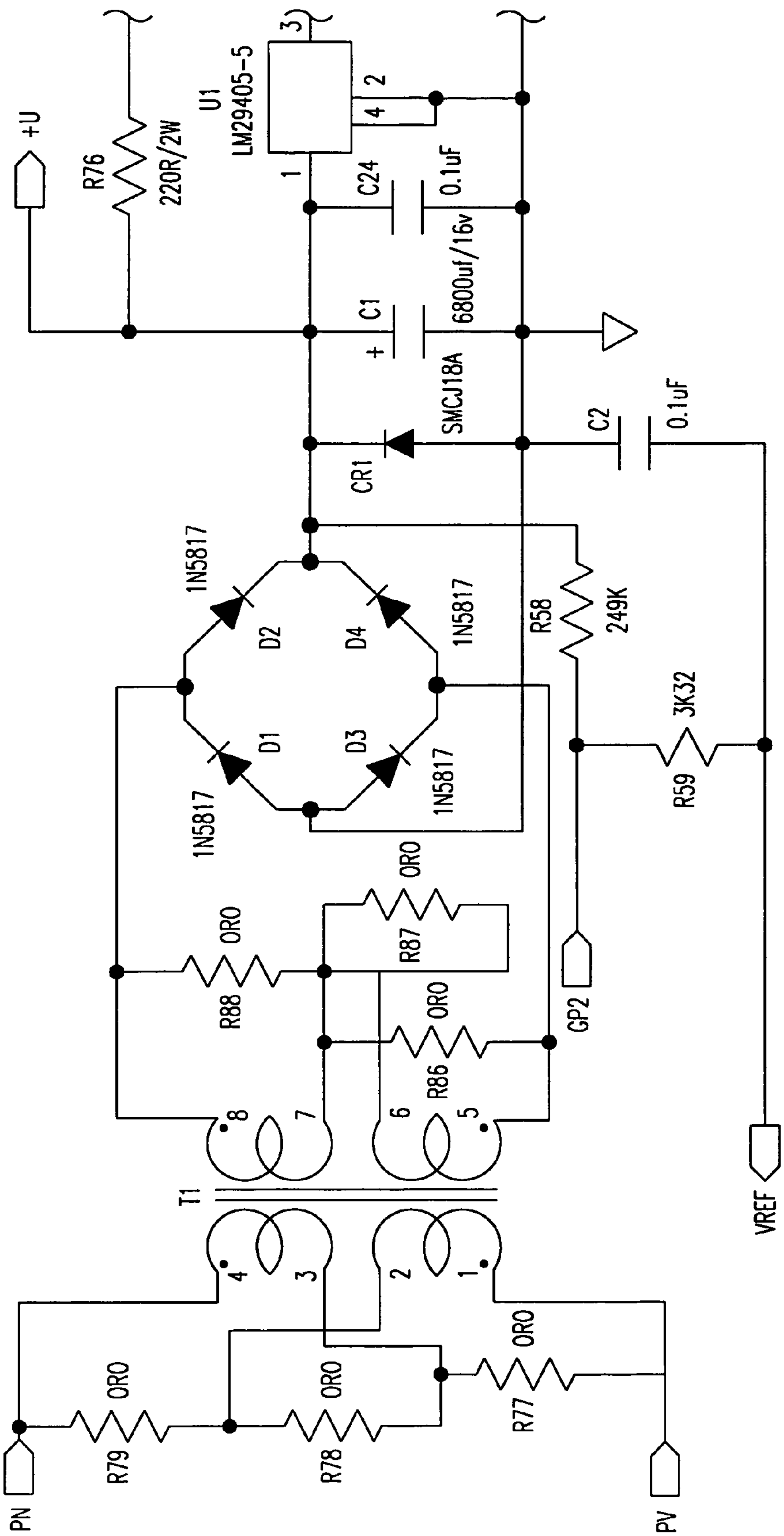
FIG. 11A provides a 10 series preferred embodiment power board schematic diagram.
Figures 2, 11A:
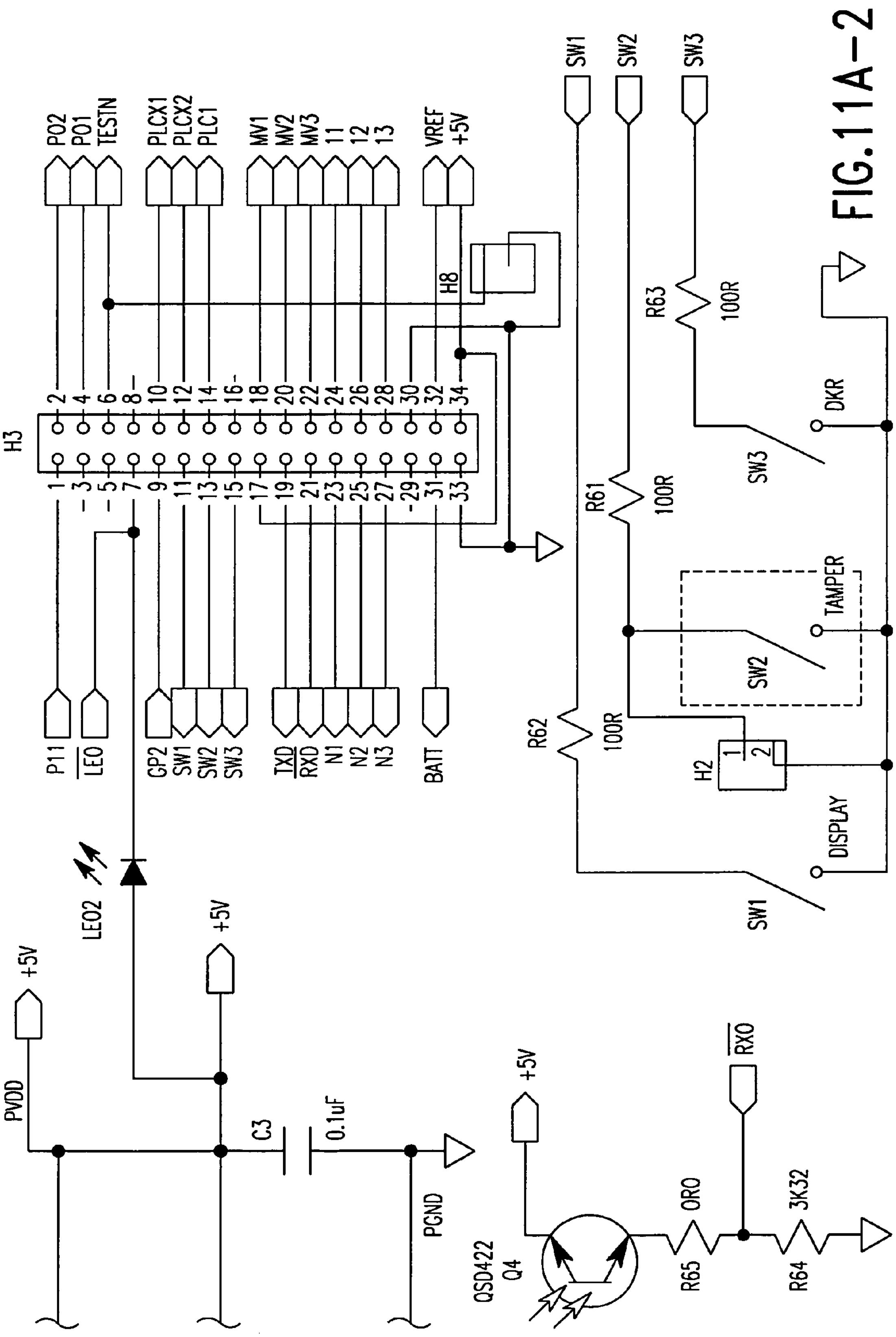
Figures 3, 11A:
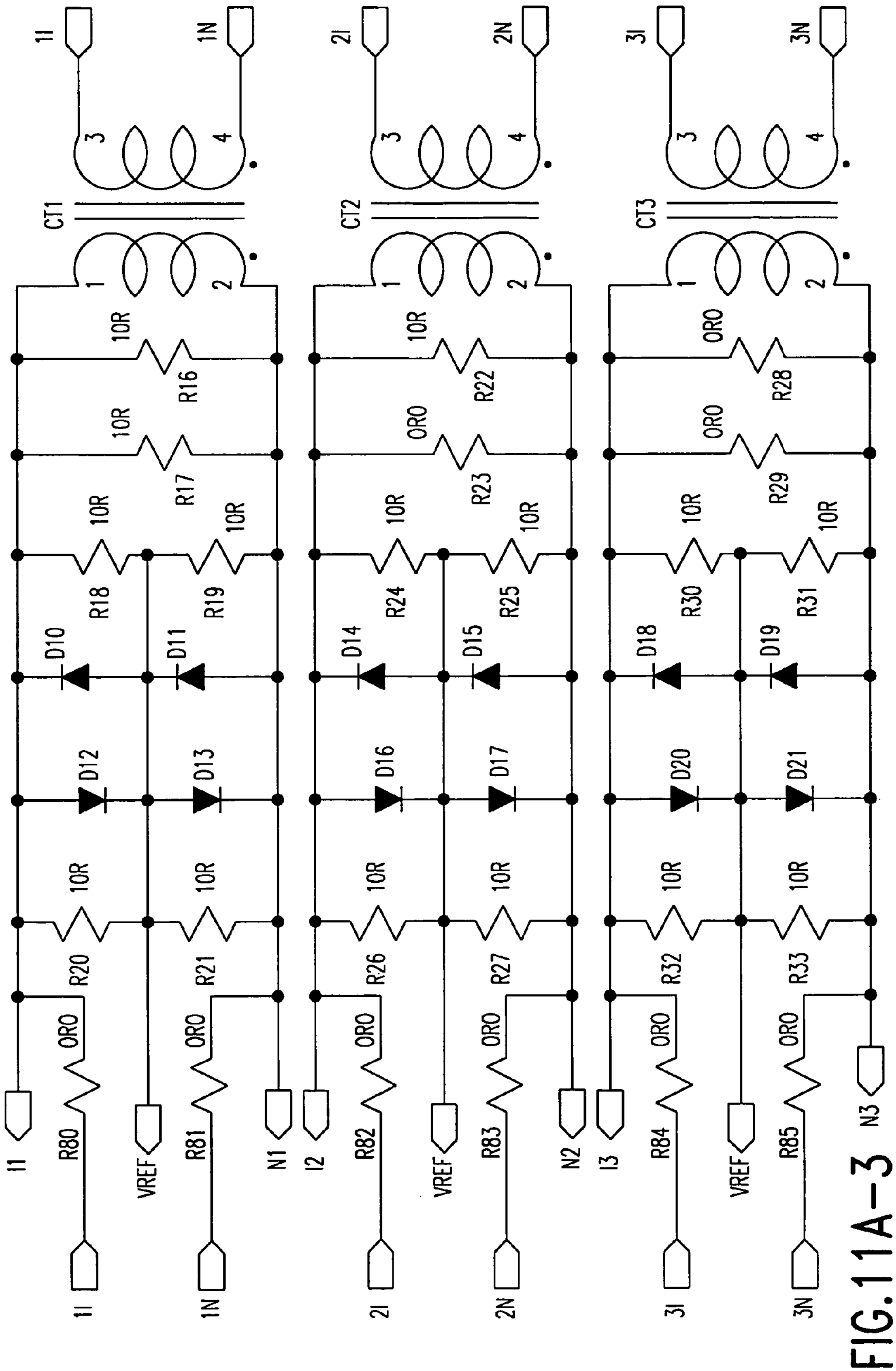
Figures 4, 11A:
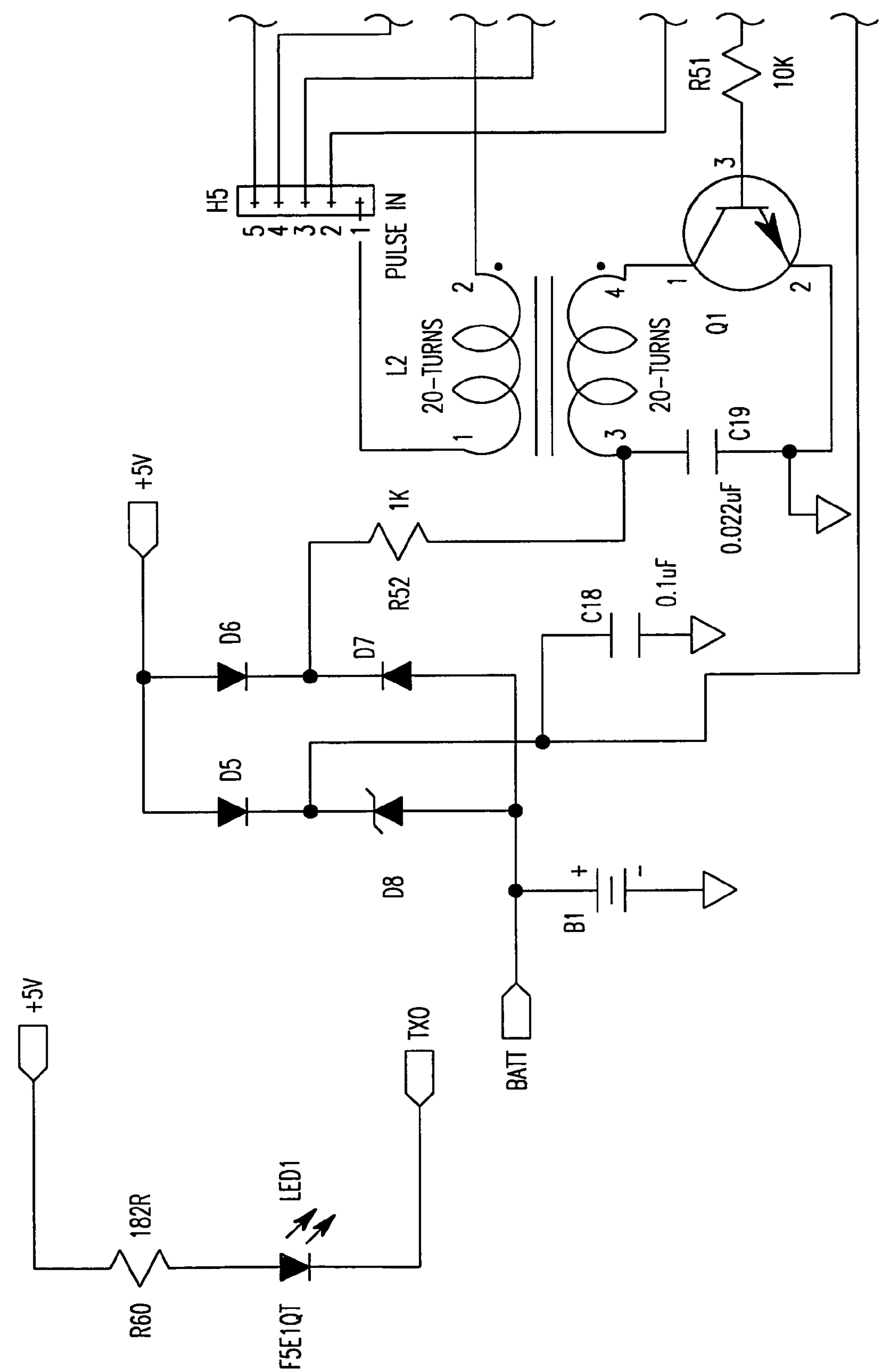
Figures 5, 11A:
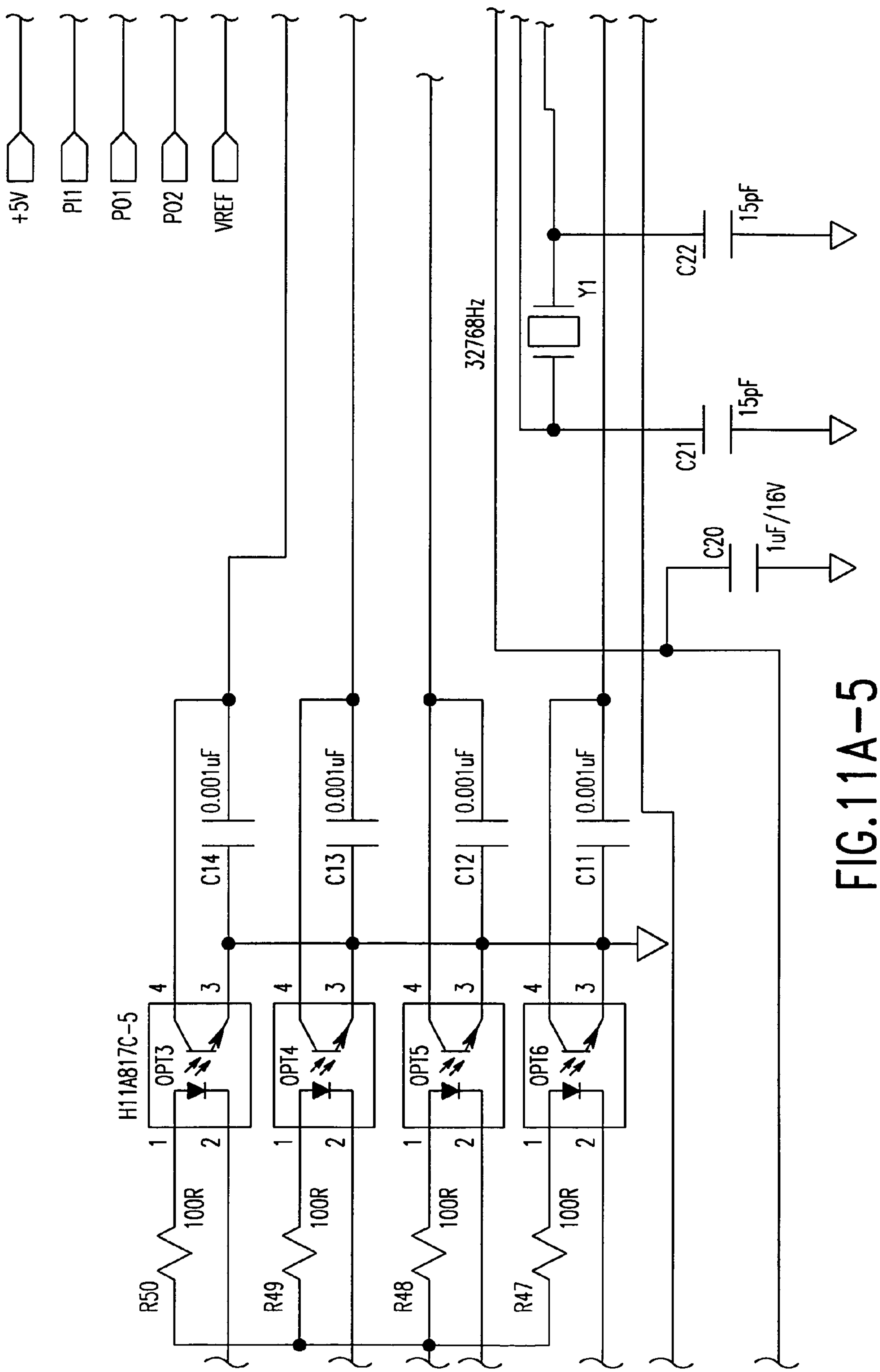
Figures 6, 11A:
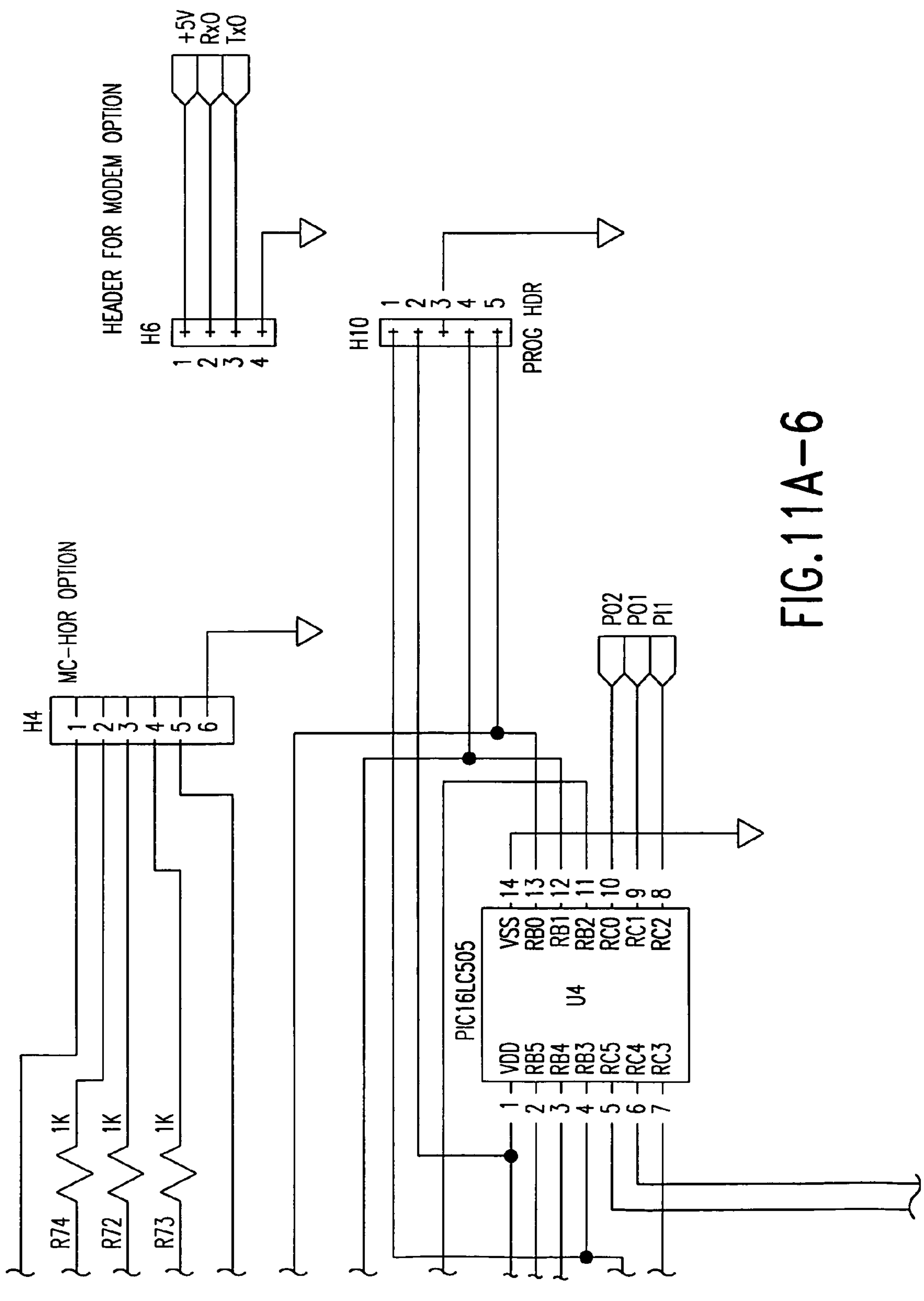
Figures 7, 11A:
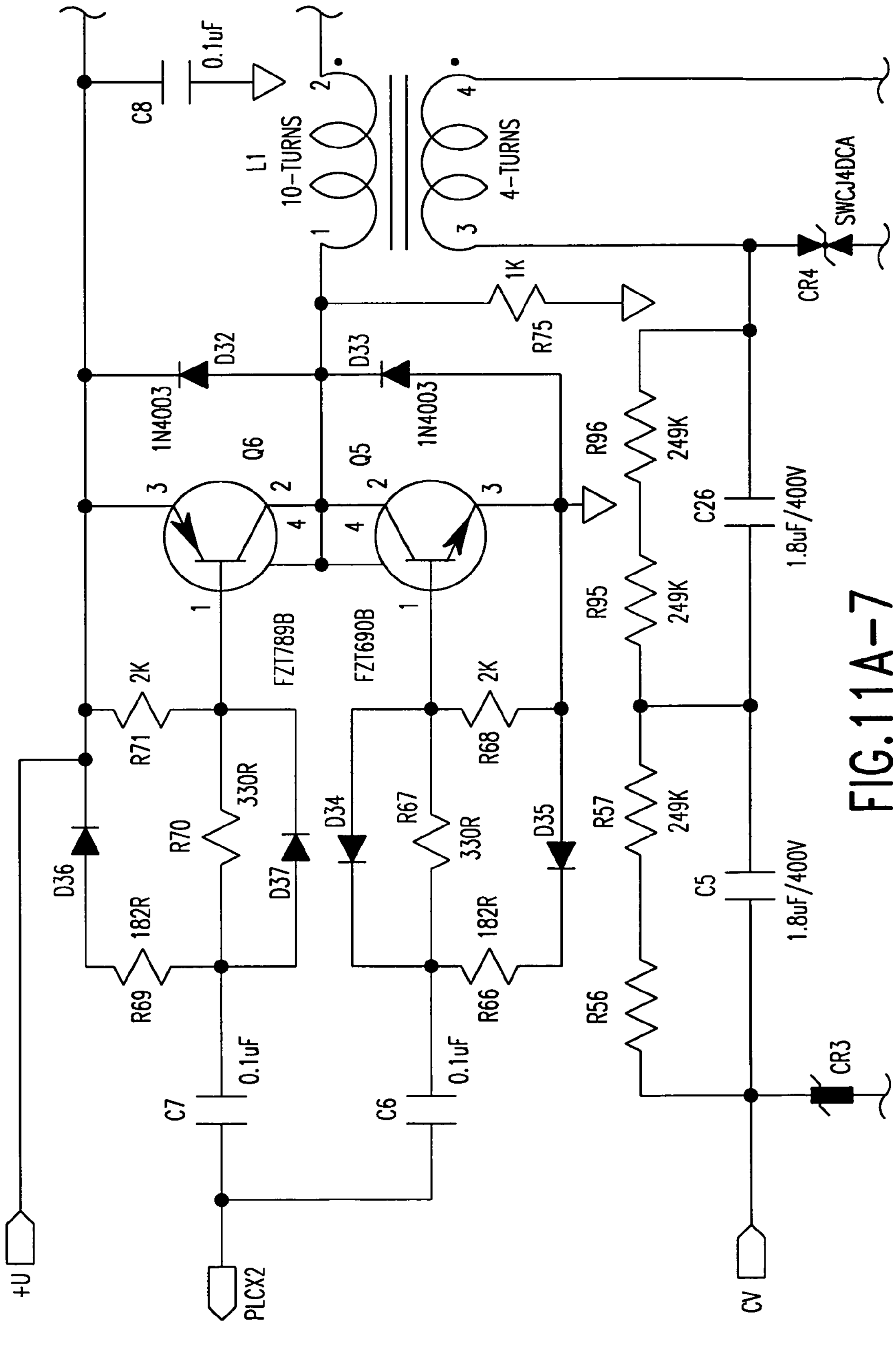
Figures 8, 11A:
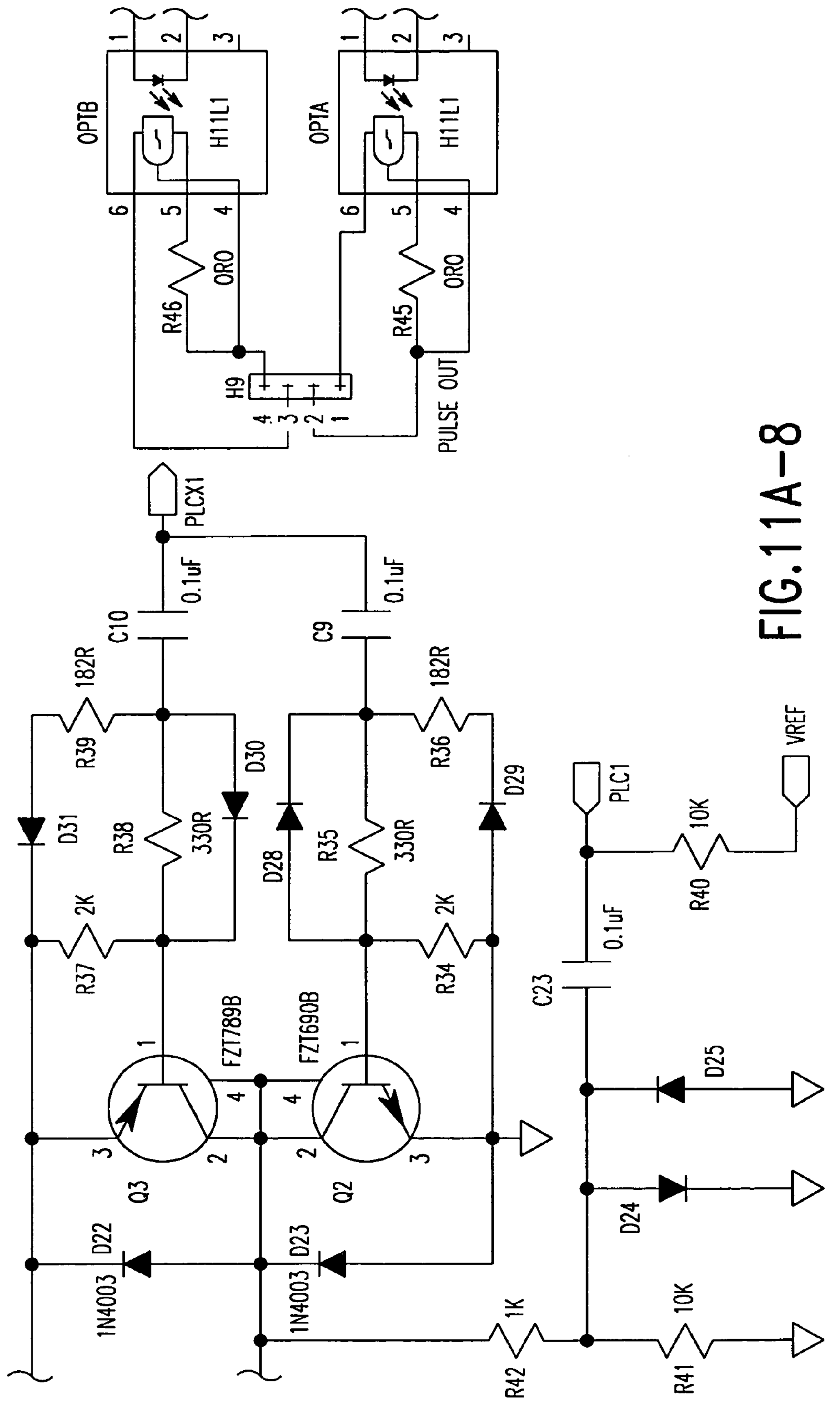
Figures 9, 11A:
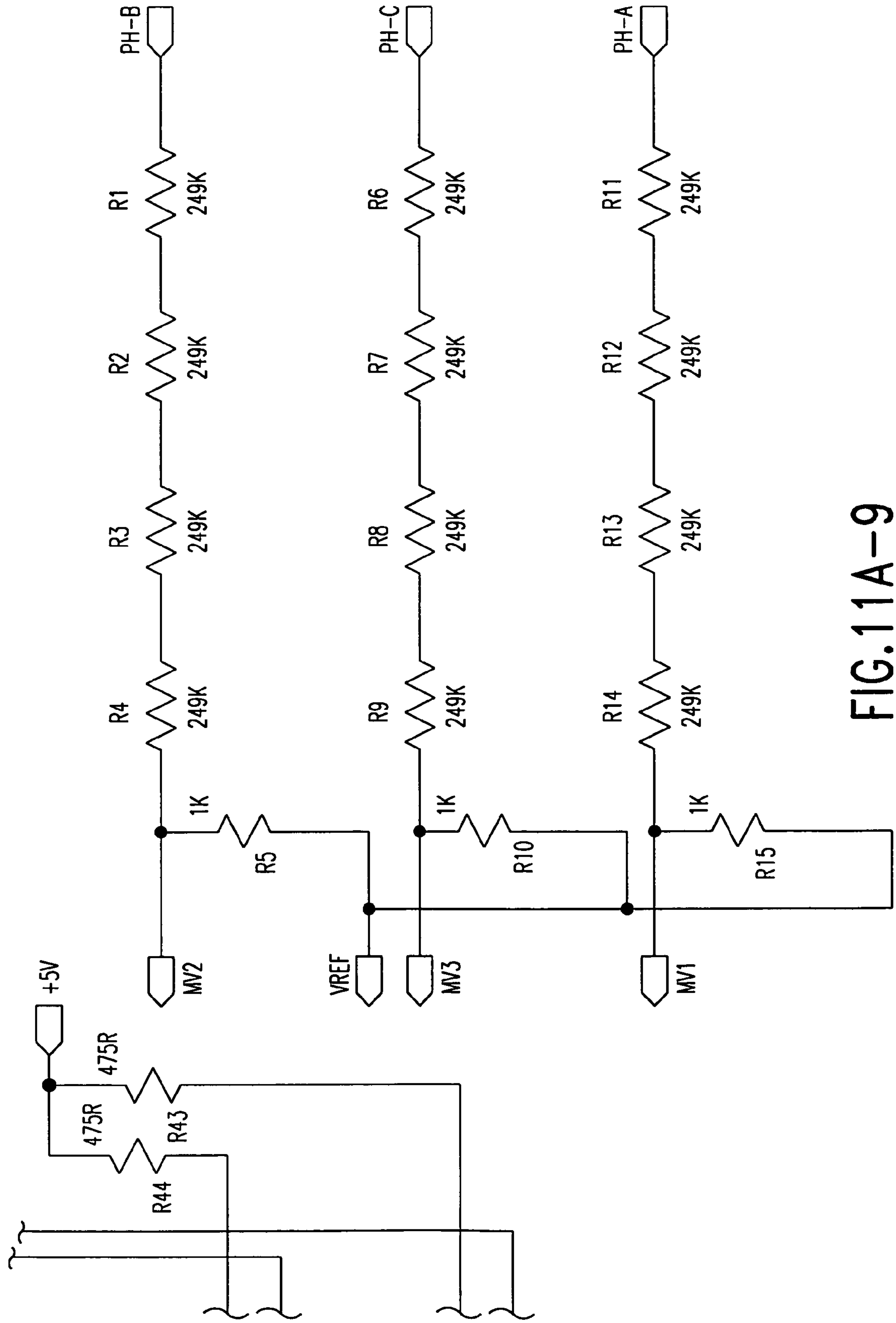
Figures 10, 11A:
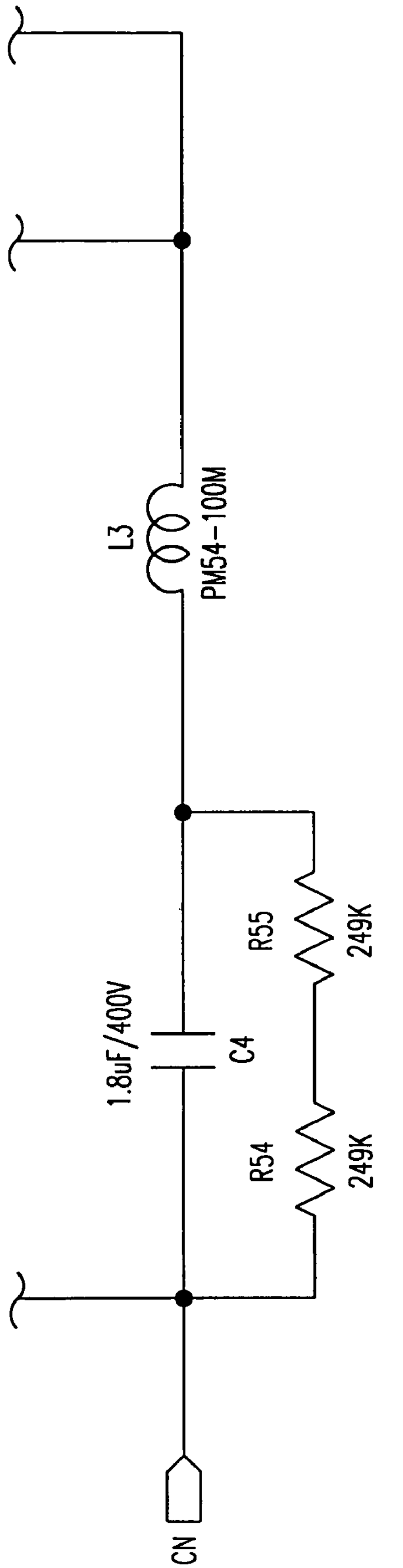
Figures 11, 11A:
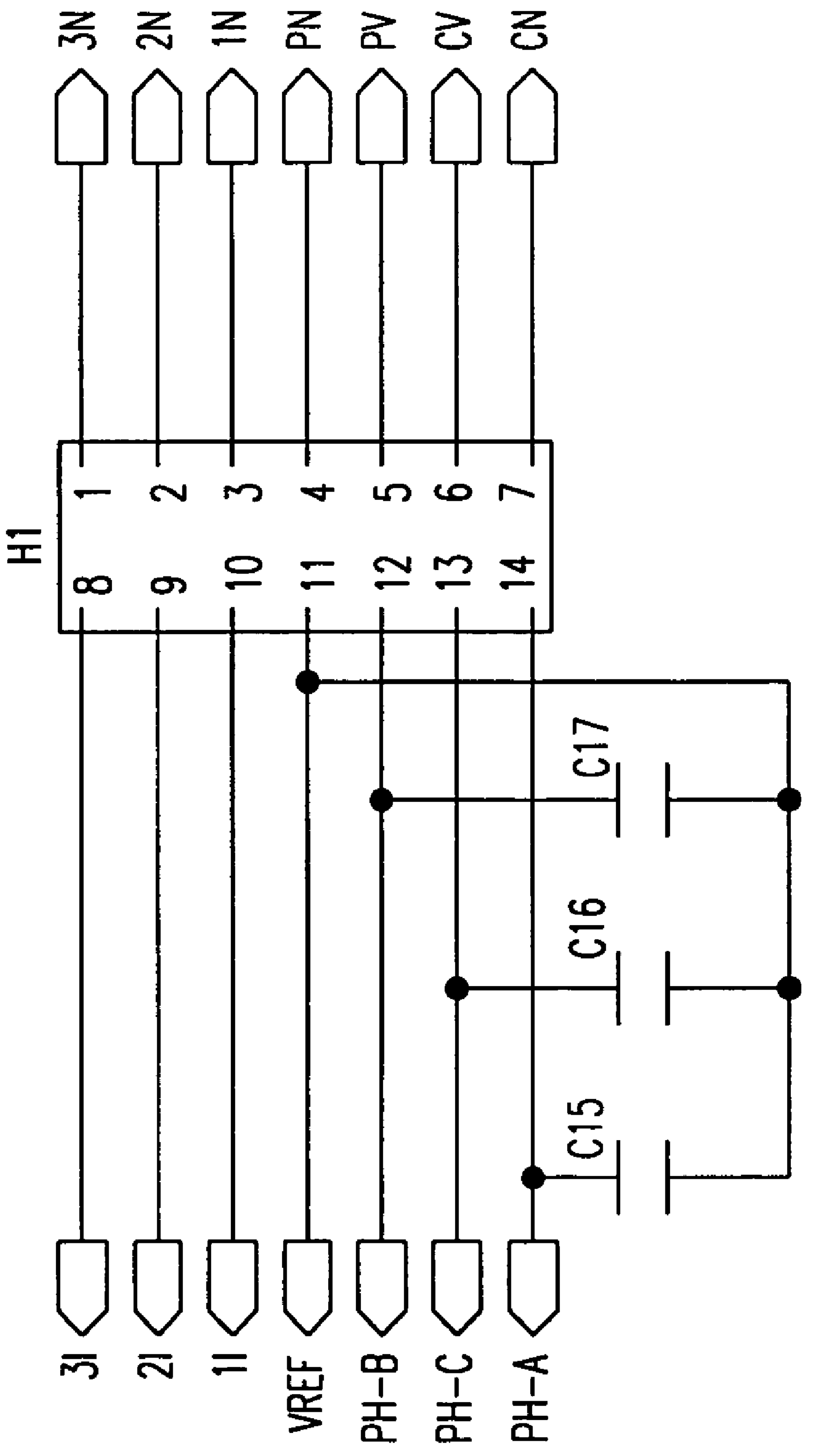
Figure 11B:
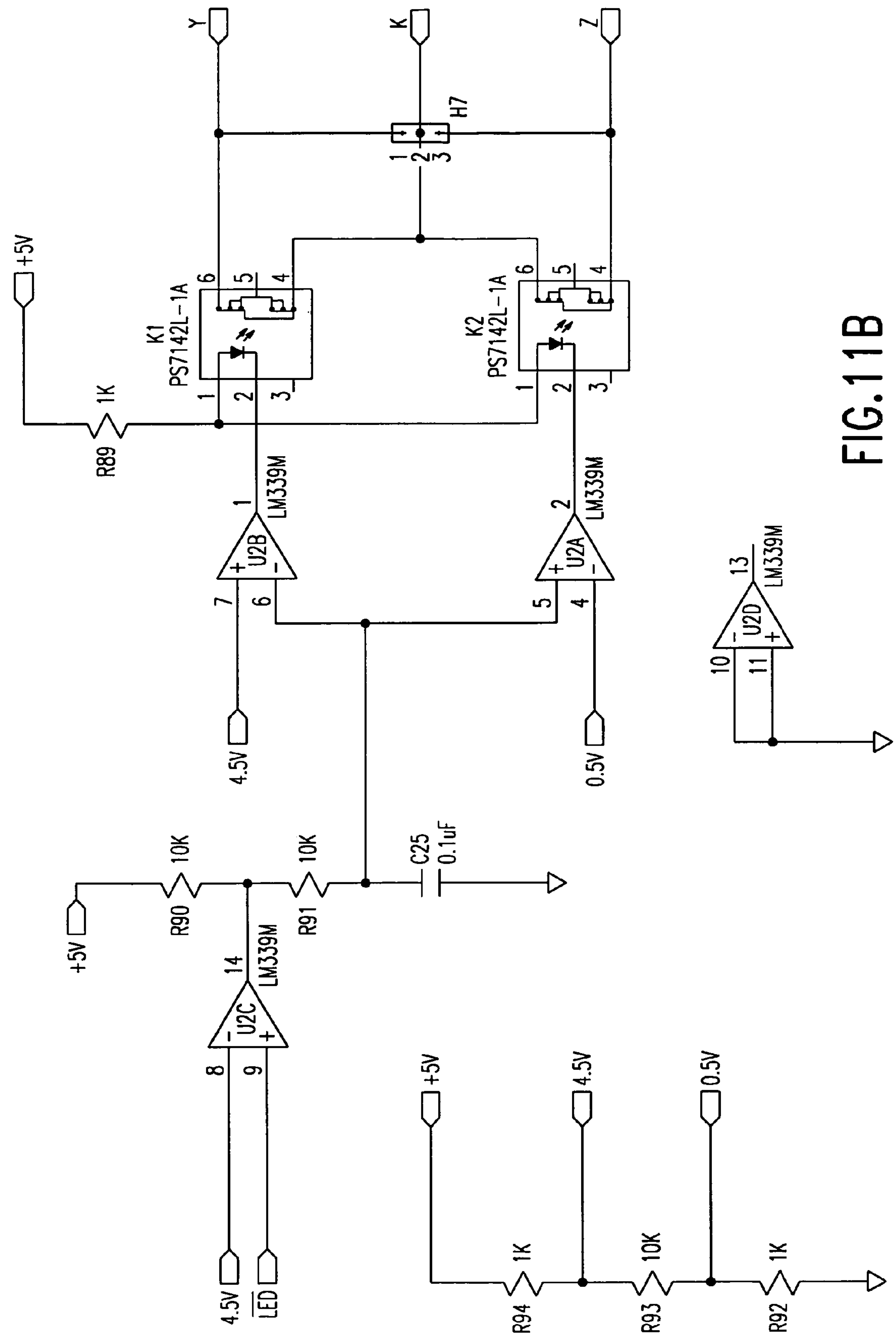
FIG. 11B provides a KYZ schematic diagram.
Figure 11C:
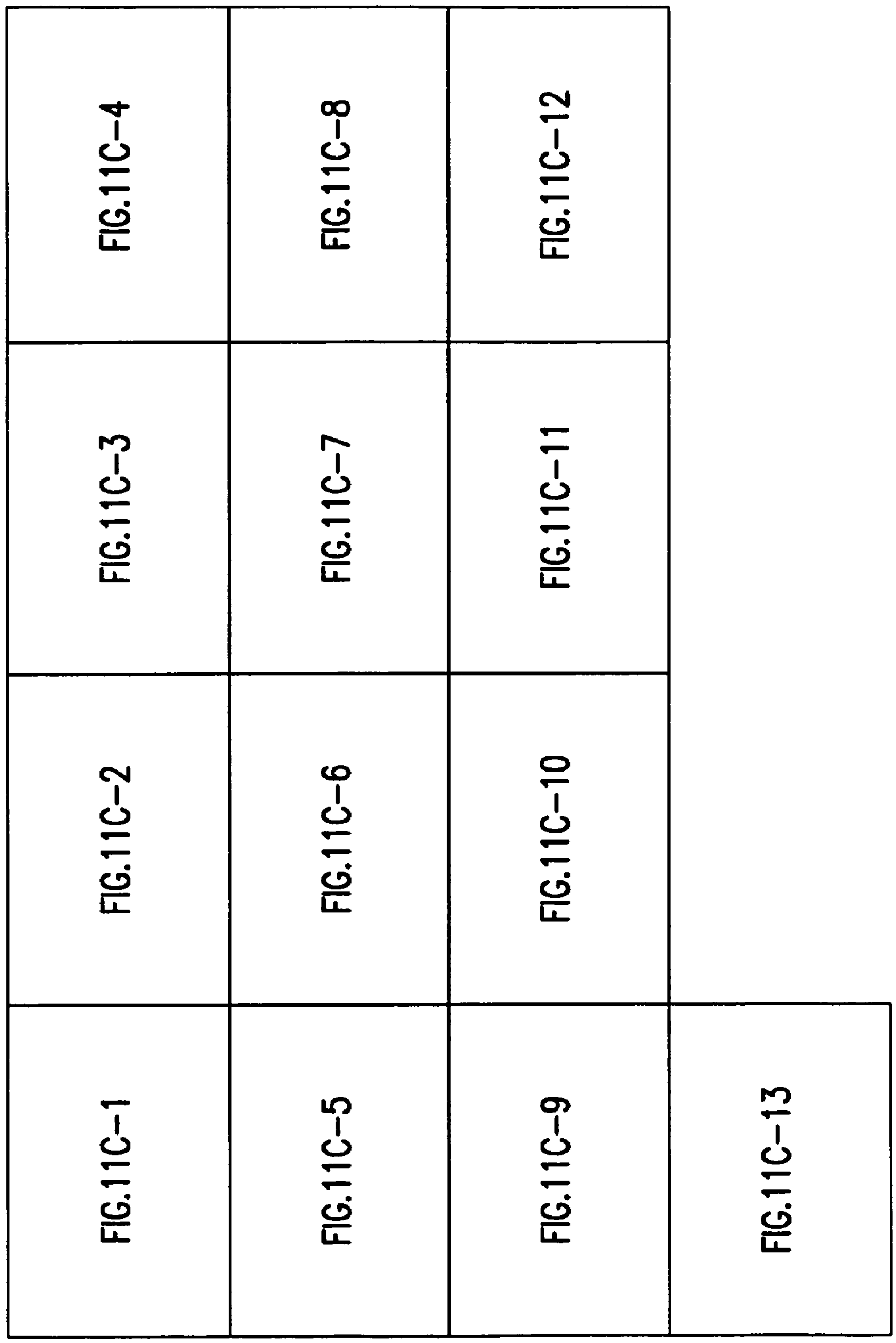
FIG. 11C is a 20 series preferred embodiment power board schematic diagram.
Figures 1, 11C:
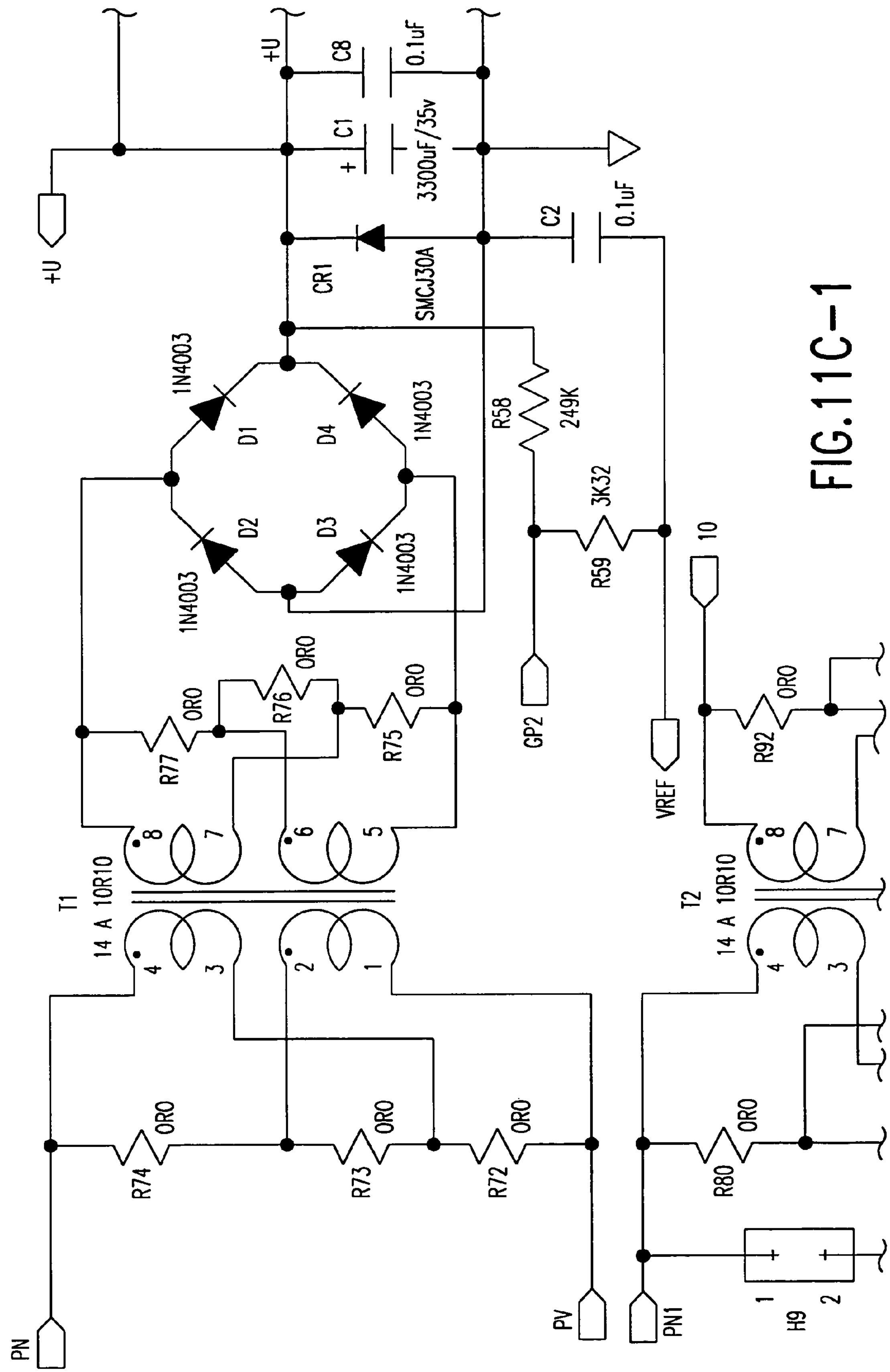
Figures 2, 11C:
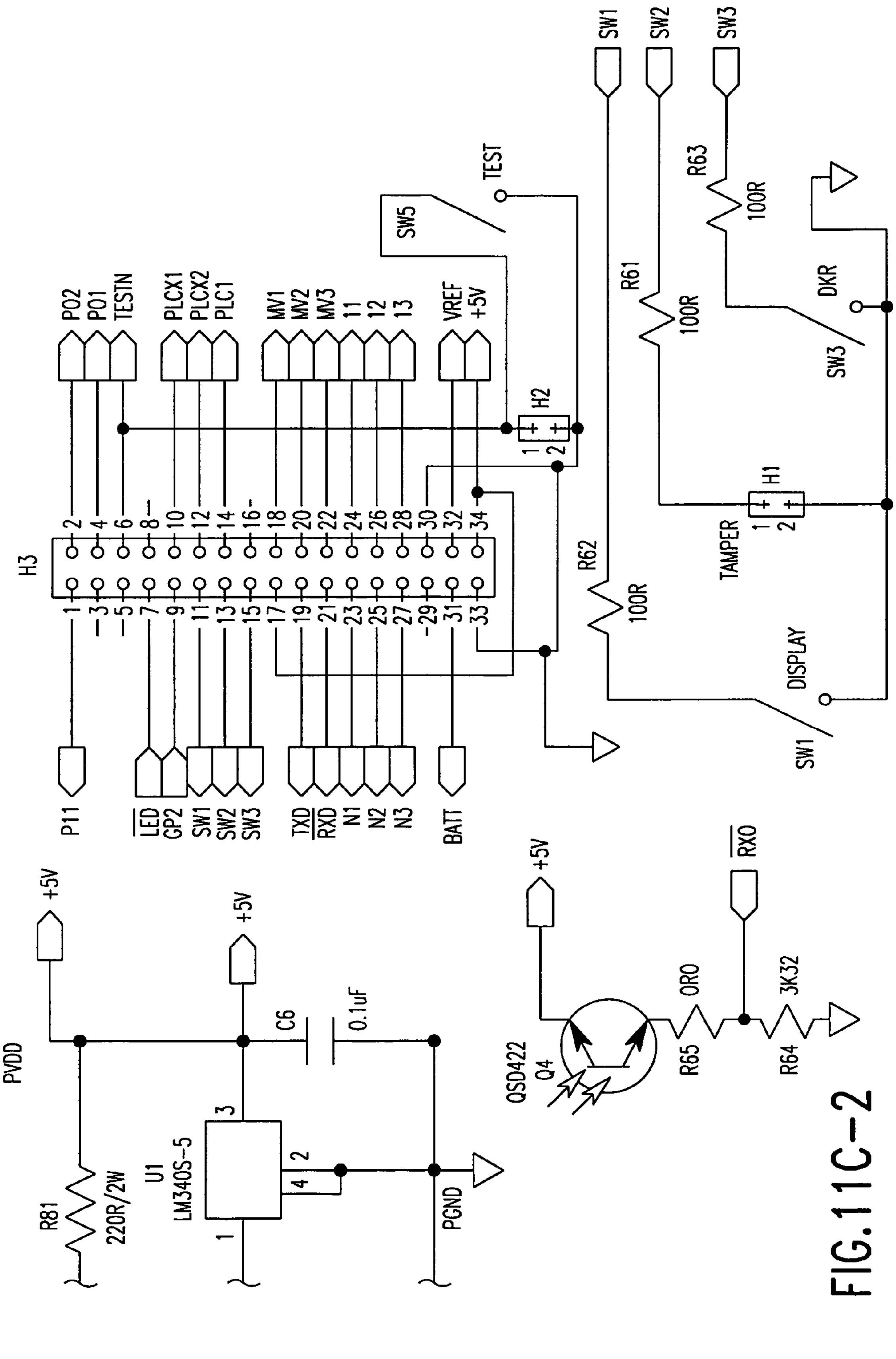
Figures 3, 11C:
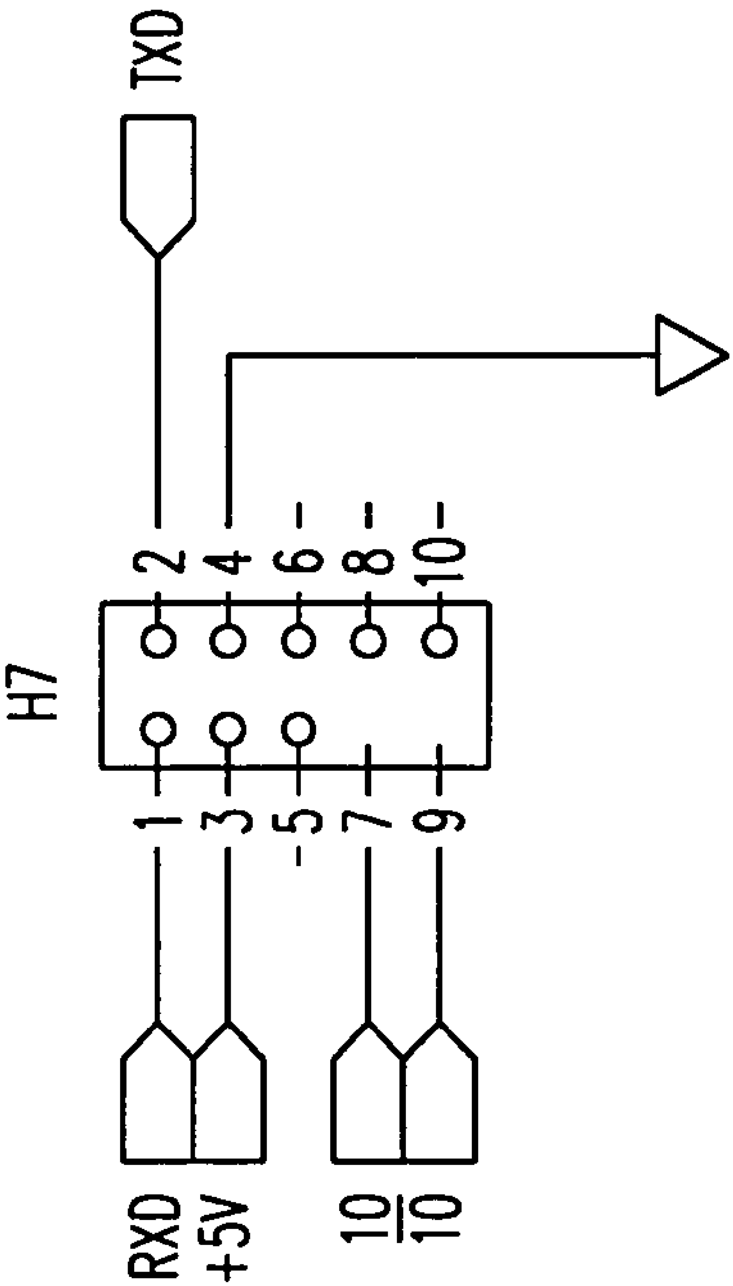
Figures 4, 11C:
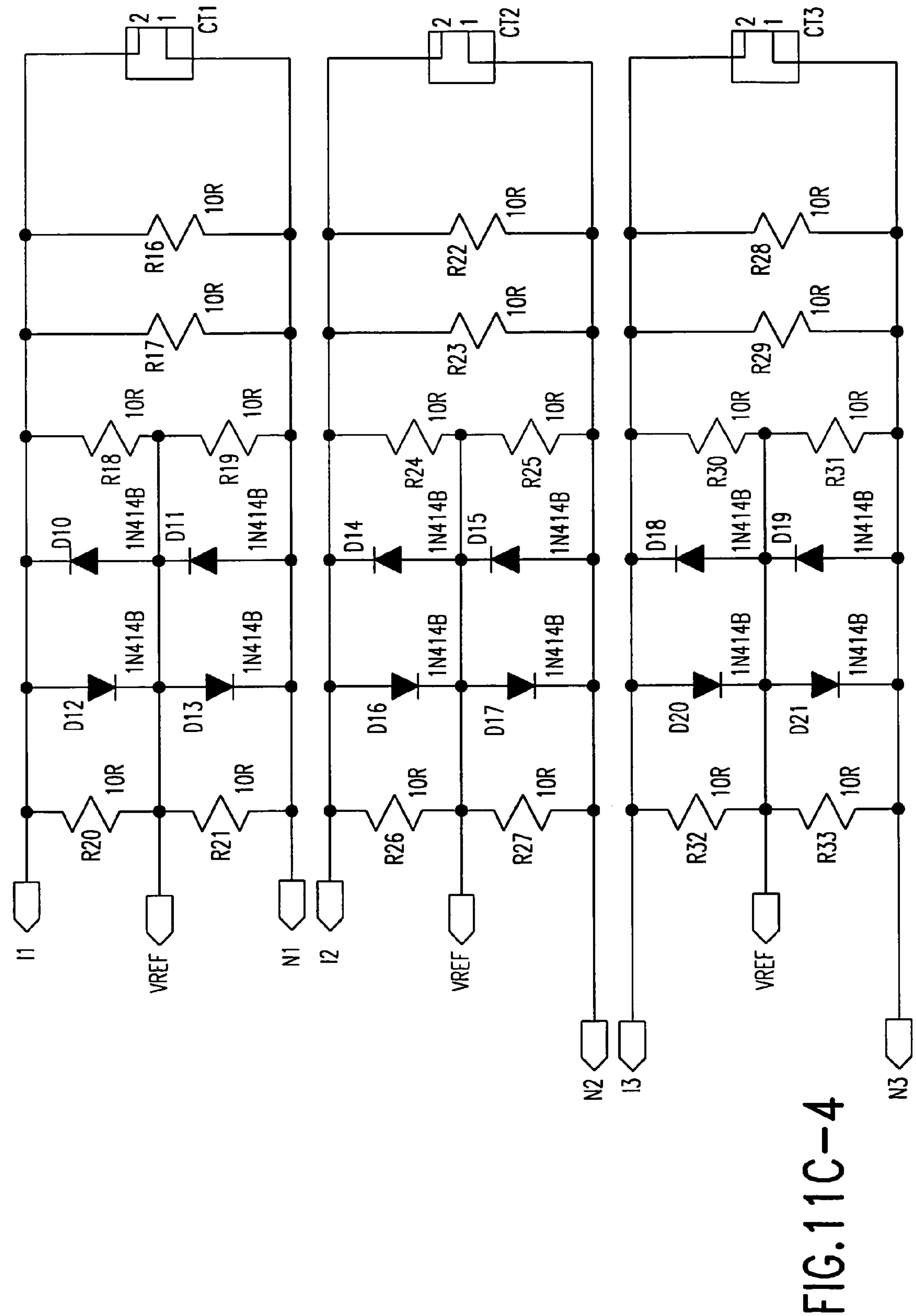
Figures 5, 11C:
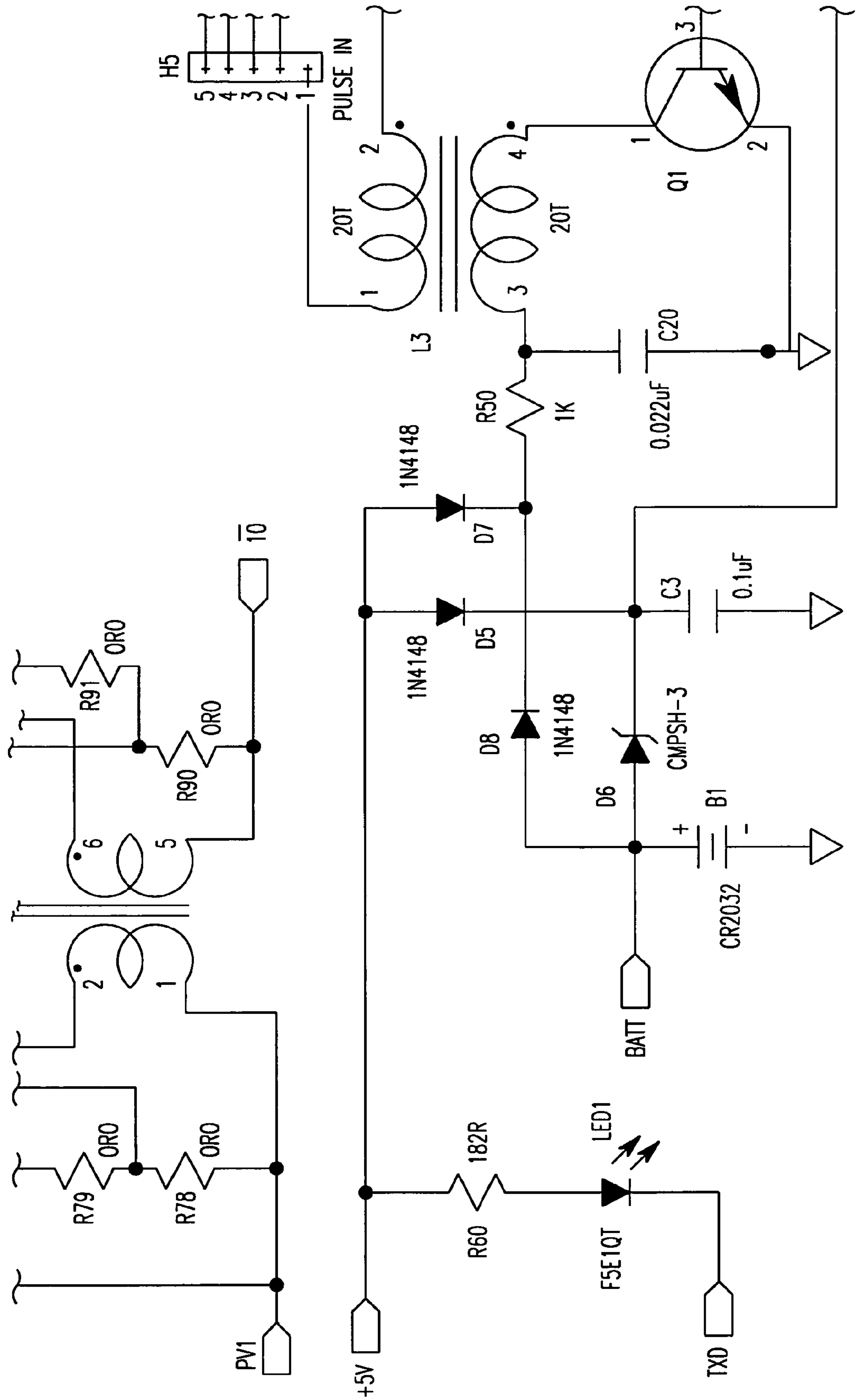
Figures 6, 11C:
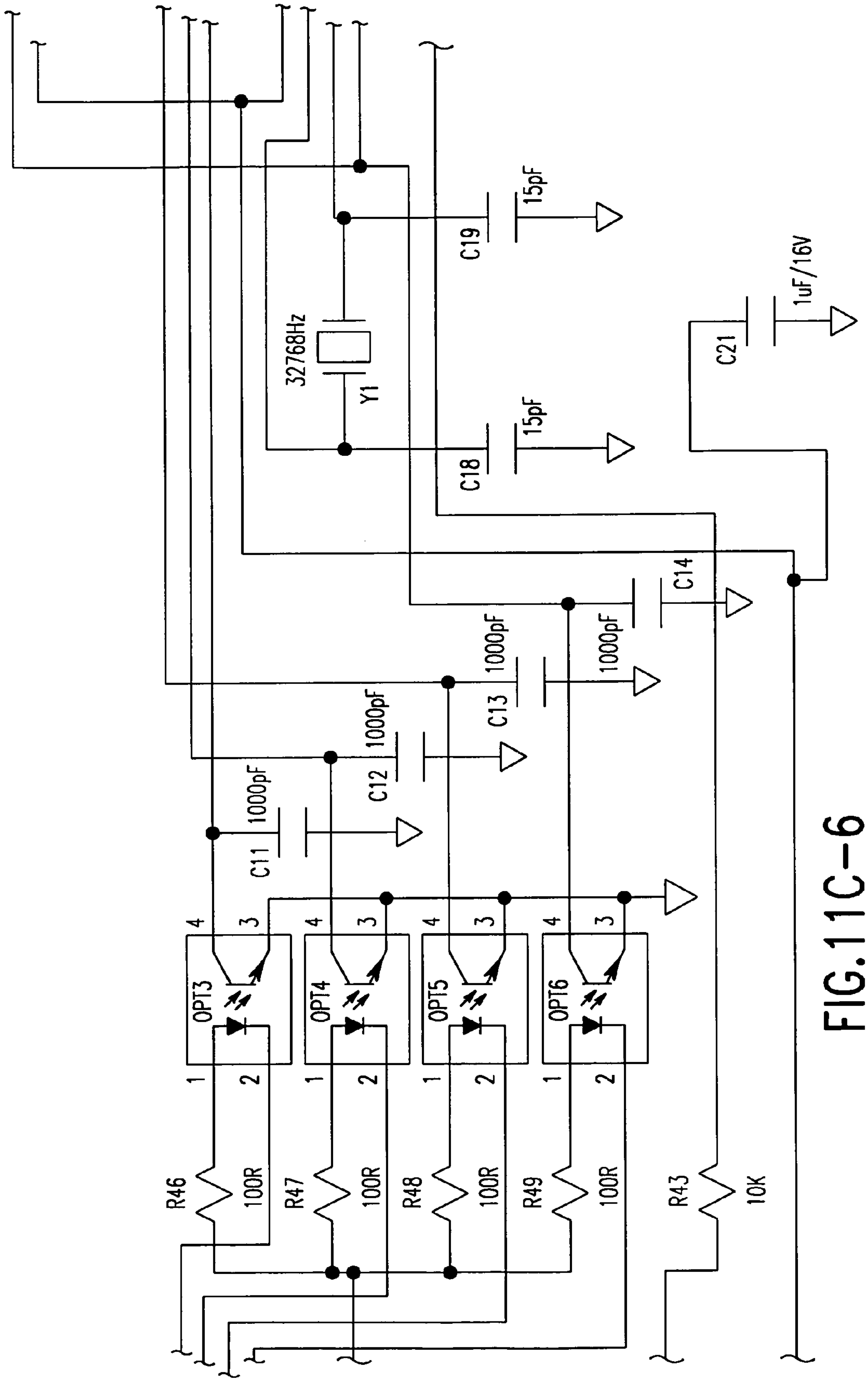
Figures 7, 11C:
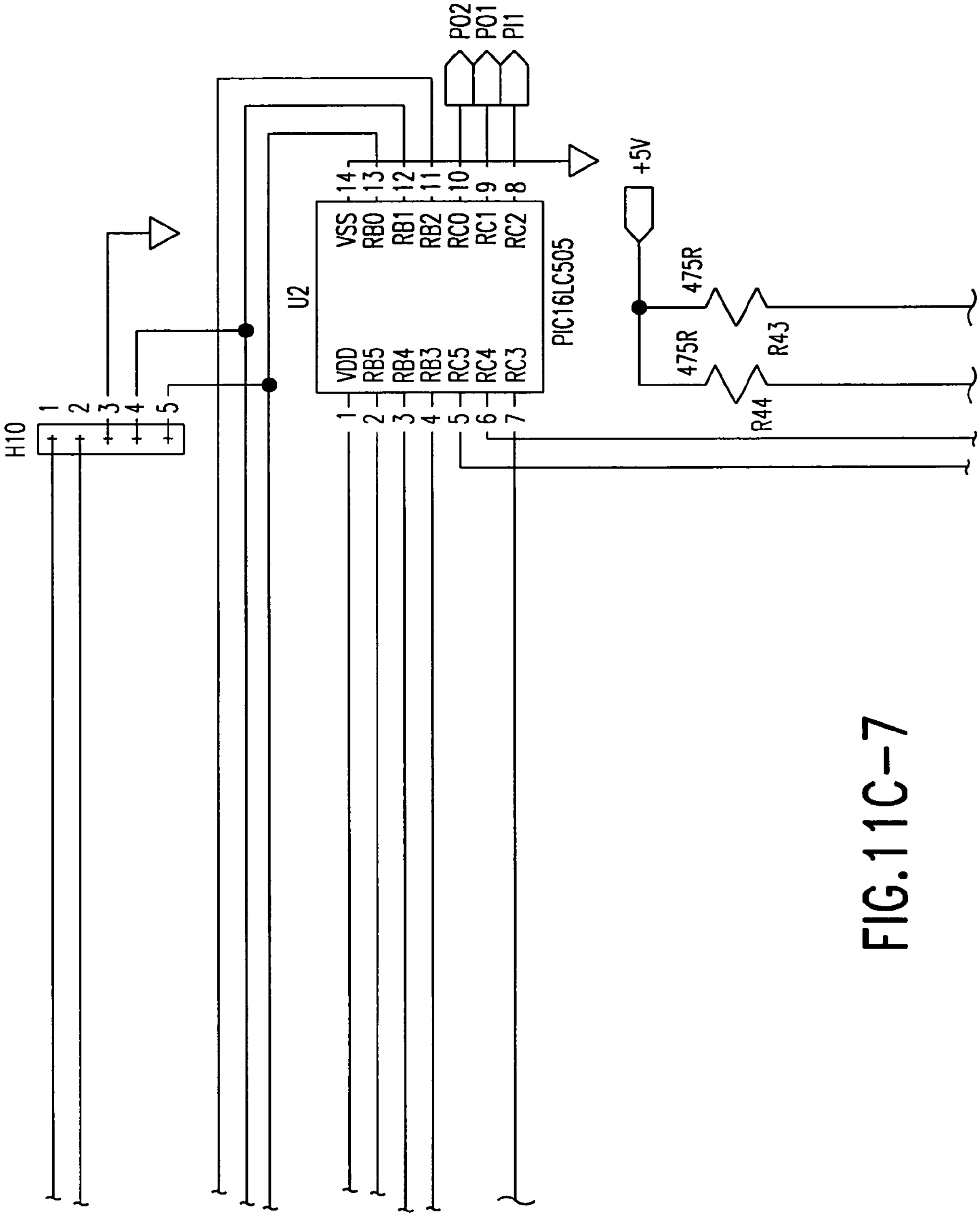
Figures 8, 11C:
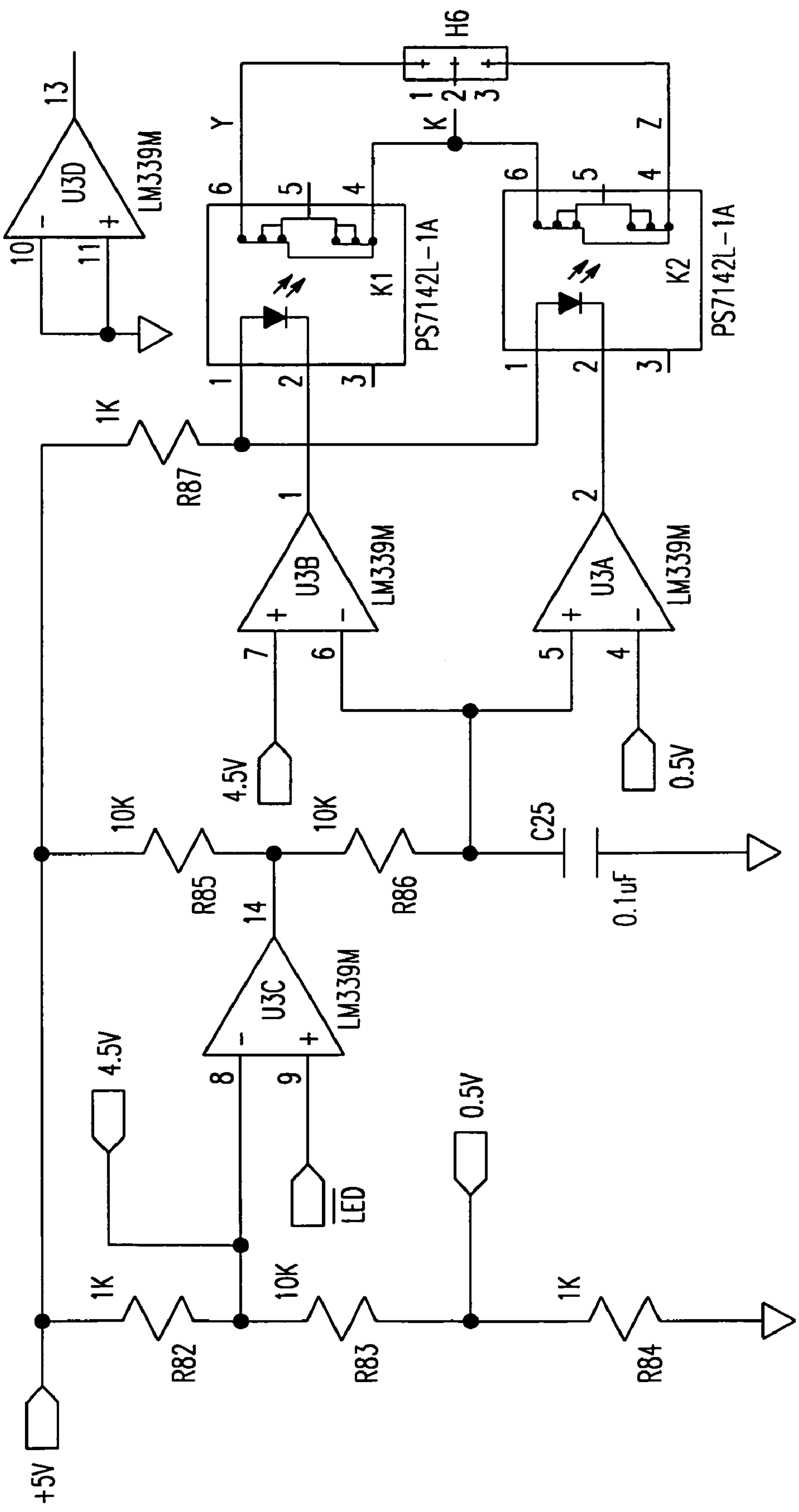
Figures 9, 11C:
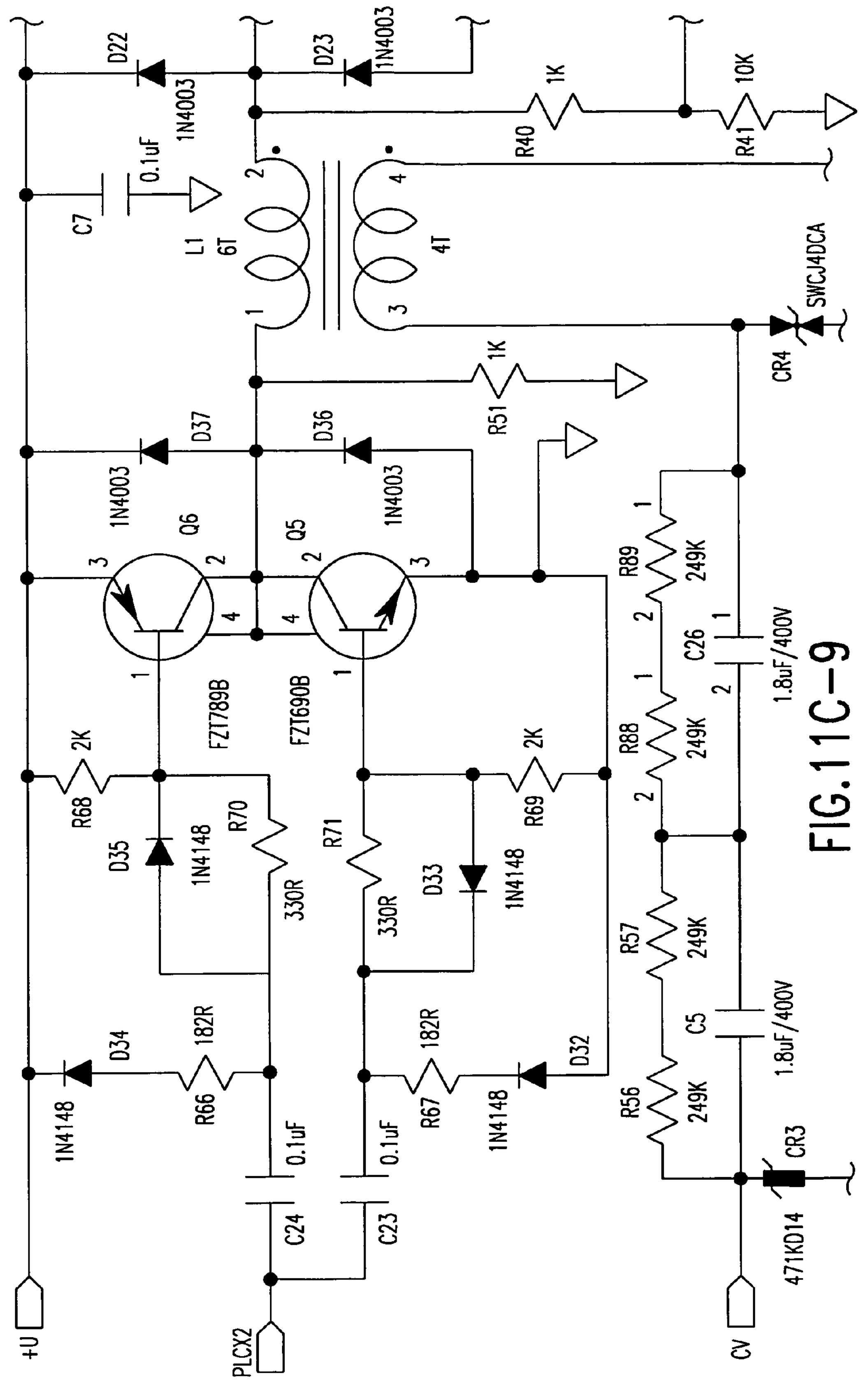
Figures 10, 11C:
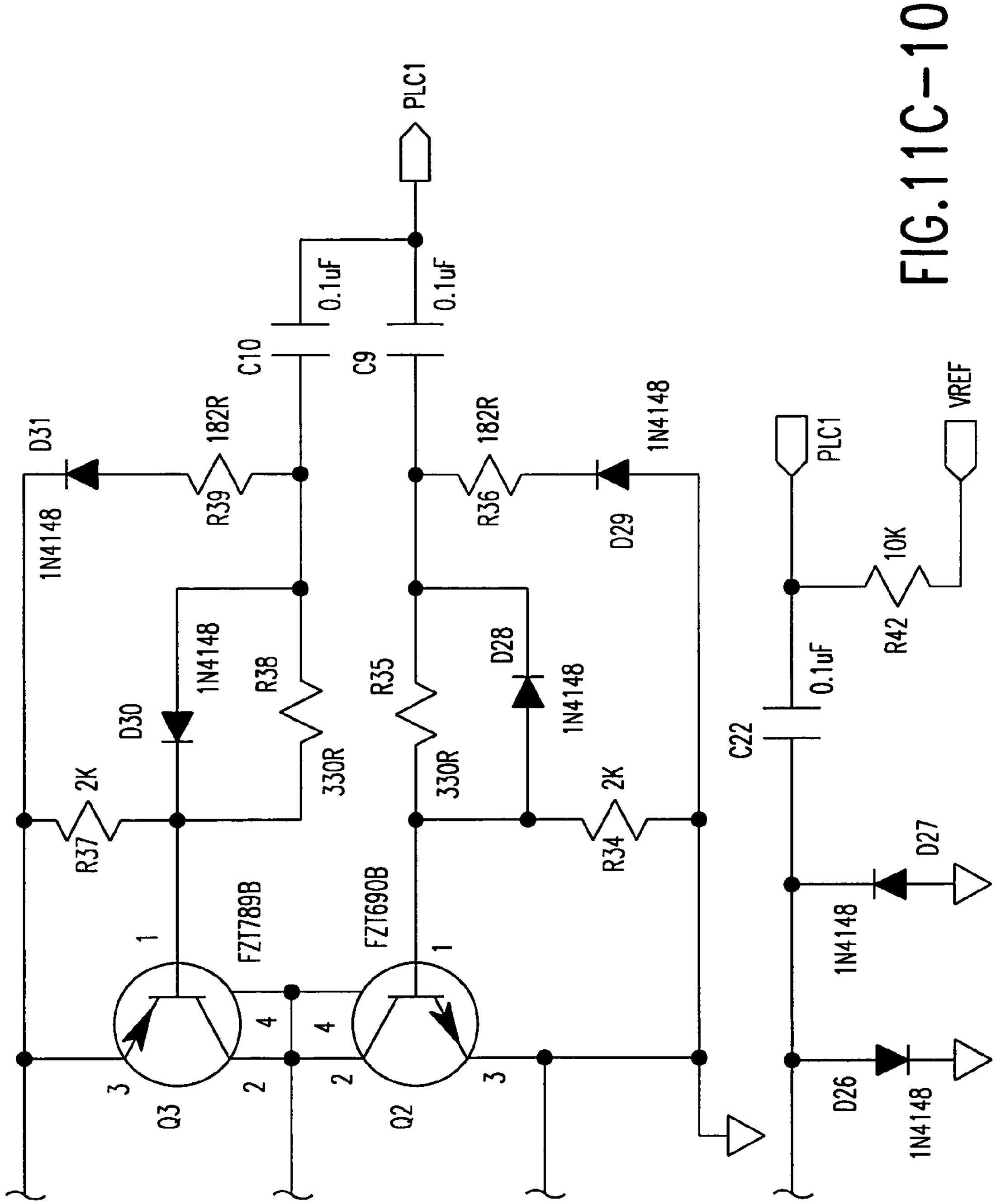
Figures 11, 11C:
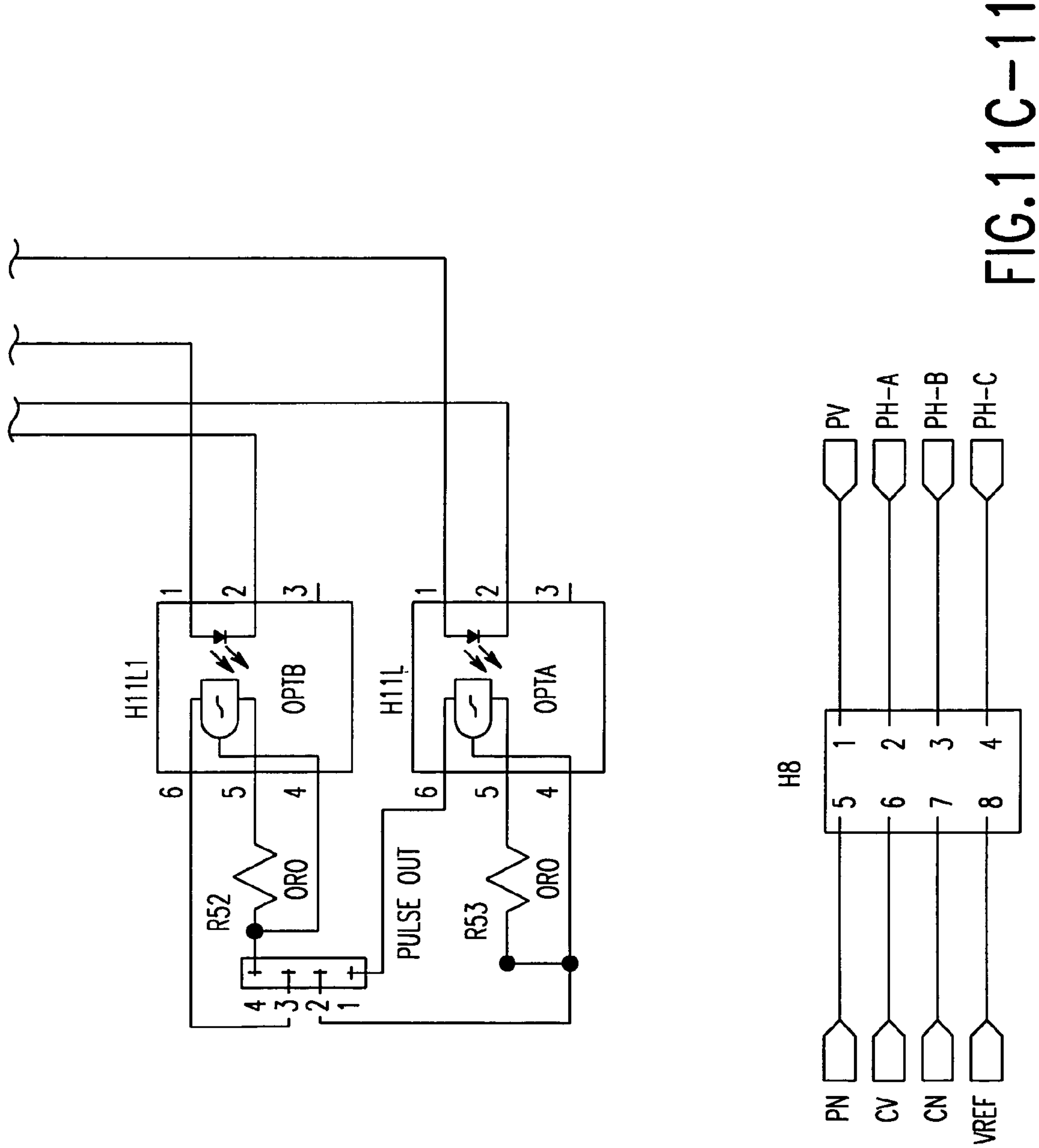
Figures 11, 11C, 12:
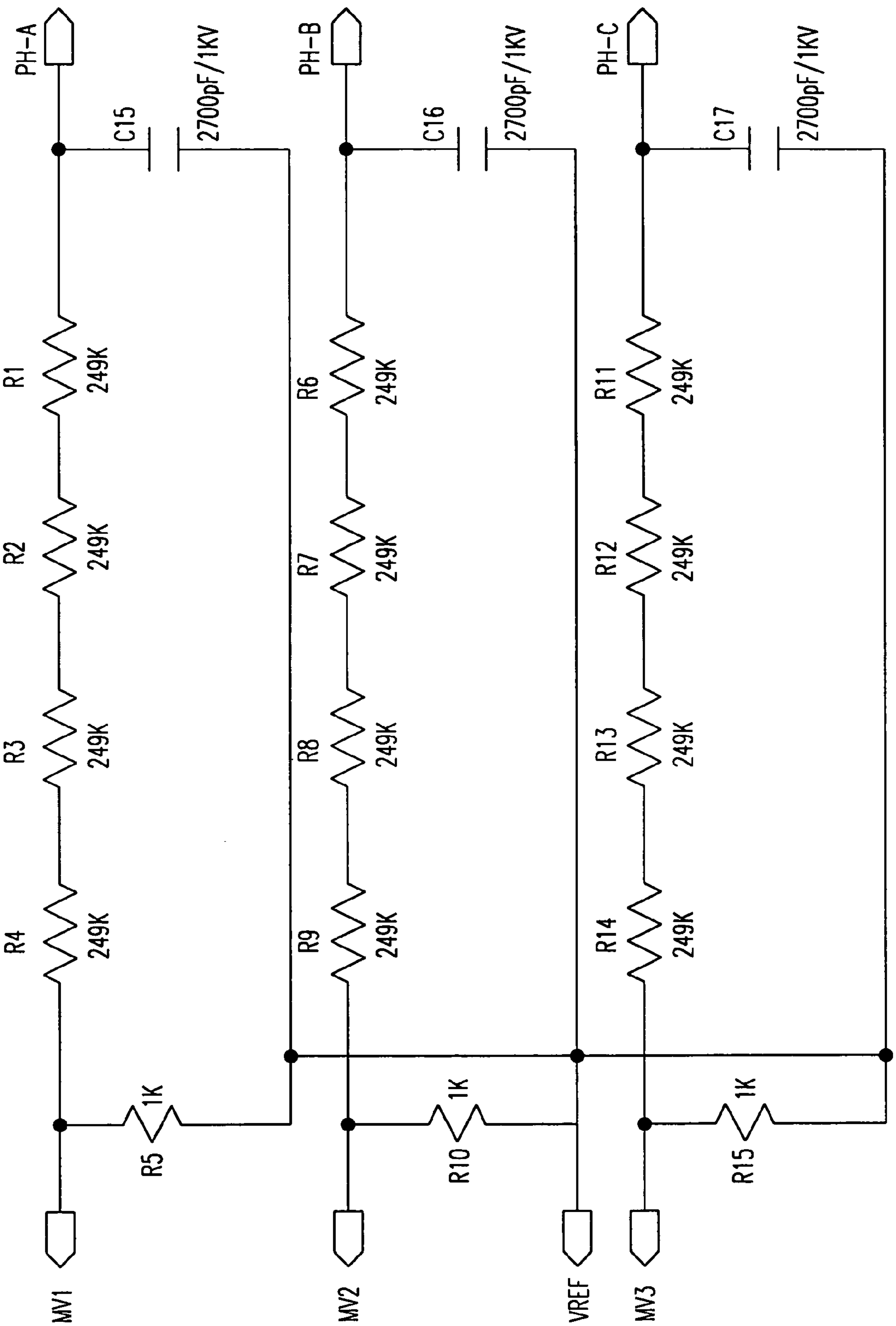
Figures 11, 11C, 12, 13:
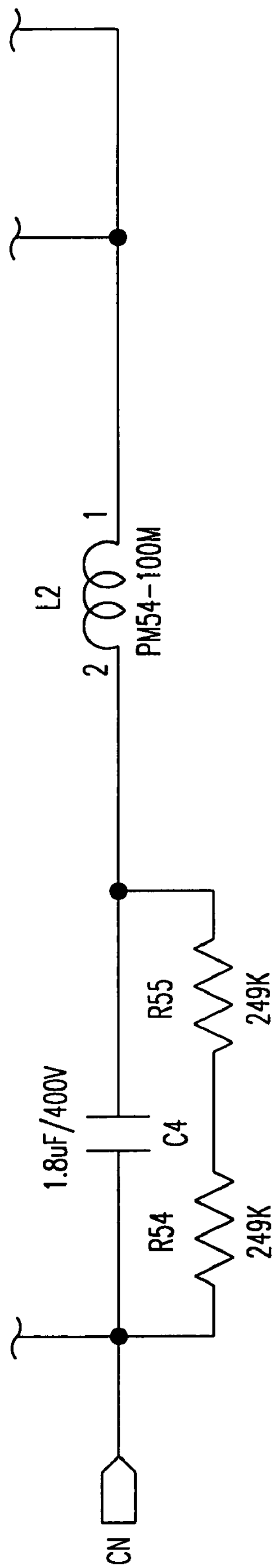
FIGS. 12A–C, 13, 14, and 15A provide a Transponder schematic diagram.
Figures 1, 12A:
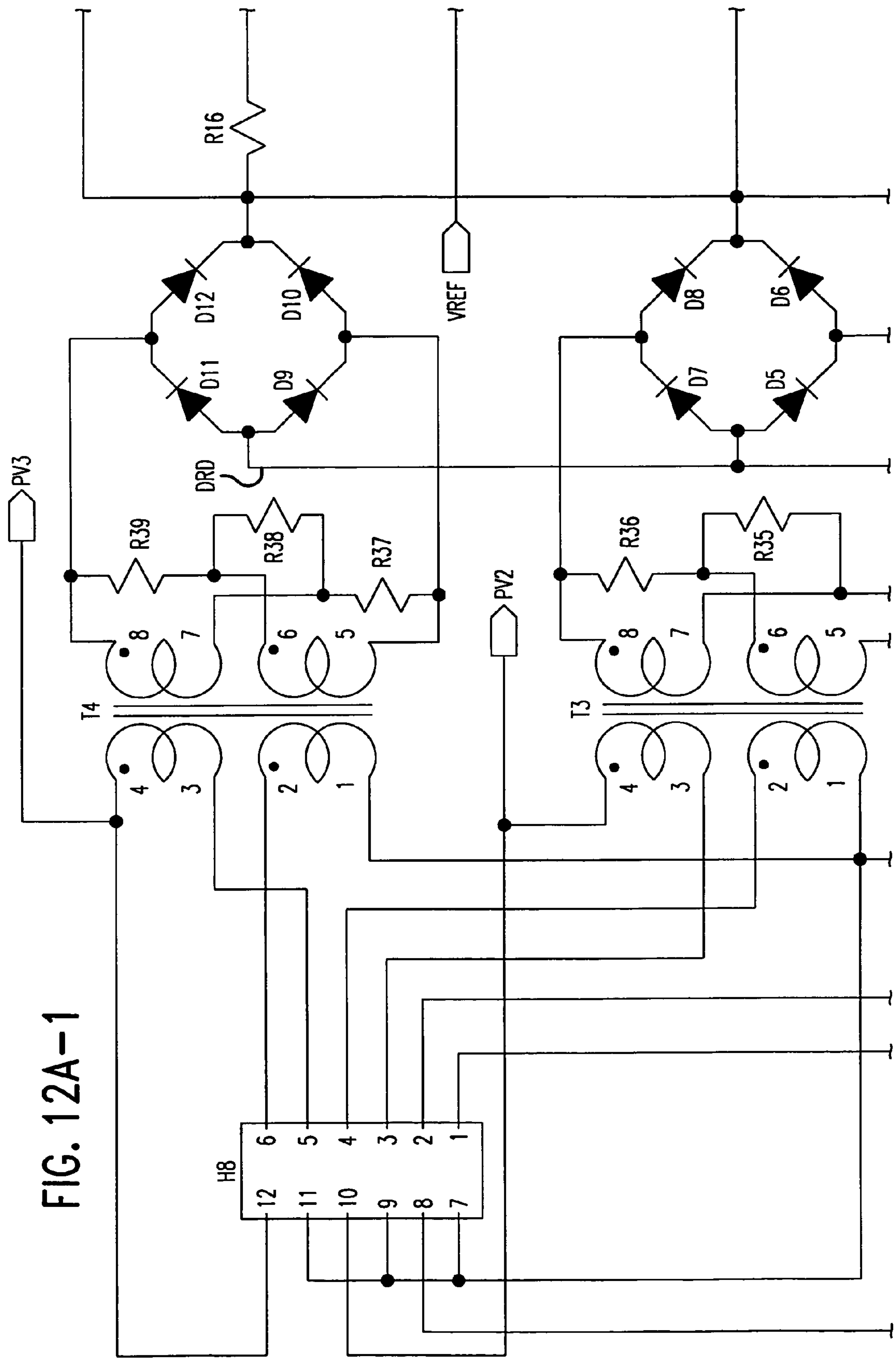
Figures 2, 12A:
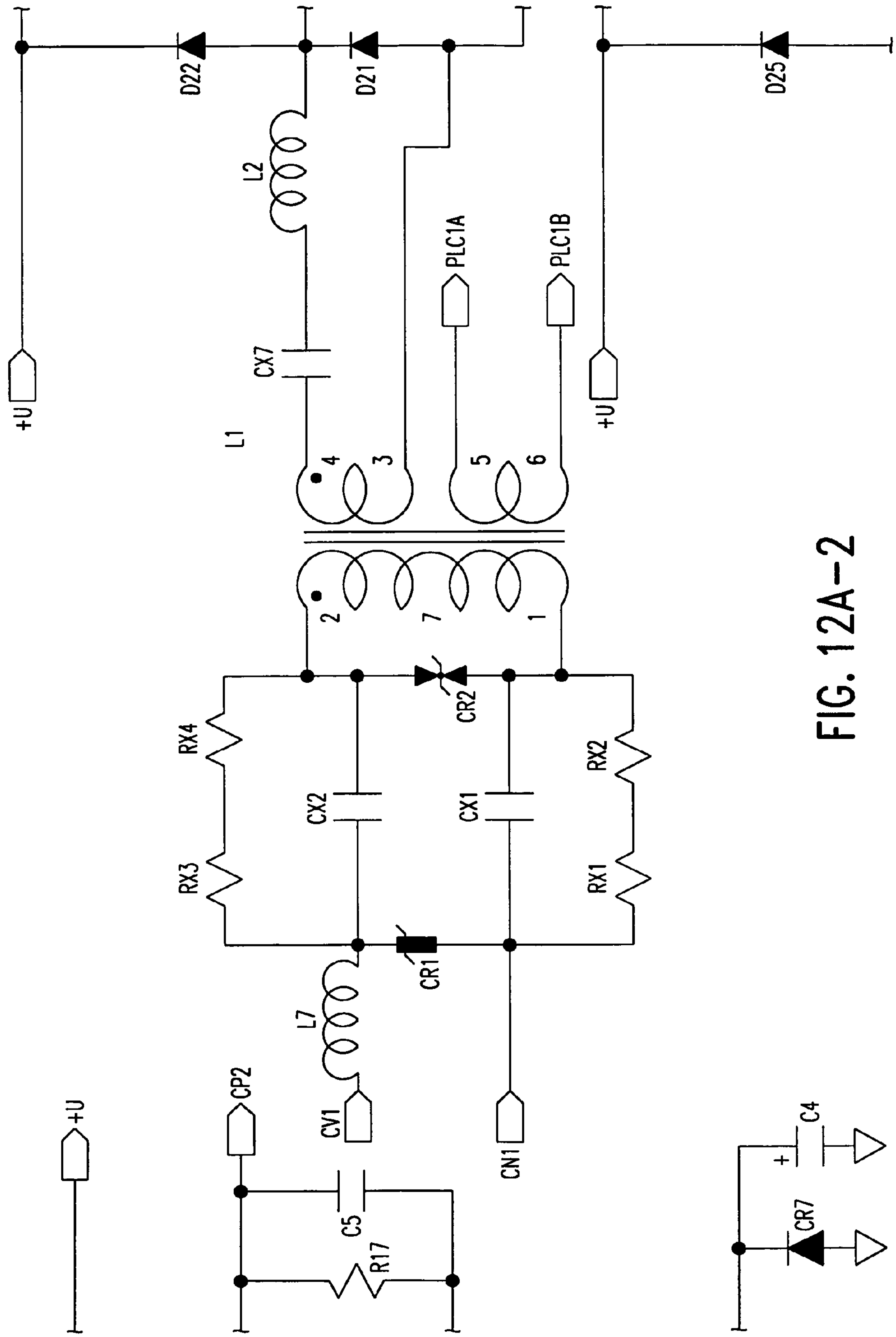
Figures 3, 12A:
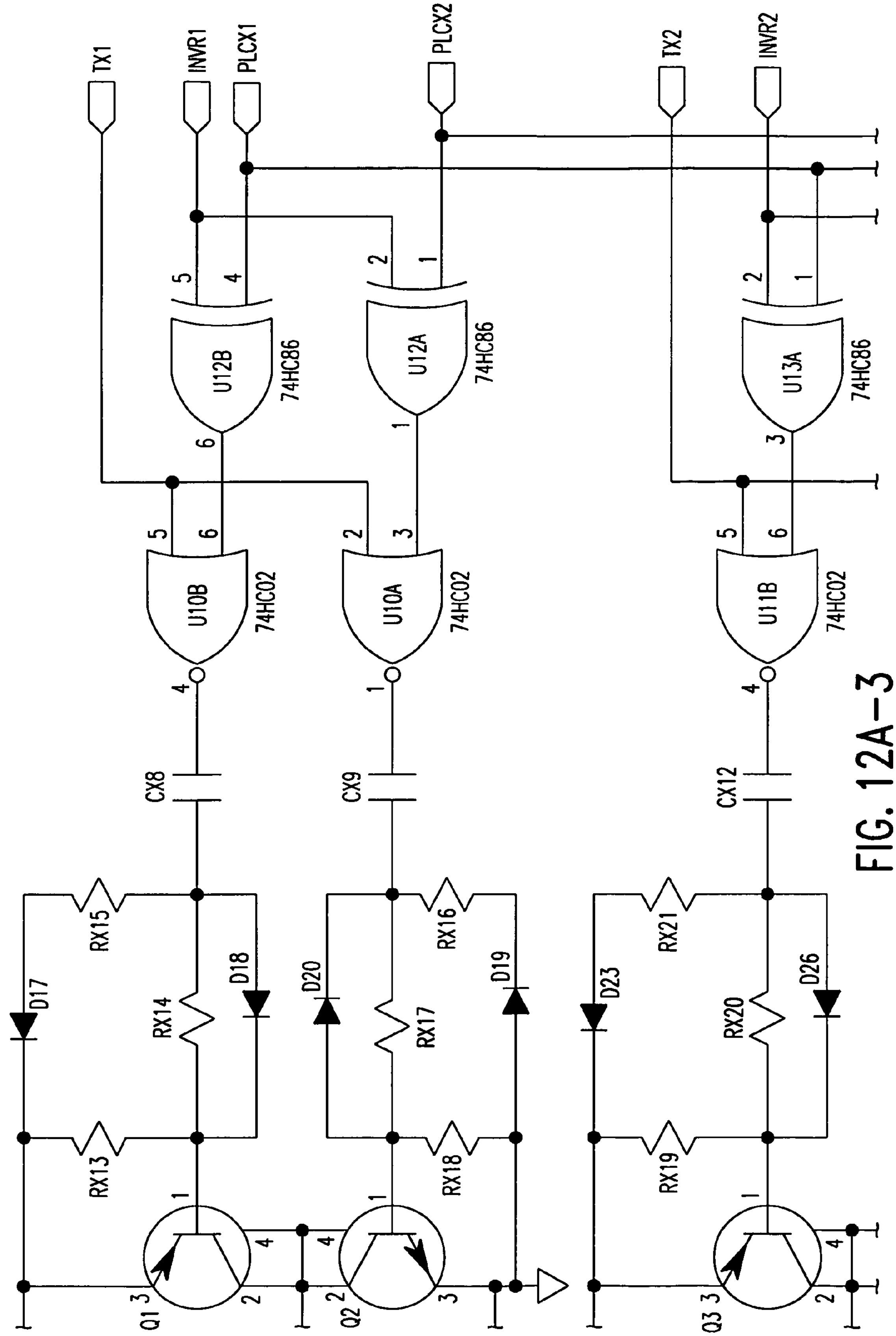
Figures 4, 12A:
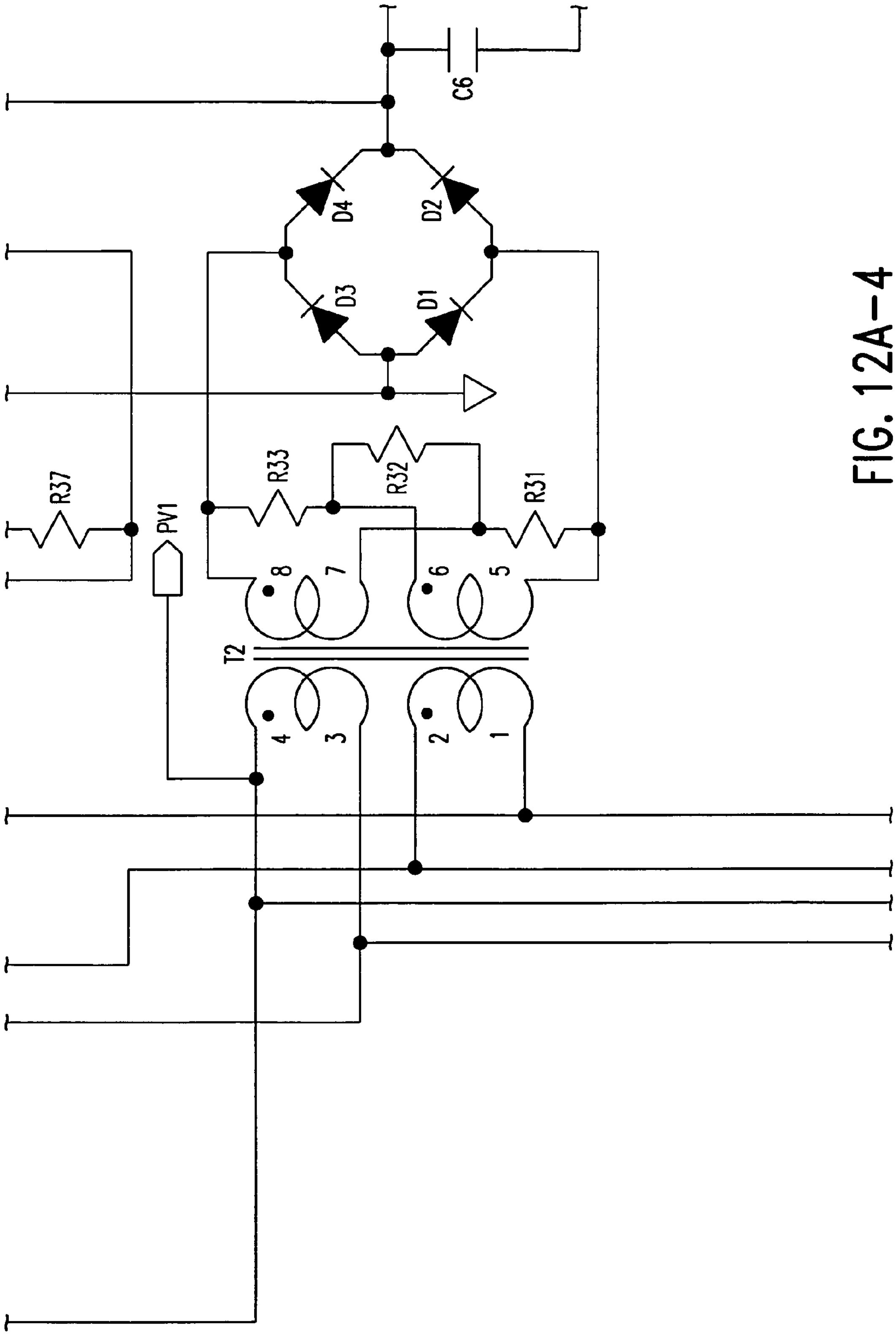
Figures 5, 12A:
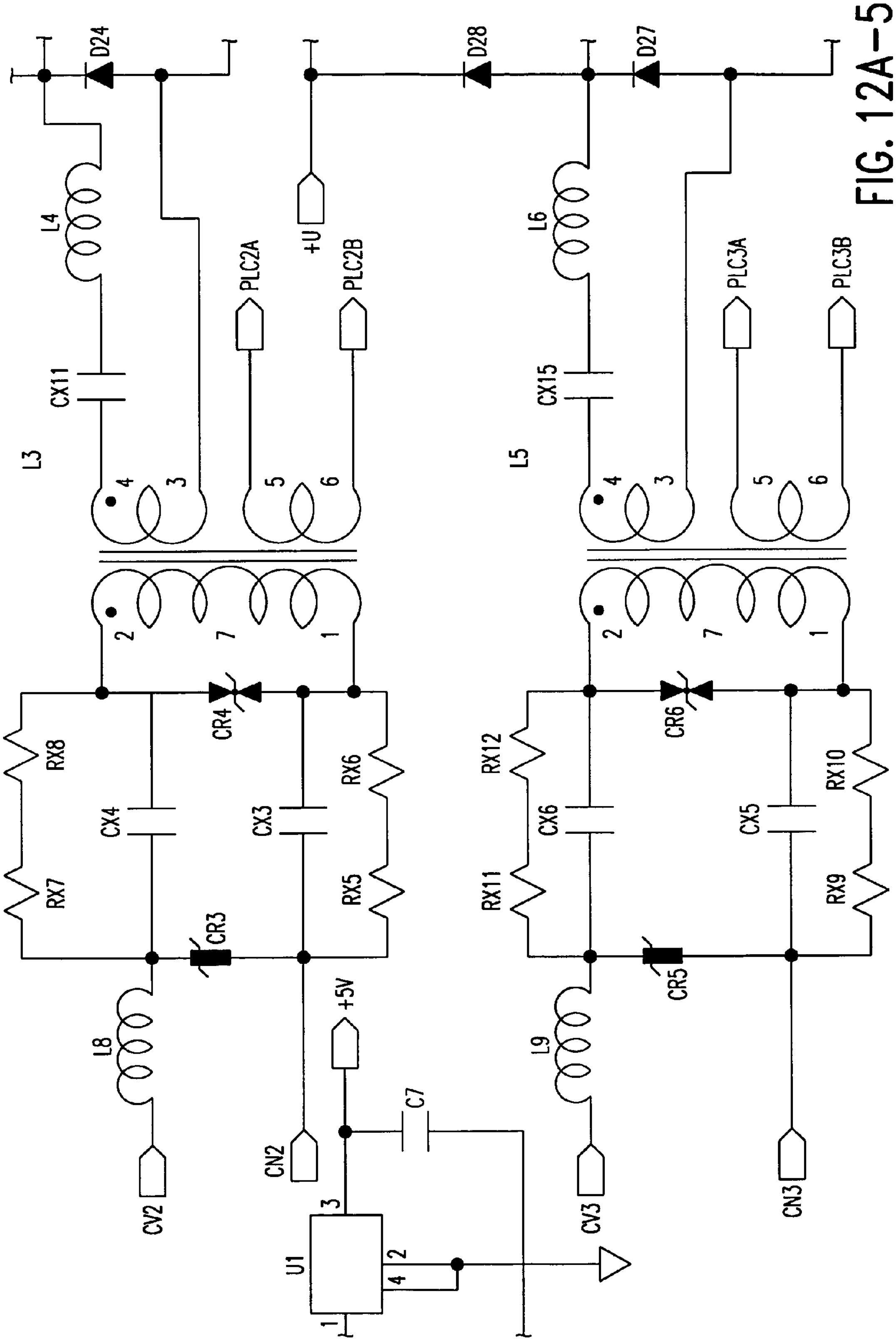
Figures 6, 12A:
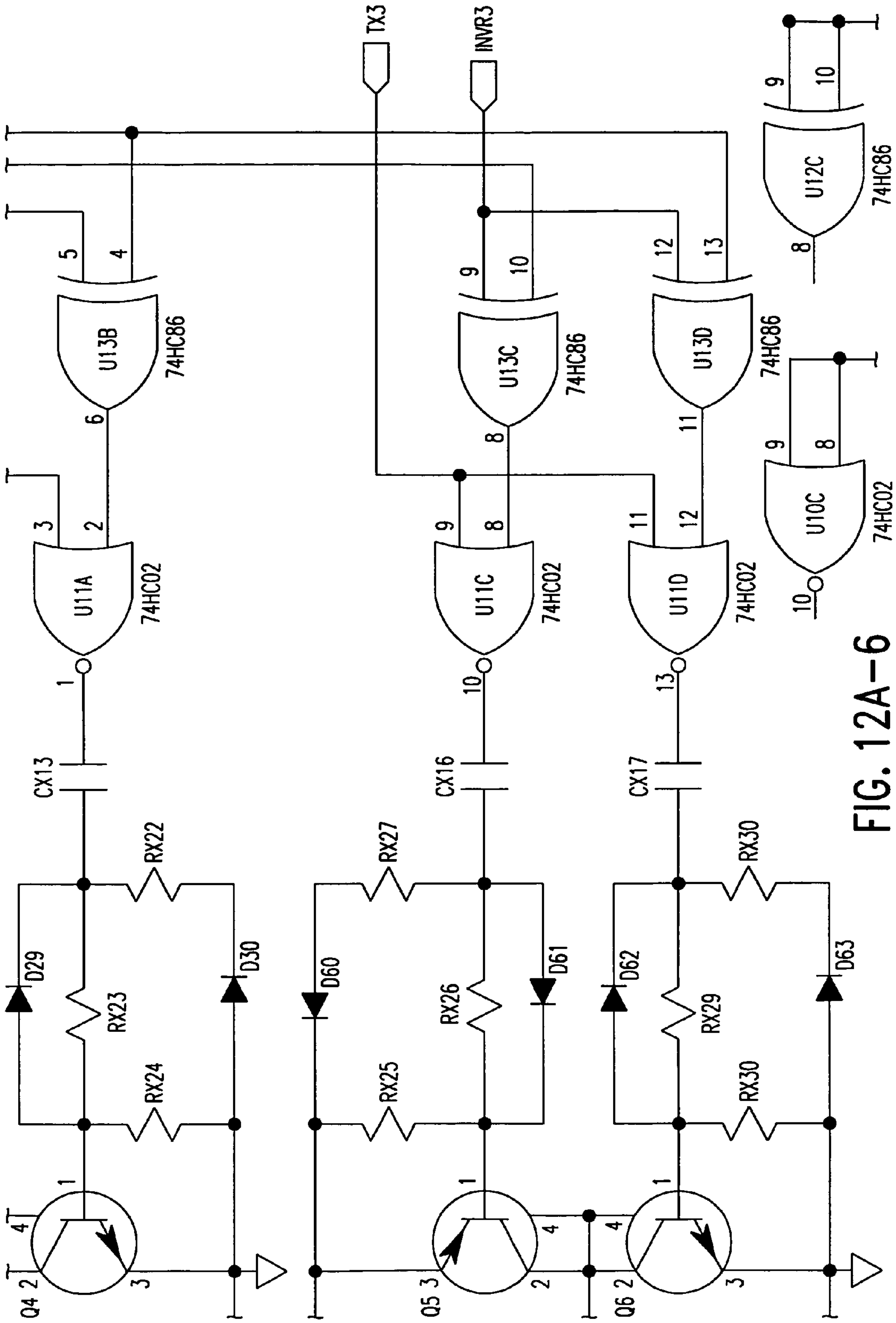
Figures 7, 12A:
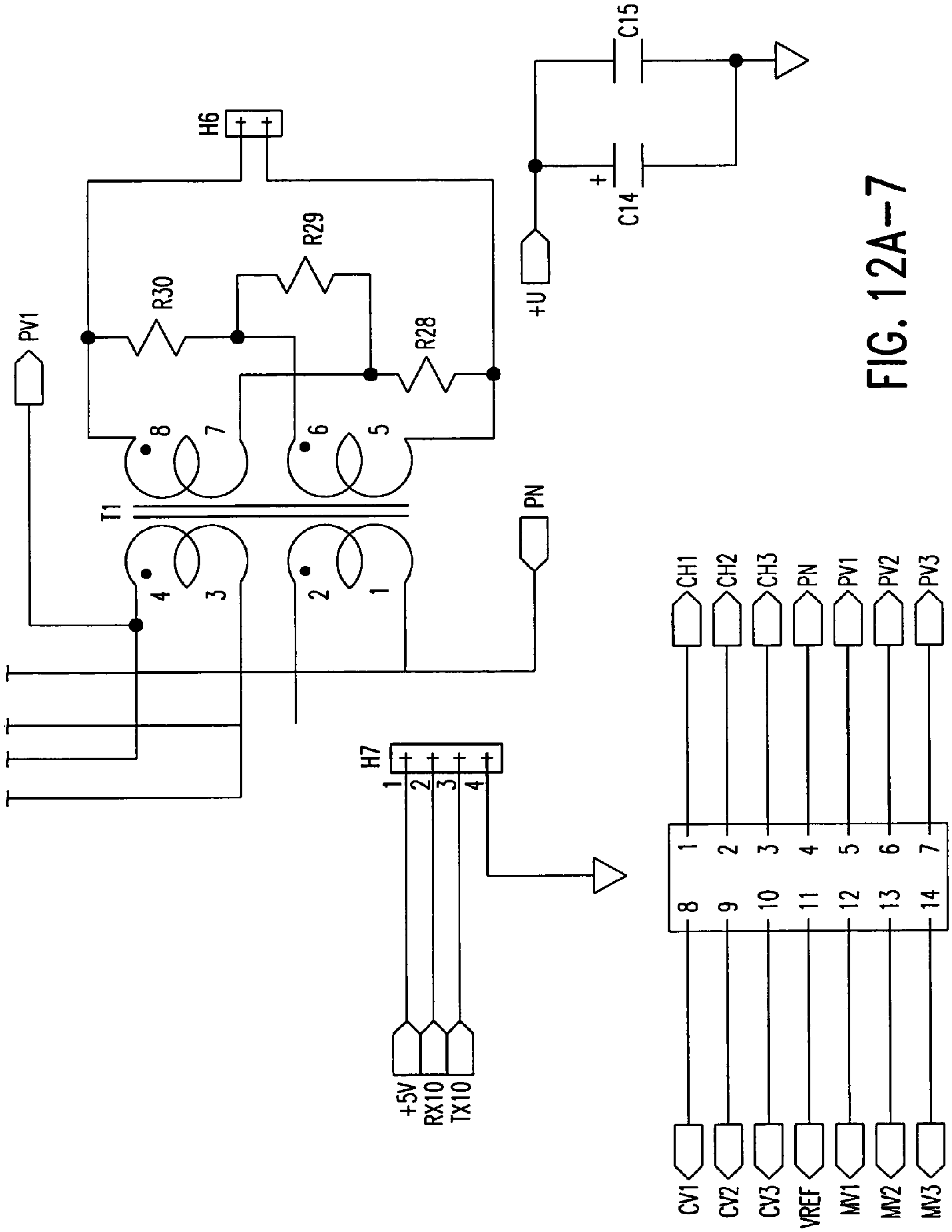
Figures 8, 12A:
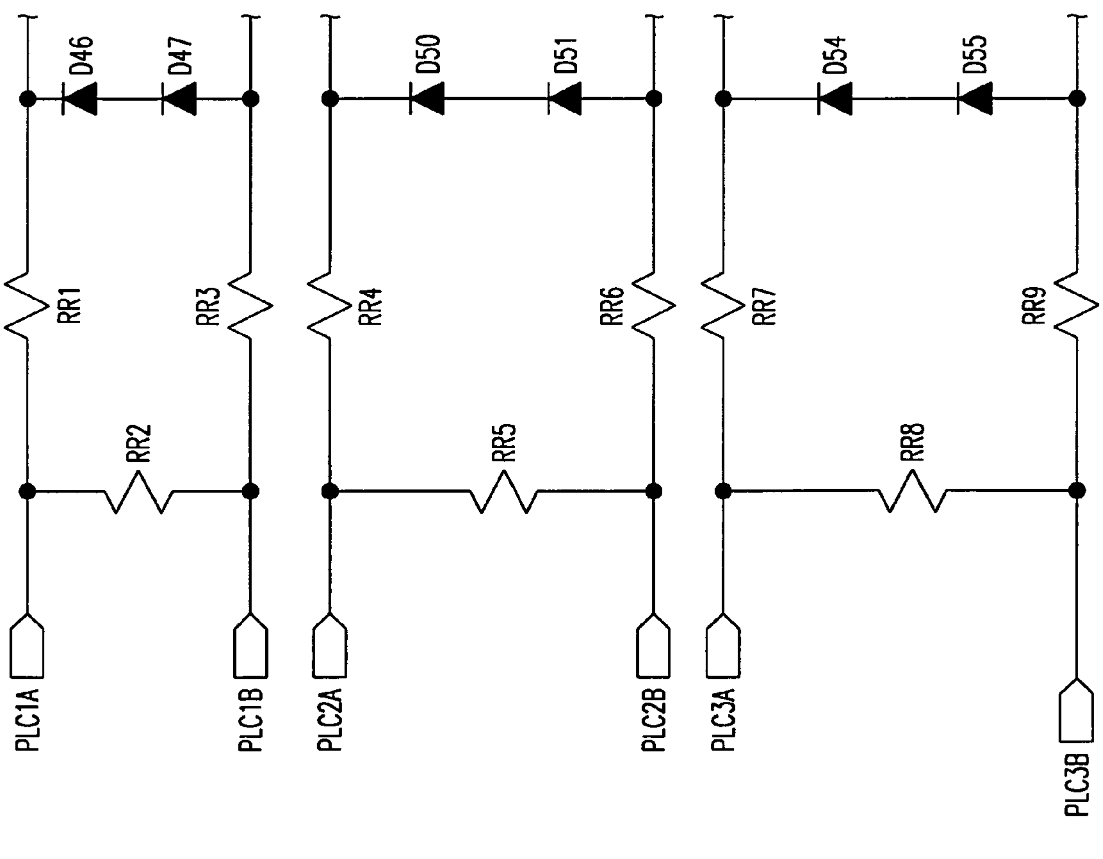
Figures 9, 12A:
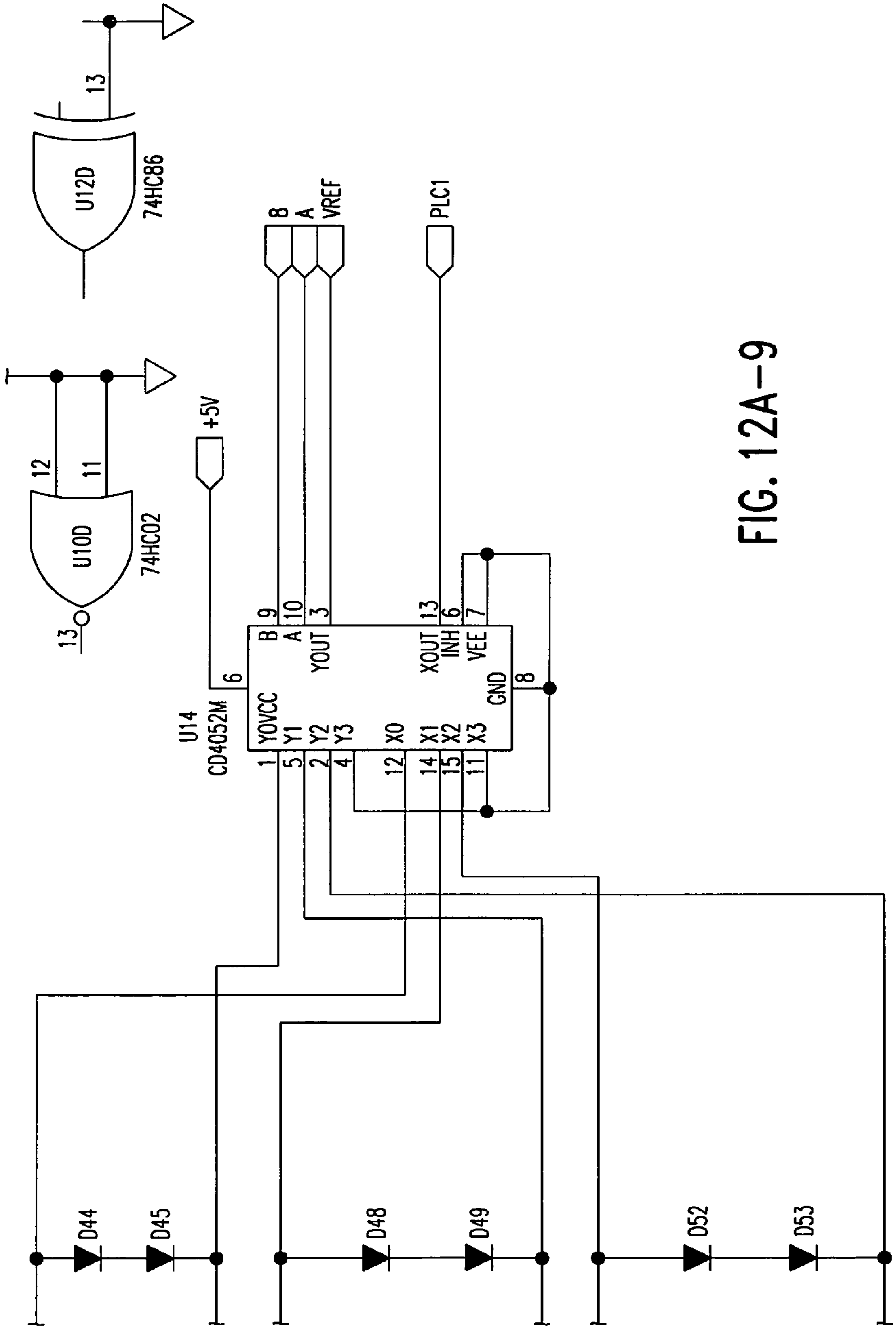
Figures 1, 12B:
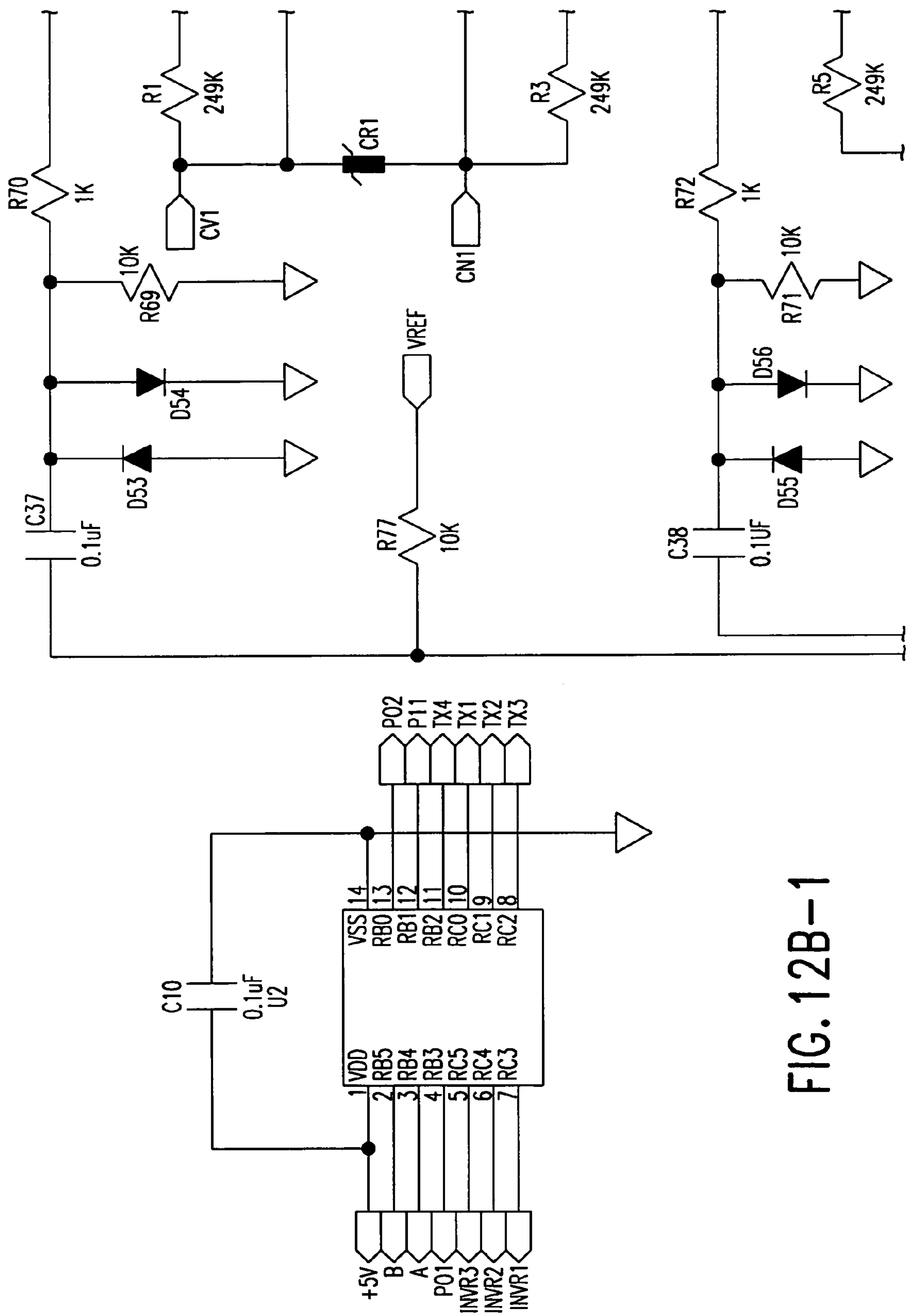
Figures 2, 12B:
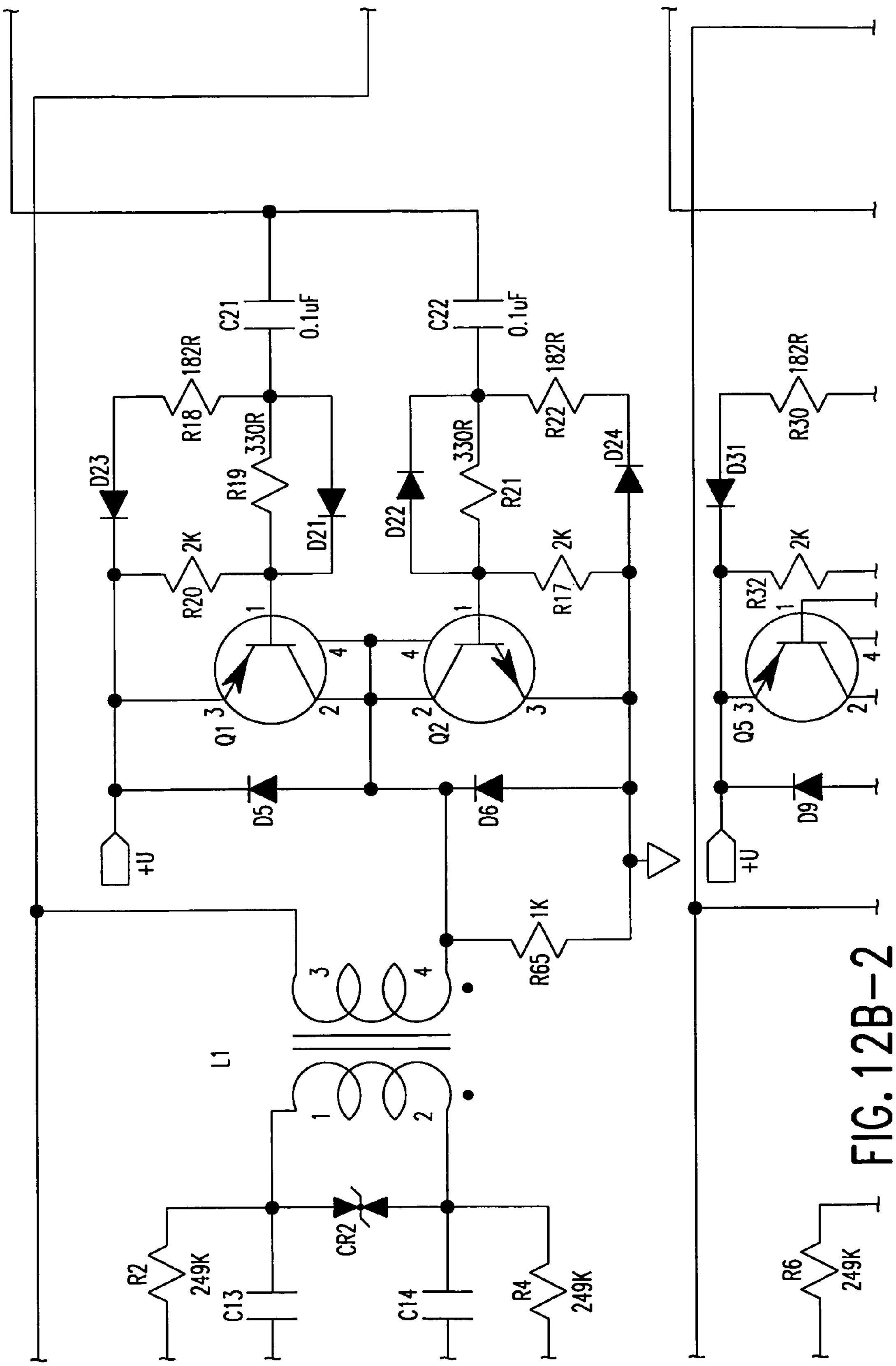
Figures 3, 12B:
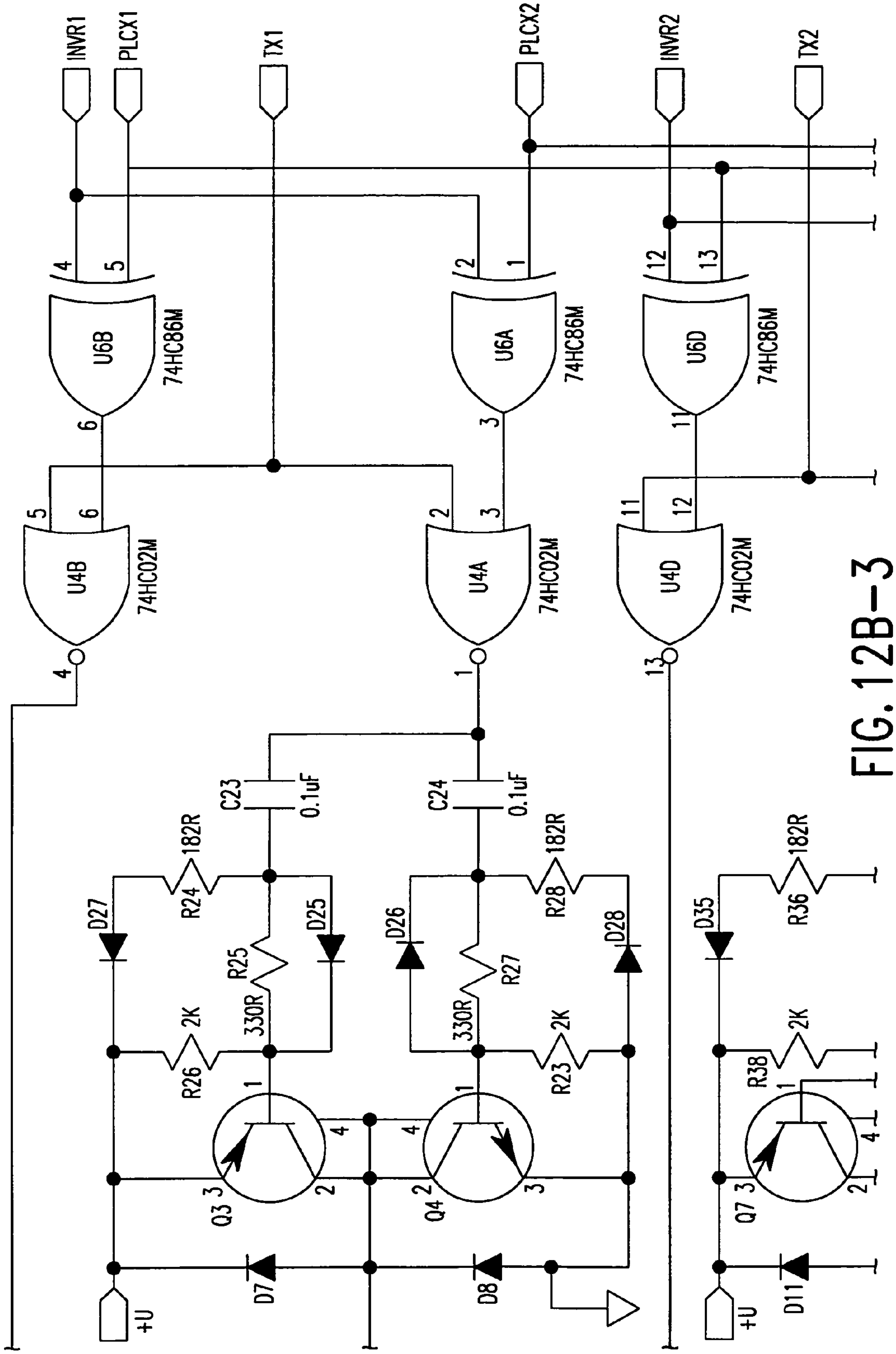
Figures 4, 12B:
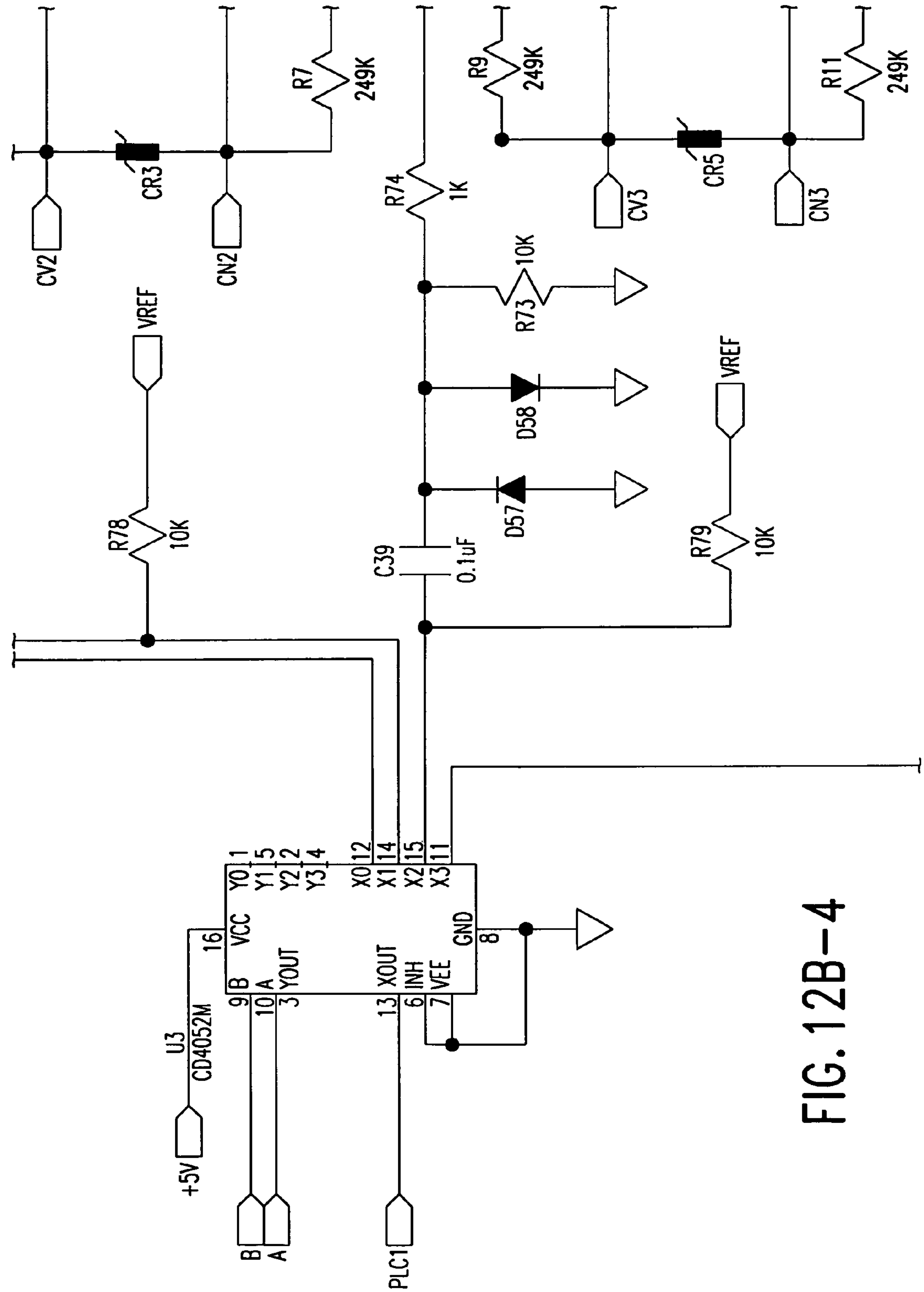
Figures 5, 12B:
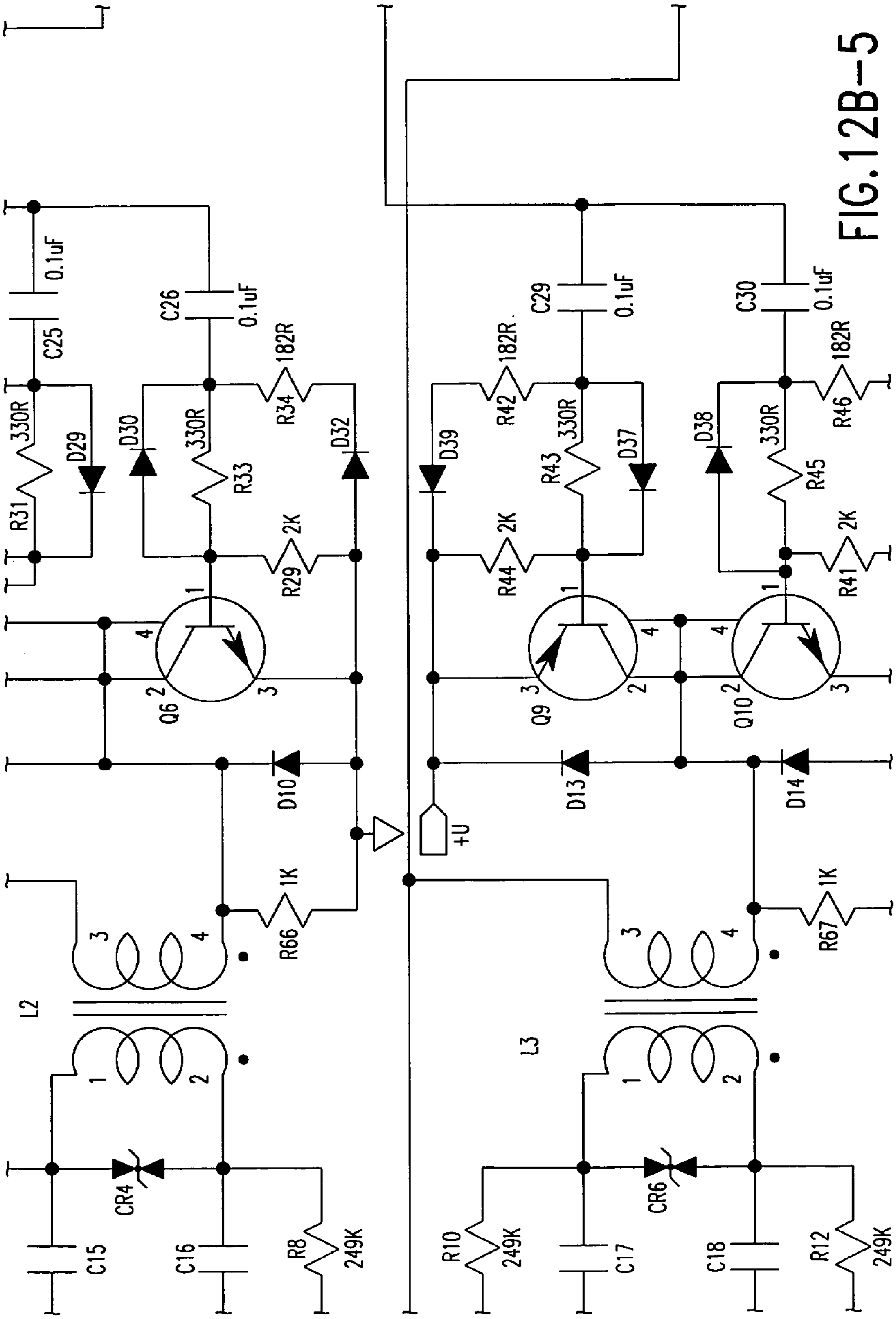
Figures 6, 12B:
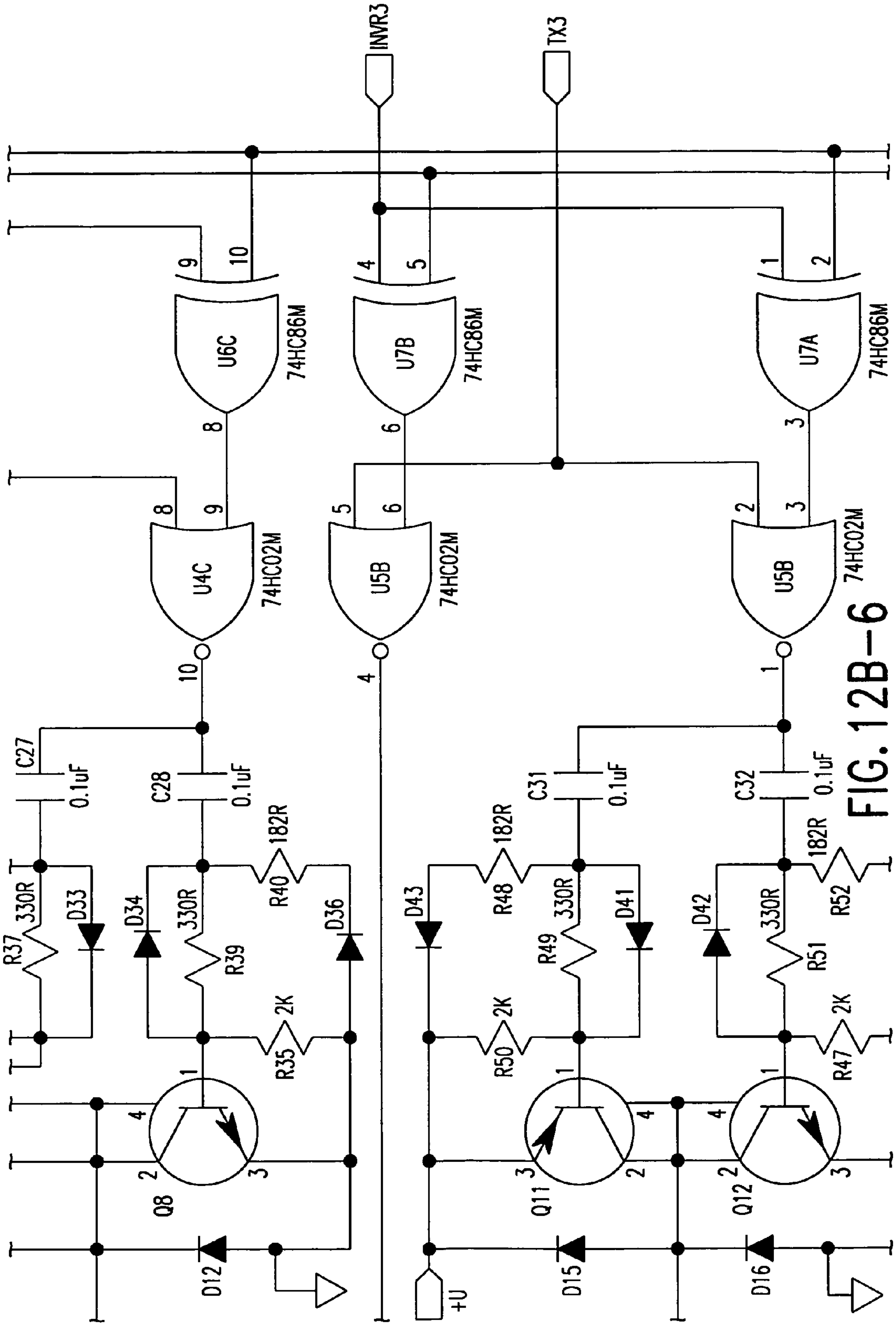
Figures 7, 12B:
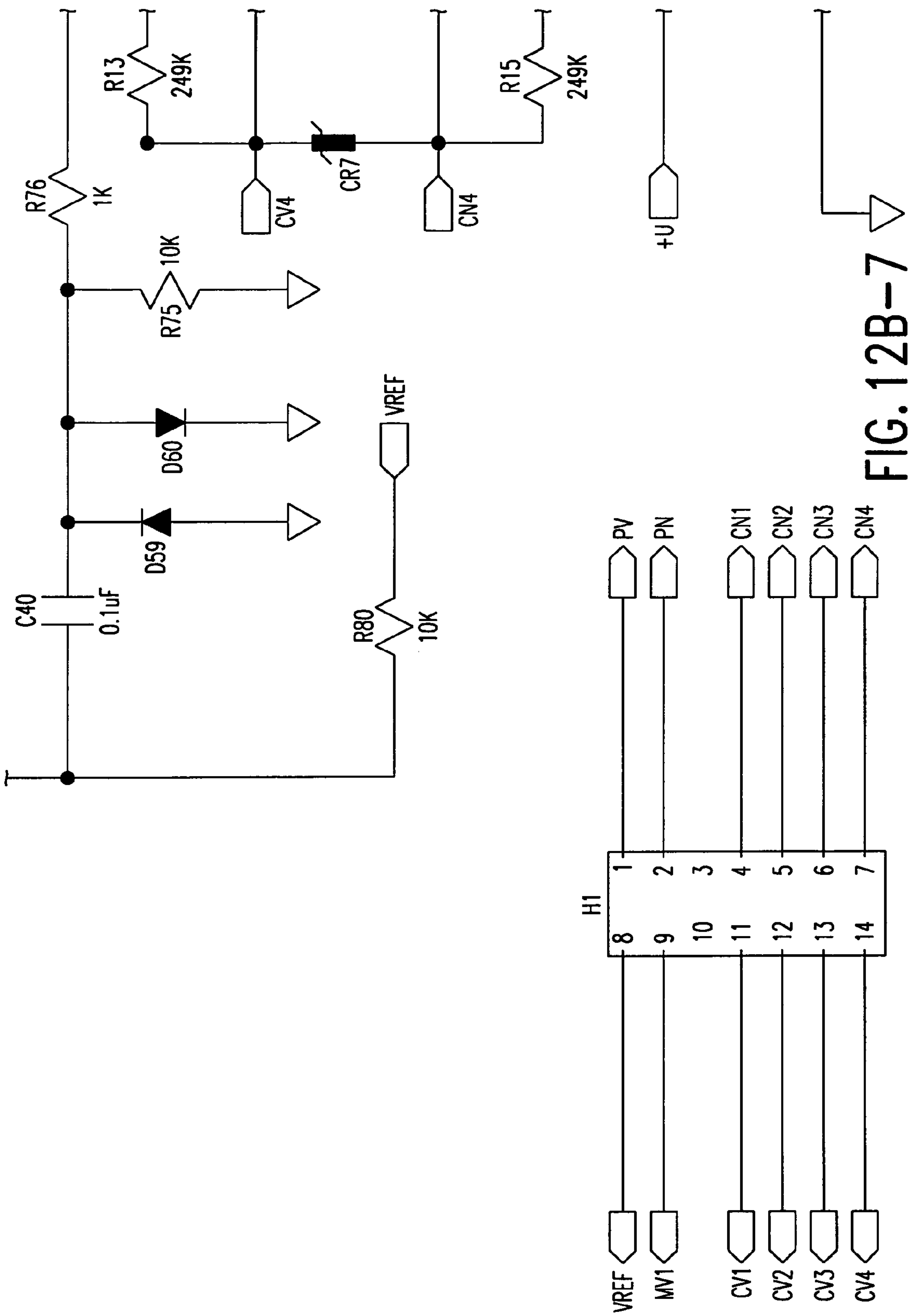
Figures 8, 12B:
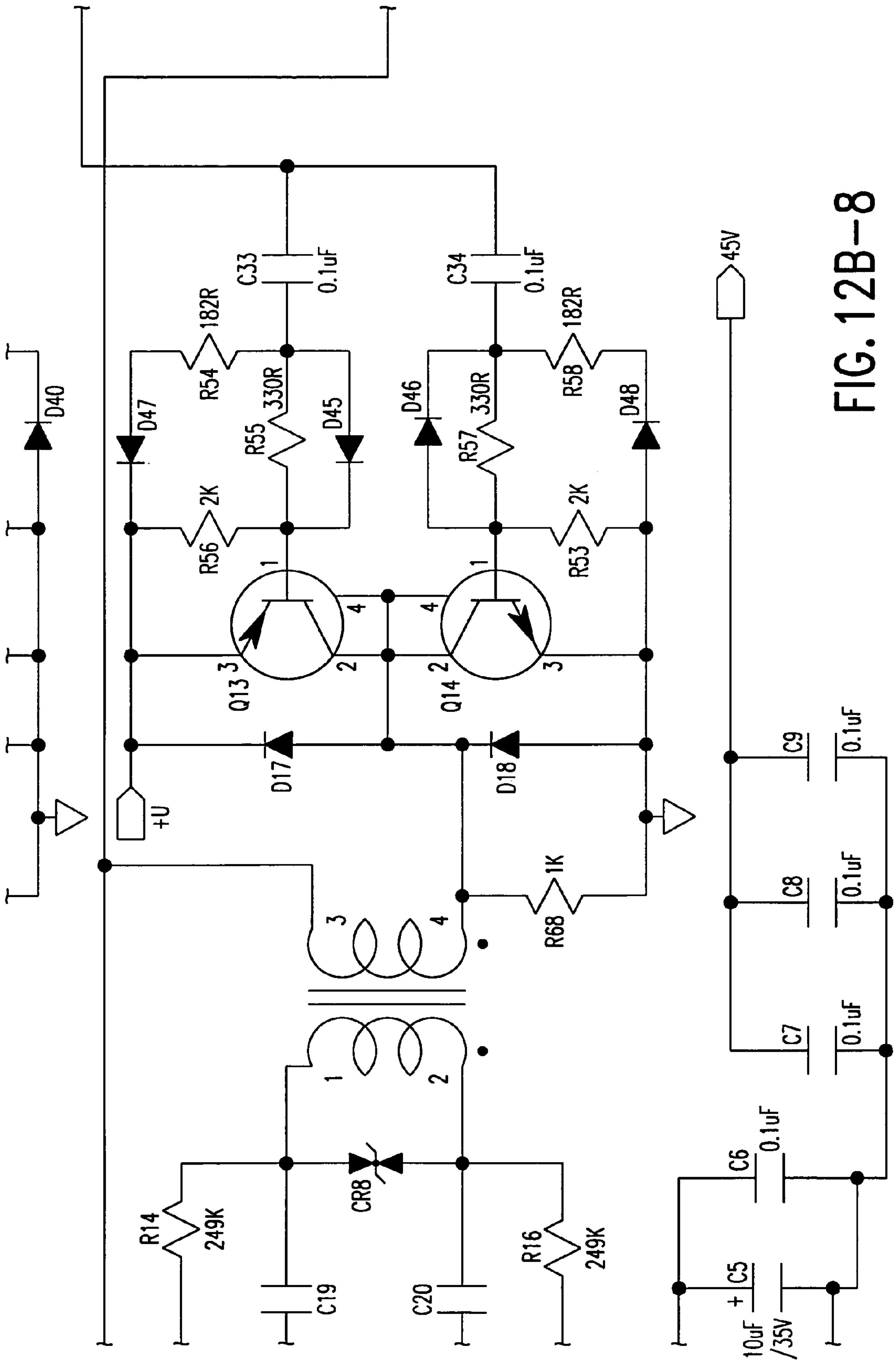
Figures 9, 12B:
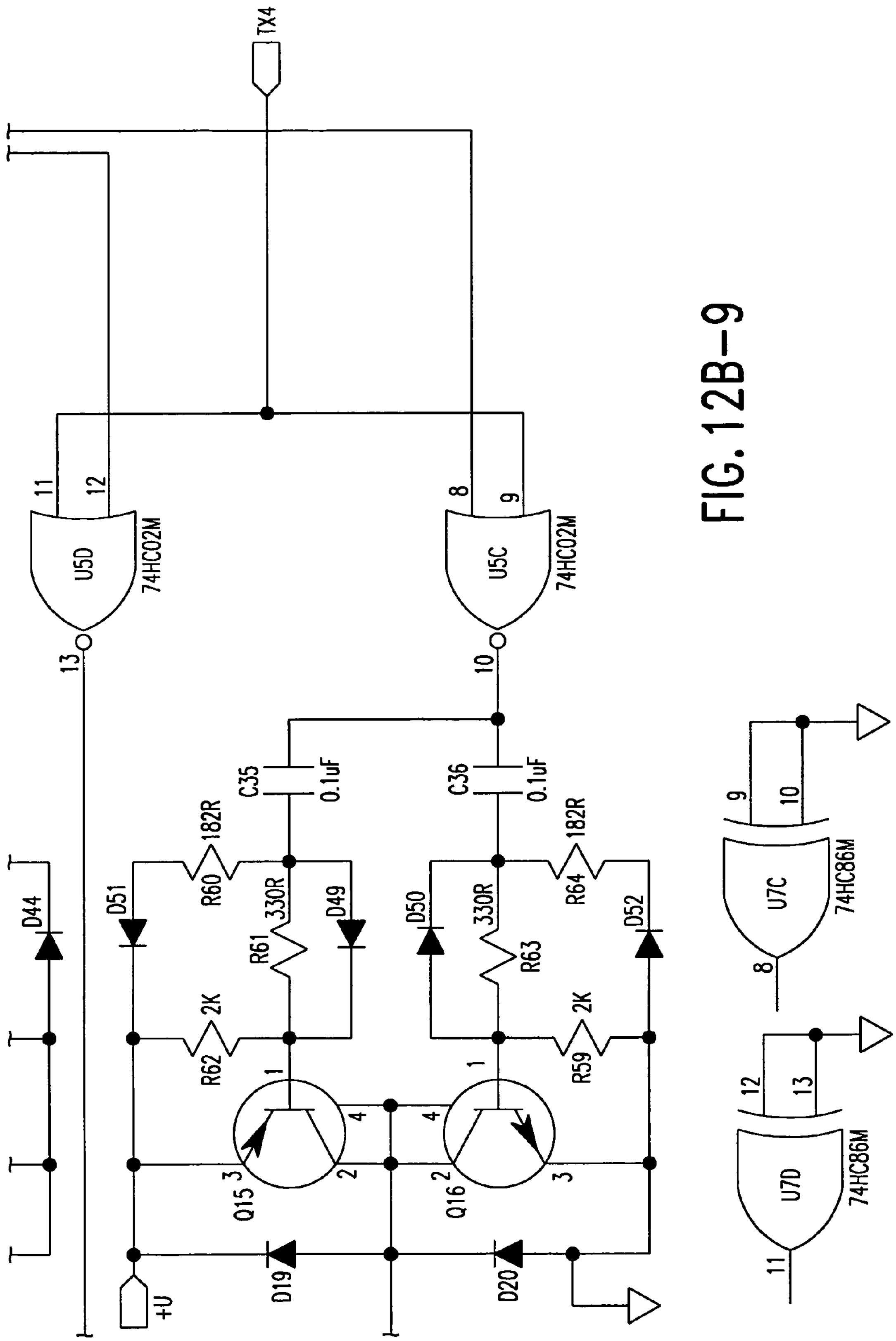
Figure 12C:
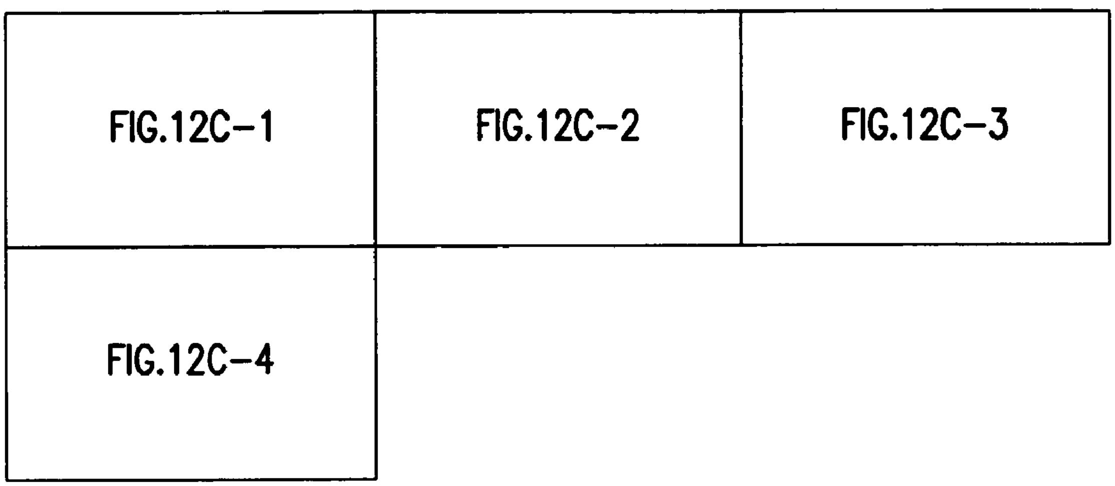
Figures 1, 12C:
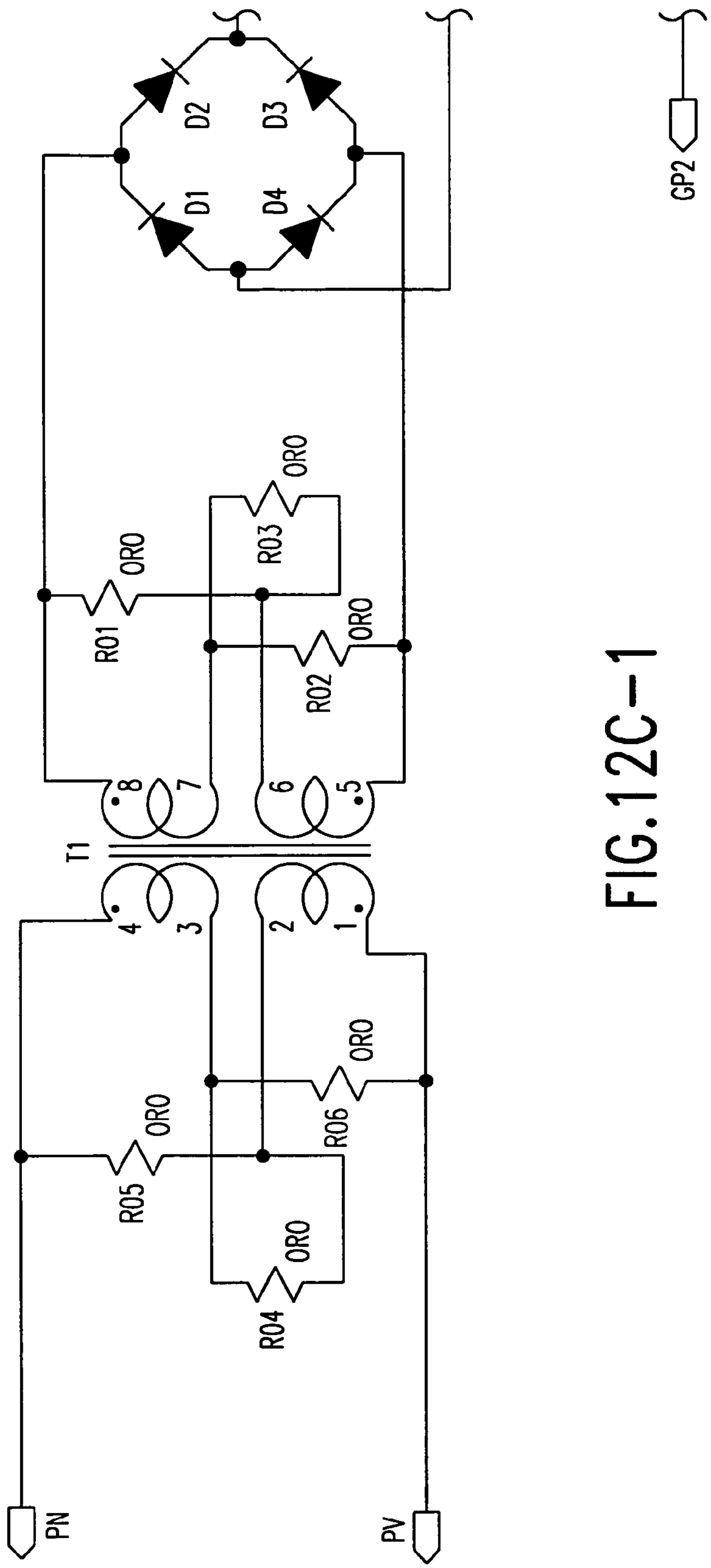
Figures 2, 12C:
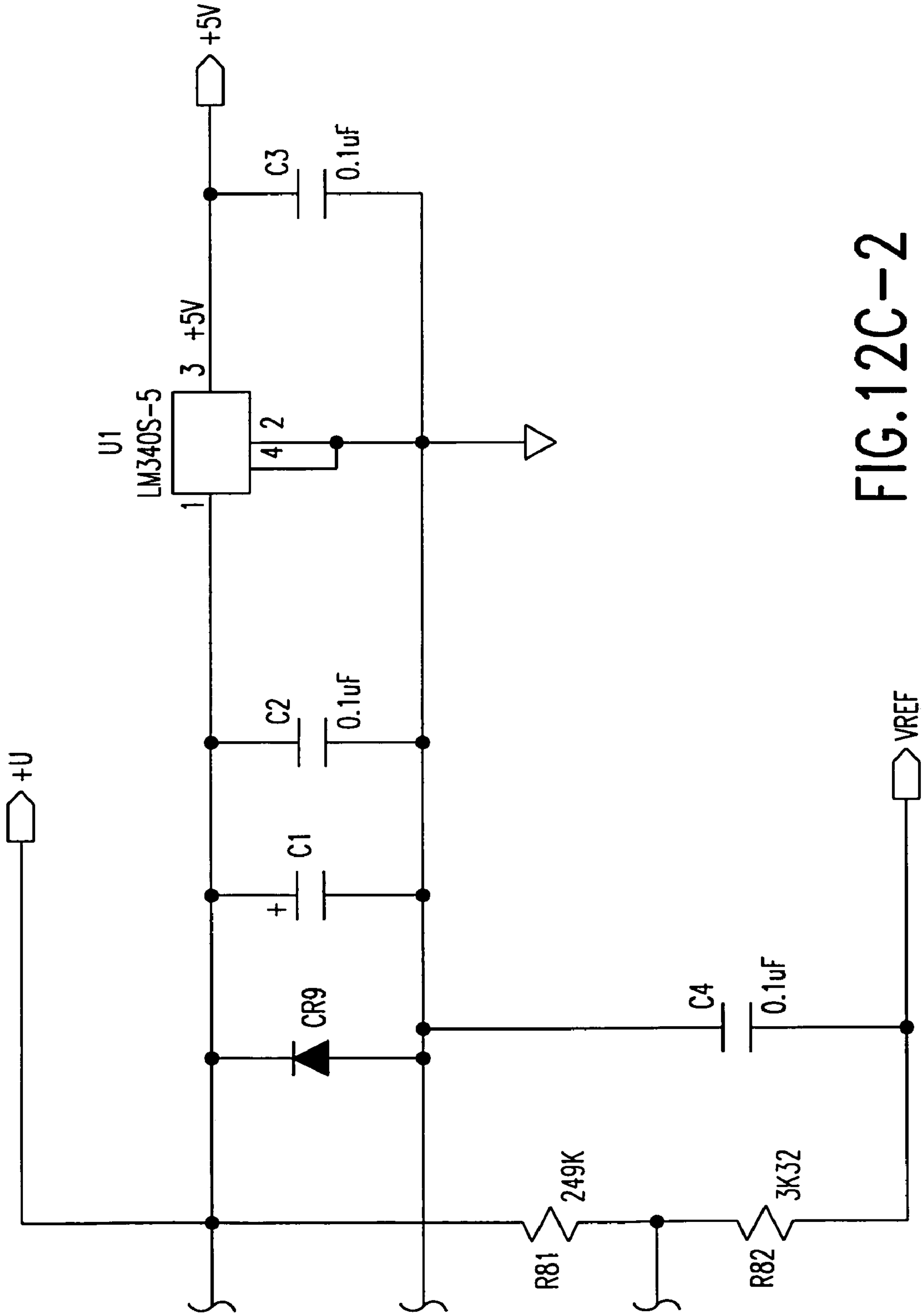
Figures 3, 12C:
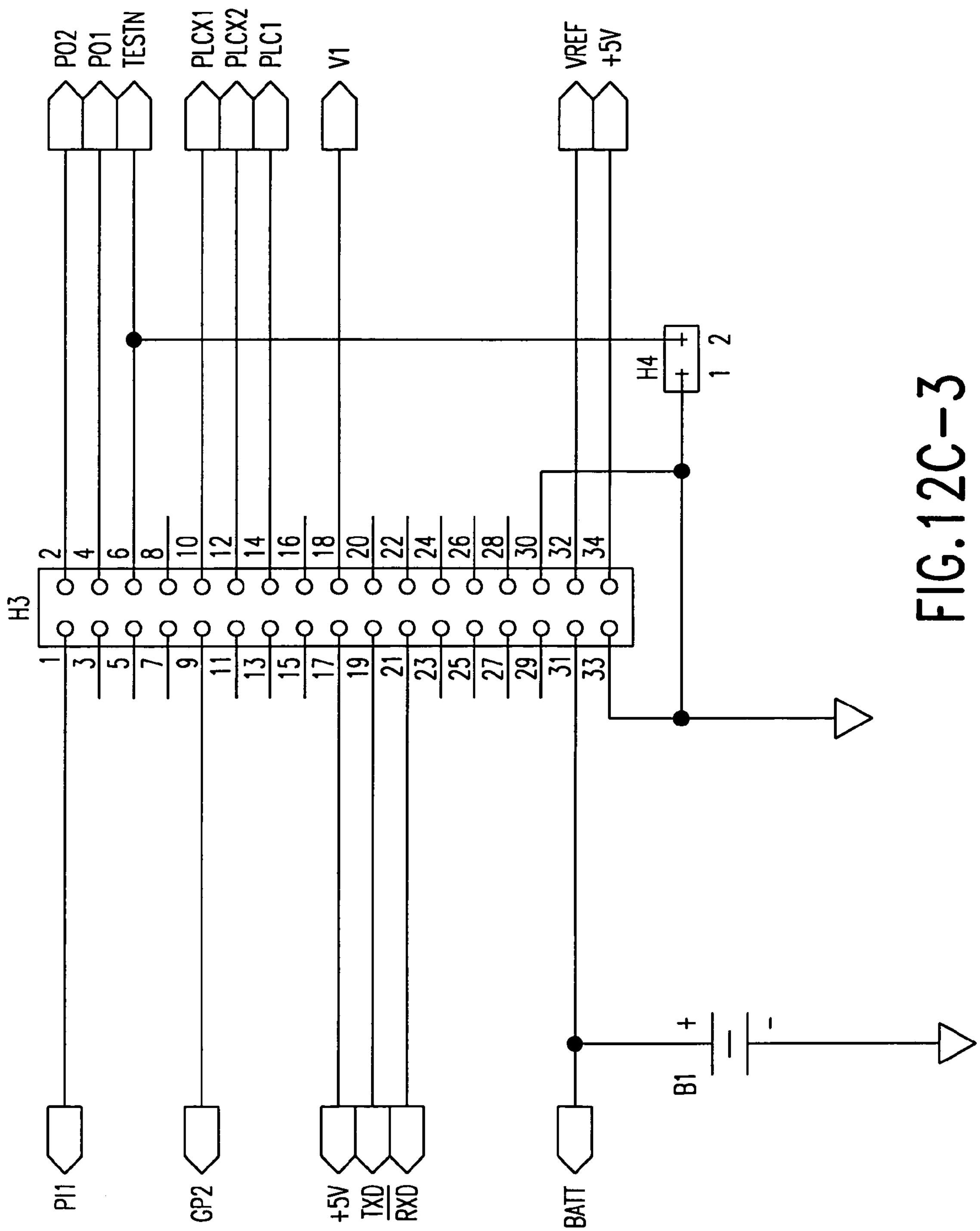
Figures 4, 12C:
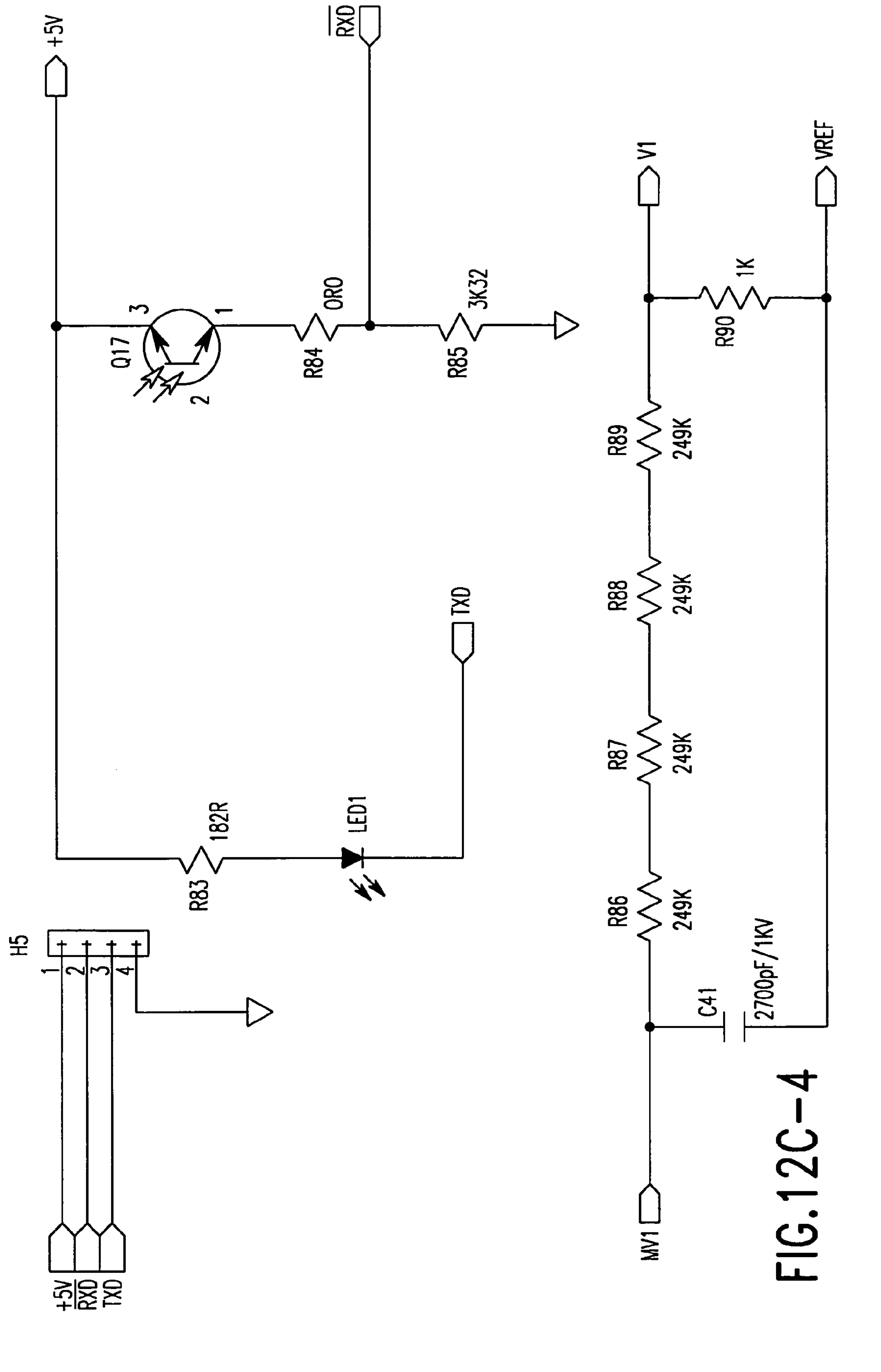
Figure 13:
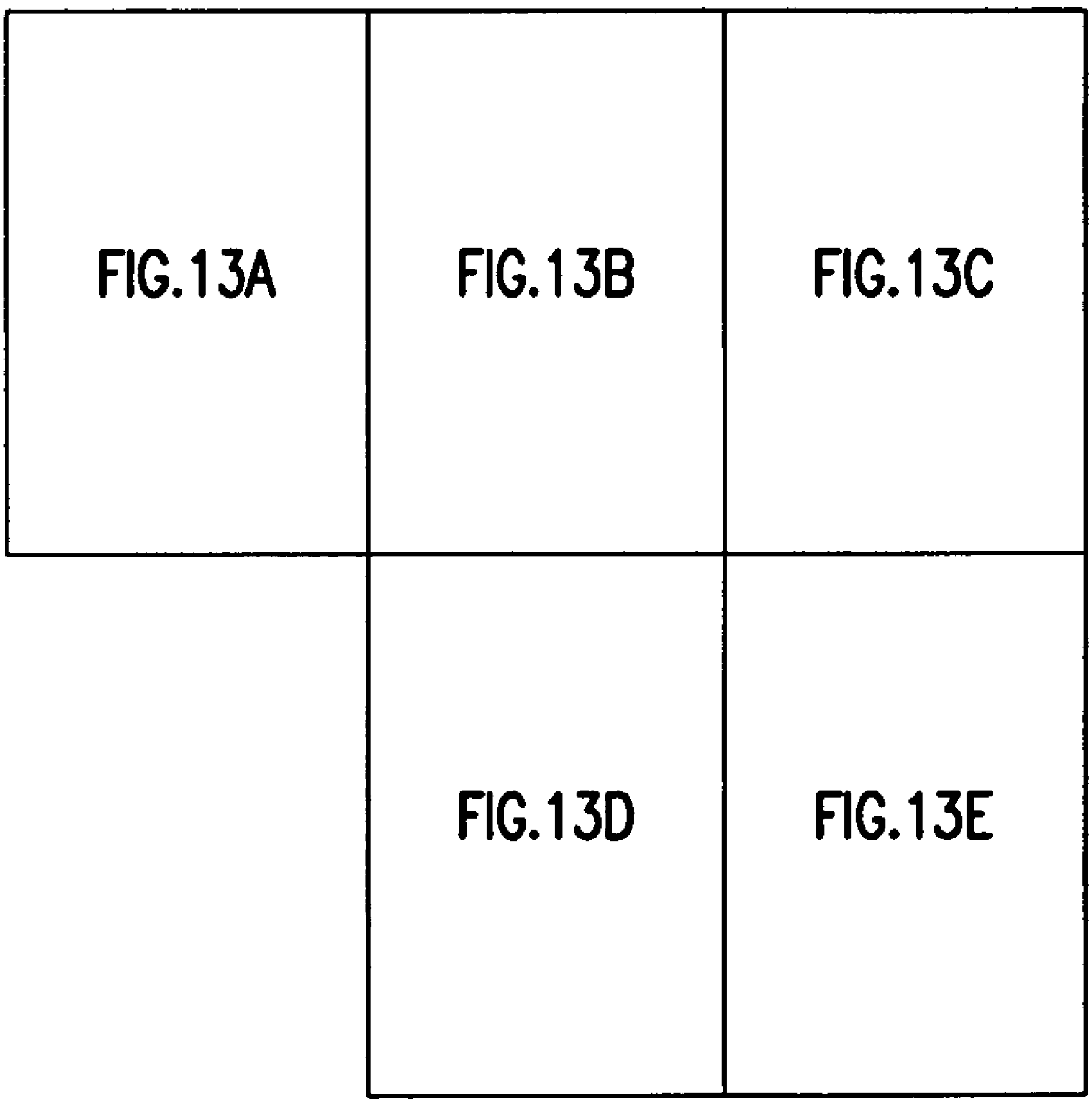
Figure 13A:
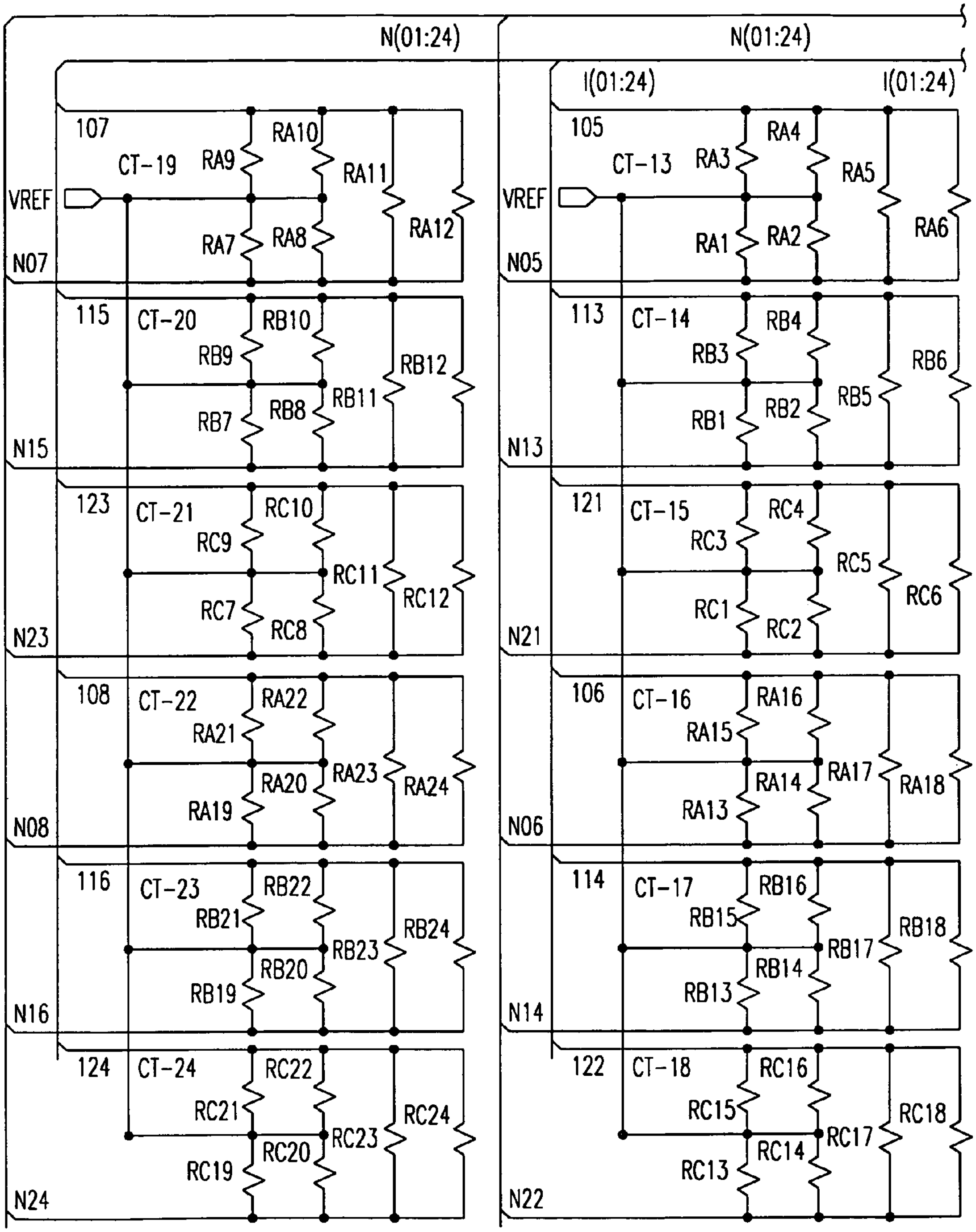
Figure 13B:
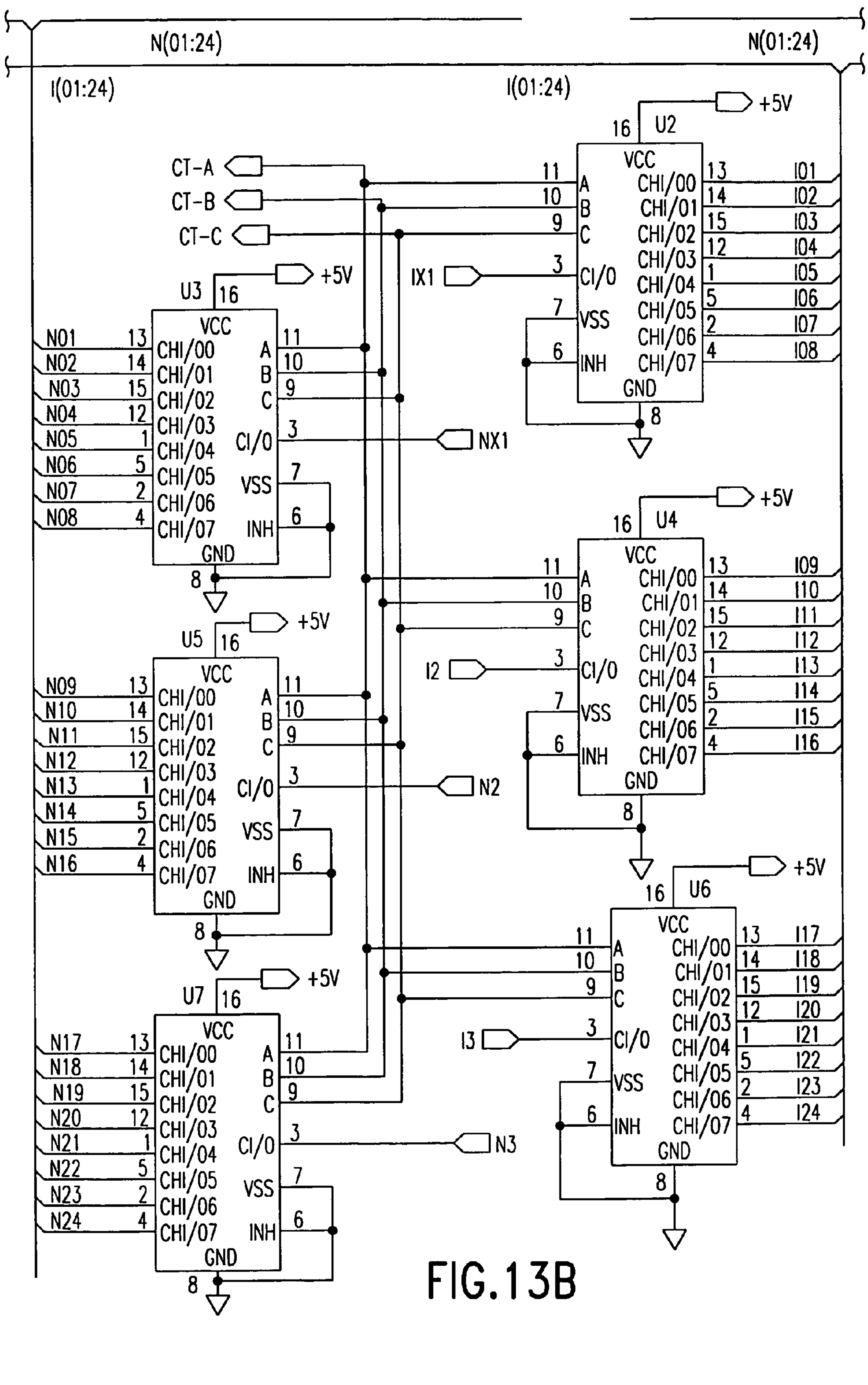
Figure 13C:
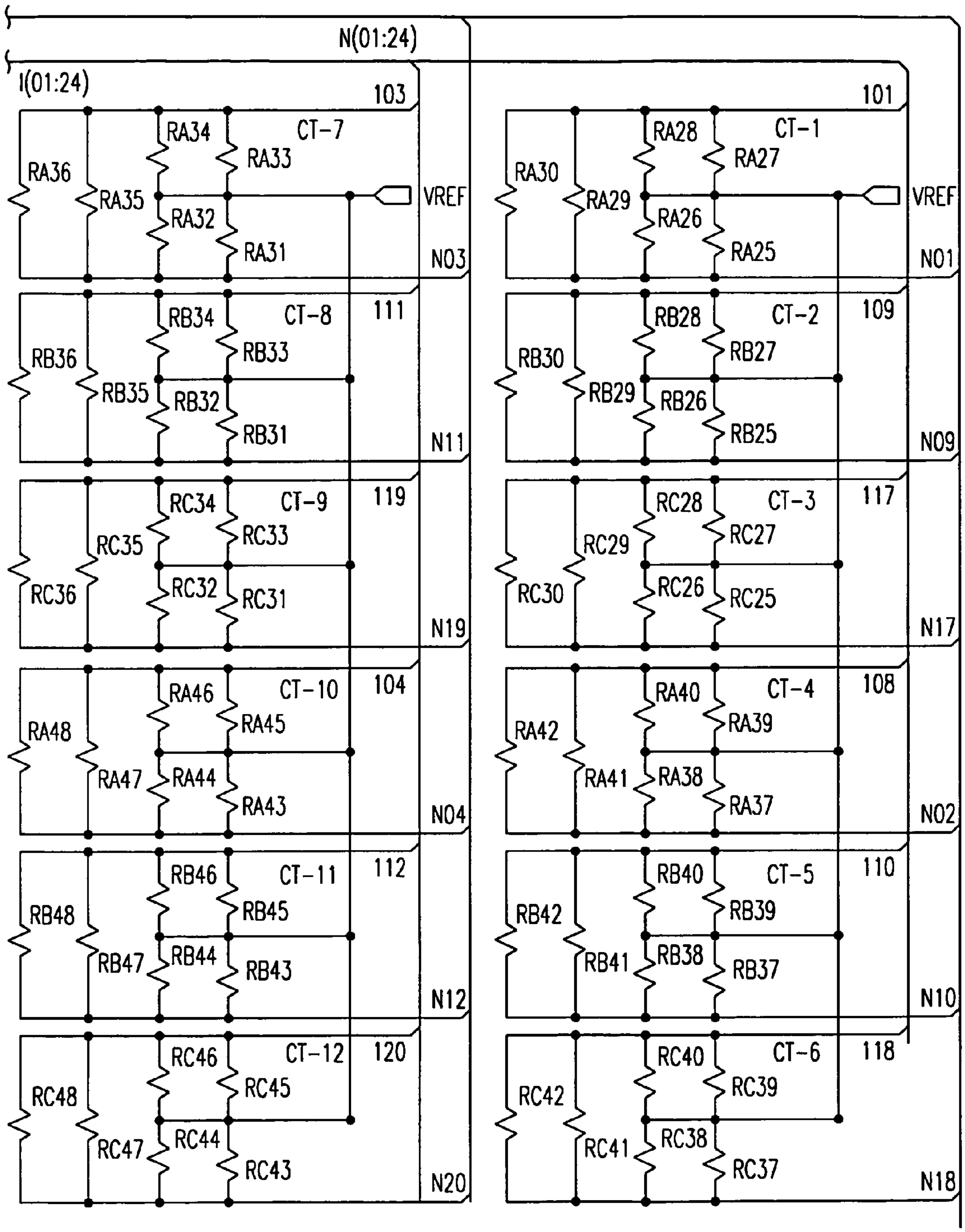
Figure 13D:
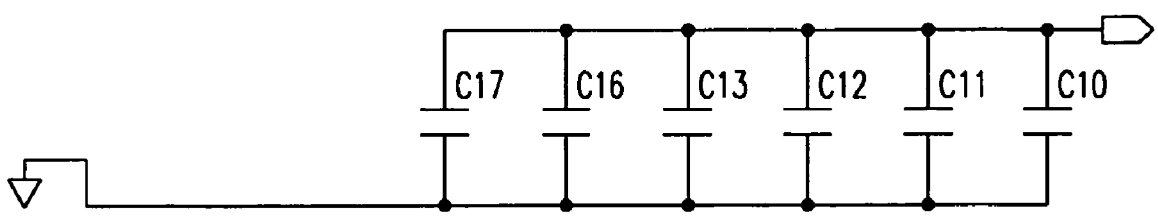
Figure 13E:
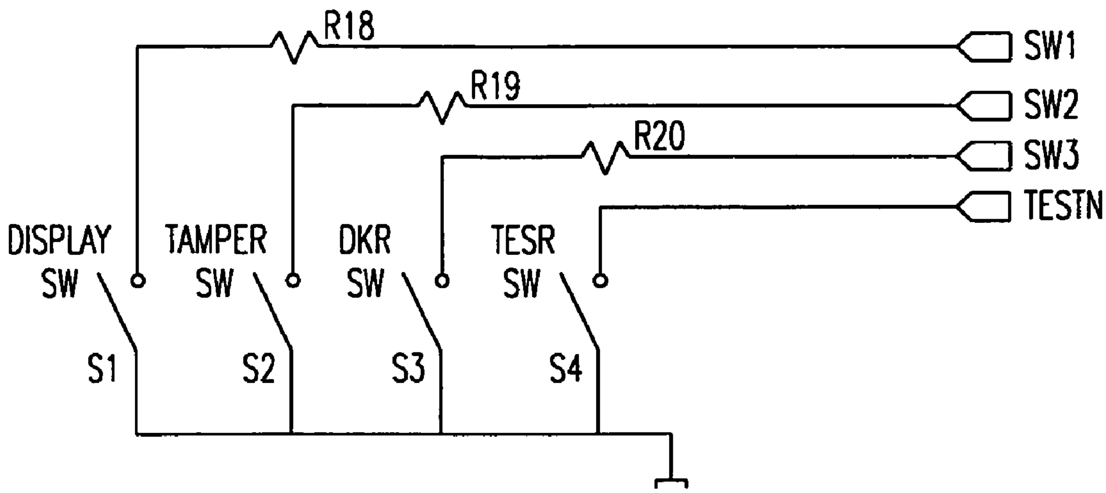
Figure 14:
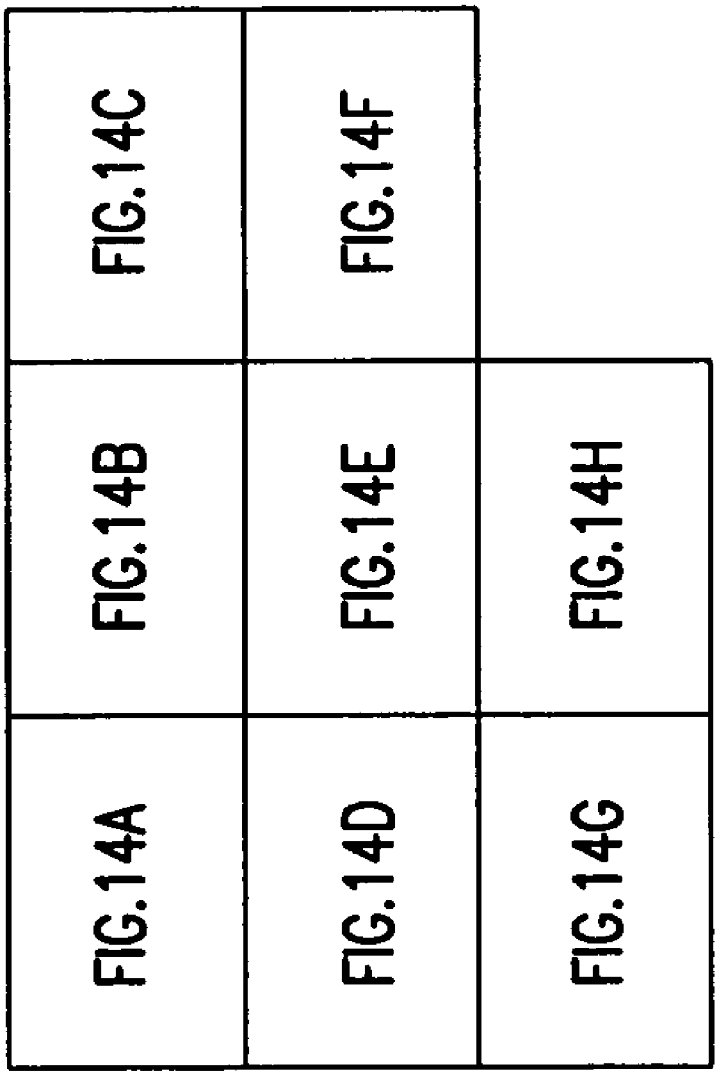
Figure 14A:
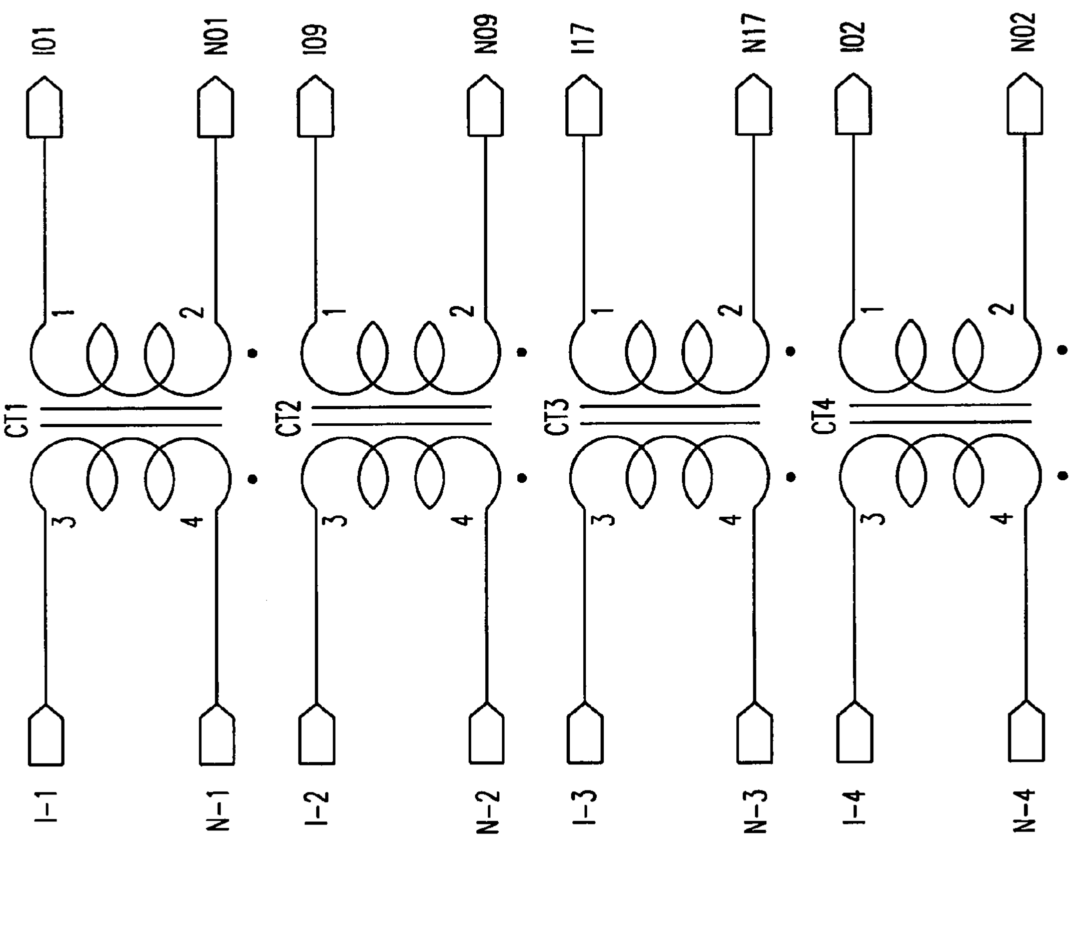
Figure 14B:
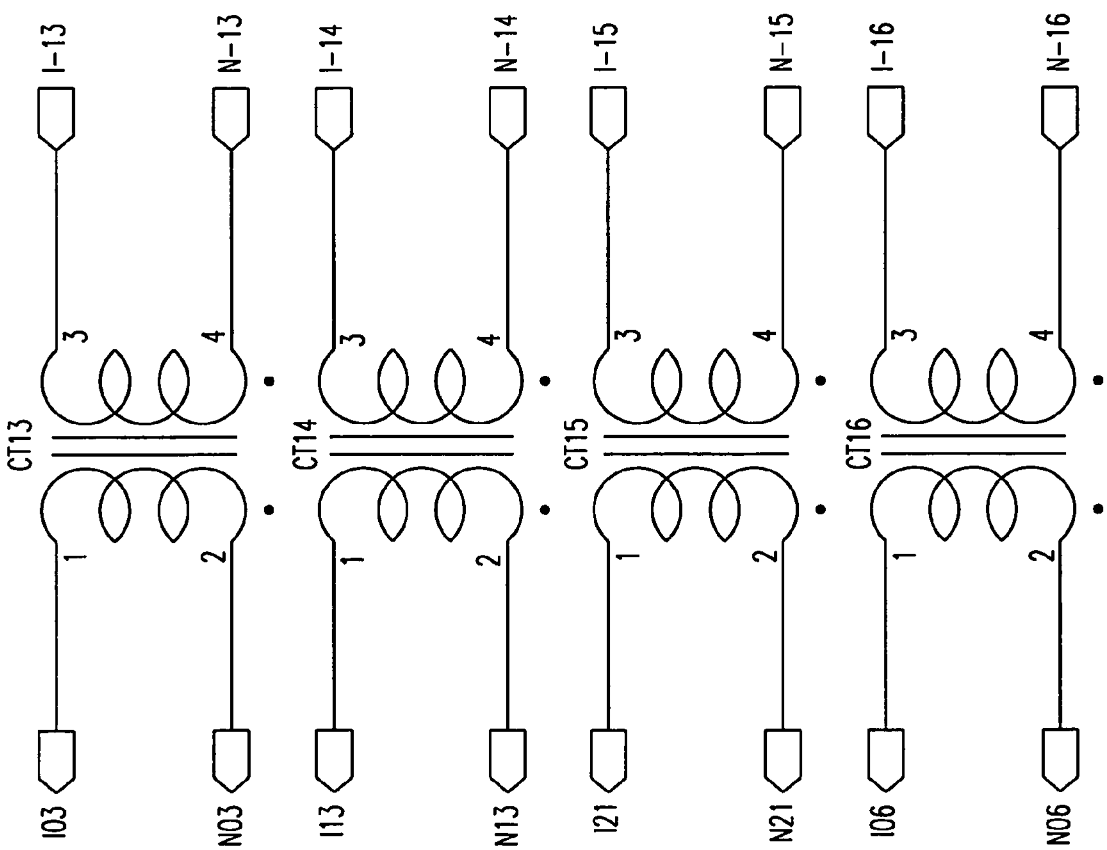
Figure 14C:
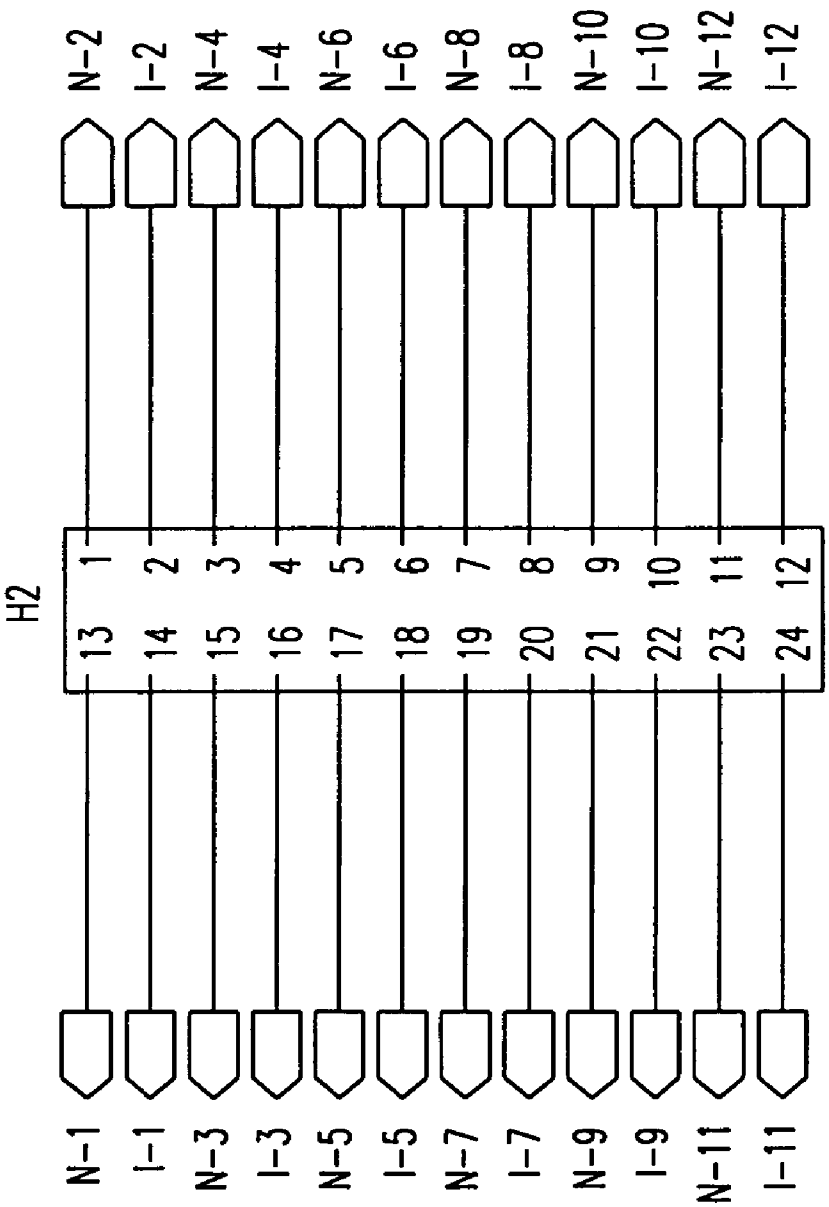
Figure 14D:
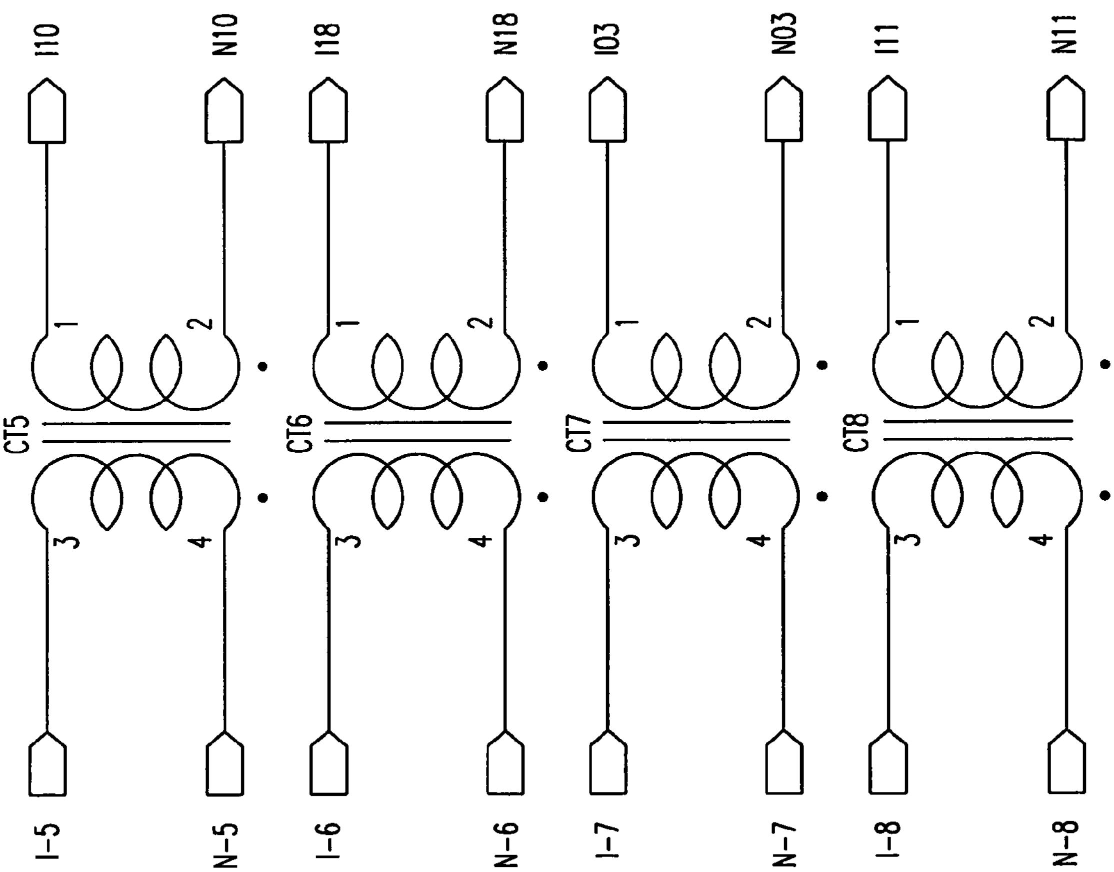
Figure 14E:
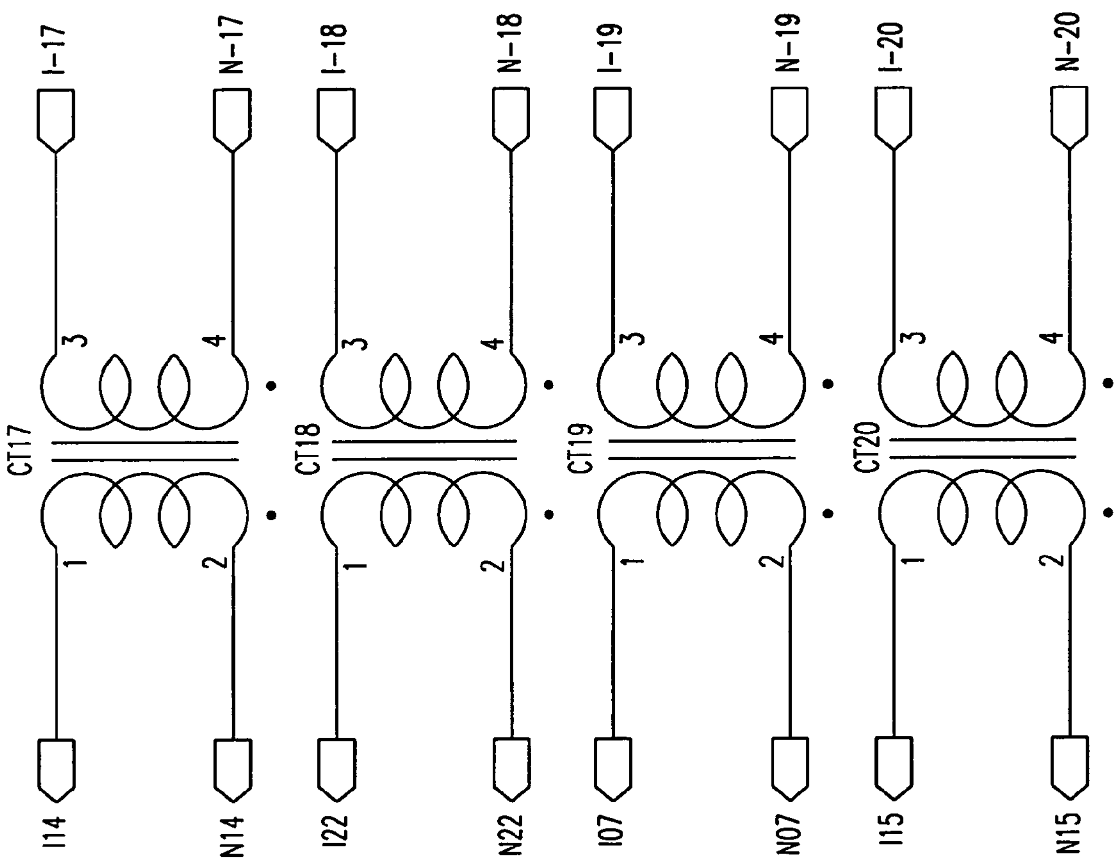
Figure 14F:
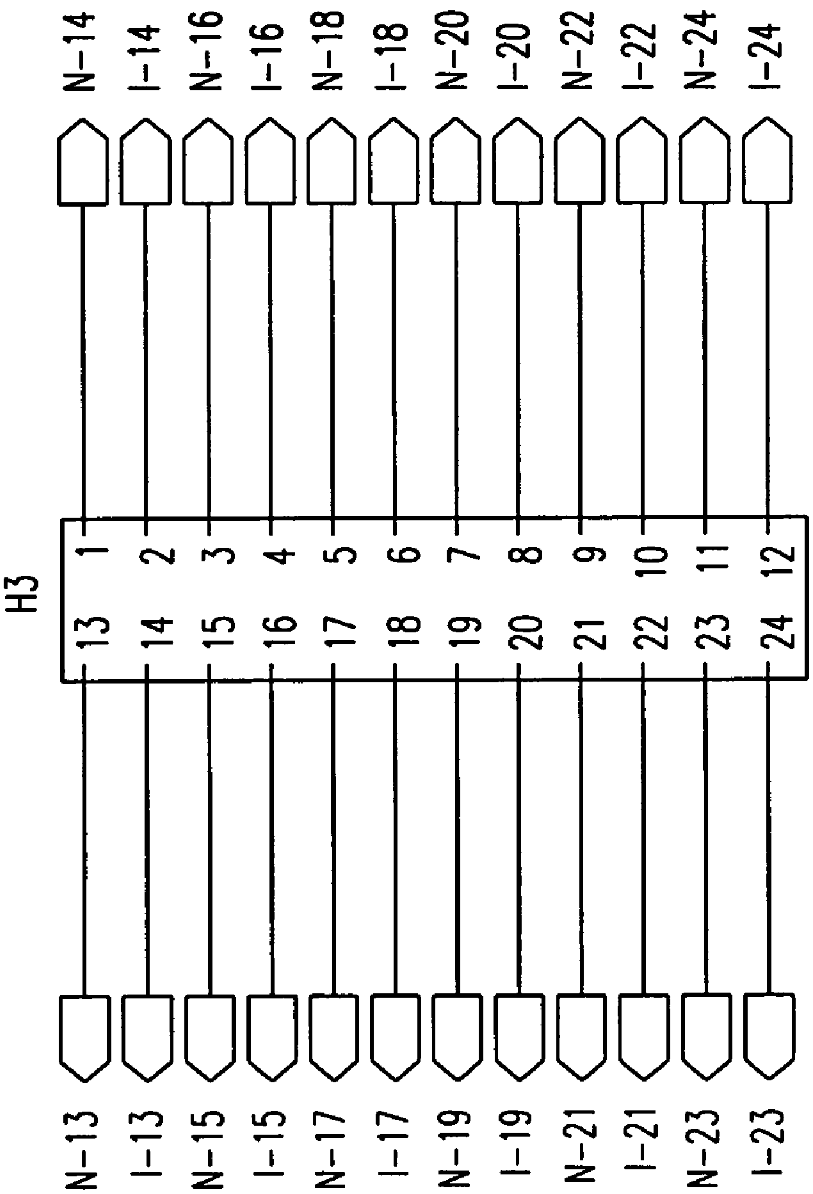
Figure 14G:
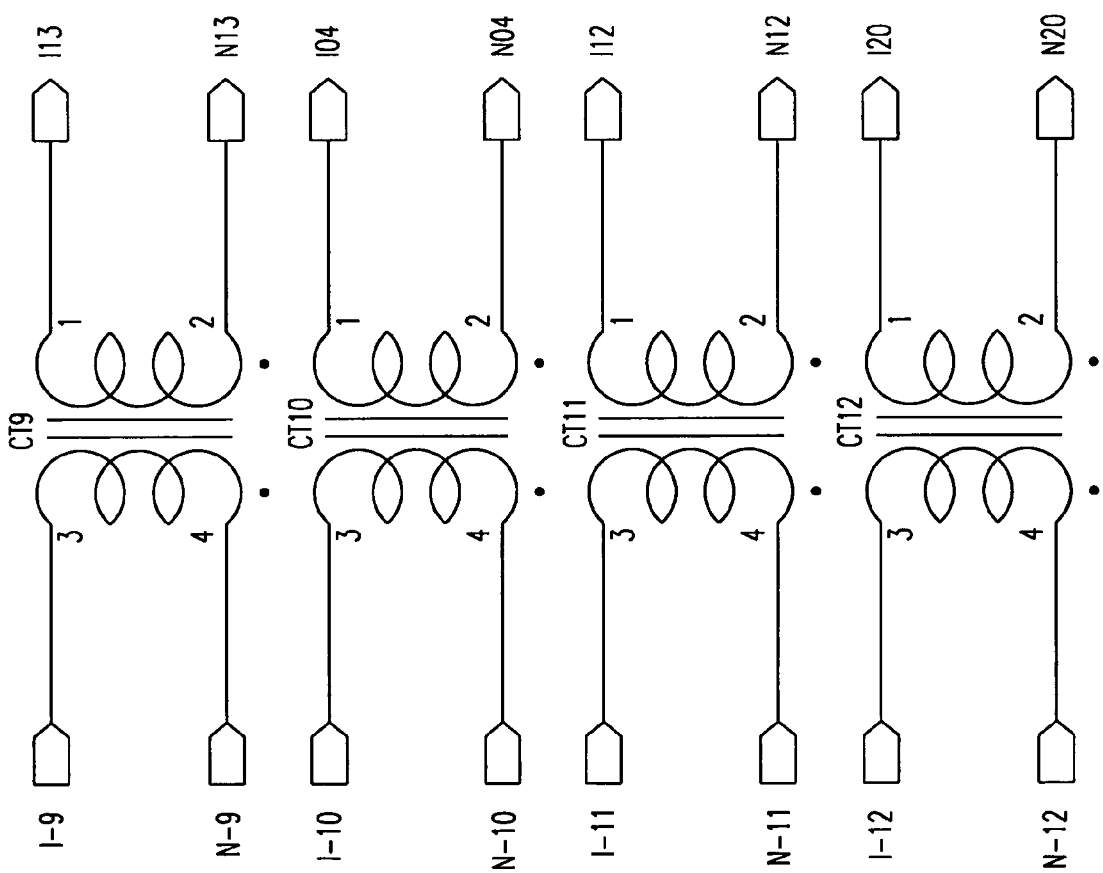
Figure 14H:
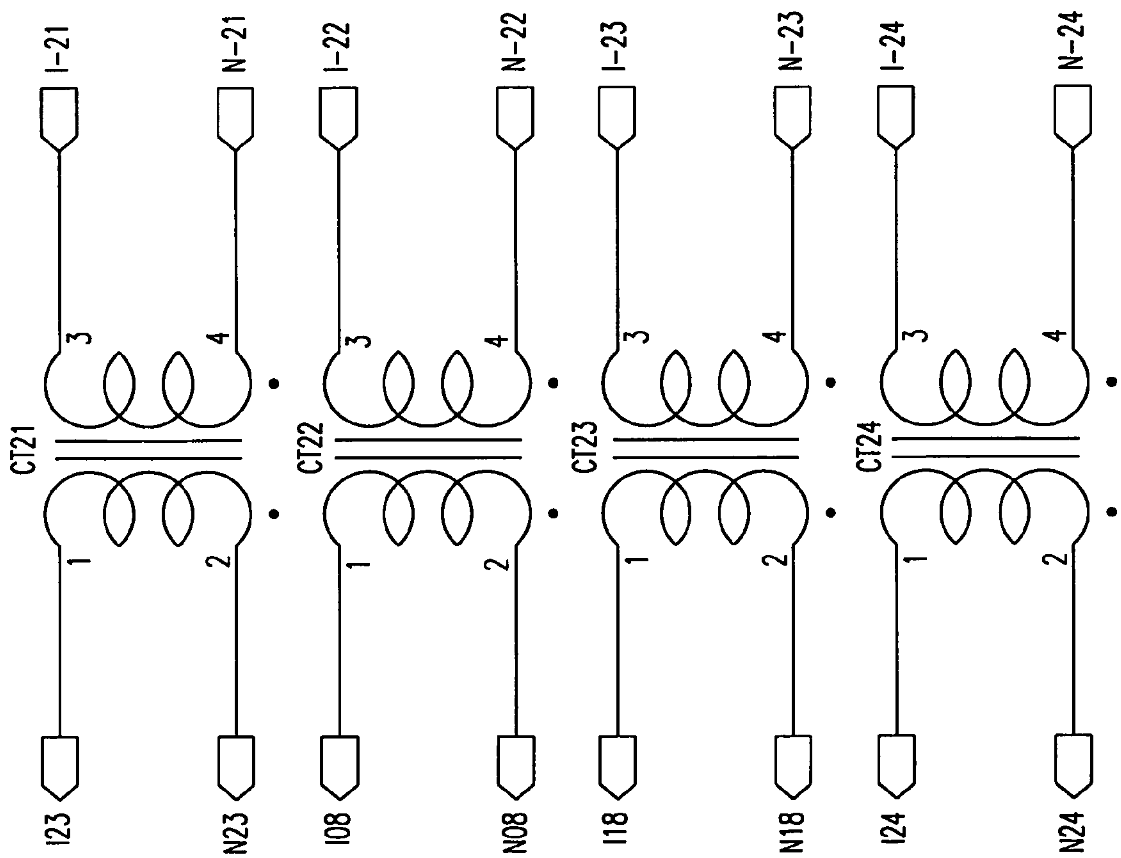

A 20 series schematic diagram can be found in FIG. 11C: CT1, CT2, and CT3 (in the upper right corner of the diagram) are inputs from the current transformer. They connect to resistor networks that convert the current source into a voltage level that is compatible with the ASIC (described below). PH-A, PH-B, and PH-C (in the bottom-central part of the diagram) are measurement voltage levels that enter a different resistor network and divide the voltage to a level that is readable by the ASIC. H3 (at the upper-central part of the diagram) is a header connection to the display board. H8 (near PH-A) is a header that connects high voltage phases. PLCX1, PLCX2, and PLC1 (near H3) are control signals that perform power line communication (PLC). U2 (in the right-central part of the diagram—near H7) is a microprocessor that is connected to a contact closure counting circuit. Contact closures are isolated by L3 and OPT1 through OPT6. Q4 and LED1 are the optical receiver and transmitter, respectively. The ferrite beads FB are intended to decouple high frequency noise. SW1, SW2, and SW3 are user access control switches. T1 is the transformer for the main power supply transformer for this unit. The input is 120/220 selectable by SW4. Power voltage is rectified and regulated. T2 provides an isolated power supply for an optional Modem Board attachment.

A third preferred embodiment (the "50 series") comprises an IEC bottom connect meter in which 100 amps at 200 volts 50 Hz pass through the meter to the customer and full complex plane (amplitude and angle) calibration of internal 10, 100, or 200 amp current elements to achieve high levels of calibration.

A fourth preferred embodiment (the "MC series") comprises a 24 channel meter that can be configured to 24 single phase loads, 12 apartment style loads, or 8 three phase commercial loads and provies economical per point cost.

The Transmeter MC series schematic diagram is of the PCB type TMX-5 and can be found in FIGS. 12A–C, 13, 14, and 15A. Note that the Low-level Transponder and the Transponder 5 also have PCB type TMX-5. Component placement determines whether the board is an MC series, Low-level Transponder, or Transponder 5. The circuits in FIGS. 12A–C, 13, 14, and 15A are discussed below.

Low-level Transponder: (1) receives instructions from Transponder to read a meter within its communication scope—typically one distribution transformer; and (2) can also be a meter to act as a check against loss due to theft. The Low-level Transponder schematic diagram is of PCB type TMX-5 and can be found in FIGS. 12A–C, 13, 14, and 15A.

Transponder: (1) reads Transmeters directly or via Low-level Transponders; and (2) communicates with fiber, phone or TCP/IP LAN. The Transponder schematic diagram is of PCB type TMX-5 and can be found in FIGS. 12A–C, 13, 14, and 15A.

TMX-5

The following are circuits in FIGS. 12A–C, 13, 14, and 15A.

H8 (see FIG. 12A) is a switch or adapter that selects between 120/220 VAC power supply voltage. Each phase is independently rectified and the rectified voltages are tied together. This requires only one of the power phases to be active for the system to receive power.

The transponder preferably has the ability to communicate on three power phases. There are three sets of PLC transmit and receive circuits (see FIG. 12A). A slave microprocessor U9 (see FIG. 15A, lower left) controls the transmit circuits by controlling the following: the PLC phase gating IC U11 (see FIG. 12A), level inverter IC U13 (see FIG. 12A), and analog inputs U14 (see FIG. 12A). J3 is the connector for serial communication to an external contact closure counter. Its power supply is current limited. The algorithms contained in the slave microprocessor are described by the HEX formatted file, PLCGATE.HEX in the attached Appendix.

There are 24 meter inputs (I0/N0 through I23/N23, shown in FIG. 13), each connecting to its own current-to-voltage resistor network. Metering is gated three phases at a time by analog multiplexers U2–U8 (see FIG. 13) into the ASIC by means of a slave microprocessor U8 (see FIG. 15A). Its master, the 68000, communicates with the slave to synchronize phase and timing. The algorithms contained in the slave microprocessor are described by the HEX formatted file, PHZGATE.HEX, in the attached Appendix.

SW1, SW2, and SW3 (see FIG. 13) are user access control switches.

H2 and H3 (see FIG. 14) are headers that connect to the current transformers CT1–CT24 (see FIG. 14) to current inputs.

MV-1, MV-2, and MV-3 (see FIG. 15A) are measurement voltage levels that enter a different resistor network and divide the voltage to a level that is readable by the ASIC.

H4, J1, and J2 (see FIG. 15A) are expansion headers that allow reading of more current channels.

H5 (see FIG. 15A) is a header connection to the display board.

J3 (see FIG. 15A) is a header that optionally connects with external pulse counters. The circuit involving Q8 provides a current-limited +5V supply.

Q7 and LED1 (see FIG. 15A) are an optical receiver and transmitter, respectively.

"Big Helper" Automated Reading and Billing Software

This software runs on the Billing Computer and preferably comprises the following functionality:

(1) Read all Transponders to obtain required metering data from all Transmeters.

(2) Compare metering data with specified limits or historical data to identify suspicious readings or equipment failures at the earliest possible time.

(3) Compare Low-level Transponder energy readings with those of the corresponding Transmeters® to identify theft.

(4) Automatically select the best route to each Transponder, whether it be fiber, telephone, RS-485 or via the Internet to a satellite billing center running the Big Helper Software. This allows one billing center to use the Internet to connect to other centers in distant places without the use of long distance telephone service.

(5) Store data to an MV-90, Oracle® (or other equivalent) database for generation of bills.

(6) Seamlessly interconnect over the Internet to form a WAN of billing computers, each associated with a different set of Transponders.

Alternate Embodiments

Gas and Water Meter Interfaces

In the 20 series embodiment (see FIG. 11C), the gas and water meter interfaces continue to accumulate contact closures in the absence of electric power applied to the electricity meter. This is important for an electric company that wishes to sell meter reading services to water and gas utilities, yet guarantee data integrity even when electric power is out for an extended period of time.

A contact-closure counting microprocessor is powered by a diode OR of the +5V supply and on-board battery, enabling contact-closure counting in the absence of power. The pulse microprocessor accumulates counts in its internal registers and sends the data to the main processor via serial transfer. To sense the state of the contact closure, the microprocessor energizes the primary of a pulse transformer. The contact closure points are in series with the secondary of the pulse transformer. If the contact is closed, the diode in an optical isolator is forward biased. This energizes its photo detector, which is a sample-and-hold capacitor. The microprocessor reads the level on the capacitor as low. If the contact is not closed, the optical isolator is idle. The capacitor recharges and is read high. The algorithms contained in the pulse microprocessor are described by the HEX formatted file, PULSE.HEX, in the attached Appendix.

Opto Adaptor

The Opto Adaptor (Optical Adaptor) converts RS232 into an optical signal that can be read by each meter. This board enables any meter to communicate with any computer through its serial port. An Opto Adaptor schematic diagram can be found in FIG. 16. U1 converts RS232 to TTL levels. Q1 and Q2 are gain transistors to drive the optical transmit LED1. Q5 is the optical receiver. Q3 provides gain and Q4 inhibits the receiver.

Modem Board

Figures 1, 17A:
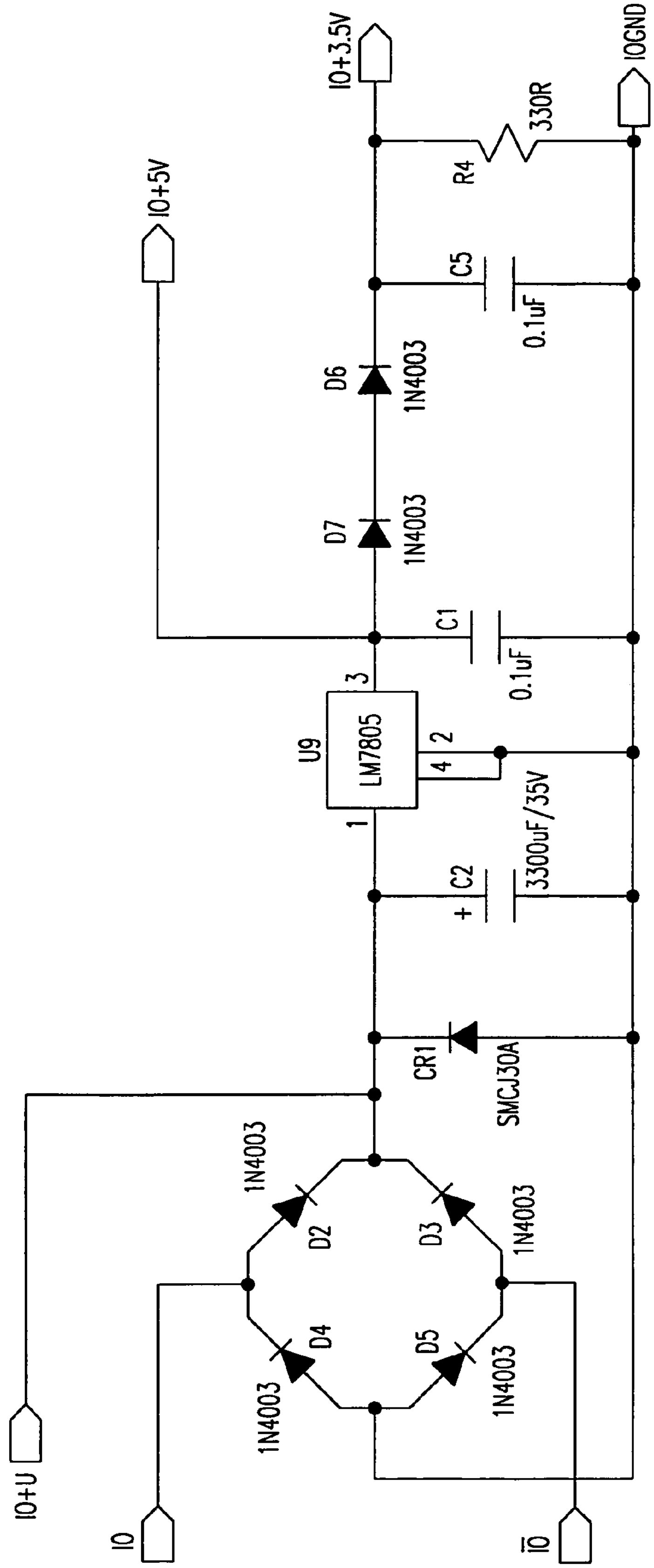
FIGS. 17A–B is a Modem Board schematic diagram.
Figures 2, 17A:
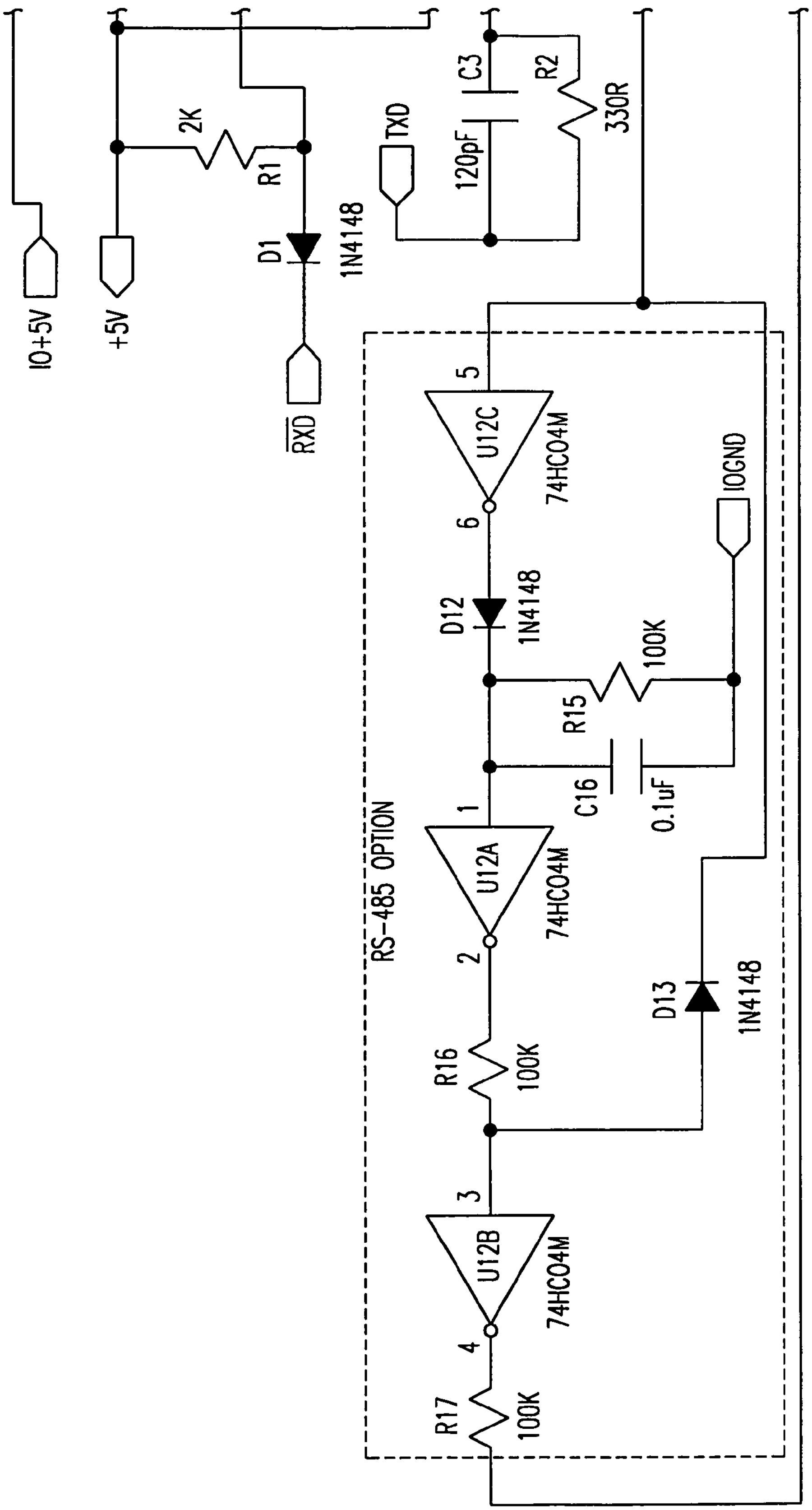
Figures 3, 17A:
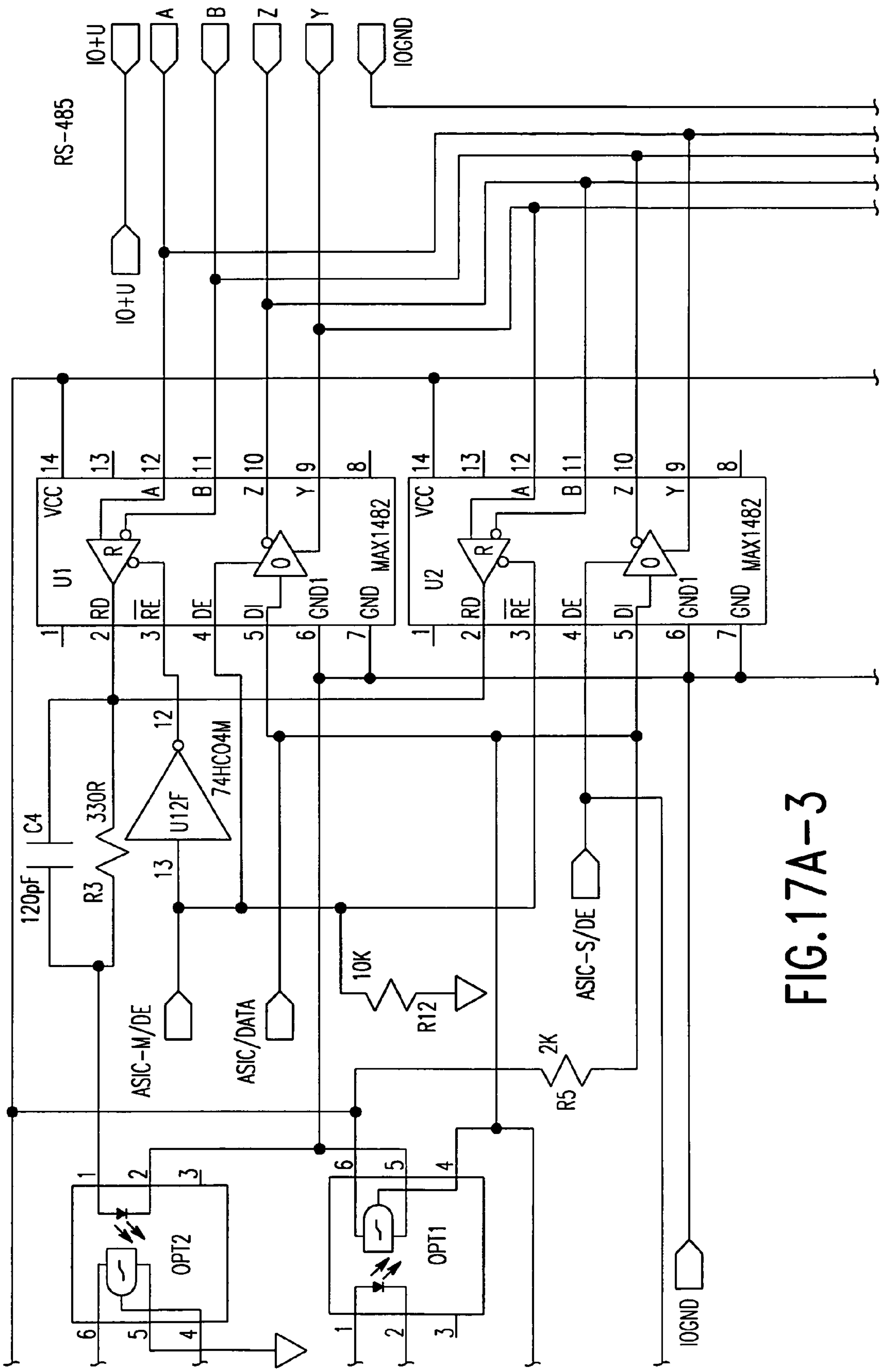
Figures 4, 17A:
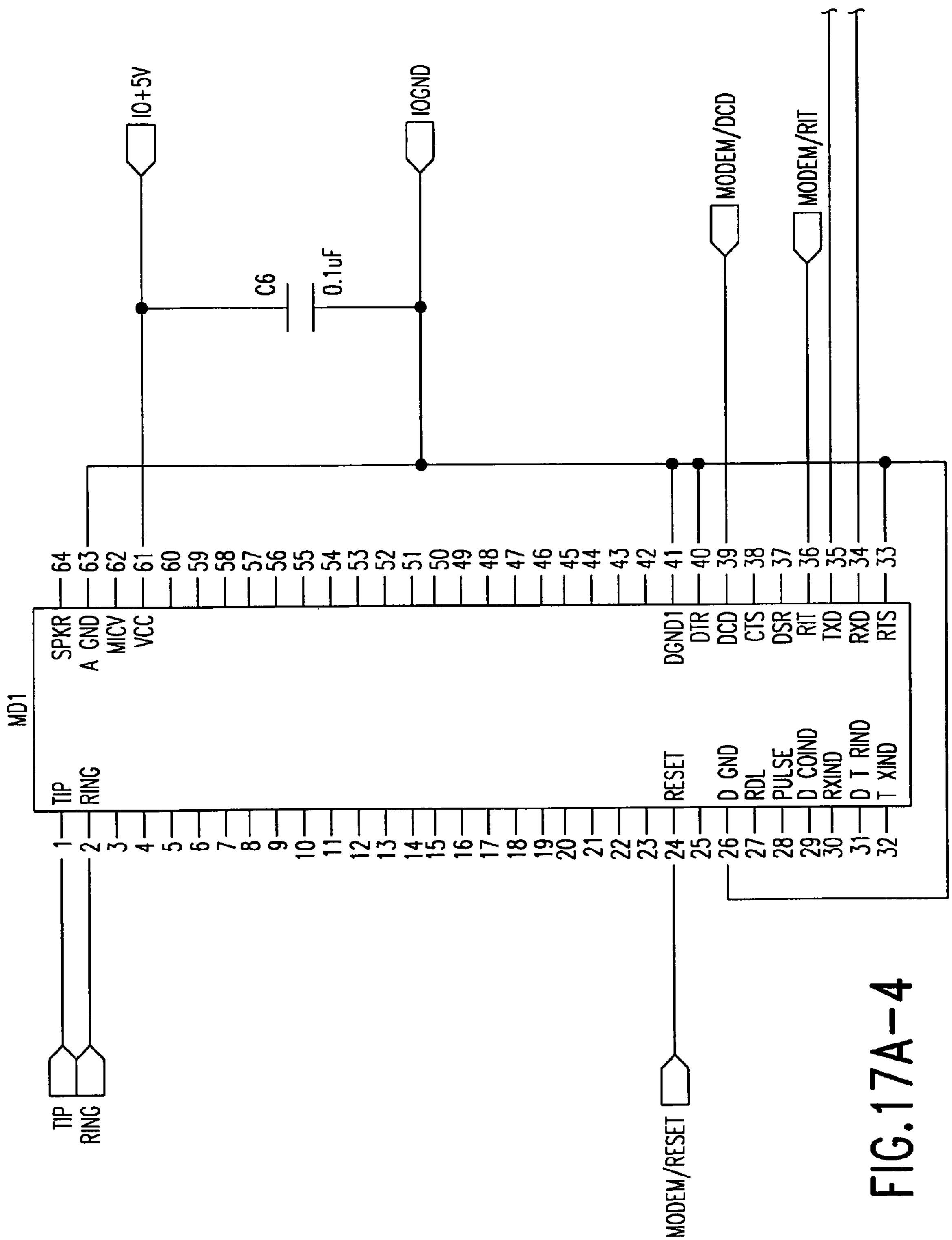
Figures 5, 17A:
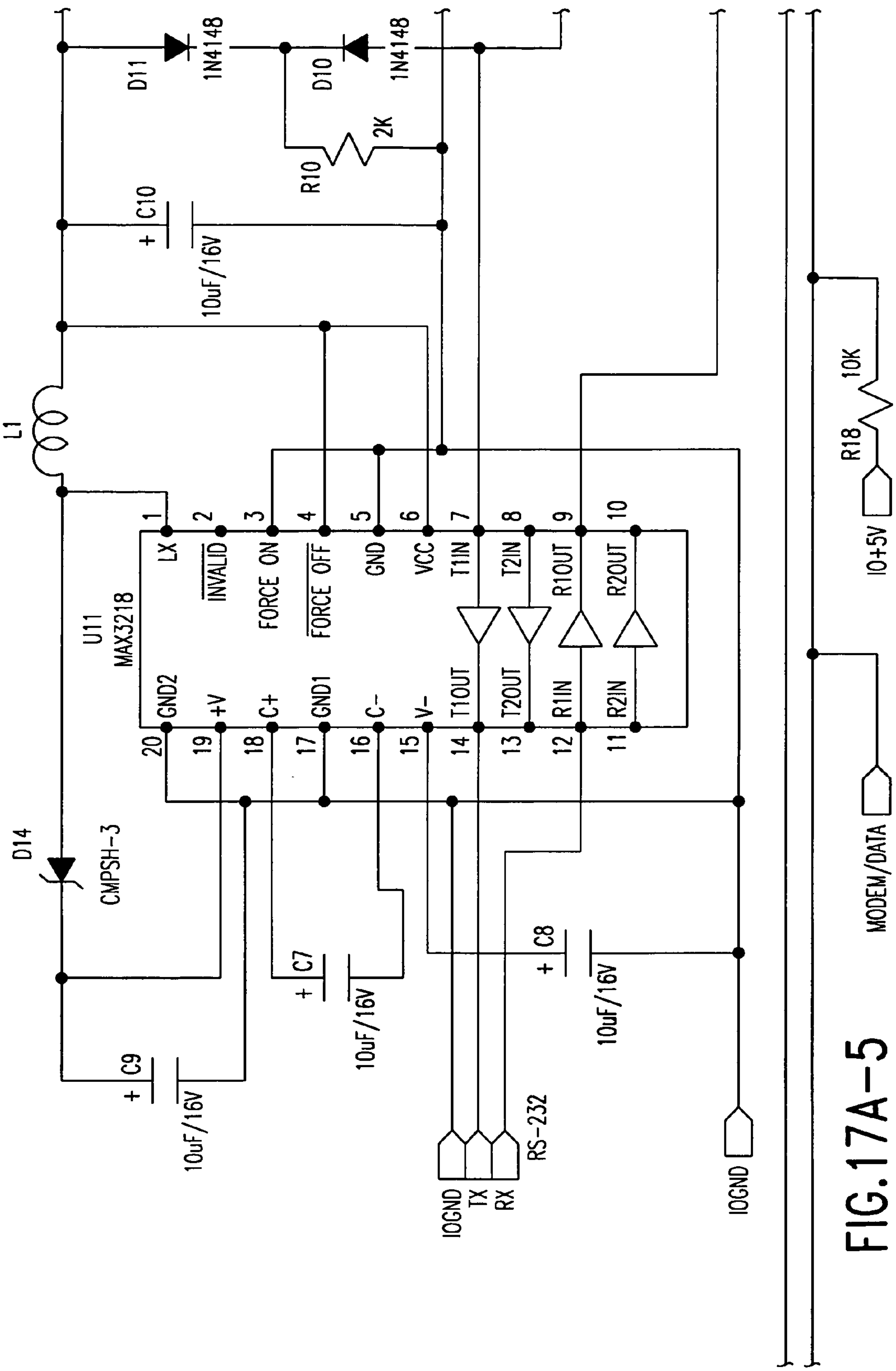
Figures 6, 17A:
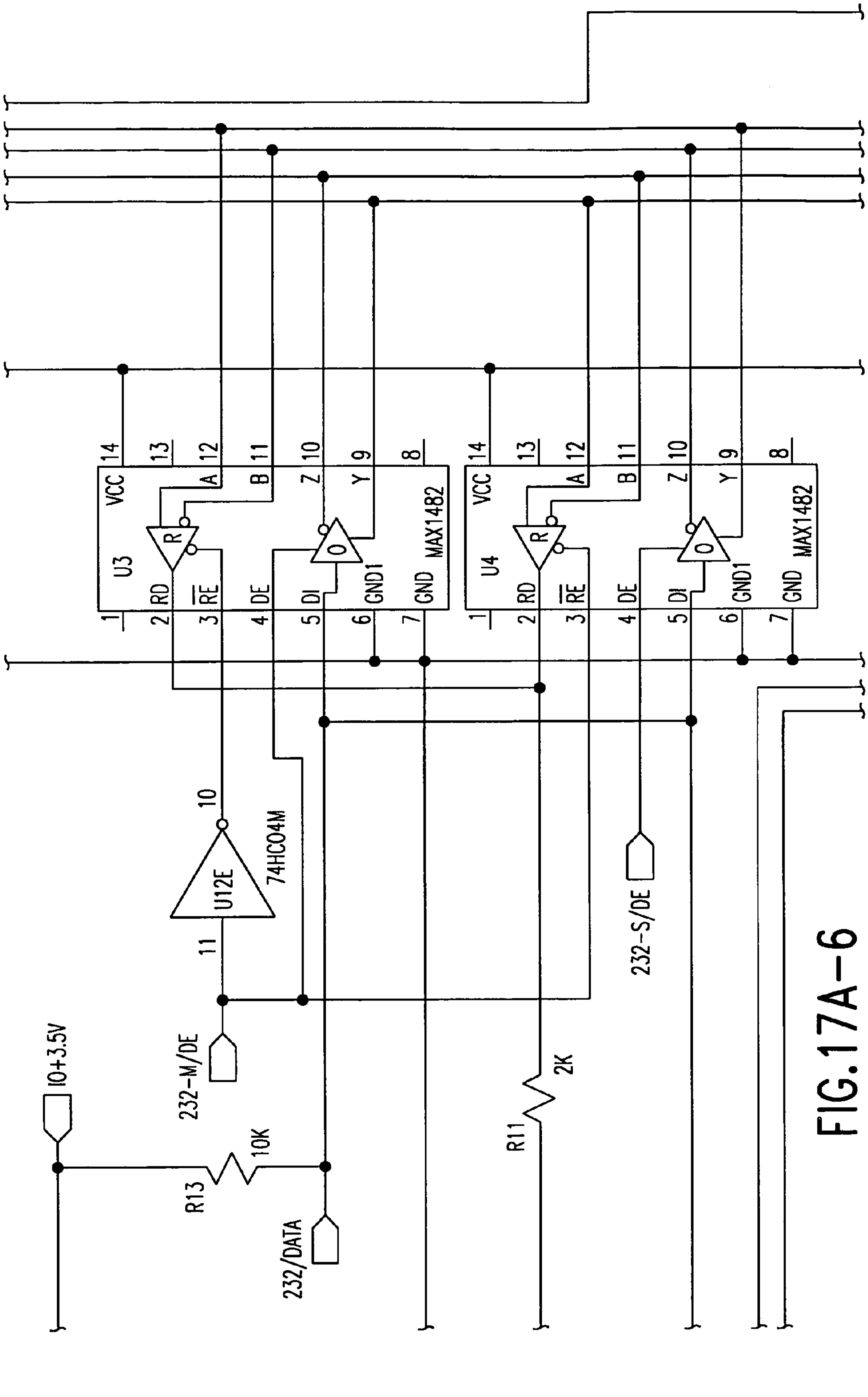
Figures 7, 17A:
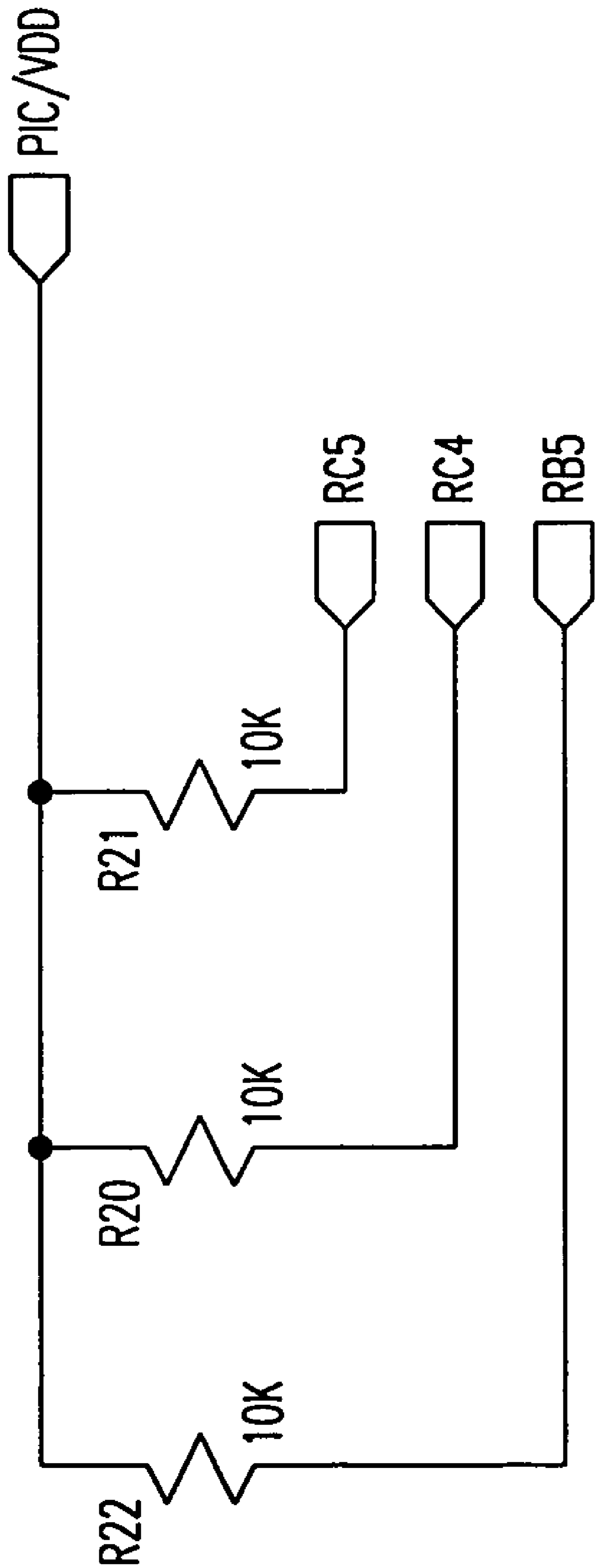
Figures 8, 17A:
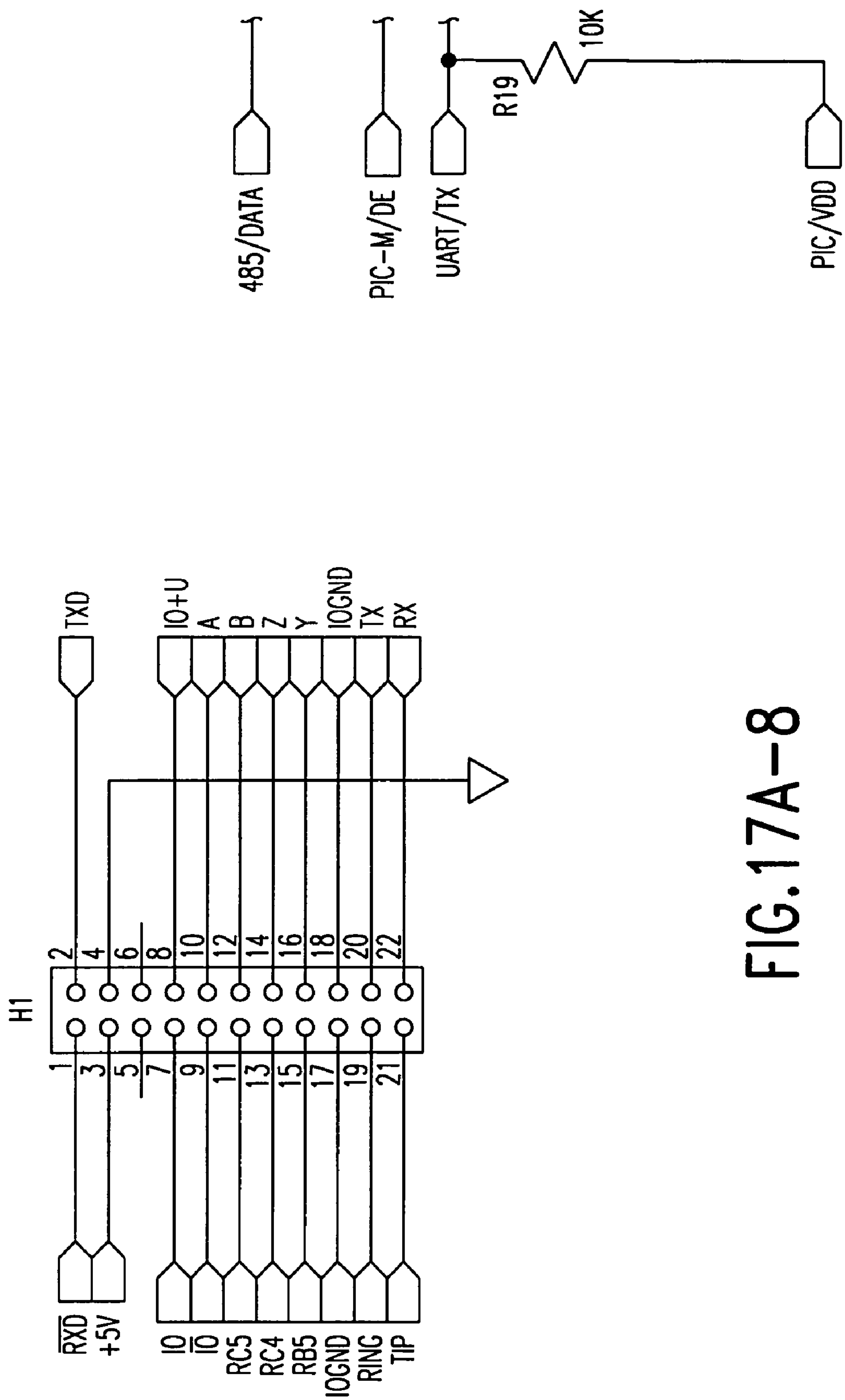
Figures 9, 17A:
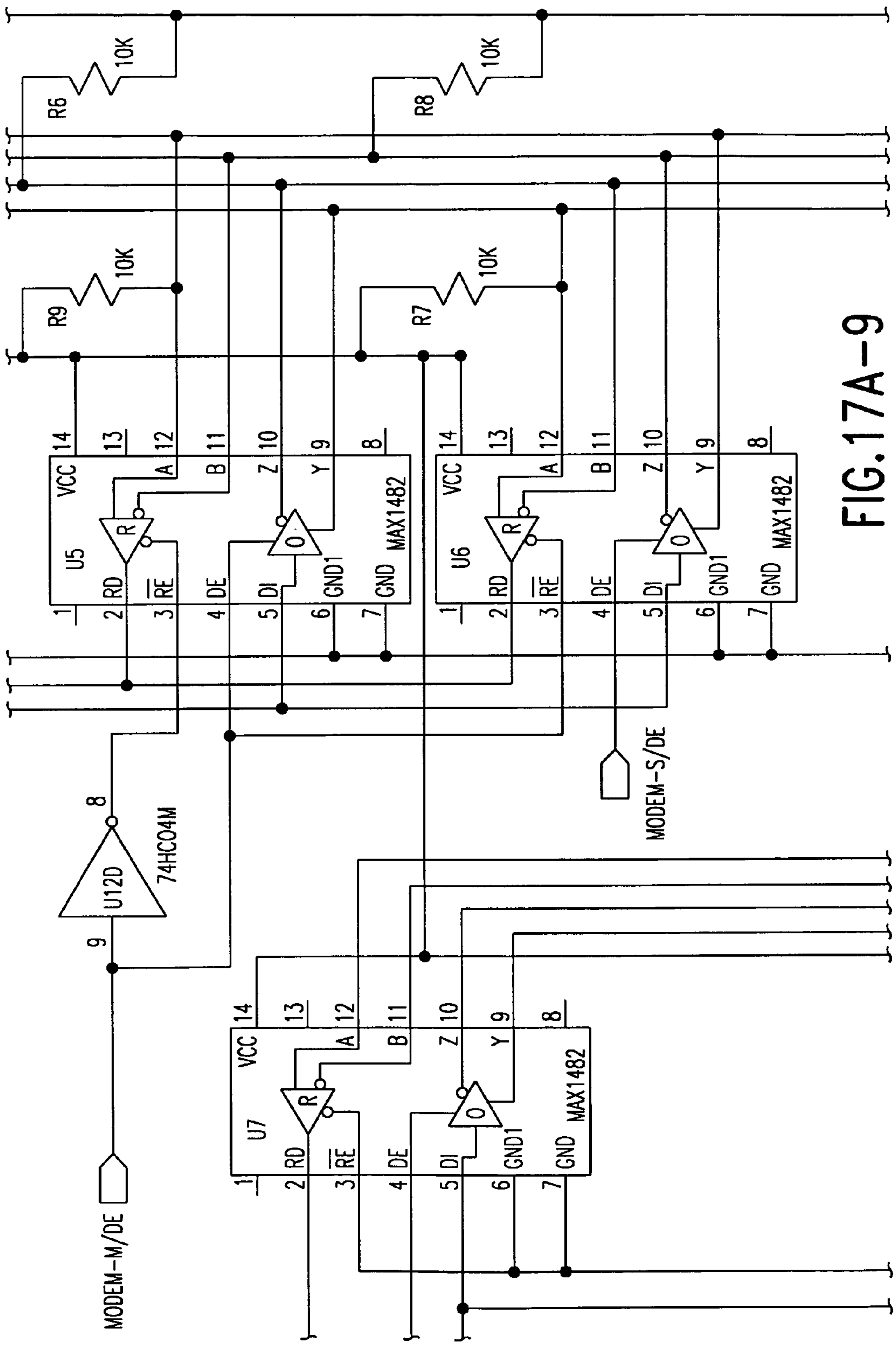
Figures 10, 17A:
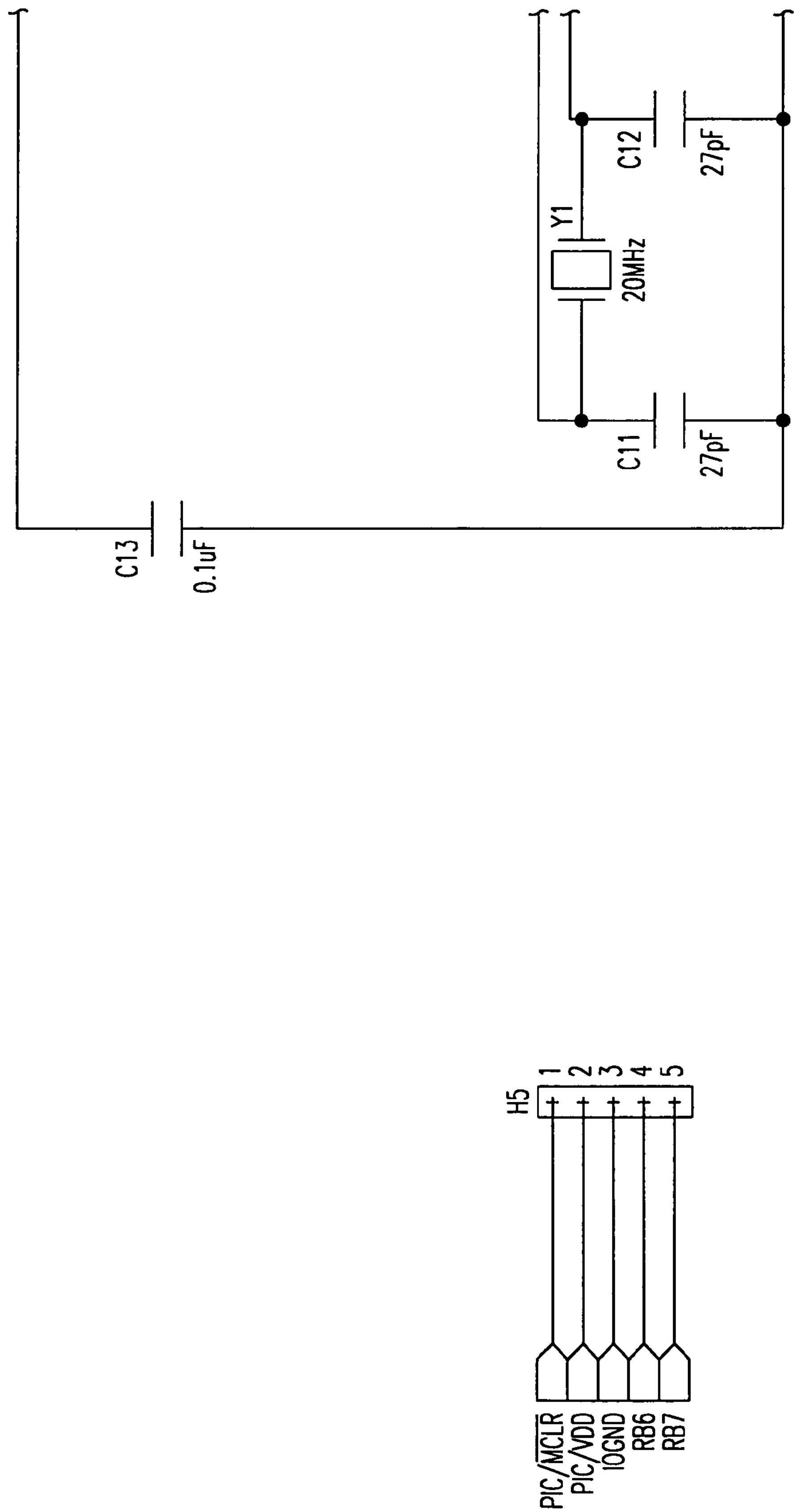
Figures 11, 17A:
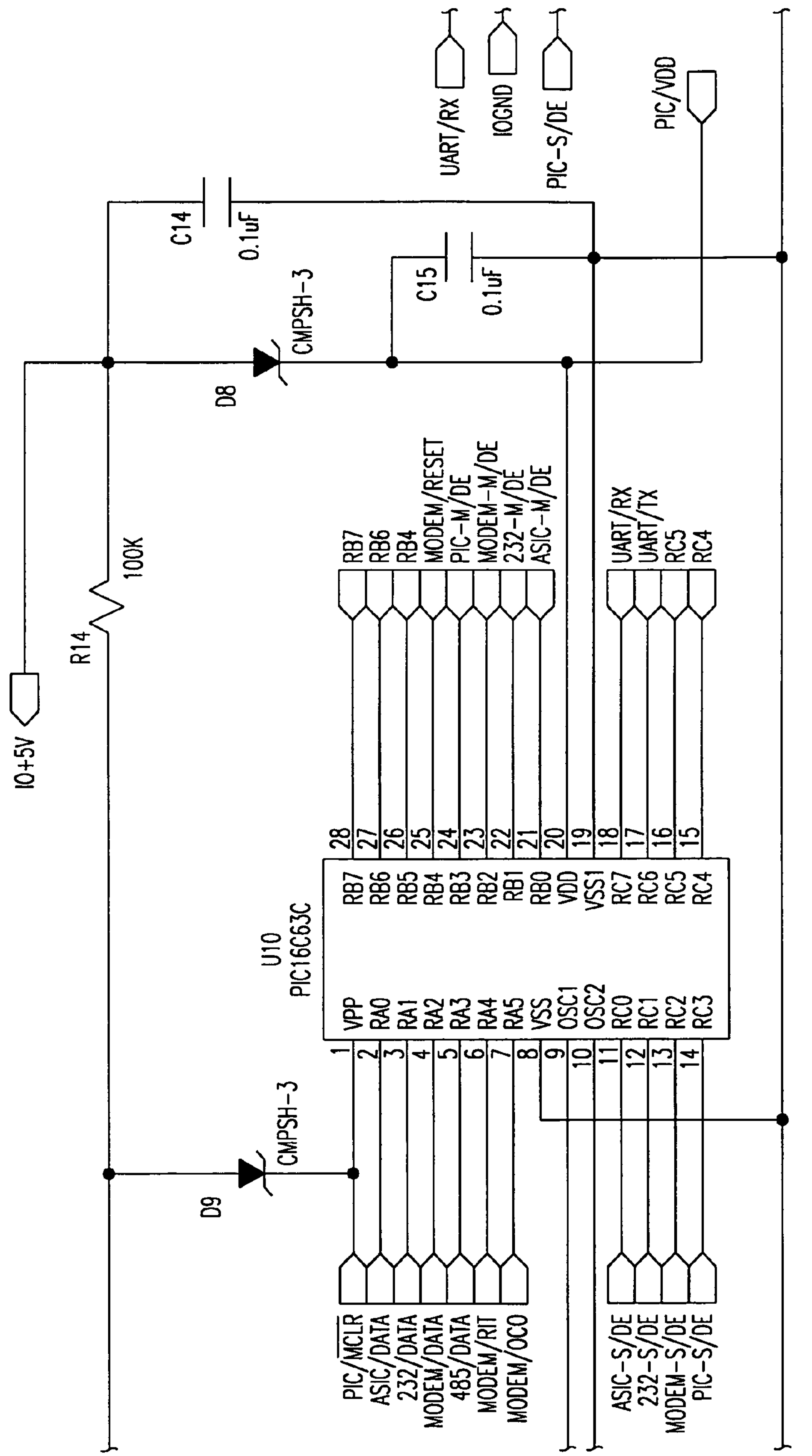
Figures 12, 17A:
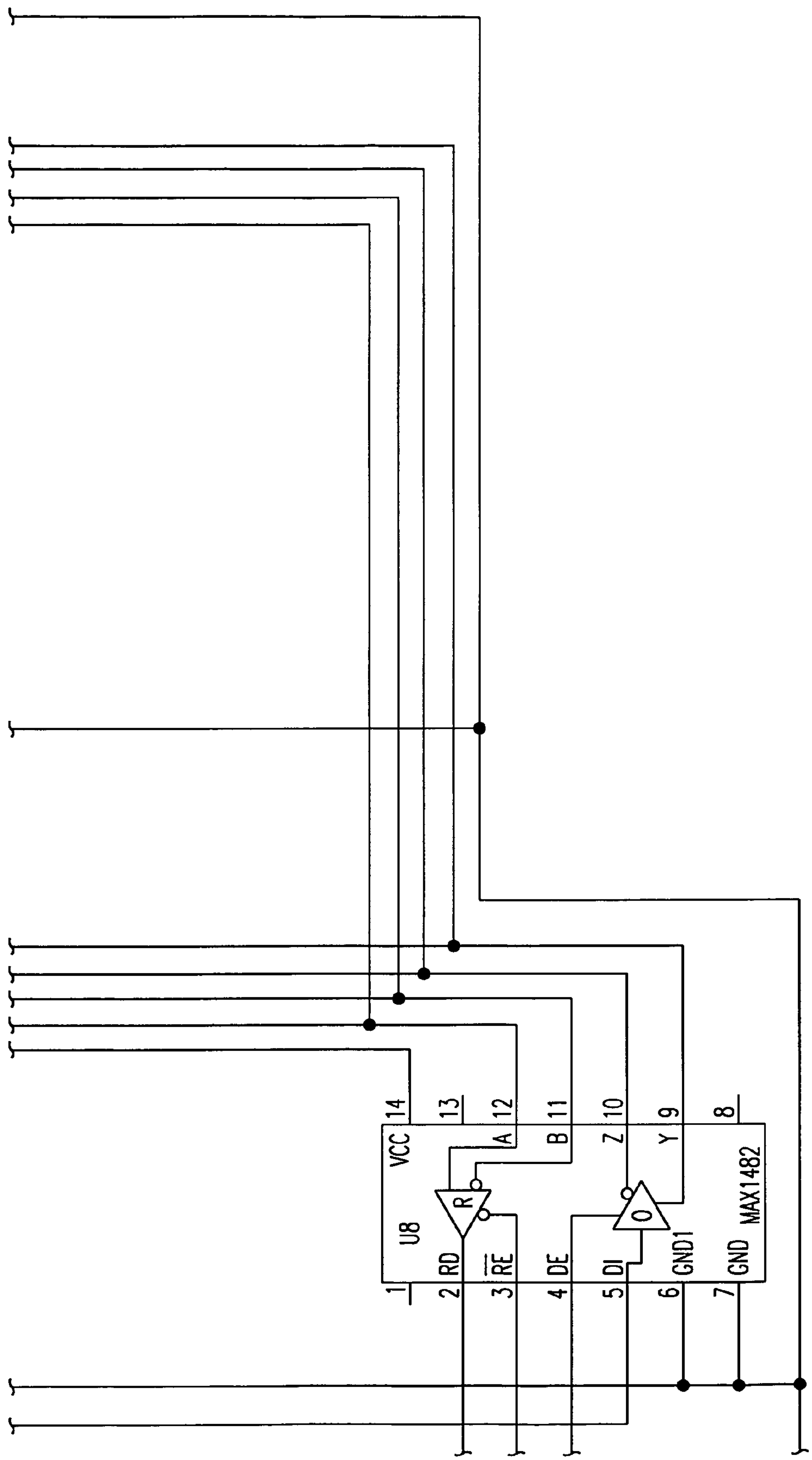
Figure 17B:
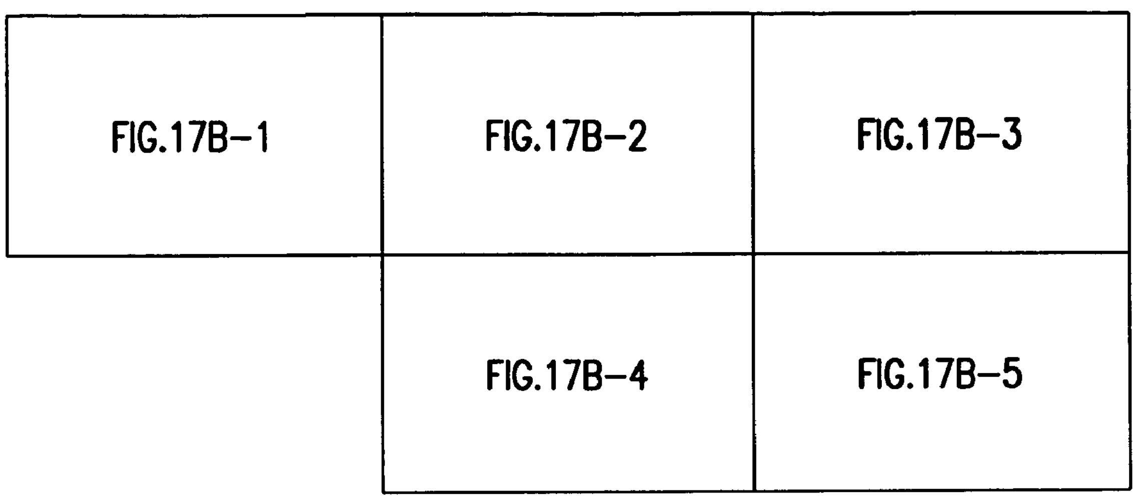
Figures 1, 17B:
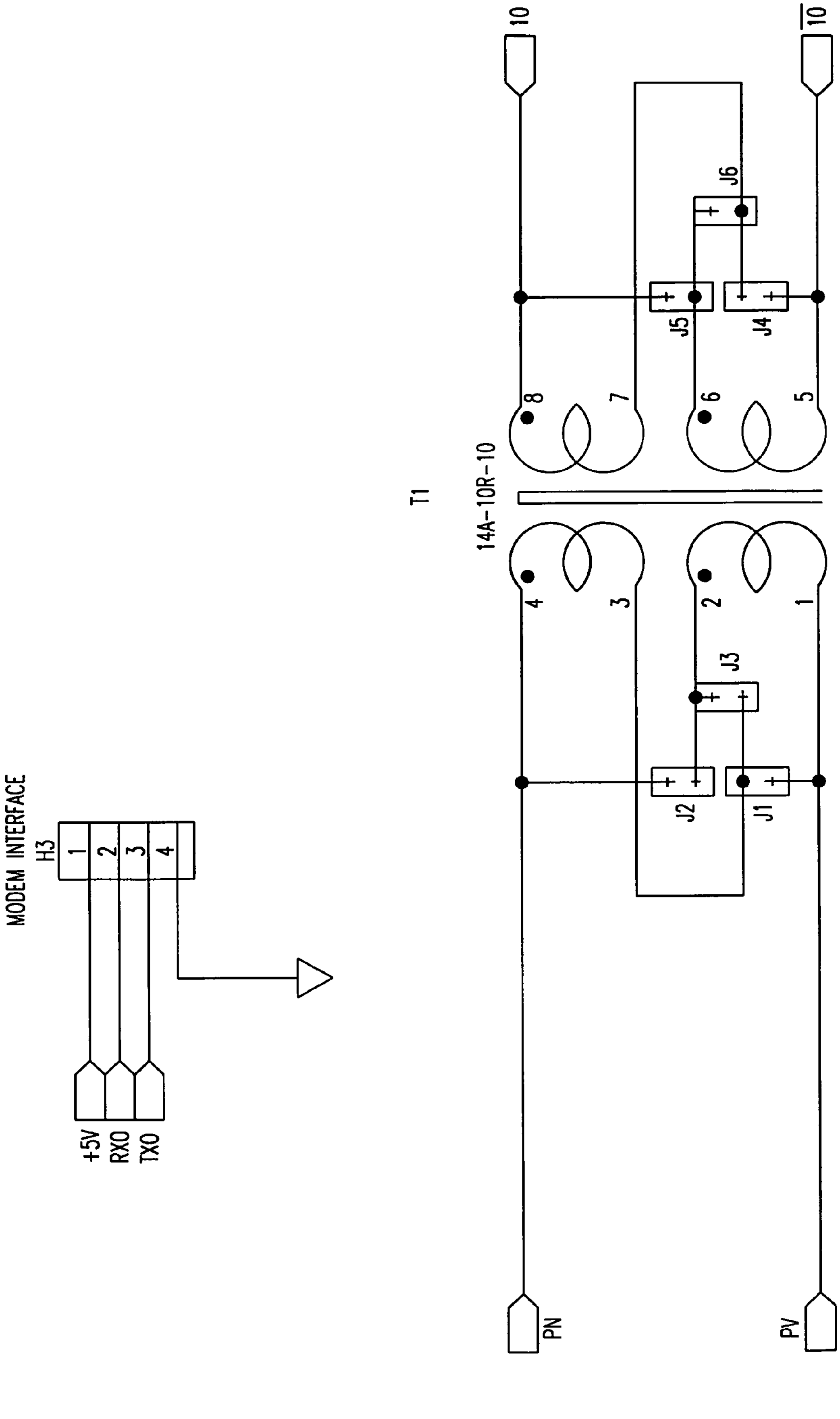
Figures 2, 17B:
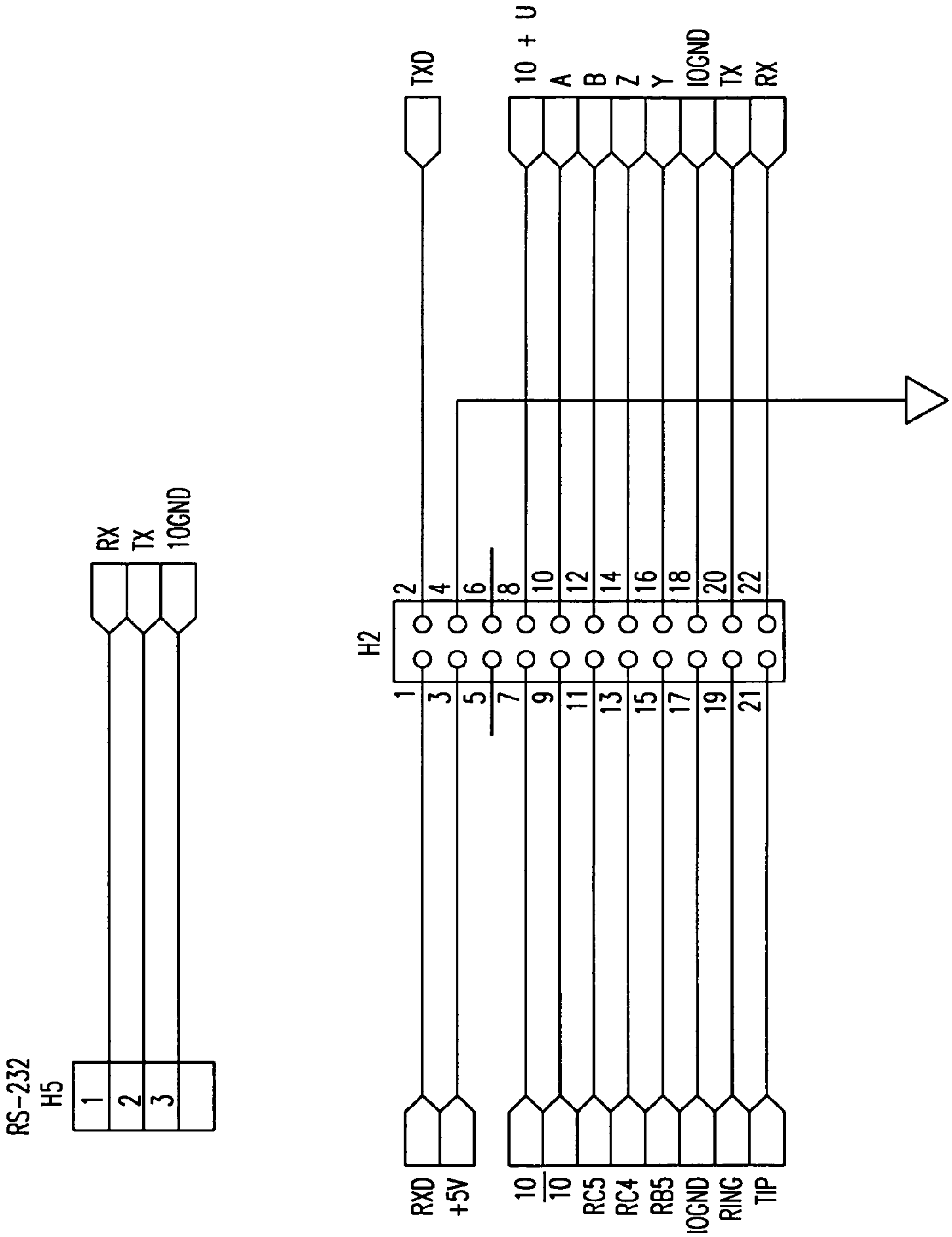
Figures 3, 17B:
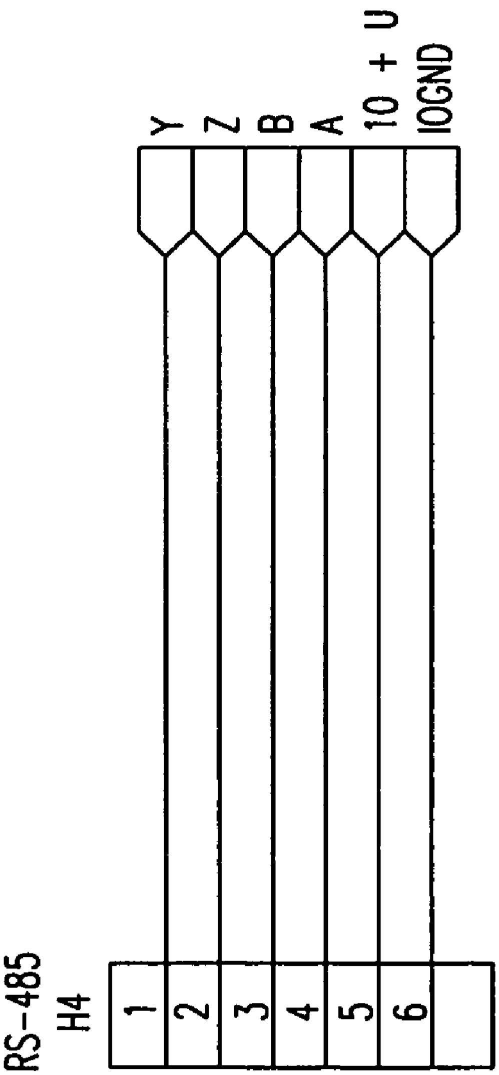
Figures 4, 17B:
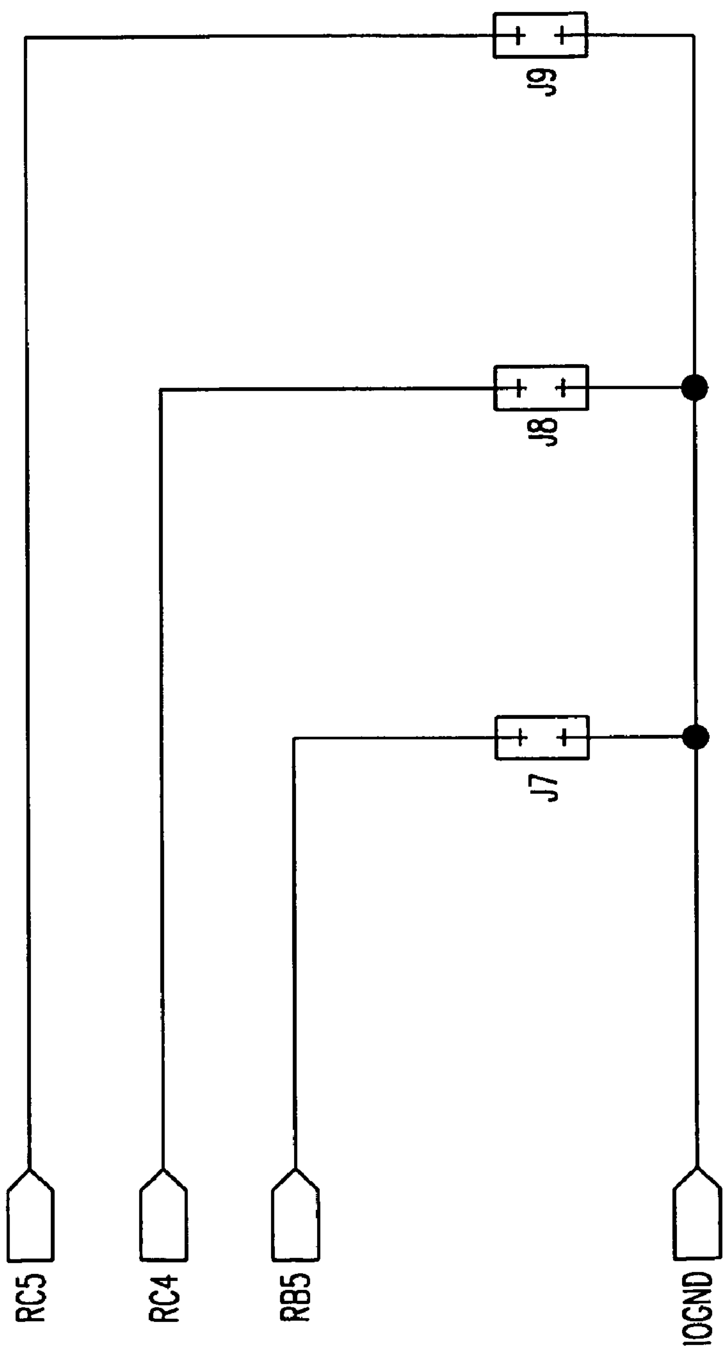
Figures 5, 17B:
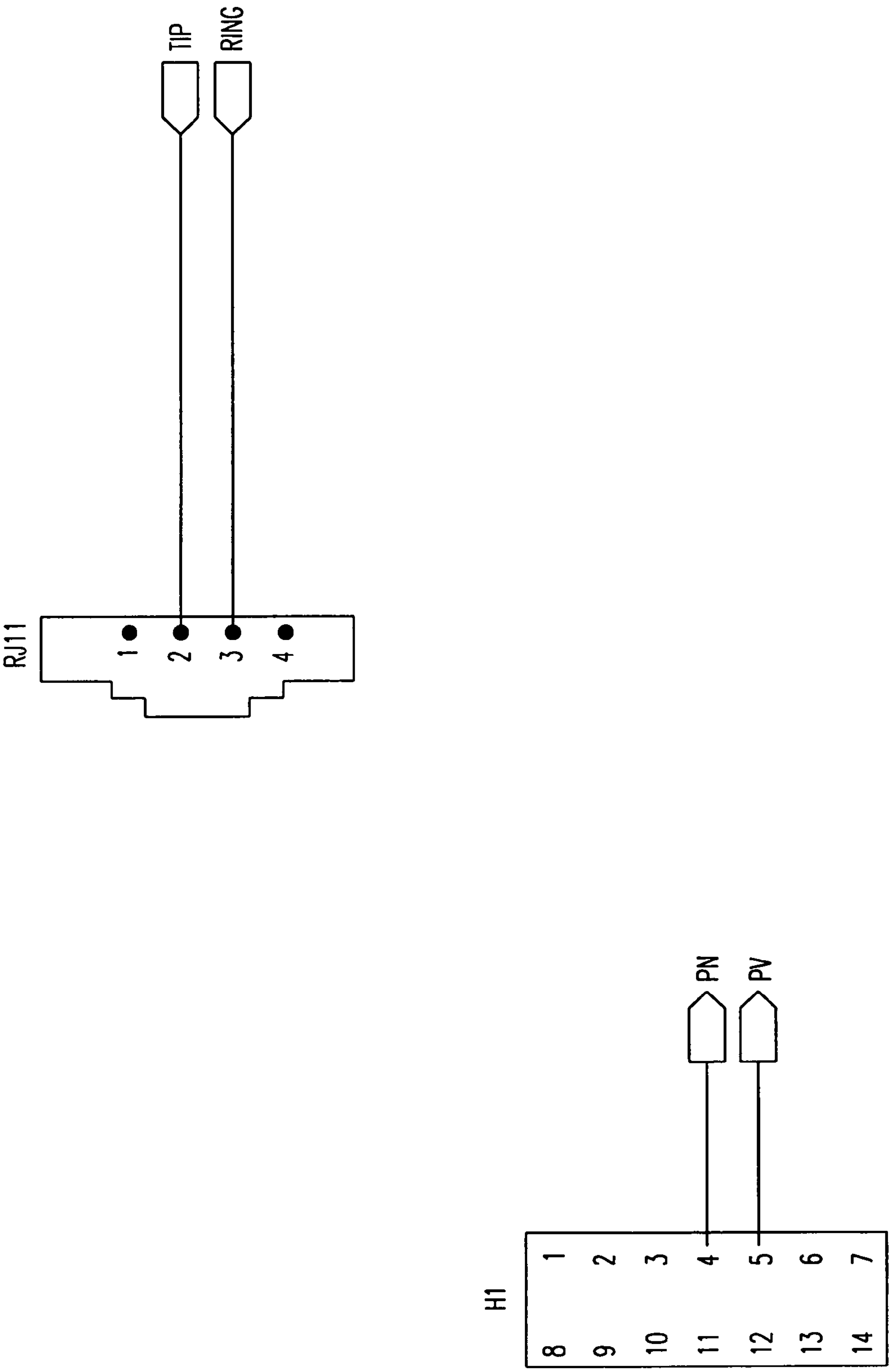

The Modem Board is so named because its on-board modem permits remote dial-in communication to other devices through different communication schemes. The Modem Board schematic diagram can be found in FIGS. 17A–B. Each Modem Board is attached to a Mother Board containing an ASIC. Each Modem Board consists of a modem MD1, external RS232 (via H4), external RS485 (via H1), and an on-board microprocessor U10. The modem, RS232, the Mother Board, microprocessor, and external RS485 all communicate across the R5485 bus by means of TTL/RS485 converters (U1–U8). U11 converts incoming RS232 to TTL levels. U12 rectifies signal levels for RS485 converter controls. The phone line is connected to RJ11. Power into the rectifier and regulator come from H2. H5 is the header that allows factory programming of U10.

To avoid bus conflicts, the on-board microprocessor arbitrates Master control and Slave control over these devices. The algorithms contained in the microprocessor are described by the HEX formatted file, MODEM.HEX, in the attached Appendix. The modem board's Auto Hunt feature seeks and adjusts to one of three appropriate baud rates 9600, 19200, and 38400.

Calibrator

The meter is calibrated automatically by a fully automatic calibrator. The calibrator: (1) can calibrate the meter at 20 points for both amplitude and phase; (2) calibrates each phase of the meter independently; (3) stores calibration constants in the non-volatile flash memory of the Transmeter; and (4) archives calibration records to the manufacturing database. The calibrator is described more fully below.

The ASIC

Meter Component

The ASIC of a preferred embodiment has an advanced electric meter with the following features:

(1) Automatic Autoranging Current and Voltage Amplifiers. The ASIC amplifiers sense the level of current and adjust to the level automatically in hardware. The ASIC voltage amplifiers are controlled by the external microprocessor.

(2) Automatic sample and hold timing logic. Allows for calibration of angle errors.

(3) Late voltage sampling logic and line frequency meter. Allows for generation of precise 90° phase shifted waveform for calculation of reactive power and energy.

(4) Offset DAC—allows for automatic firmware controlled amplifier offset correction.

(5) 12 BIT DAC with calibration points. A 12 BIT DAC with only 8 bits of accuracy is calibrated with digitally selected current sources to achieve 12-bit resolution and monotonicity.

(6) Auxiliary inputs to read battery voltage, power supply voltage, signal voltage from powerline modem and external analog quantities.

(7) Use of one of the analog inputs to compensate the temperature curve of the ADC to achieve better accuracy. Reads a fraction of the reference voltage generated with a voltage divider to maintain a constant scale factor over temperature..

(8) A digital potentiometer with 64 tap points used to digitally calibrate the voltage reference to within 0.1% from an initial accuracy of 5%.

(9) Read the voltage on a common silicon diode to obtain an analog of temperature. Storing N pairs of calibration position from (8) above and temperature diode voltages can fit a curve of degree N−1 to the temperature variation, precisely controlling the temperature variation of the reference voltage. The diode is also used to correct the temperature variation of the real time clock crystal.

Powerline Modem Component

The ASIC of a preferred embodiment has a powerline modem with the following features:

(1) An adjustable gain, adjustable frequency analog bandpass filter with minimal external components.

(2) A circuit to allow continuous calibration of the gain and center frequency of the bandpass filter under microprocessor control.

(3) A bandpass delta-sigma modulator to convert the analog data to a digital stream.

(4) A digitally implemented demodulator unit capable of adjusting gains and demodulating either fsk or bpsk data.

(5) A digitally implemented fsk and psk modulator.

(6) A digitally and software implemented data clock that uses the line frequency or a multiple thereof as a common synchronous data clock throughout the system network.

Digital Control and Memory

The ASIC of a preferred embodiment contains many circuits that control the external devices on the Display Board: (1) a Motorola 68000 bus generator; (2) memory control logic; (3) a real-time clock (RTC); (4) a watchdog timer; (5) 4 kBytes of CMOS battery backed RAM; (6) digital I/O; (7) tamper switch detection that continues to operate on battery; and (8) a bootstrap ROM for loading a secondary bootstrap program to internal RAM.

Firmware

Firmware controls many of the above-mentioned features of metering with advanced calibration algorithms, powerline communication protocols, liquid crystal displays, serial data interface. See 28130104.S in the attached Appendix.

The firmware provides an Advanced Data Integrity Method by providing a flash memory audit trail for added protection against data loss.

The firmware also provides a Data Log of Energy and Event Information, since the audit trail of energy information is commercially valuable under deregulation to ESCOs, utilities and end-users.

The firmware works with the Calibrator and (optionally) a Toaster (a test apparatus) to calibrate:

(1) The ADC. Realize 12 bits from an 8 bit limited CMOS process.

(2) The voltage reference. Obtain 0.1% accuracy from a 5% device.

(3) The internal current transformers (both amplitude and phase—a complex plane calibration), at 20 separate logarithmically-spaced points throughout the load curve.

(5) All components in the metering circuit, (6) The time clock's 32768 Hz crystal.

The firmware also provides Temperature Compensation Methods, since it: (1) uses a temperature diode to calibrate the voltage reference and time clock over temperature; and (2) uses a resistor divider on the voltage reference to calibrate the ADC over temperature.

The firmware also provides Self Calibration Methods, since it: (1) calibrates the bandpass filters periodically, and (2) adjusts the offsets in the meter circuits continually.

Also, the firmware provides Advanced Metering Parameters, since it:

(1) Uses a unique sample and control algorithm to provide all metering quantities. This method is fully determined by the program in the 68000, which controls the ASIC.

(2) Measures line frequency and create virtual 90 degree shifted voltage waveform for reactive power.

(3) Uses real, reactive and apparent power to calculate power factor, total harmonic distortion and phase angle.

The firmware can also automatically determine the proper range for: (1) Voltage; (2) Current; (3) Powerline signal; and (4) Demodulator parameters.

A more detailed description of the ASIC, its components, and its functionality are provided below.

Figure 15A:
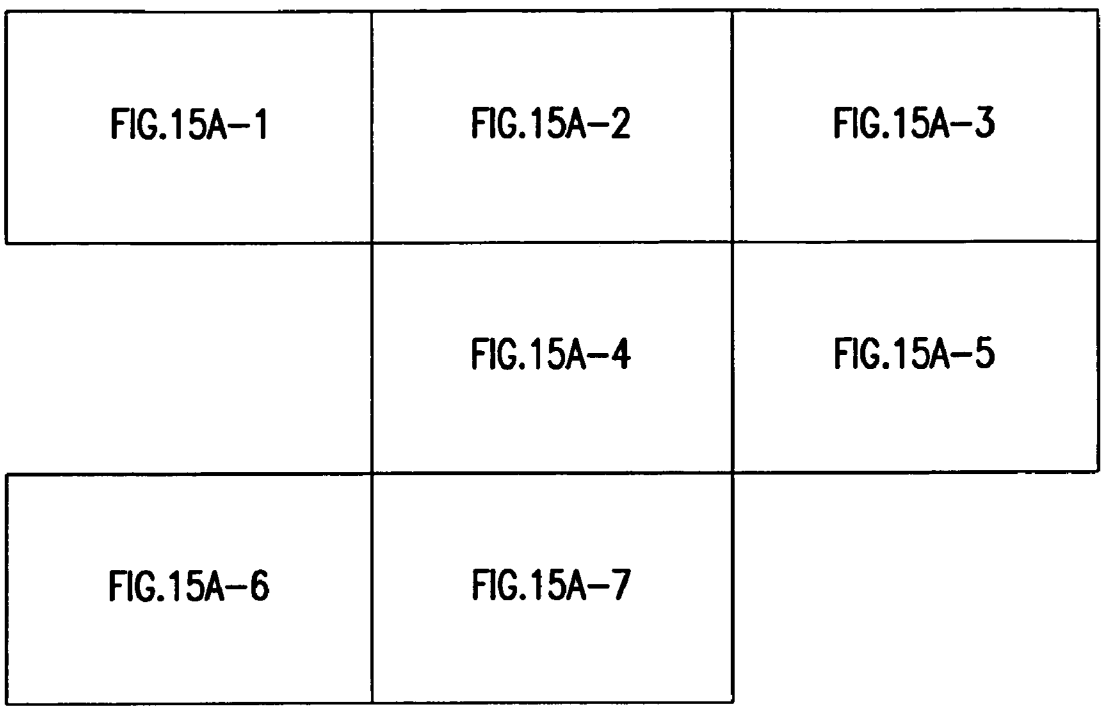
Figures 1, 15A:
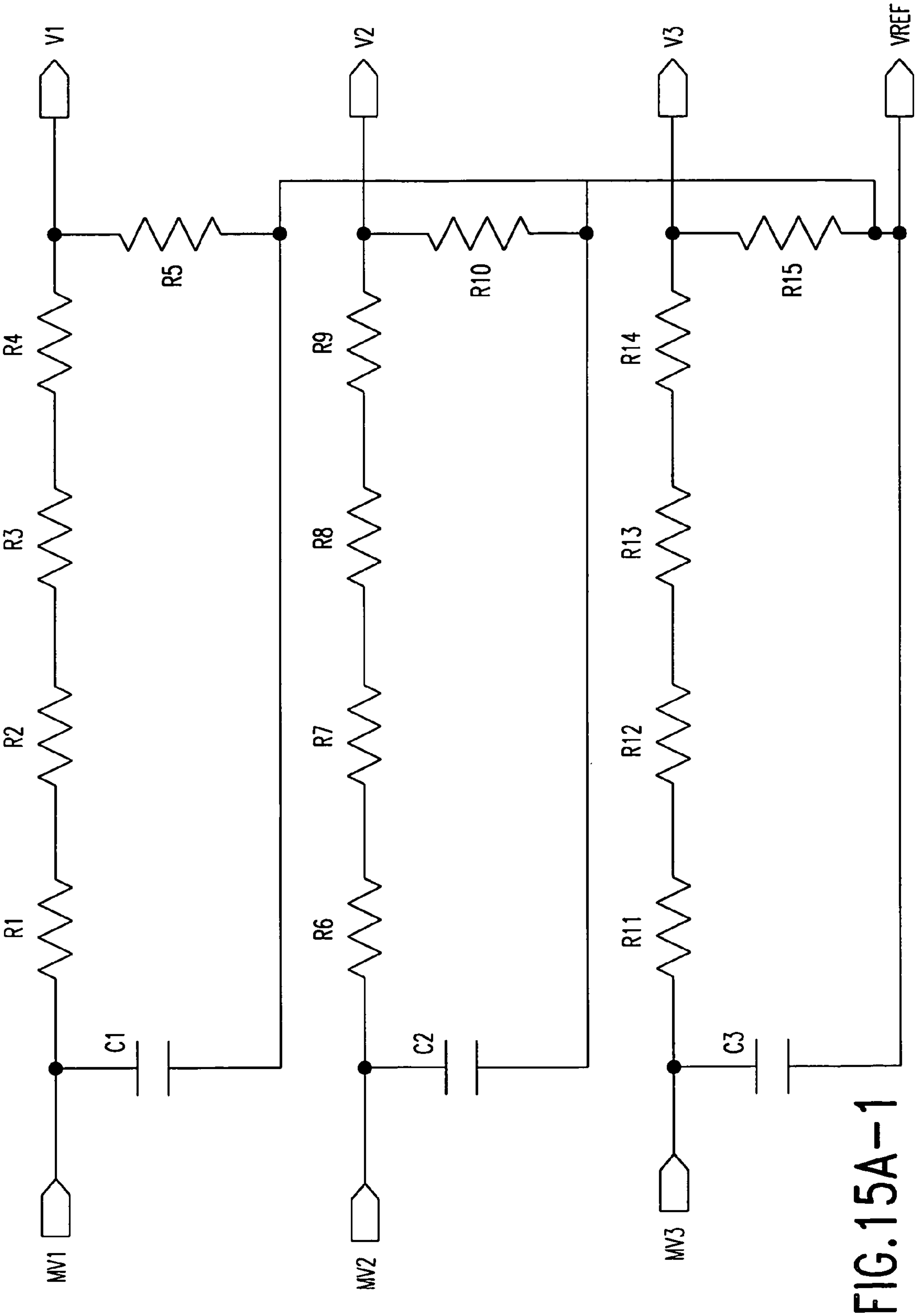
Figures 2, 15A:
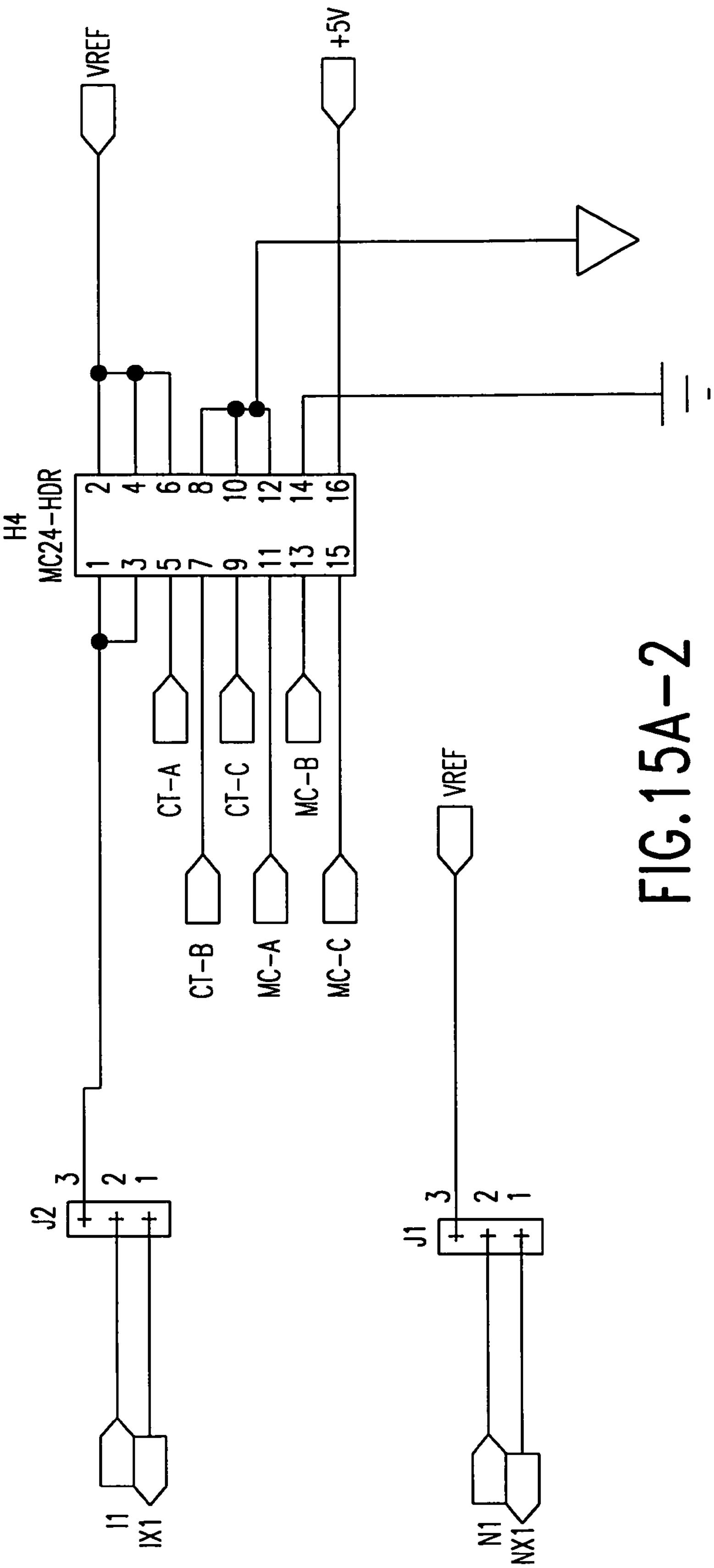
Figures 3, 15A:
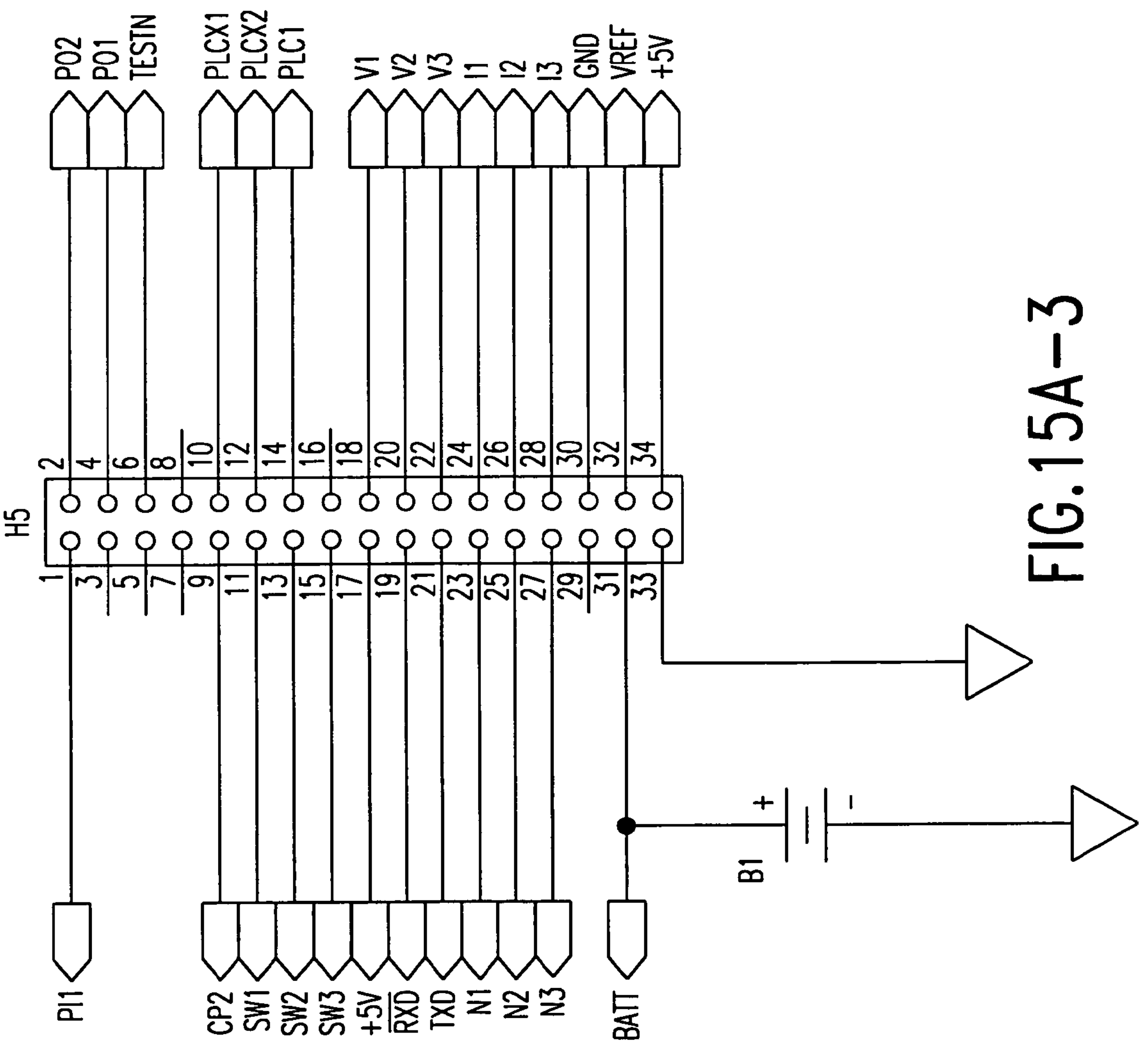
Figures 4, 15A:
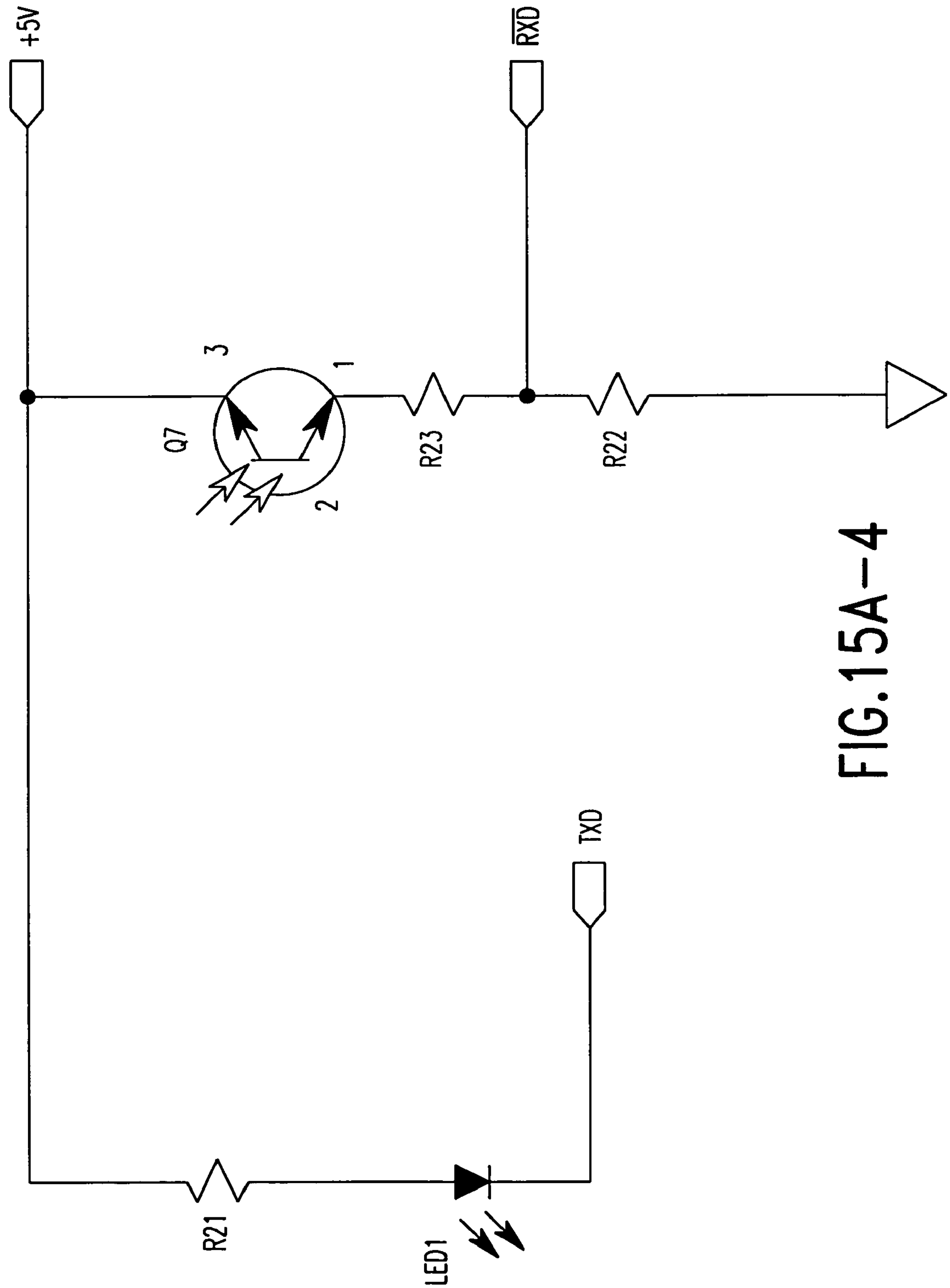
Figures 5, 15A:
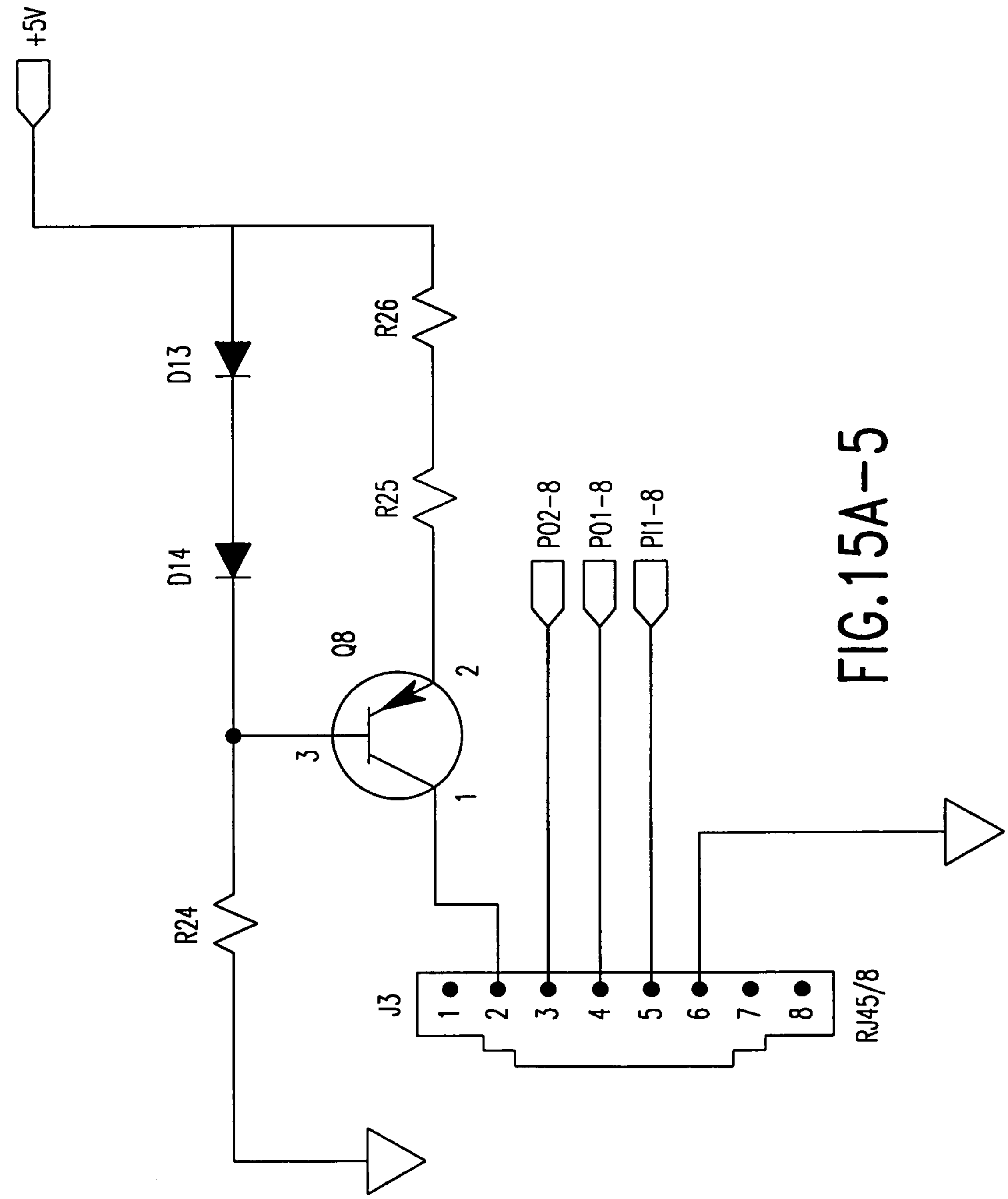
Figures 6, 15A:
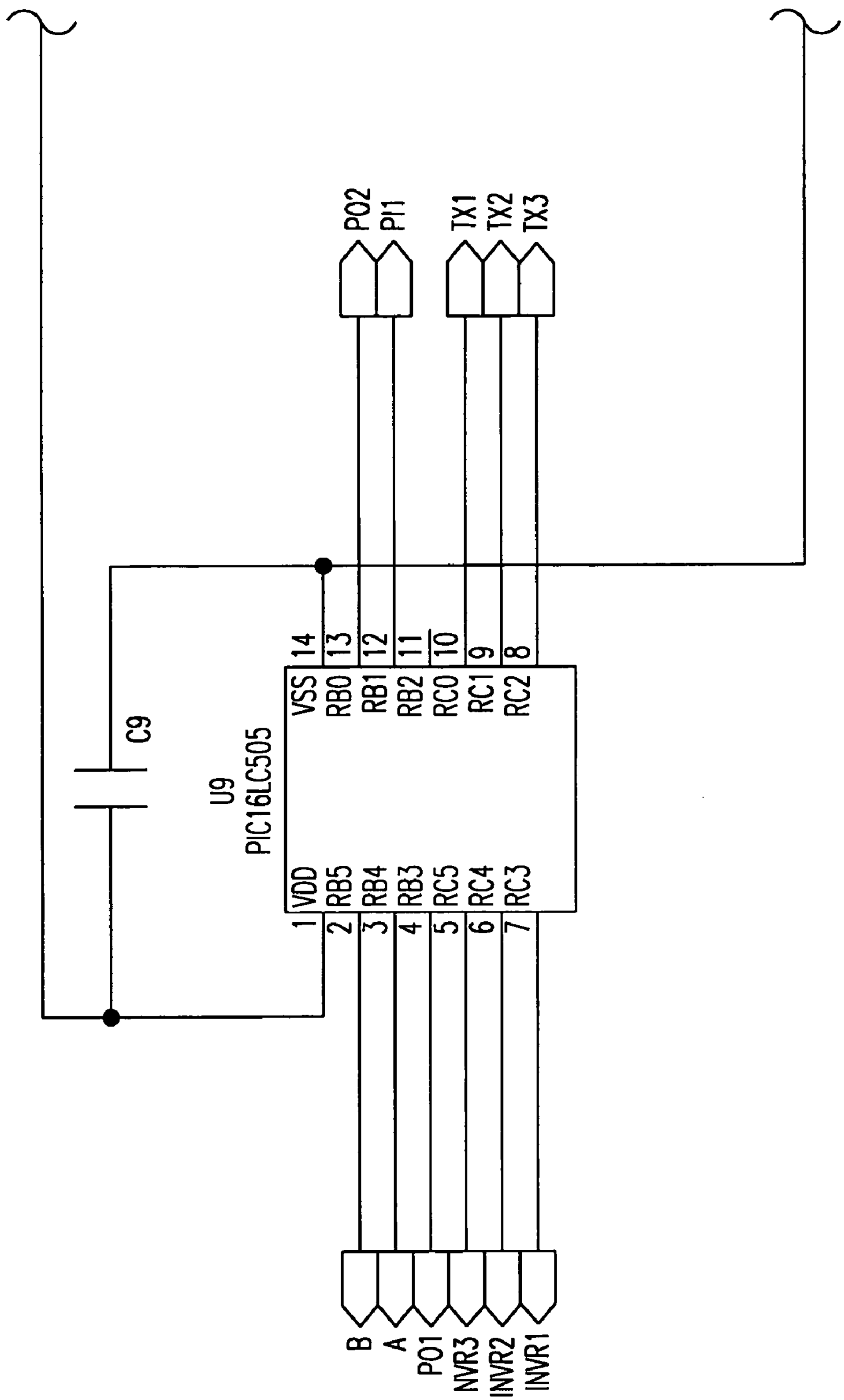
Figures 7, 15A:
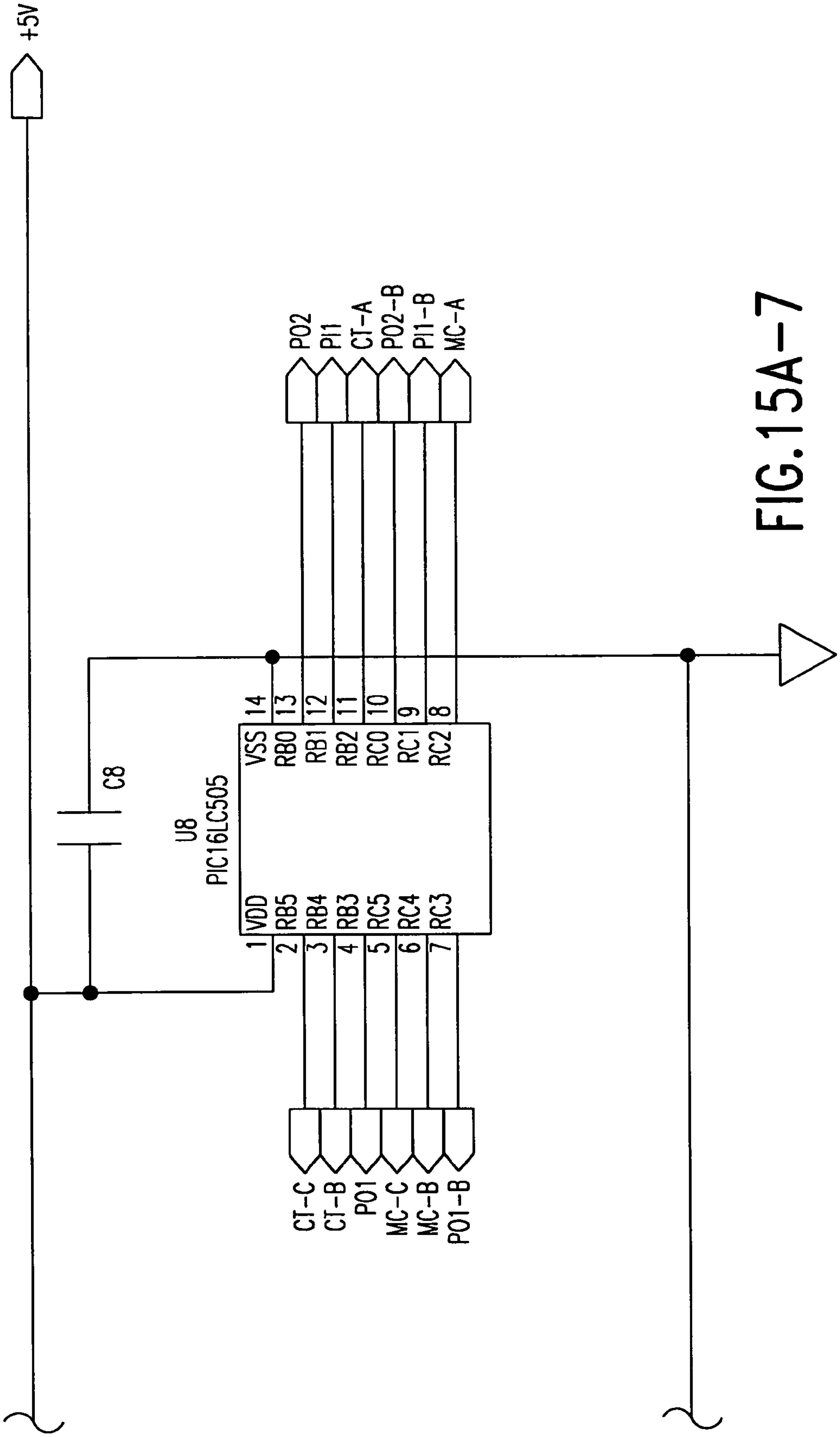
Figure 15B:
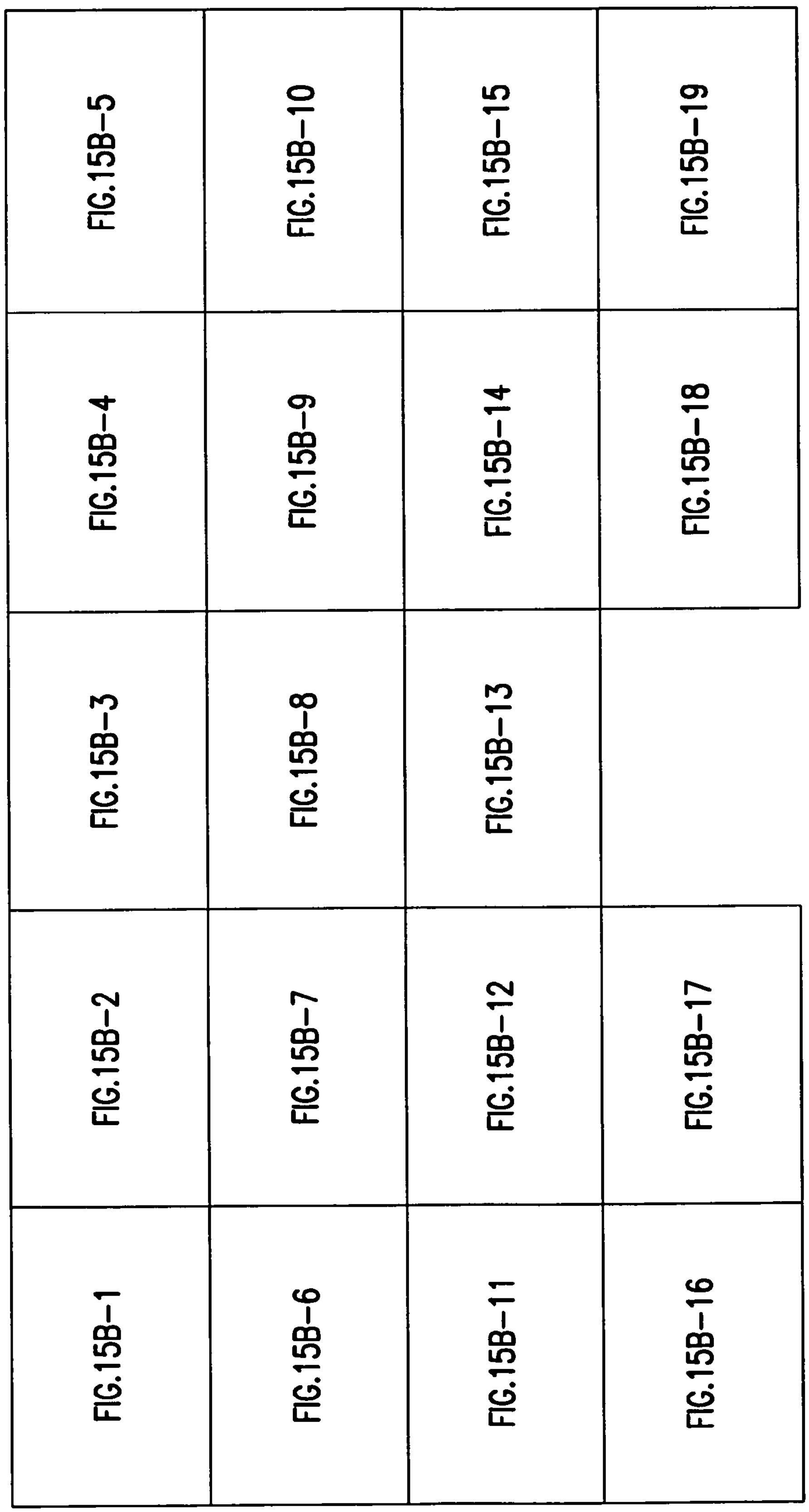
FIGS. 15B–C provide a Mini Closet Interface schematic diagram.
Figures 1, 15B:
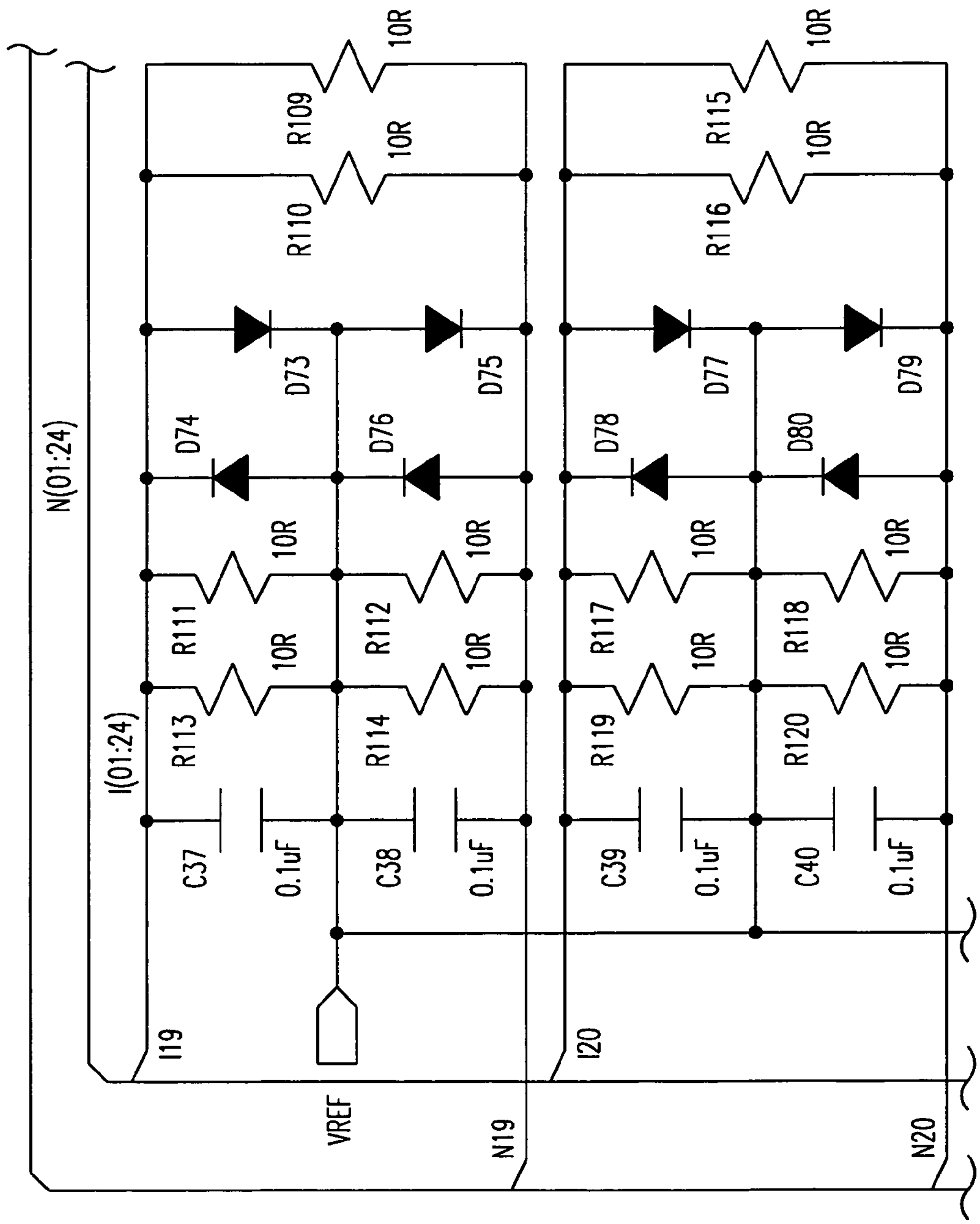
Figures 2, 15B:
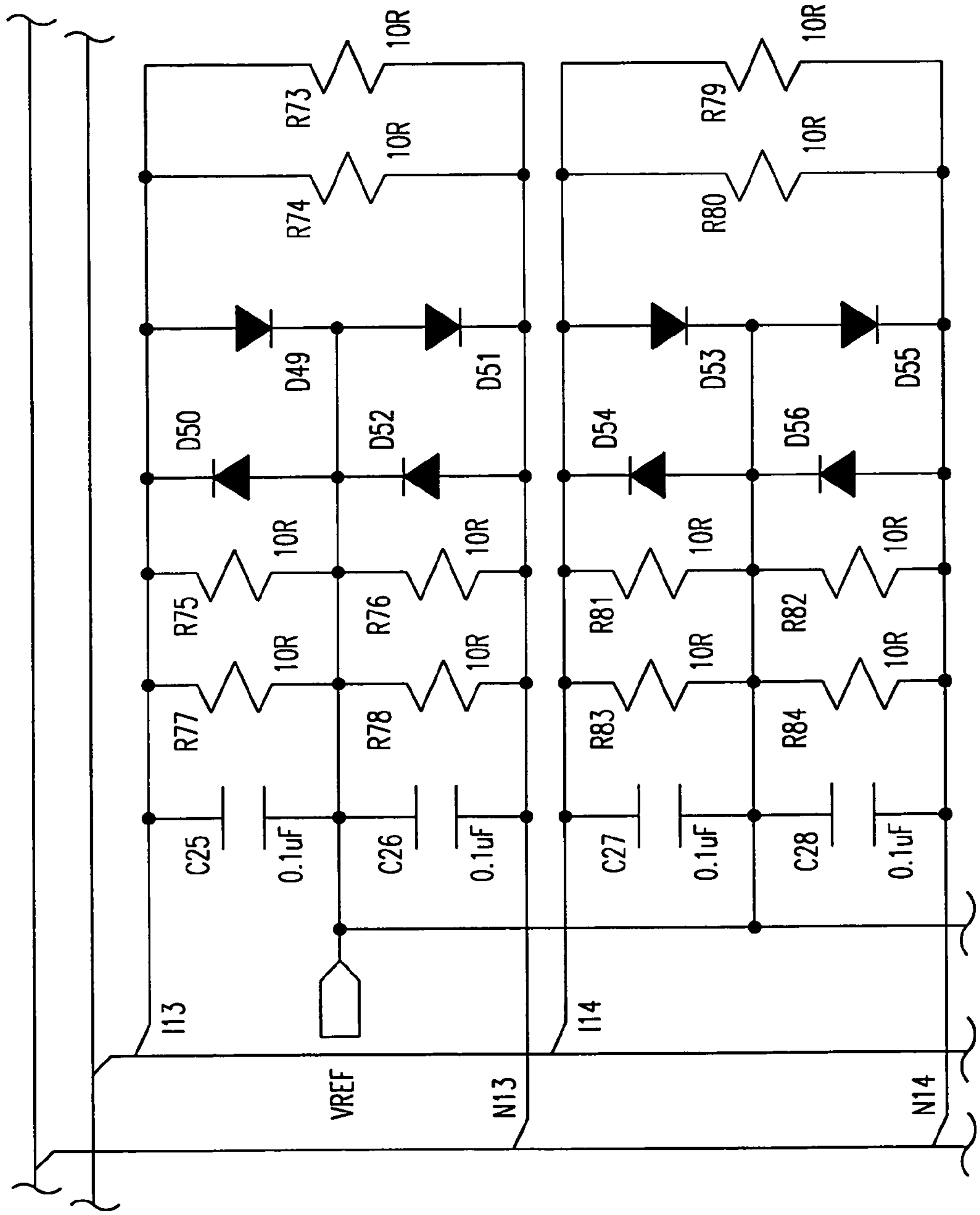
Figures 3, 15B:
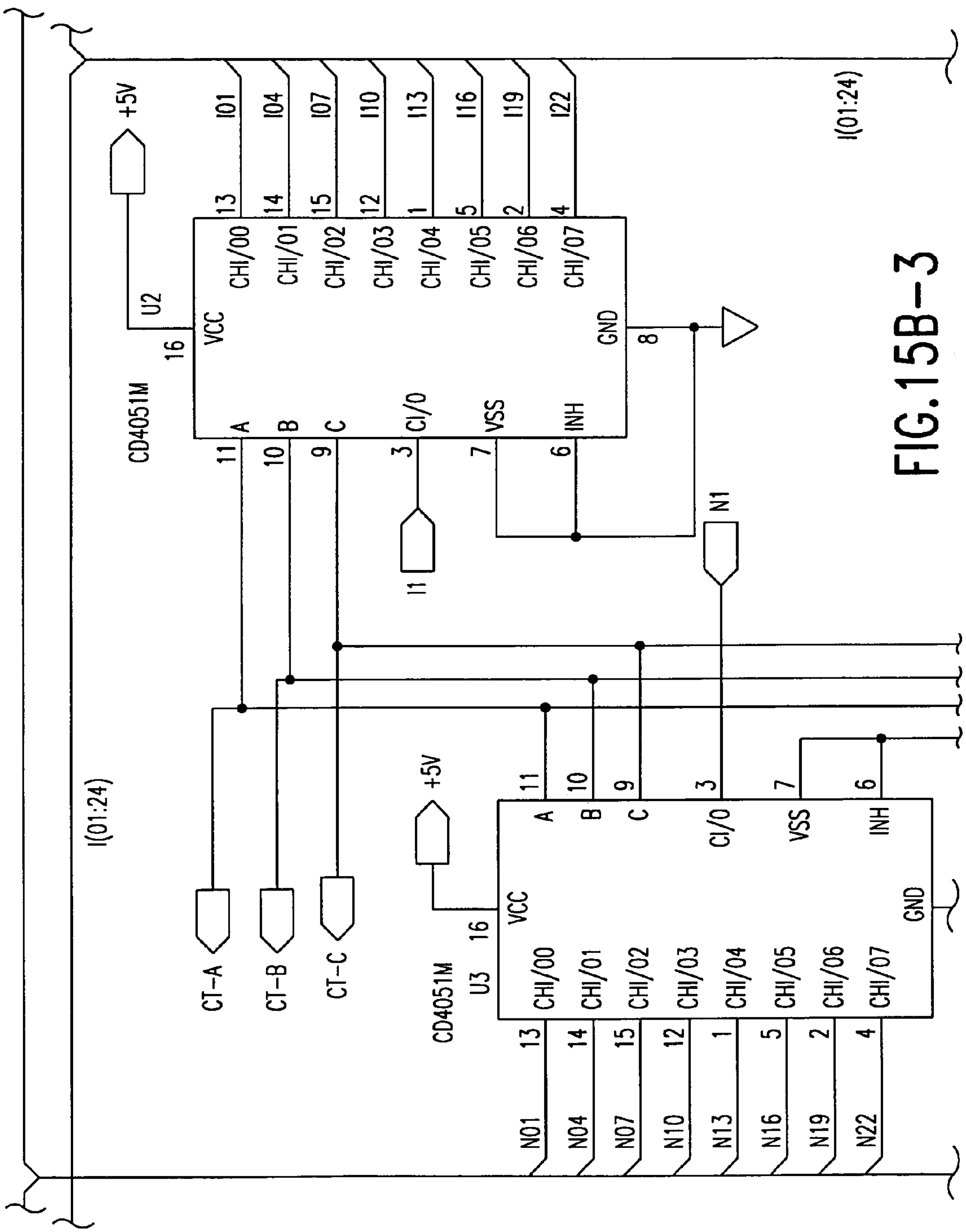
Figures 4, 15B:
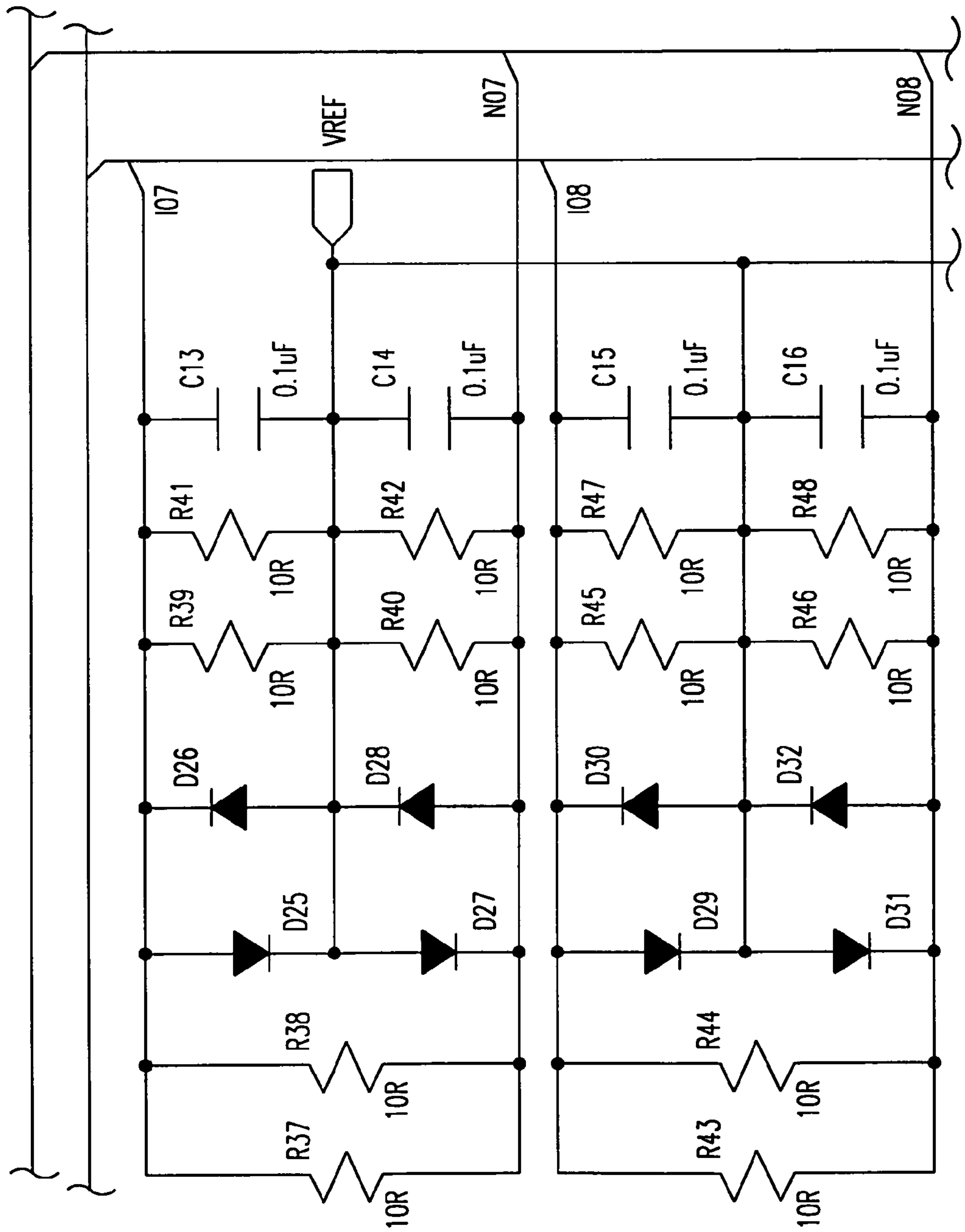
Figures 5, 15B:
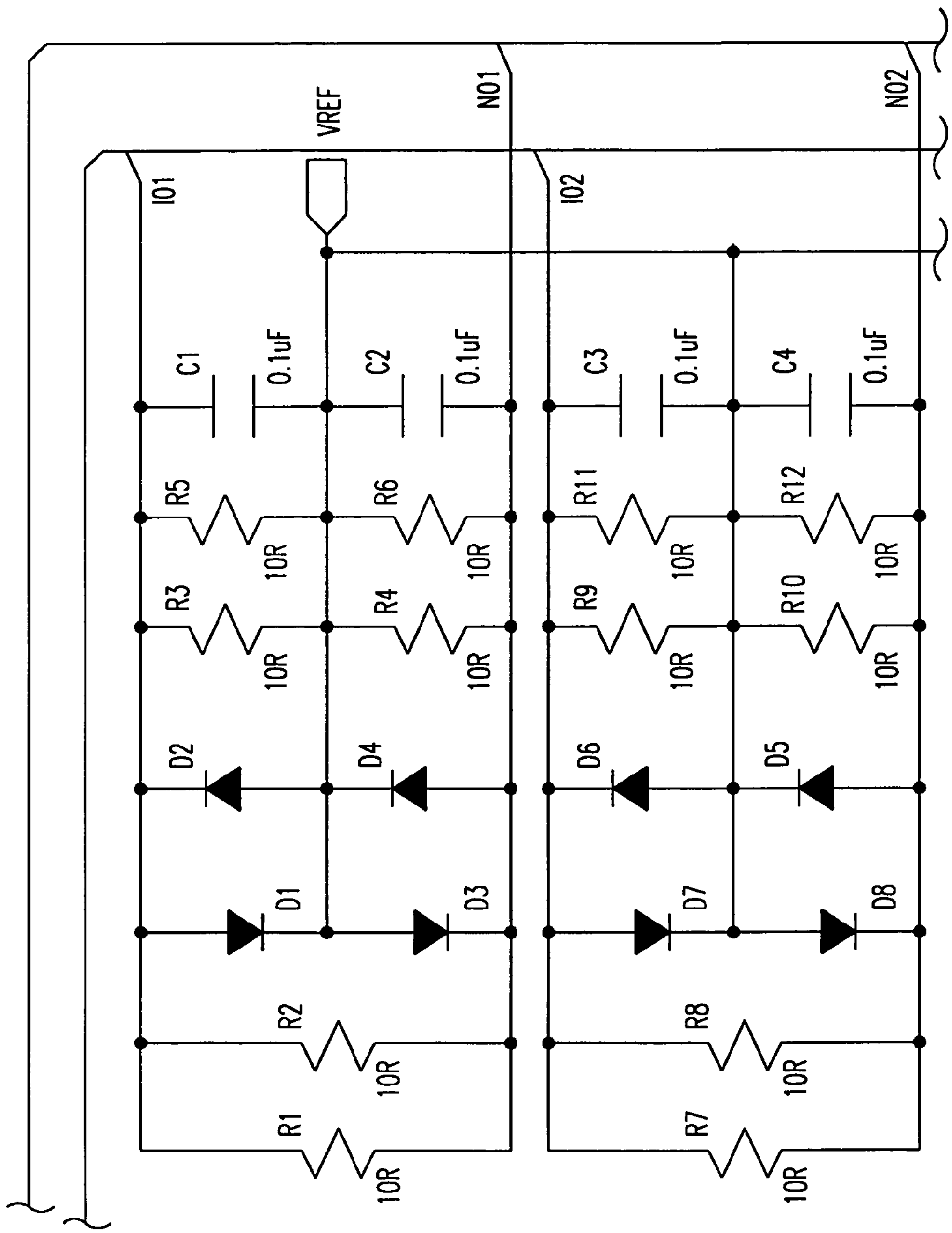
Figures 6, 15B:
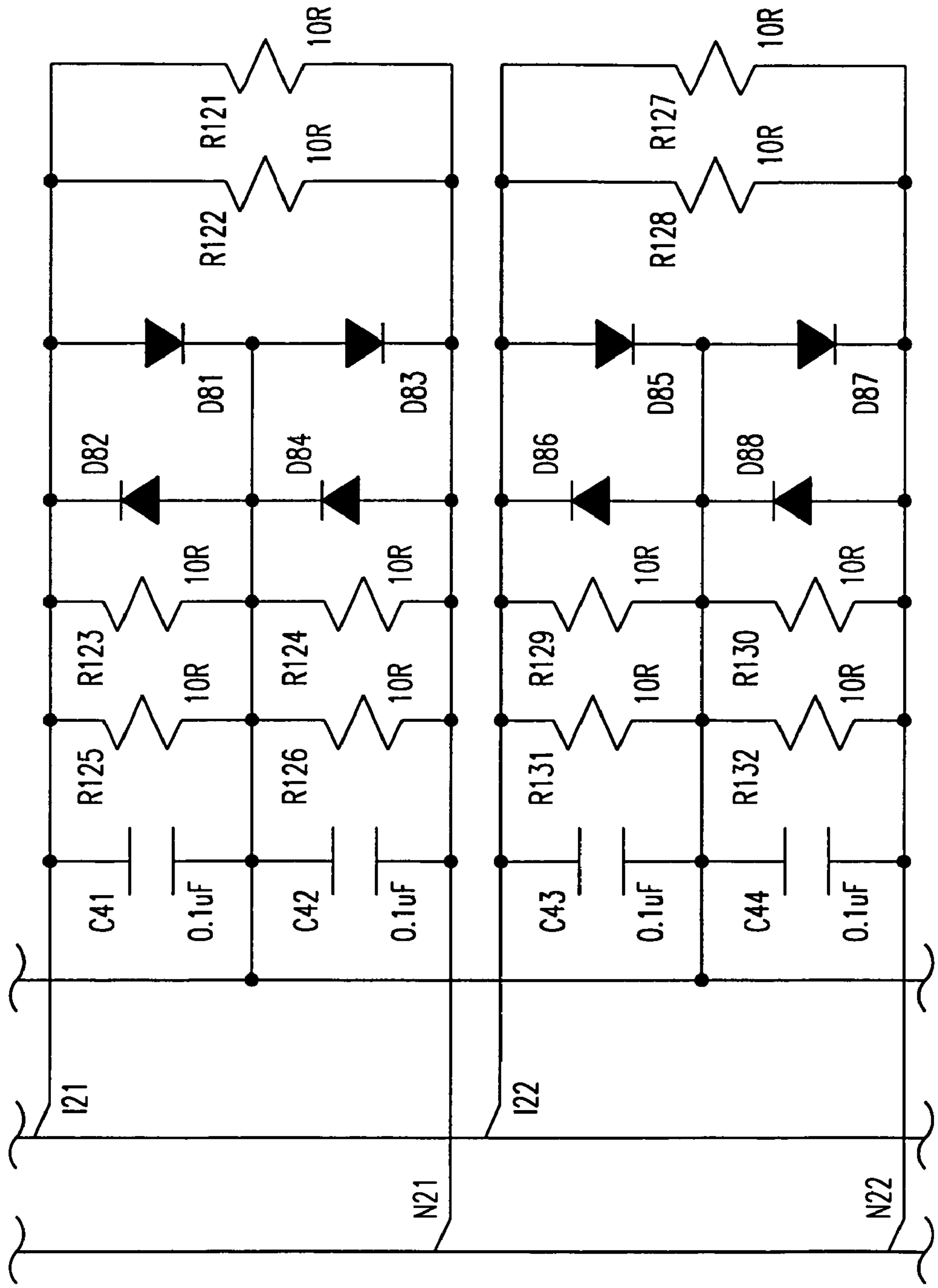
Figures 7, 15B:
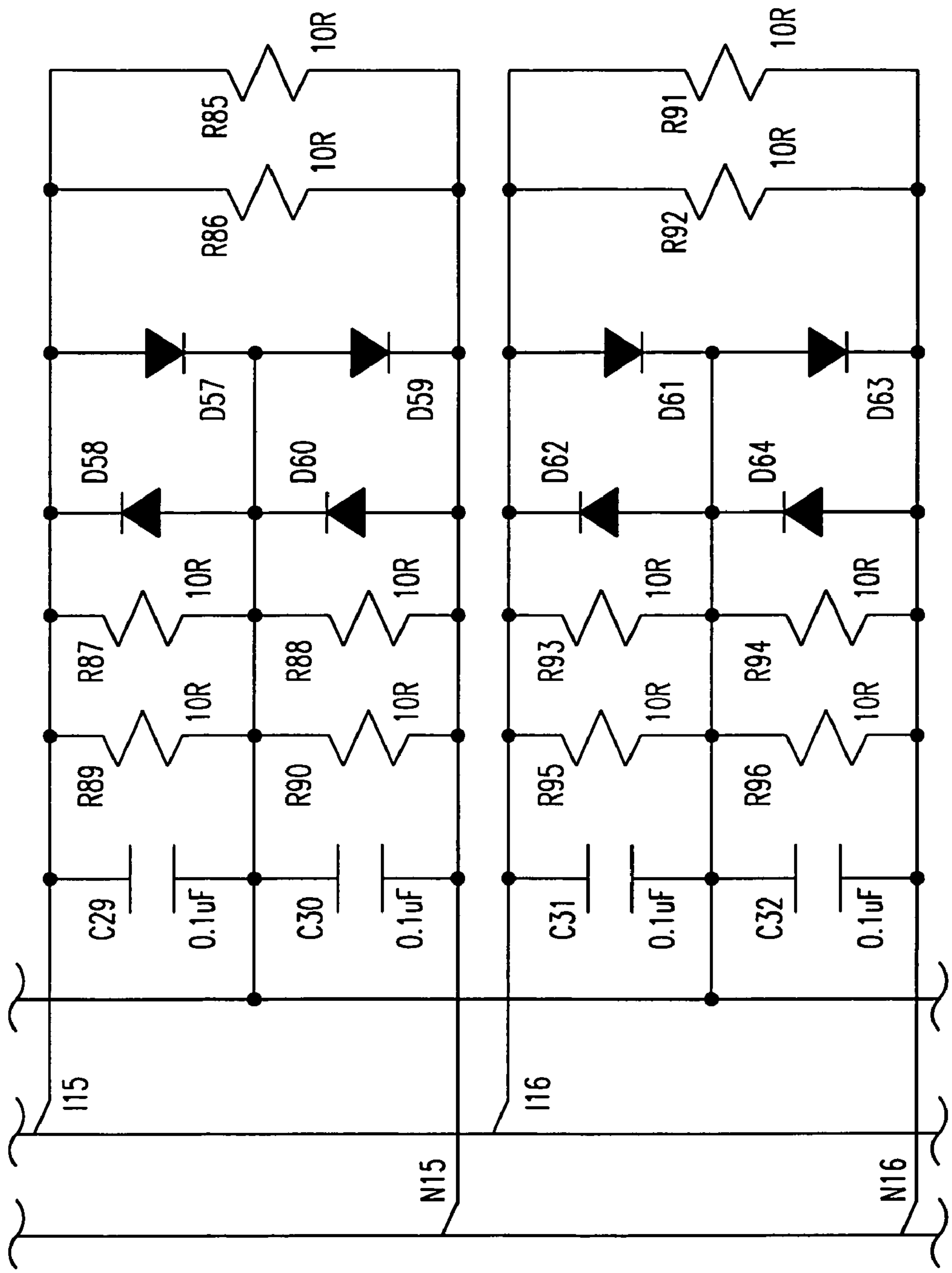
Figures 8, 15B:
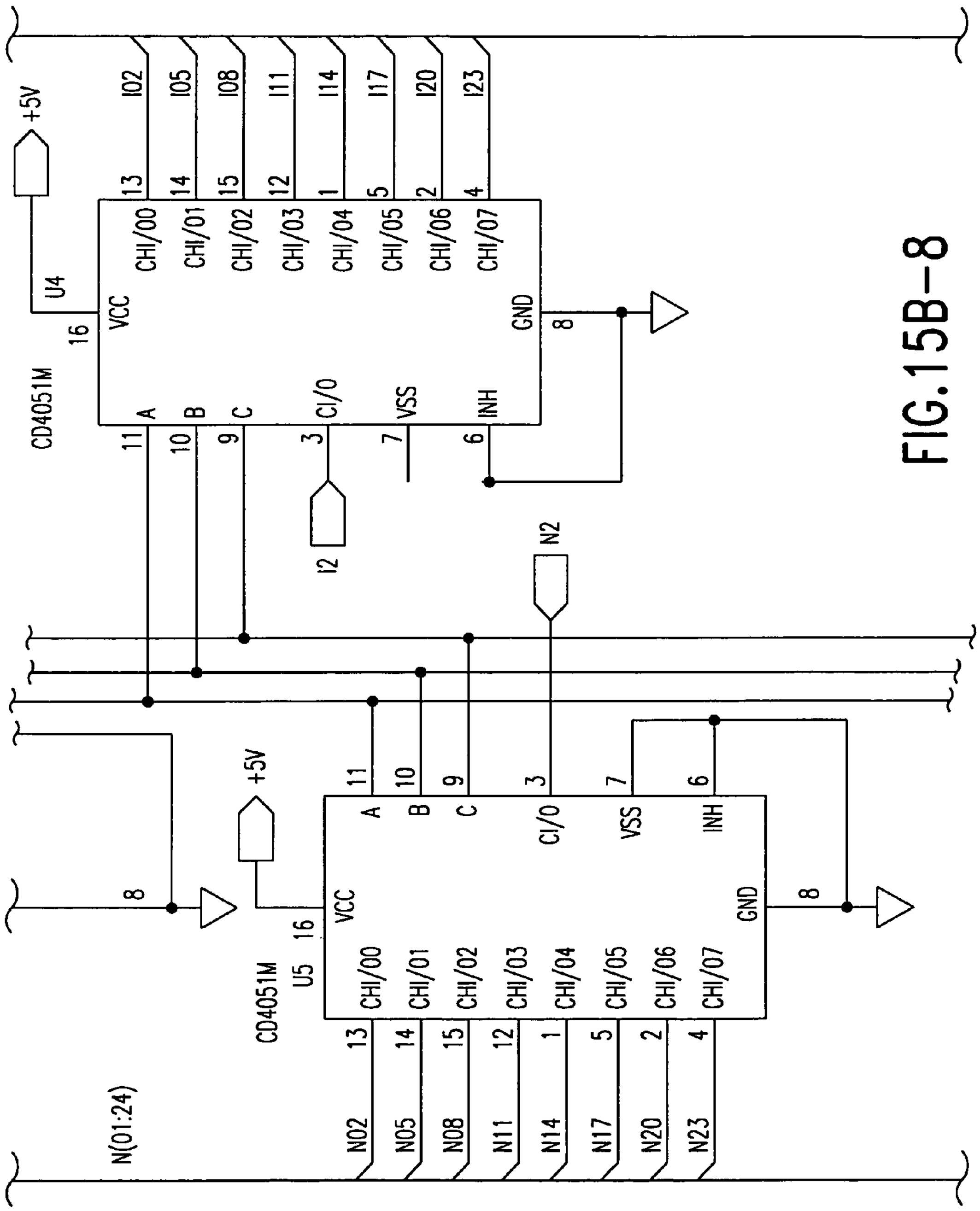
Figures 9, 15B:
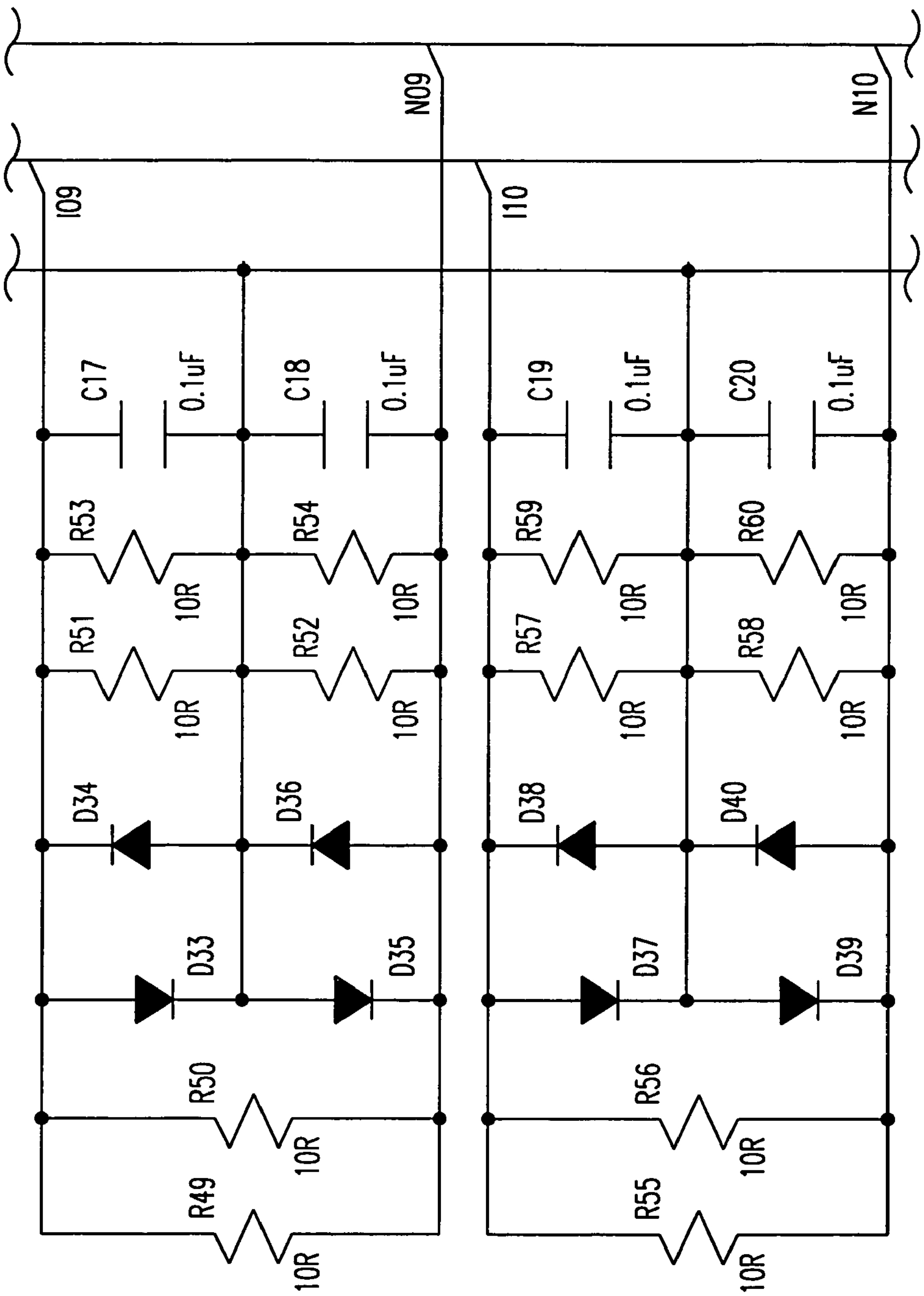
Figures 10, 15B:
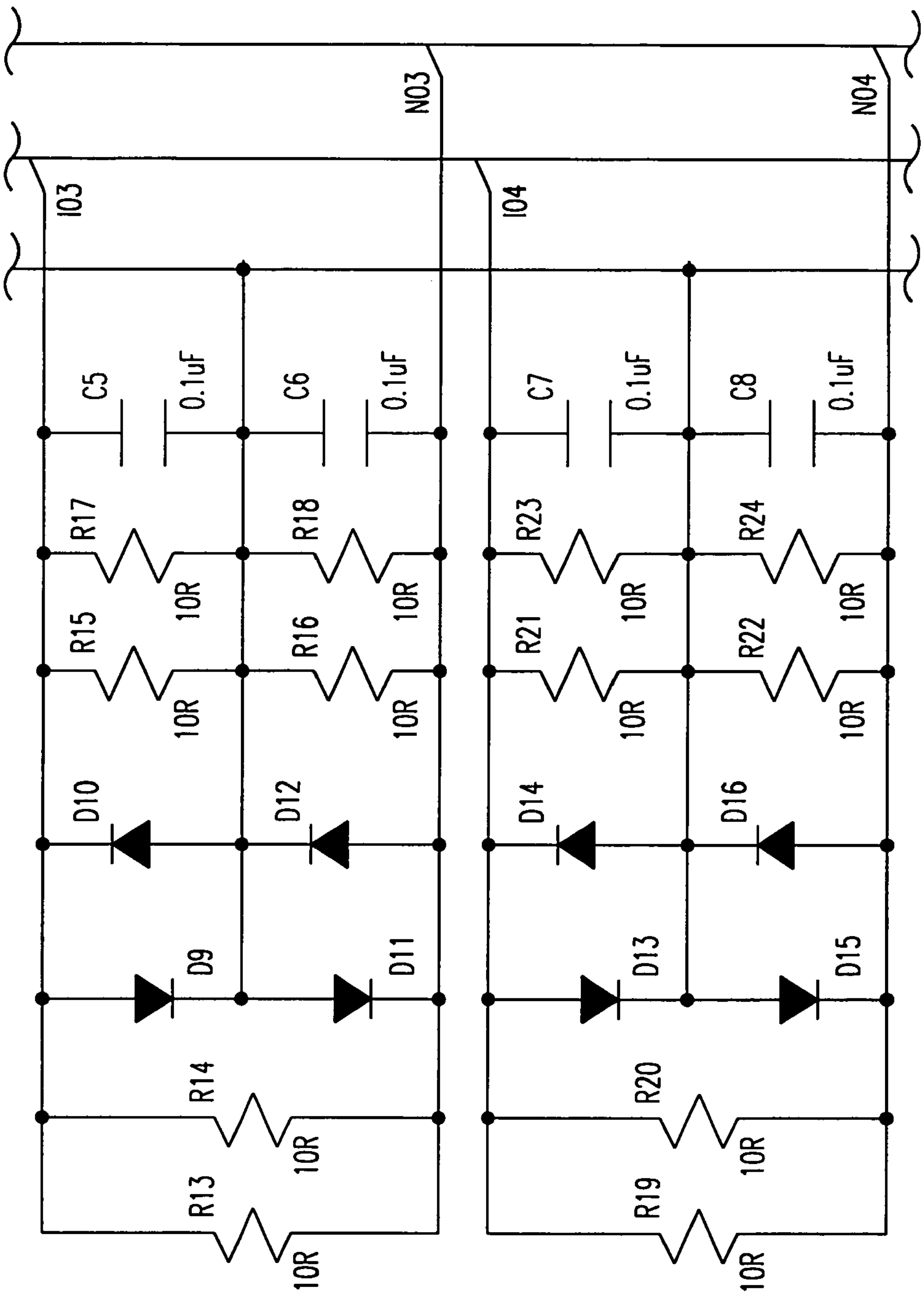
Figures 11, 15B:
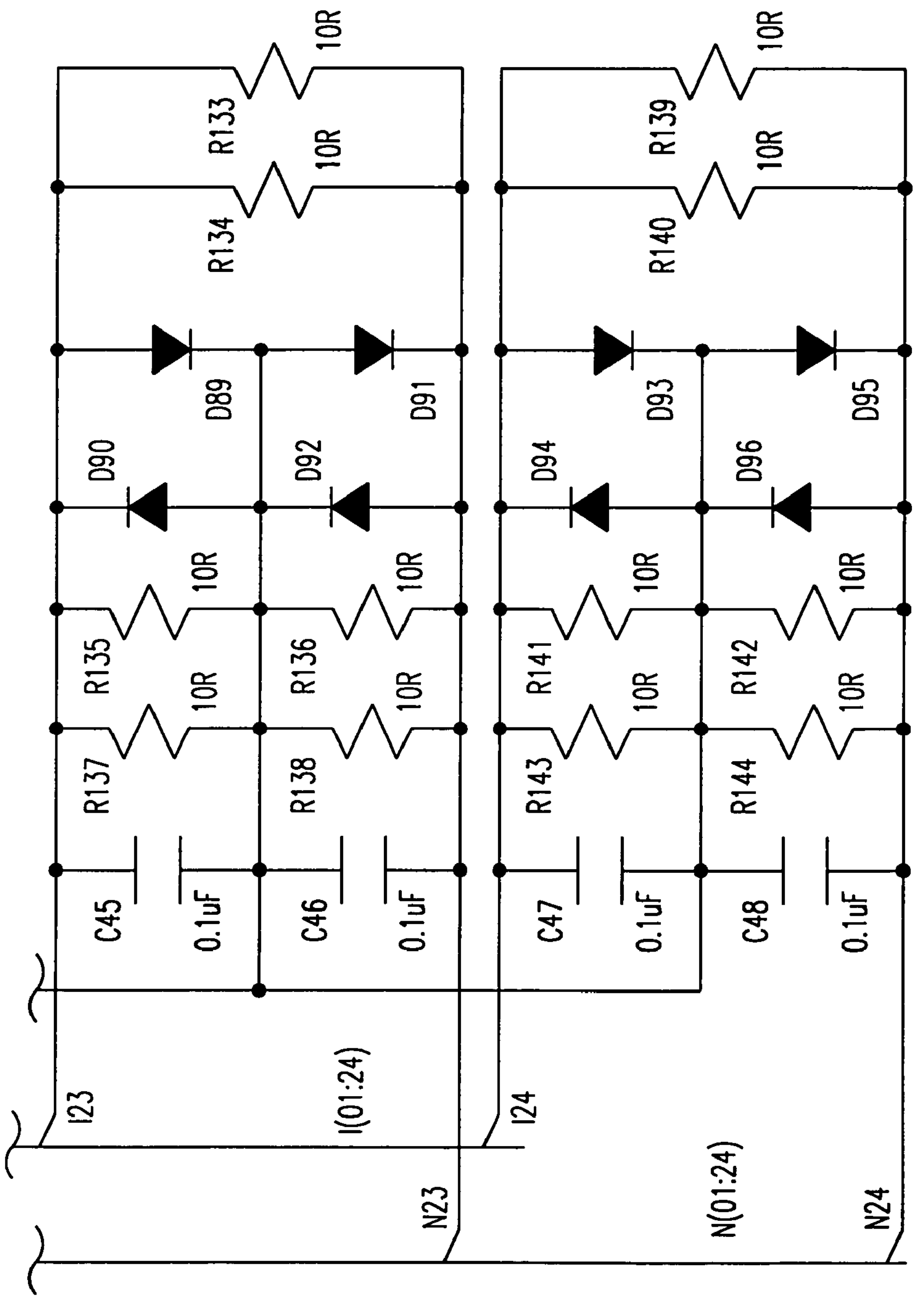
Figures 12, 15B:
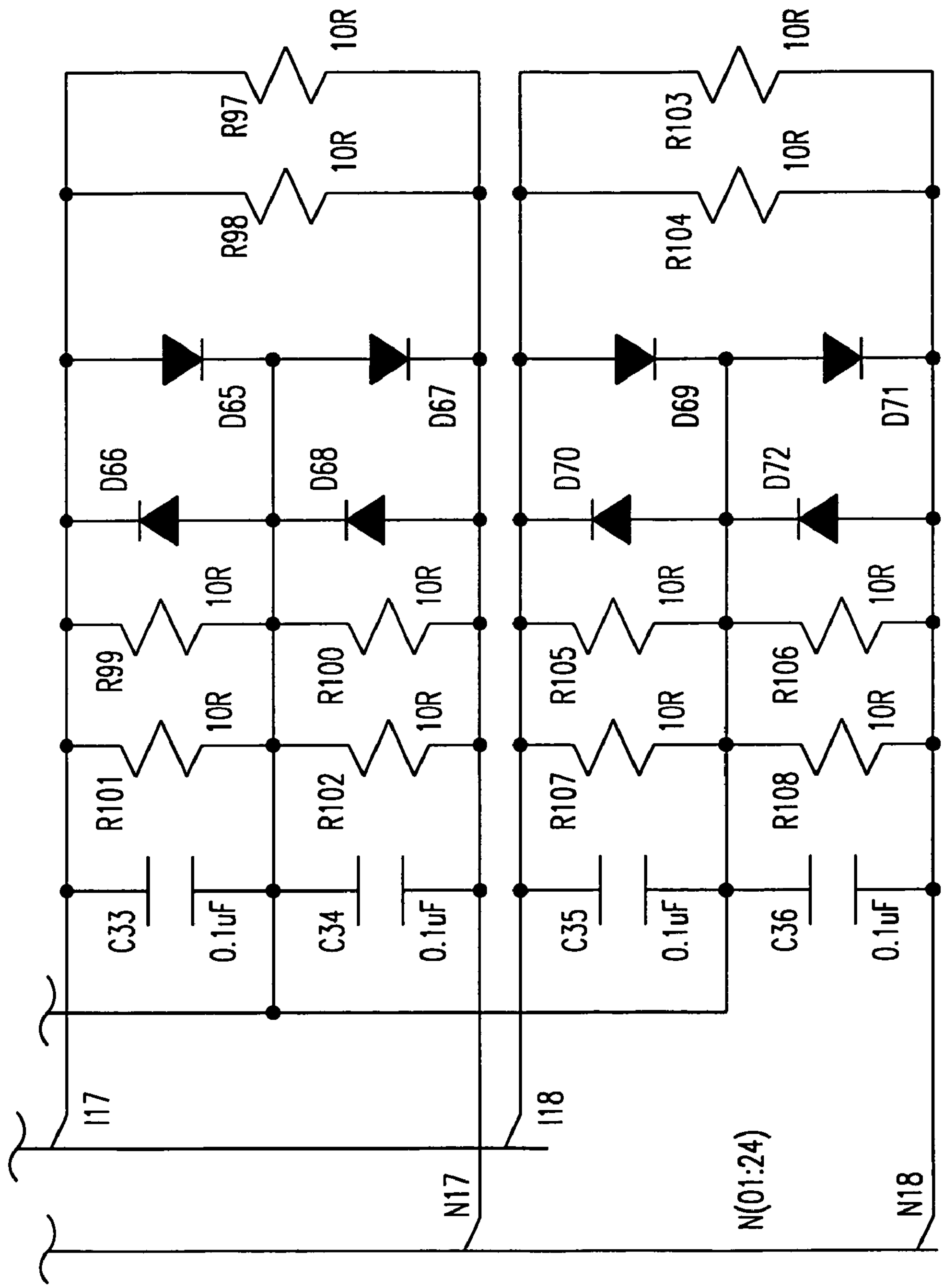
Figures 13, 15B:
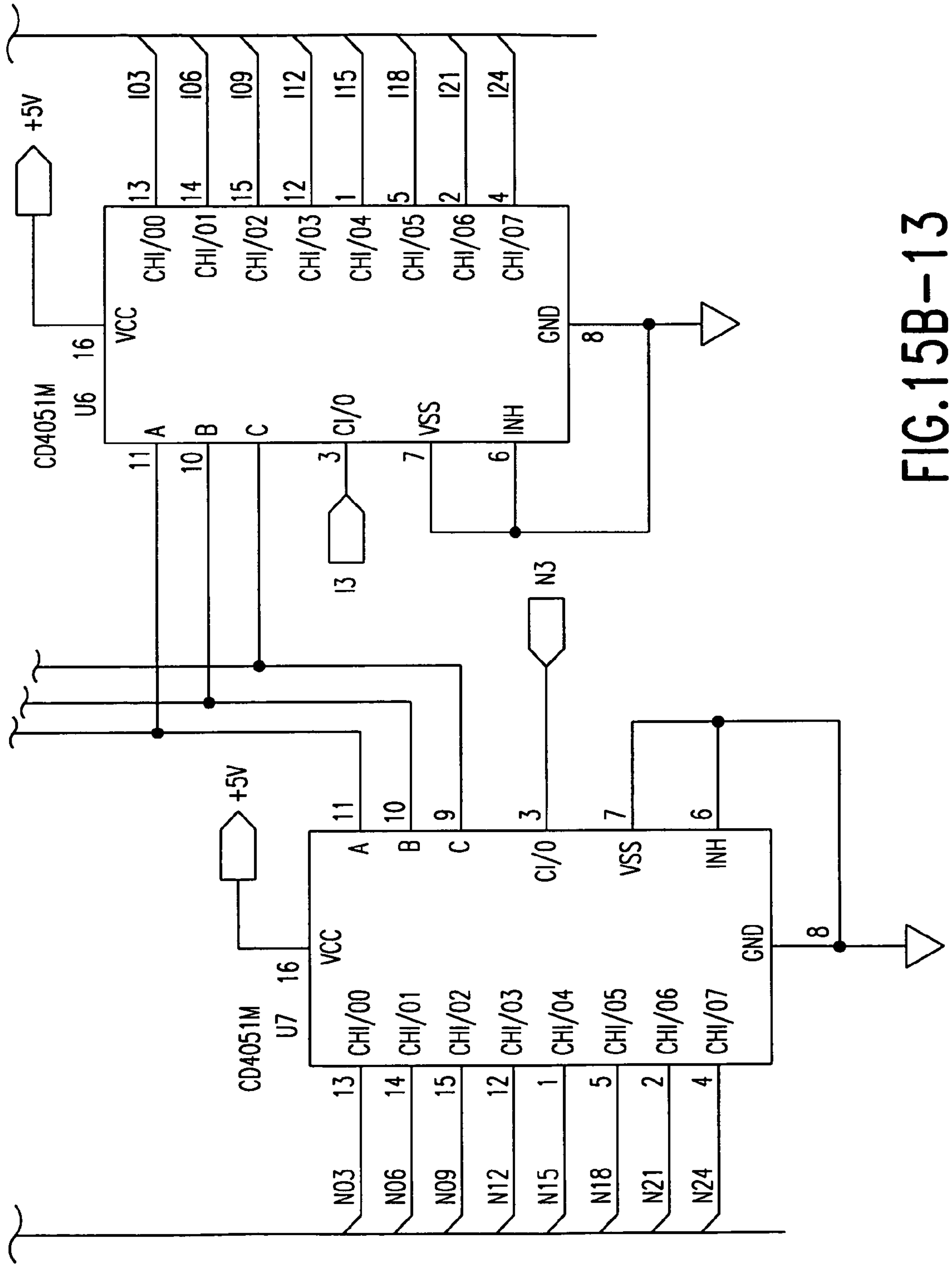
Figures 14, 15B:
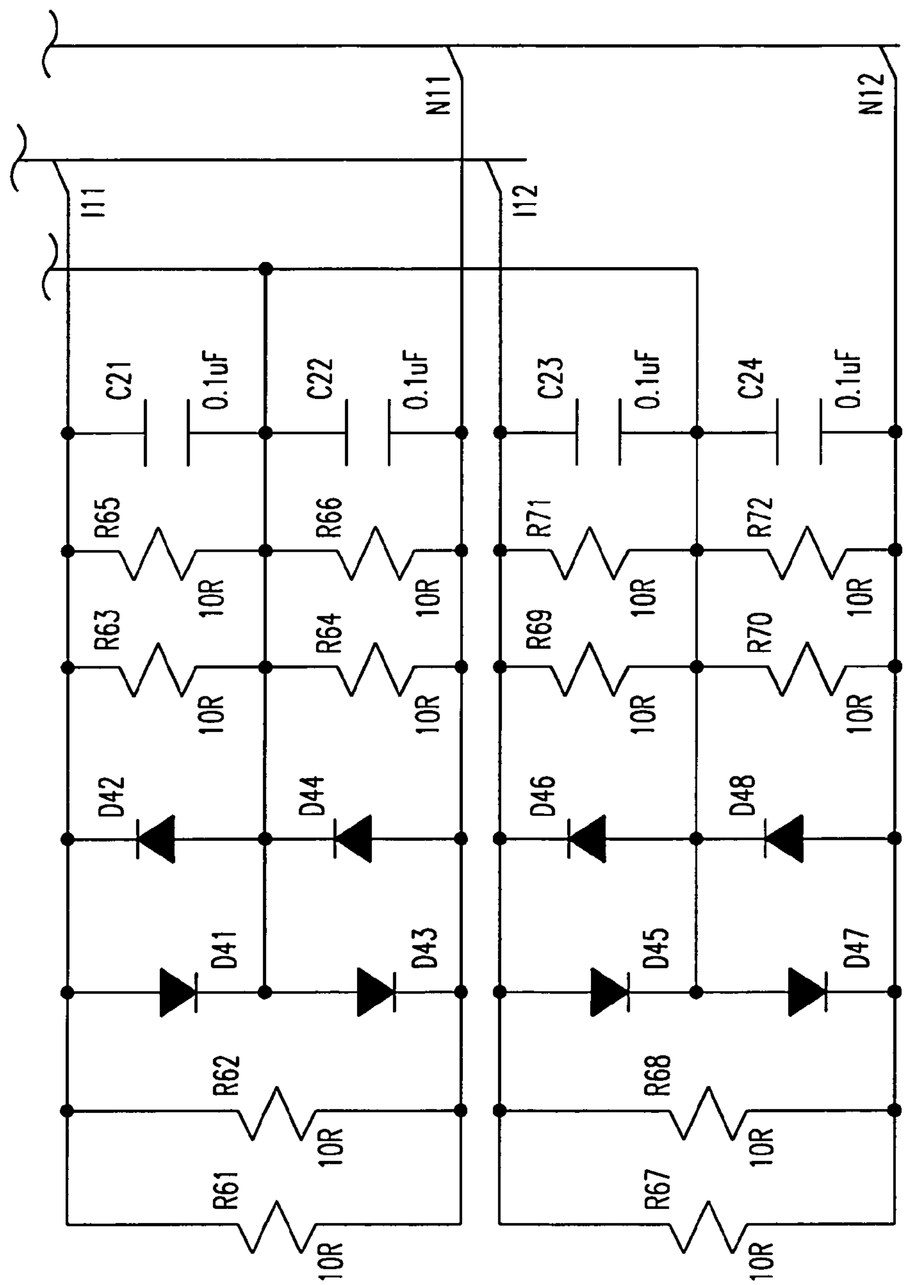
Figures 15, 15B:
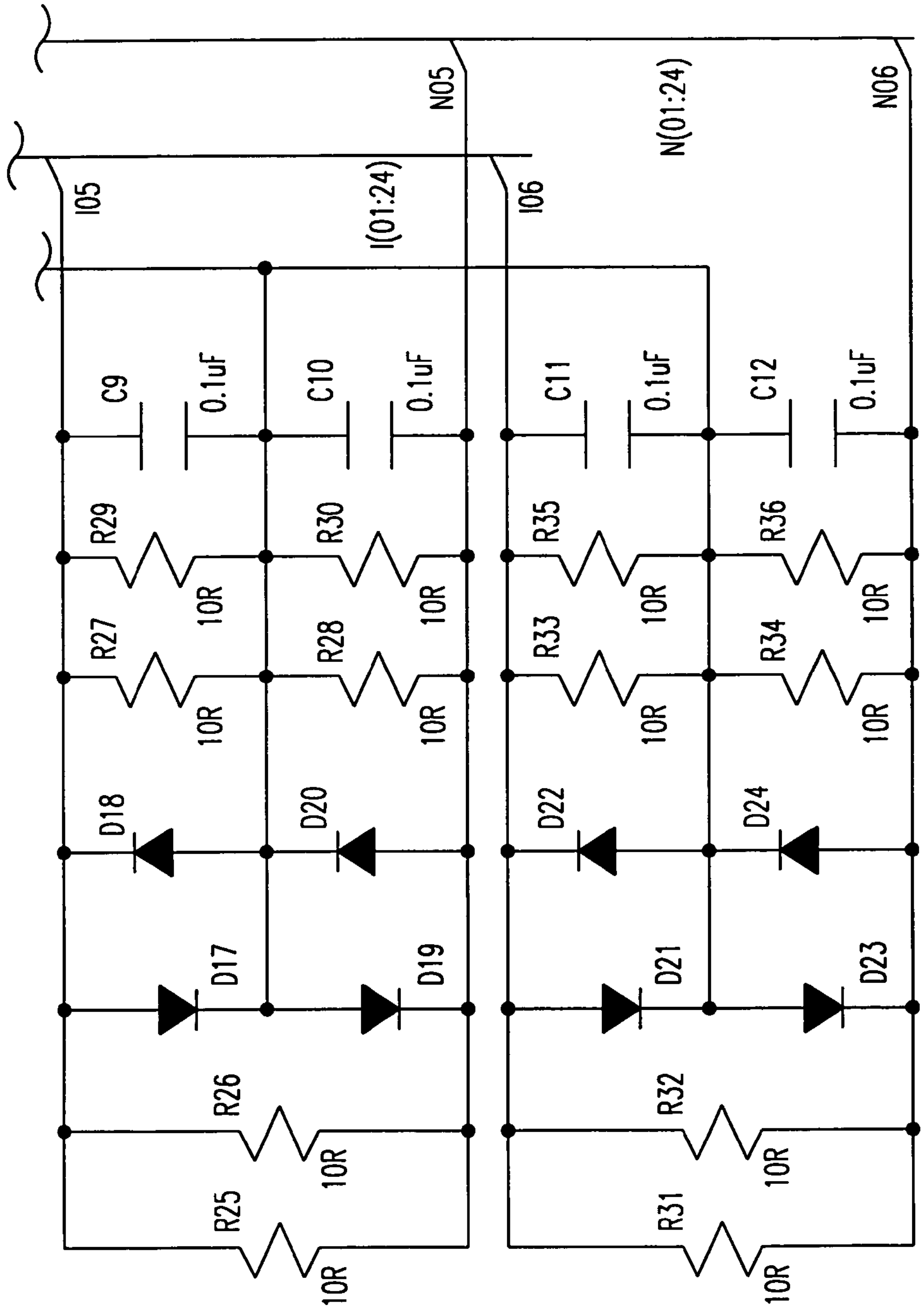
Figures 15, 15B, 16:
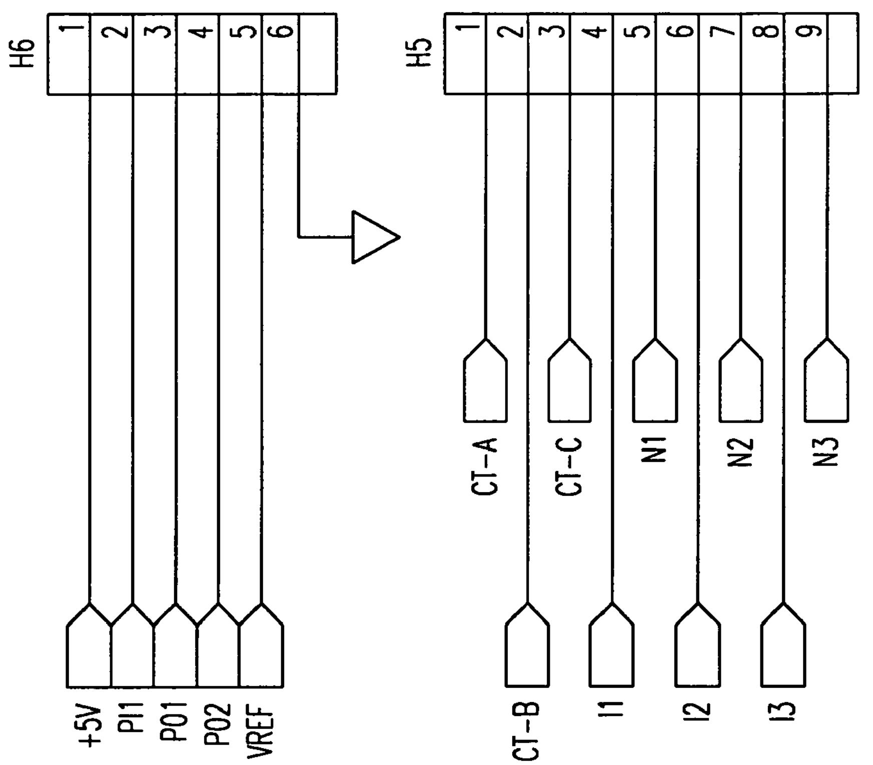
FIG. 16 is an Optical Adaptor schematic diagram.
Figures 15, 15B, 16, 17:
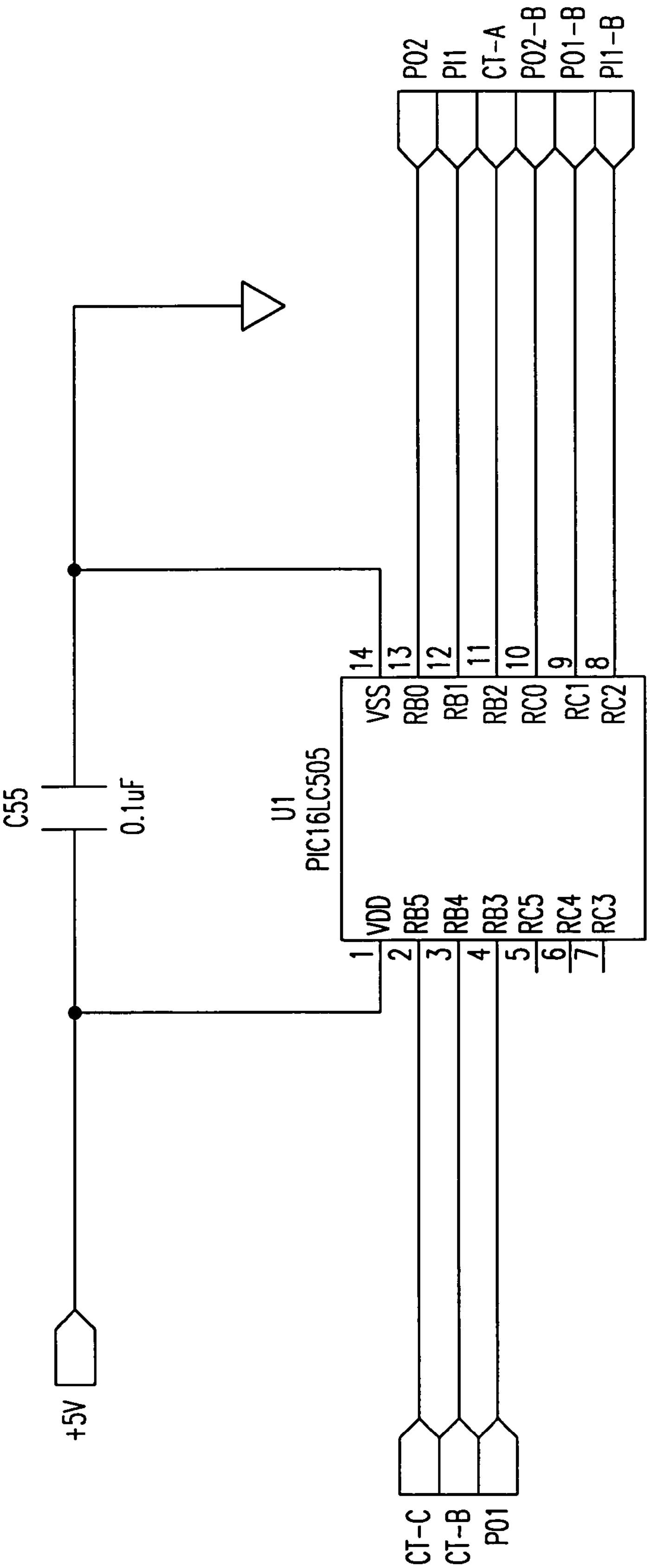
Figures 15, 15B, 16, 17, 18:
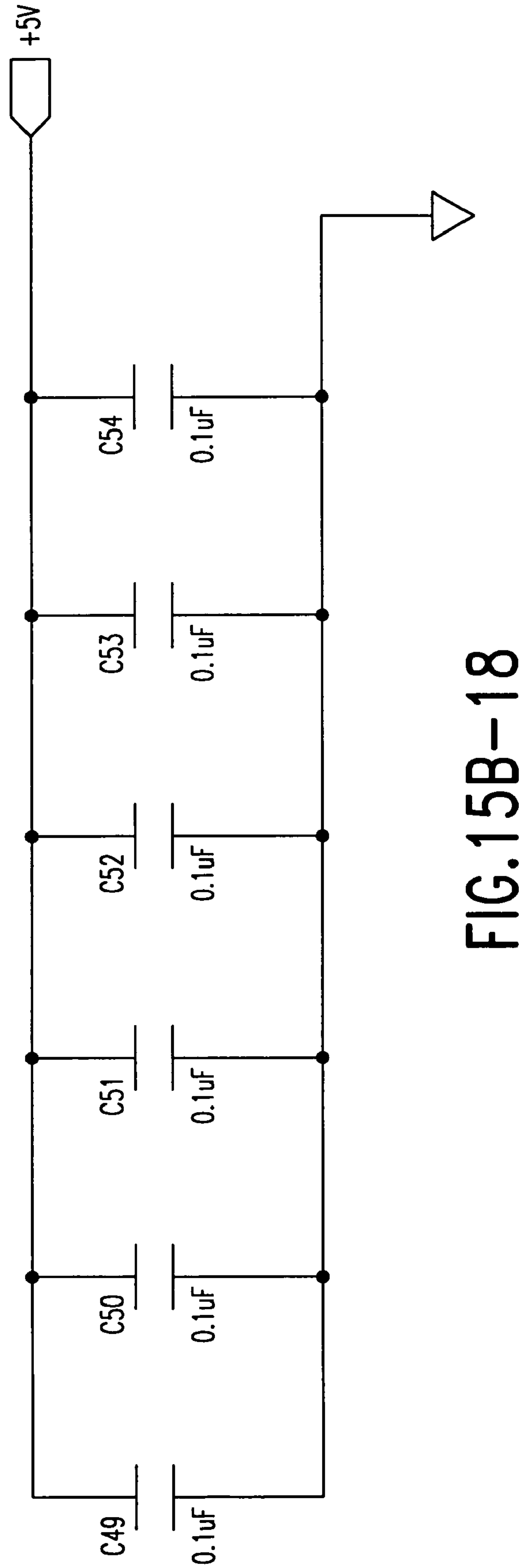
FIG. 18 depicts a configuration of a preferred submeter system.

Configuration of a preferred submeter system is depicted in FIG. 18. The following is a description of principal modules in the system.

A Power Supply 1801 supplies unregulated DC voltage +U for high power functions such as PLC. A regulated +5VDC feeds each of the ICs and many other circuit blocks.

A Battery 1802 provides power for power-out operation of several functions in the ASIC including the Internal RAM A2, RTC A3, and 32768 Hz crystal 1809. It also powers the pulse reader when system power is unavailable.

Microprocessor U2 performs all the intelligent computations from the raw meter data and the ASIC states. The main program memory resides in the FLASH U5 but also run out of RAM and ASIC ROM in some cases.

FLASH U5 is nonvolatile memory, the site of primary memory storage and program memory.

RAM U3 is an IC that is external to the ASIC for microprocessor temporary storage of information.

Display Driver U4 sends the control signals to the LCD LCD1.

The ASIC U1 contains the bulk of the control hardware in the submeter system. The control blocks within the ASIC are discussed below.

32768 Crystal 1809 is used for time keeping.

20M Crystal 1810 is the system clock for both the ASIC and the microprocessor.

$V_{REF}$ CR1 is a 2.5VDC reference voltage. This design utilizes an IC with an external voltage adjustment such as LM336-2.5. The ASIC contains a 64 tap digital potentiometer that provides one of 64 voltage levels to the external control line. The ASIC control of $V_{REF}$ CR1 saves the cost of a moving part and provides digital code accuracy. Furthermore, because this code can be software-controlled, $V_{REF}$ can be calibrated meter by meter and can be calibrated to fit a parabolic profile with temperature. $V_{REF}$ is calibrated to 2.49V, the voltage point of greatest temperature stability.

PLC Hardware 1815 is the power circuitry for the PLC transmit and receive.

Peripheral Interface 1818 is the connection point to external devices such as Pulse Relay, Relay Control, Minicloset interface, and transponder phase control circuits.

Hardware Test Points 1820 supply the ASIC with information that enables reading of +U, temperature, and ADC calibration. Various test points in the ASIC can be output as well.

Optical Reader 1825 is the hardware that translates the serial communication into optical transmission.

Voltage Divide 1830 is a 1000:1 voltage divide circuit that prepares measurement voltage for ASIC input.

Current Shunt 1835 is a resistor network used to convert current to voltage for ASIC input.

Detailed ASIC Description

A preferred ASIC system U1 is depicted in FIG. 18. The following is an explanation of the different modules in the ASIC.

The Meter

Meter A1 reads the current and voltage channels from Voltage Divide 1830 and Current Shunt 1835. Internal amplifiers and correction factors improve the accuracy of the meter reading.

RAM (Internal) A2 is non-volatile RAM, backed up by the external battery 1802. This is the storage site for temporary RAM accumulators and other critical RAM variables.

Real Time Clock (RTC) A3 is the continuous time keeper for the system. The RTC is clocked by an accurate 32768Hz crystal 1809 and is the standard for time clocking. Battery power from battery 1802 keeps the RTC operational even when system power is removed.

PLC Control A4 contains the control logic required to transmit and receive data that was sent through the PLC channels.

Digital Control Logic A5 provides the interface bits that control the enable lines for each part, the address and data busses, system reset, and access to internal state registers.

Unless Watchdog Timer ("WDT") A6 is refreshed, it will trigger a system reset.

Serial UART with FIFO A7 functions much like the PC16550D from National Semiconductor.

Digital I/O A8 is used for communicating to peripheral devices through the Peripheral Interface 1818.

Analog I/O A9 is used to gather system information from Hardware Test Points 1820. This also outputs various analog points within the ASIC.

Sampling

The following is an example of the sampling times of voltage and current.

Ideally the voltage and the current samples are performed exactly at the same time. However there are timing issues in the current and the voltage measurement hardware. Because time discrepancies are usually not equal, a constant timing adjustment, which we shall call "delay," is applied to the current sampling channel. The term "delay" is used loosely here because the actual numerical delay can be a positive or negative number. In Table 1, the delay is 0.056°. This number is obtained through calibration.

For each measurement, four voltage samples ($V_1$ $V_{L1}$ $V_2$ $V_{L1}$) and one current sample (I) are taken. $V_1/V_{L1}$ is used for phase-to-neutral reading and the $V_2/V_{L2}$ pair allows phase-to-phase reading. The difference between the two types will become more evident in the meter diagram discussion.

$V_1$ and $V_{L1}$ comprise a voltage sample pair. The two samples are placed approximately 2° apart. $V_1$ is called the Voltage Sample and $V_{L1}$ is called the Late Voltage Sample.

Each measurement phase takes turns utilizing the metering channel to read their sample pairs. For example, in a three-phase meter, phase 1 is read, then phase 2 is read, then phase 3 is read, then phase 1 is read again. Eventually all the phases are read and the cycle repeats.

The process requires two voltage samples to be 90° apart. The strategy is to set the cycle period so that $V_1$ from one sample pair and $V_{L1}$ from another sample pair will be exactly 90° apart. Table 1 lists example sampling degrees for a three-phase (3Φ) meter. Only phase 1 is shown.

TABLE 1

| Sample n | $V_1(n)$ | $V_{L1}(n)$ | I(n) |
|---|---|---|---|
| 1 | 0° | 2° | 0.056° |
| 2 | 44 | 46 | 44.056 |
| 3 | 88 | 90 | 88.056 |
| 4 | 132 | 134 | 132.056 |
| 5 | 176 | 178 | 176.056 |
| 6 | 220 | 222 | 220.056 |
| 7 | 264 | 266 | 264.056 |
| 8 | 308 | 310 | 308.056 |
| 9 | 352 | 354 | 352.056 |
| 10 | 36 | 38 | 36.056 |

Note the following:

(1) $V_1(1)$ and $V_{L1}(3)$ are 90° apart and therefore complete a measurement pair. $V_1(2)/V_{L1}(4)$, $V_1(3)/V_{L1}(5)$, and $V_1(4)/V_{L1}(6)$ make up future measu (2) Note that the current is offset from the voltage by 0.056 degrees. This is the delay required to synchronize the reading of the two channels.

If Table 1 were extended, the sampling would sweep out the entire voltage waveform over a period of time. In a 3Φ meter every 4° would be sampled over 11 cycles. Table 2 shows the sequences of sampling degrees that would sweep the entire waveform:

TABLE 2

| $V_1(n)$ in degrees $\Phi_1$ of a 3Φ meter |
|---|
| 0, 44, 88, 132, 176, 220, 264, 308, 352, 36, 80, 124, 168, 212, 256, 300, 344, 28, 72, 116, 160, 204, 248, 292, 336, 20, 64, 108, 152, 196, 240, 284, 328, 12, 56, 100, 144, 188, 232, 276, 320, 4, 48, 92, 136, 180, 224, 268, 312, 356, 40, 84, 128, 172, 216, 260, 304, 348, 32, 76, 120, 164, 208, 252, 296, 340, 24, 68, 112, 156, 200, 244, 288, 332, 16, 60, 104, 148, 192, 236, 280, 324, 8, 52, 96, 140, 184, 228, 272, 316, 0 |

Even better, since the 2° separation between $V_1$ and $V_{L1}$ is not exact, all of the degrees between will eventually be swept out over a longer period of time.

The other two phases in a three-phase meter fall evenly between the gaps of the sample pairs, as shown below in Table 3, $V_1$ degrees of a 3Φ Meter:

TABLE 3

| Phase1 | Phase 2 | Phase 3 |
|---|---|---|
| 0.00° | 14.67° | 29.33° |
| 44.00 | 58.67 | 73.33 |
| 88.00 | 102.67 | 117.33 |
| 132.00 | 146.67 | 161.33 |
| 176.00 | 190.67 | 205.33 |
| 220.00 | 234.67 | 249.33 |
| 264.00 | 278.67 | 293.33 |
| 308.00 | 322.67 | 337.33 |
| 352.00 | 6.67 | 21.33 |

Two-phase (2Φ) meters are sampled analogously to a 3Φ meter except the third phase samples are discarded. Table 4, $V_1$ degrees of a 2Φ Meter, shows the sampling of a Two-Phase Meter:

TABLE 4

| Phase1 | Phase 2 |
|---|---|
| 0.00° | 14.67° |
| 44.00 | 58.67 |
| 88.00 | 102.67 |
| 132.00 | 146.67 |
| 176.00 | 190.67 |
| 220.00 | 234.67 |
| 264.00 | 278.67 |
| 308.00 | 322.67 |
| 352.00 | 6.67 |

Mini-closets are sampled so that all 24 phases are sampled in about 630 degrees or seven quarter cycles of the line as shown below in Table 5, Sample Pair Degrees of a Mini-Closet. This implies that each phase sweeps the entire sine wave in 67 line cycles.

TABLE 5

| Phase | V | $V_L$ |
|---|---|---|
| 1 | 0.00° | 2.00° |
| 2 | 26.17 | 28.17 |
| 3 | 52.33 | 54.33 |
| 4 | 78.50 | 80.50 |
| 5 | 104.67 | 106.67 |
| 6 | 130.83 | 132.83 |
| 7 | 157.00 | 159.00 |
| 8 | 183.17 | 185.17 |
| 9 | 209.33 | 211.33 |

TABLE 5-continued

| Phase | V | $V_L$ |
|---|---|---|
| 10 | 235.50 | 237.50 |
| 11 | 261.67 | 263.67 |
| 12 | 287.83 | 289.83 |
| 13 | 314.00 | 316.00 |
| 14 | 340.17 | 342.17 |
| 15 | 6.33 | 8.33 |
| 16 | 32.50 | 34.50 |
| 17 | 58.67 | 60.67 |
| 18 | 84.83 | 86.83 |
| 19 | 111.00 | 113.00 |
| 20 | 137.17 | 139.17 |
| 21 | 163.33 | 165.33 |
| 22 | 189.50 | 191.50 |
| 23 | 215.67 | 217.67 |
| 24 | 241.83 | 243.83 |
| 1 | 268.00 | 270.00 |

Electrical quantities are computed from sampled voltage and current. The following are the mathematical formulas used:

Quantities calculated every sample:

Sample Index: n=n+1

Real Energy: $WHr_n=K_U V_1(n)I(n)T_S+WHr_{n-1}$

Reactive Energy: $VARH_n=K_U V_{L1}(n+m)I(n)T_S+VARH_{n-1}$

Apparent Energy: $U_n=\sqrt{WHr_n^2+VARH_n^2}$

Volts-Square Hour: $V^2H=K_V^2 V_1(n)^2 T_S+V^2H_{n-1}$

Current-Square Hour: $I^2H_n=(K_U/K_V)^2 I_1(n)^2 T_S+I^2H_{n-1}$

Quantities Calculated Every Frame of N Samples:

Frame Index:

$f=f+1$

RMS Voltage:

$VRMSF_f=\sqrt{(V^2H_n)/T_N}$

RMS Current:

$IRMS_f=\sqrt{(I^2H)/T_N}$

Volt-Amp Hour:

$VAH_f=VRMS_f IRMS_f T_N+VAH_{f-1}$

Where:

$K_U$=KWH calibration constant for a particular range and metering phase.

$K_V$=Voltage calibration constant.

$V_1(n)$=Voltage sample point "n".

$V_{L1}(n+m)$=Late voltage sample that is 90° displaced on the waveform from $V_1(n)$.

I(n)=Current sample point.

N=Total number of samples taken in a frame.

$T_S$=Sample period.

$T_N$=Frame period.

Notes:

1. $V_{RMS}$ and $I_{RMS}$ are non-accumulation quantities but require a frame of samples for calculation. A frame size is approximately 1 second's worth of samples. The $V_{RMS}$ calculation uses $V^2H$ that has accumulated between samples 0 and N. Similarly, the $I_{RMS}$ calculation uses $I^2H$ that has accumulated between samples 0 and N. Therefore VAH is only updated once per frame.

2. VAH contains power of harmonic content, whereas WHr, U, and VARH, do not.

Calibration

When the meters are produced, they are capable of measuring voltage, current, KWH, and other parameters. These measurements can have an error of up to plus or minus 15 percent, due to manufacturing tolerances in the electronic components. While the value of this error is not predictable, the error will be extremely stable for a given meter. In other words, a meter which has just been built will not be particularly accurate, but the error will be very repeatable.

The calibrator used in a preferred embodiment measures the inherent error of the meter, then instructs the meter's onboard processor to correct the measured error. The meter stores these correction factors in its non-volatile memory, resulting in readings that are both accurate and stable.

The calibrator comprises a computer and auxiliary equipment. The calibrator is preferably capable of supplying AC voltages between 0 and 600 volts, and AC currents between 0 and 210 amps. The phase angle theta (Θ) between the voltage and the current is adjustable from −90 to +90 degrees. The frequency of the AC power can be either 50 or 60 hertz.

The calibrator communicates with the meter using the meter's built-in optical communications port, and uses standard measurement devices to measure the actual correct value of the parameters being adjusted. For voltages, the calibrator uses a digital voltmeter (DVM) to obtain the actual values. For KWH, the calibrator uses a Radian KWH standard to measure the KWH to 0.05 percent accuracy.

There are several possible sources of errors in the meter's measurements: (1) voltage reference value and stability; (2) ADC linearity; (3) amplifier gain and delay; (4) sample rate; (5) system clock frequency; and (6) component tolerances for resistors and capacitors in measurement circuitry.

Calibration Algorithm

Voltage reference calibration: The output voltage of the voltage reference is adjusted by the calibrator to an initial value chosen to provide the most stable output voltage. This is accomplished by reading the actual value of the voltage reference using a DVM. The meter is then instructed to set the value of a digitally-controlled potentiometer (within the ASIC in the preferred embodiment) that adjusts the output voltage of the voltage reference. The calibrator then repeats this process until the voltage reference is set to the correct nominal output voltage (in a preferred embodiment, this is 2.490 Volts).

ADC linearity calibration: the meter uses an ADC inside the ASIC to read the voltage, current, and other analog values needed by the measurement algorithm of the meter. When the ASIC is manufactured, this ADC may be non-monotonic at high-order bit transitions. The ASIC provides for individual adjustment of the weight of the 5 high-order bits in the ADC, allowing calibration to guaranteed monotonicity. The calibrator uses a DVM to measure values just above and below these bit transitions, and adjusts the weight of each bit in order to get a monotonic response. These adjustments are performed by the meter's firmware, which writes correction values into registers in the ASIC. When the proper correction values have been found, the calibrator instructs the meter to store these values permanently in the non-volatile memory.

$V_{REF}$ and ADC temperature drift calibration: the voltage reference and the ADC are both affected by temperature changes experienced by the ASIC. This results in an error which varies with temperature. The calibrator measures the performance of the voltage reference and the ADC at 3 different temperatures (room temperature, 5° C., and 85° C.). The effect of temperature is then communicated to the meter's firmware. In operation, the meter reads its ambient temperature, then uses the temperature calibration information to correct for the effects of temperature on the ADC and voltage reference.

Voltage calibration: the meter must measure AC RMS voltage. The accuracy of the measurement is affected by the factors listed above (in "sources of error"). The meter has 4 different measurement ranges for voltage. In the present meter, these ranges are: (1) Range 3 –0 to 75 volts; (2) Range 2–75 to 150 volts; (3) Range 1–150 to 300 volts; and (4) Range 0–300 to 600 volts.

The different ranges use different internal configurations of the ASIC, resulting in different gains in the signal presented to the ADC. Each of these gain settings may have a different error. For each voltage range, the calibrator supplies the meter with an AC voltage which is appropriate for that range. The calibrator then reads the voltage applied to the meter using a DVM, and also reads the voltage as measured by the meter. The difference in these readings is analyzed, and a correction factor is calculated and sent to the meter. For each range, this process is repeated until the meter and the DVM measurements agree. The value of the correction factor (the Voltage Calibration Constant) is then permanently stored in the non-volatile memory of the meter.

KWH calibration: the meter must measure energy in KWH. In order to do this accurately, the external quantities of voltage and current must be accurately measured so that KWH can be calculated. The KWH measurement depends on the value of the voltage and the current, and the timing relationship between the voltage and the current. The equation for KWH is Volts*Amps*Cos(Theta)*Hours, where Theta is the phase angle between the voltage and the current. The meter performs this measurement by sampling the voltage and the current simultaneously, then processing these instantaneous values.

Various errors can occur due to the reasons listed above. For this measurement, it is not only necessary to correct any errors in the values of the measured voltage and current, it is also necessary to correct for any error in the time relationship of these measurements. The meter has 20 ranges for current, from range 23 at 0.5 amps to range 4 at 100 amps. For each range, the internal configuration of the ASIC amplifiers is different, and the CT introduces current-dependent errors in both amplitude and delay. Therefore, the calibrator repeats the KWH calibration for each range.

Amplitude compensation: any error in the actual value measured for voltage and current is compensated for by using an "Amplitude" (A) calibration constant. This constant is a factor by which the readings are multiplied, to make the measured value correct.

Delay compensation: the time relationship between the voltage and the current signals may be incorrect due to amplifier characteristics in the ASIC, or due to the characteristics of the current transformers (CTs). In particular the CTs introduce a current-dependent phase shift which becomes greater and greater at low currents. This results in the current signal not being properly synchronized with the voltage signal. This error results in errors in the KWH measurement due to the change in theta caused by this time shift.

Any error in the time relationship between the voltage and the current measurement is compensated for by instructing the ASIC to sample the current either before or after the ASIC samples the voltage. This time-delay between the samples is adjusted to exactly cancel the time-delay caused by the measurement circuitry. This is referred to as the "Delay" (D) calibration constant.

KWH calibration algorithm: for each of the 20 current ranges, the calibrator sets up a specified voltage and current. This voltage and current are supplied to the meter being calibrated, and also to a KWH standard (Radian RM-10, +/–0.05%). The calibrator cannot directly measure the quantities that it needs to communicate to the meter (amplitude and delay error). Instead, the calibrator measures the actual error in KWH registration. This error is caused by the combination of the amplitude error and the delay error. The calibrator does this measurement by supplying the specified current and voltage to the meter and to the standard, then measuring the accumulated KWH for a specified time interval. The difference between the standard and the meter measurements is the KWH error.

In order to separate the contributions of the amplitude error and the delay error to the total error, the calibrator performs the KWH test twice. In the first test, theta is set to 60 degrees, and the KWH error is measured and saved. Then, the test is repeated at 0 degrees.

Because the slope of the cosine is nearly flat around 0 degrees and quite steep at 60 degrees, the contribution of the delay (timing) error is very small at 0 degrees, and much larger at 60 degrees. The contribution of the amplitude (value) error is the same at either 0 or 60 degrees. Therefore, with these 2 measurements, the calibrator can solve for the 2 independent error sources (amplitude and delay).

After the calibrator does these measurements and makes these calculations, the calibrator instructs the meter to compensate for these errors.

This entire process is then repeated, until the measurements at both 0 and 60 degrees are within specification. The calibration constants are then stored in the meter's non-volatile memory.

Interval Metering

Interval metering stores independent records of metering data for future recall. Electrical parameters are continuously accumulated into battery-backed RAM and then periodically stored to non-volatile FLASH memory. For example, if the metering interval were set to 30 minutes, there would be 48 records of data in the day. Table 6 below, illustrating interval storage, is an example of data storage using Interval Metering. Interval Metering can be particularly useful in calculating billing demand.

TABLE 6

| Time at start of Interval | Consumption |
|---|---|
| Feb. 03, 2001 05:00 am | 0.122 kwh |
| Feb. 03, 2001 05:30 am | 0.128 kwh |
| Feb. 03, 2001 06:00 am | 0.115 kwh |
| Feb. 03, 2001 06:30 am | 0.858 kwh |
| Feb. 03, 2001 07:00 am | 0.778 kwh |
| Feb. 03, 2001 07:30 am | 0.353 kwh |
| Feb. 03, 2001 08:00 am | 0.247 kwh |
| Feb. 03, 2001 08:30 am | 0.137 kwh |

Interval Metering offers more frequent data records, which is useful in demand billing calculations and Theft Detection. But more important, Interval Metering in conjunction with FLASH memory provides protection from data corruption. In the past, switching a very high-current inductive load created an enormous transient on the line, destroying the RAM data. In other cases, RAM has also been found to corrupt in the presence of EMI sources such as toy transmitters.

Because RAM data is frequently dumped to FLASH memory, only a minimal amount of data in RAM is ever exposed to corruption. Reducing the storage intervals further increases data protection. FLASH is a far more reliable memory because, it requires a sequence of commands for any data modification and does not require a power source for data retention.

Figures 15, 15B, 16, 17, 18, 19:
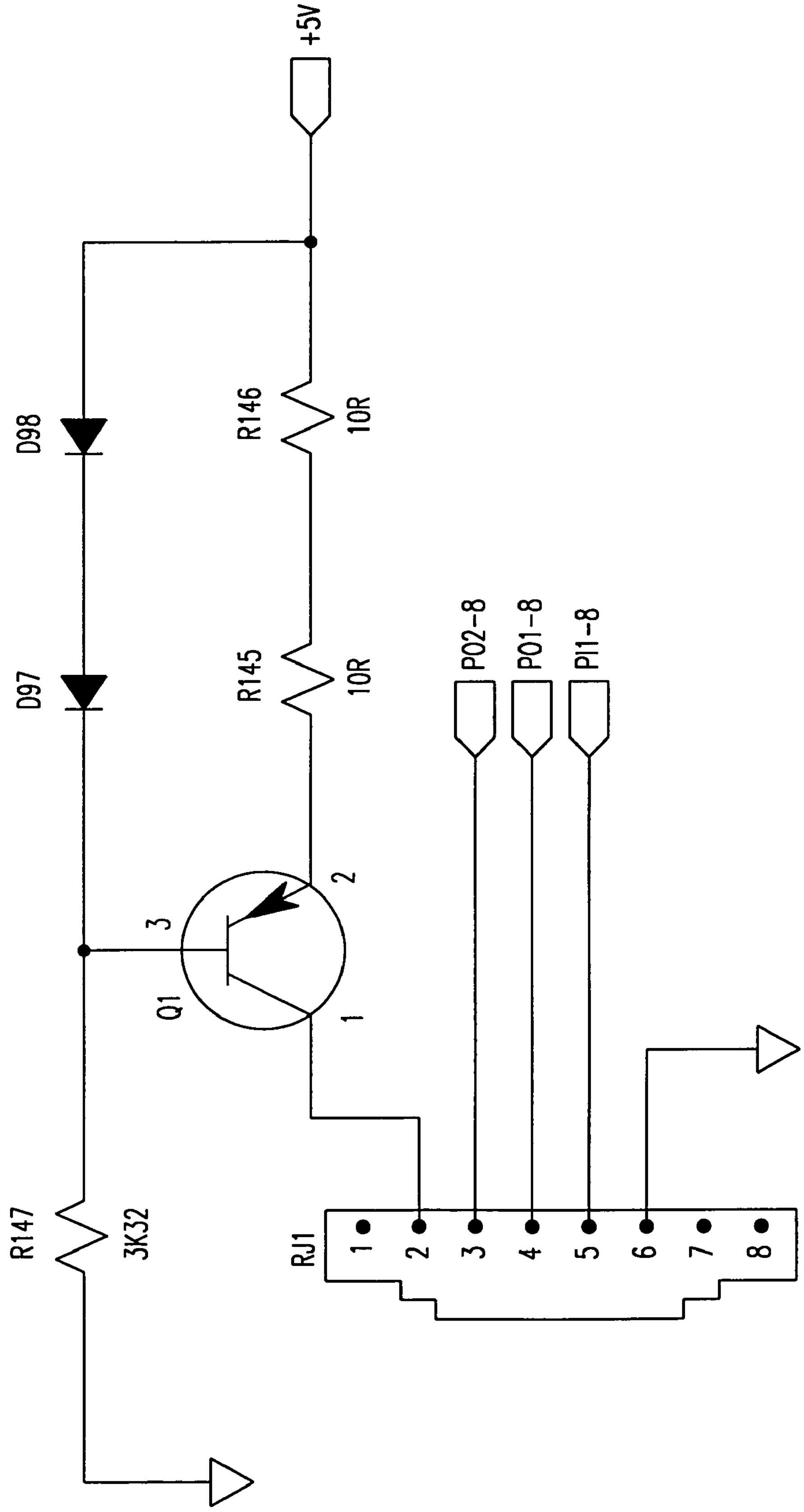
FIG. 19 shows how electrical parameters are accumulated in preferred software.

FIG. 19 shows how electrical parameters are accumulated in preferred software. There are two data accumulation registers per parameter and phase. The first register iAcc[0] becomes active. After a short period of time, this register is available to be dumped into RAM register curph. While waiting for this transfer, iAcc[0] ceases to accumulate and iAcc[1] is cleared and begins active accumulation. When iAcc[1] is ready for transfer, iAcc[1] becomes inactive and iAcc[0] is cleared and begins to accumulate. This enables seamless accumulation and periodic dumping to curph in RAM.

At the end of a metering interval, the electrical parameters are then stored to FLASH. After successful storage to FLASH, the RAM register is cleared and begins to accumulate for the next interval.

Meter Hardware

Figure 20:
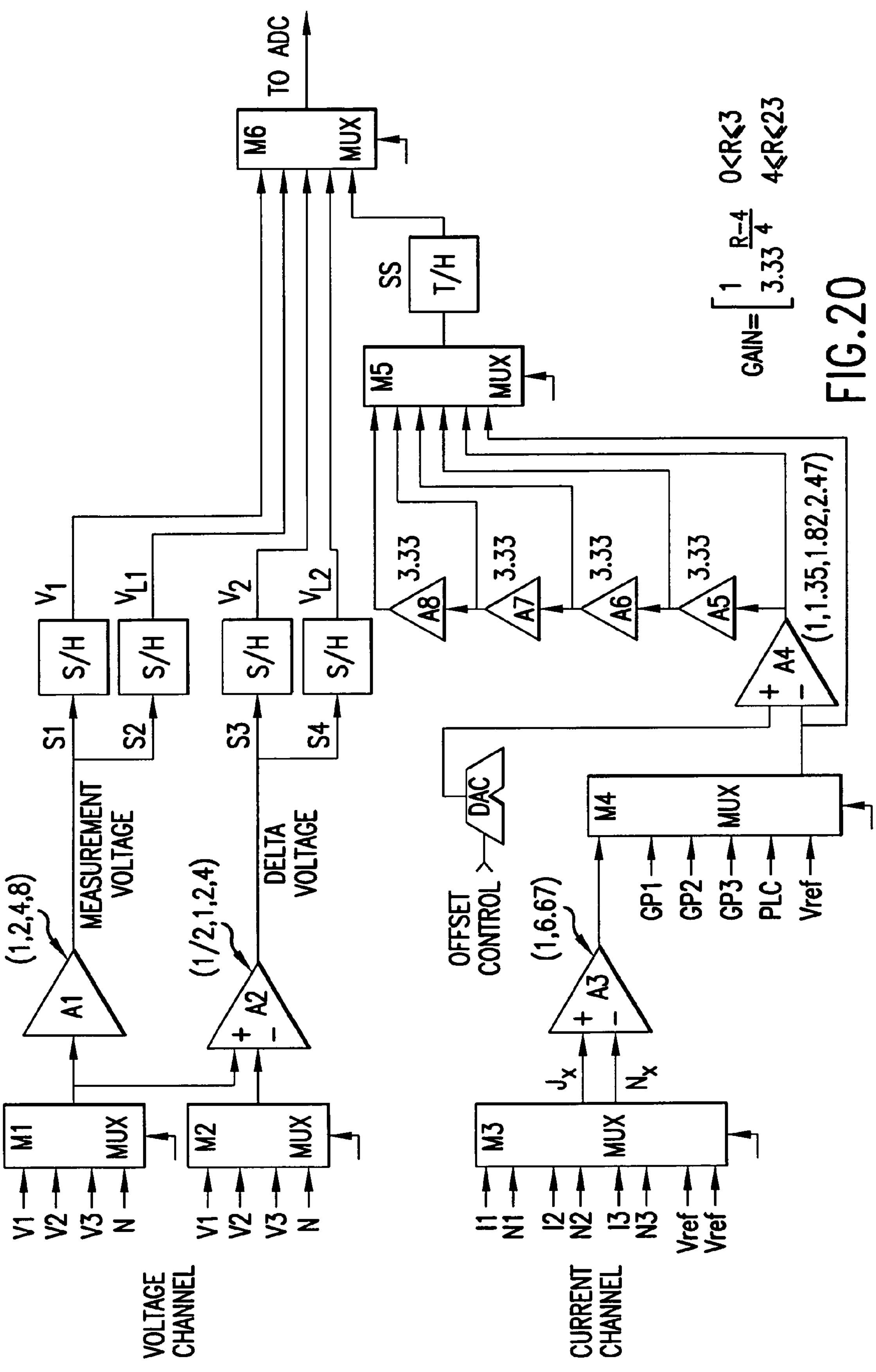
FIG. 20 depicts overall meter hardware of a preferred embodiment.

The overall Meter Hardware is depicted in FIG. 20. The upper portion shows the voltage channel and the lower portion the current channel. Both voltage and current are fed through their own gain stages and are selected through MUX M6 for the ADC.

Voltage channel—MUX M1 and MUX M21 independently select between V1, V2, V3, and N. The signal through the amplifier A1 is phase-to-neutral. The signal through the amplifier A2 is a differential (or delta) voltage between the two signals that were selected from MUX M1 and MUX M2, the delta voltage $V_2$. Each of these voltages pass through two sample and hold circuits, creating the late voltage $V_L$. From the four sample and holds emerge: $V_1$, $V_{L1}$, $V_2$, $V_{L2}$.

Amplifiers A1 and A2 have adjustable gains. Because A2 is intended for higher delta voltage, its gains are half of A1. The gain setting corresponds to a particular range of voltage amplitudes that will obtain optimal readable scale after amplification. There are four voltage ranges, 0 through 3.

| | |
|---|---|
| $V_1$: | Gain = $2^R$ |
| $V_2$: | Gain = $2^{R-1}$ |

Current channel—MUX M3 selects between 4 signal pairs: I1/N1, I2/N2, I3/N3, and $V_{REF}/V_{REF}$. The signal passes through amplifier A3, is selected by MUX M4 and passes through a series of amplifiers A4-A8. There are 23 current range settings selectable through MUX M5 and amplifier A4.

| | | |
|---|---|---|
| I: | Gain = 1.00<br>$3.33^{(R-4)/23}$ | 0 £ R £ 3<br>4£ R £ 23: |

Offset control—Small offset voltage in amplifier A3 could saturate the current channel at higher ranges, making current unreadable. To null any offset, the output offset is dynamically monitored and adjusted in amplifier A4.

ADC Temperature Calibration—Because there is temperature variation with the ADC, the ADC is calibrated with temperature against the temperature sensing diode. The result is a best fit curve that can be applied to the final data in software.

Power Line Communication

A preferred implementation of Power Line Communication (PLC) is flexible enough to allow for faster data rates and successful data recovery.

Modulation schemes—Two modulation techniques are available: Frequency Shift Keying (FSK) and Phase Shift Keying (PSK).

Data Rates—The Baud Clock is synchronized to the line phase by means of a Phase-locked Loop (PLL). The PLL is jointly implemented in software and hardware. By knowing the zero phase crossings from the PLL, the actual data rate can be synchronized to fractions or multiples of the line frequency.

Figure 21:
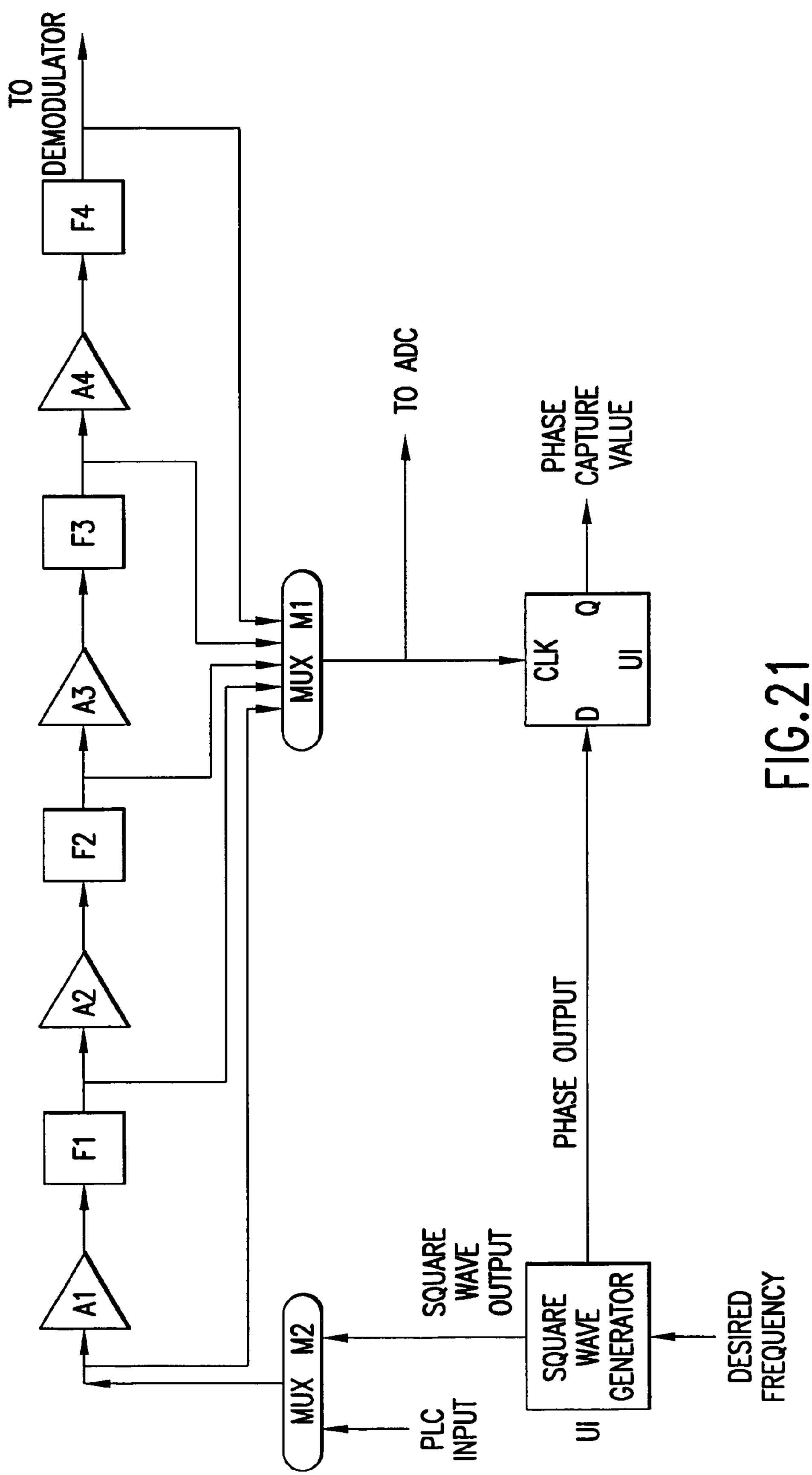
FIG. 21 depicts preferred PLC receive circuitry for an ASIC.

PLC Receiver—The PLC receive circuitry as found in the ASIC is shown in FIG. 21. In the normal mode, M2 channels the PLC input into the filter. The filter rejects out-of-band noise and couples the signal into the demodulator.

The PLC filter is designed as a continuous time domain filter. Its advantage over switched capacitor filters is to achieve higher Q and lower internal noise level in the operating frequency band. The high Q is essential because a bandpass effect is created from a lowpass, high Q design with attenuation. The attenuation compensates for high gain at the peak frequency of the LPF. The attenuation provides the low frequency rejection. A true bandpass filter can also be used as well. The filter is tunable to frequencies from 20–90 kHz. The filter also compensates for variation due to components and temperature variation.

The overall filter is frequency-tuned with the Coarse Adjustment Register. The proper setting places the filter in the vicinity of the desired value. The entire filter is comprised of four filter stages, with the attenuation control spread over the four stages. These four stages need to be aligned to the desired frequency. Fine Adjust registers F1–F4 enable frequency tuning of each stage while Attenuation registers A1–A4 enable amplitude tuning or each stage. Together, these adjustments calibrate out any discrepancies between stages.

Figure 22:
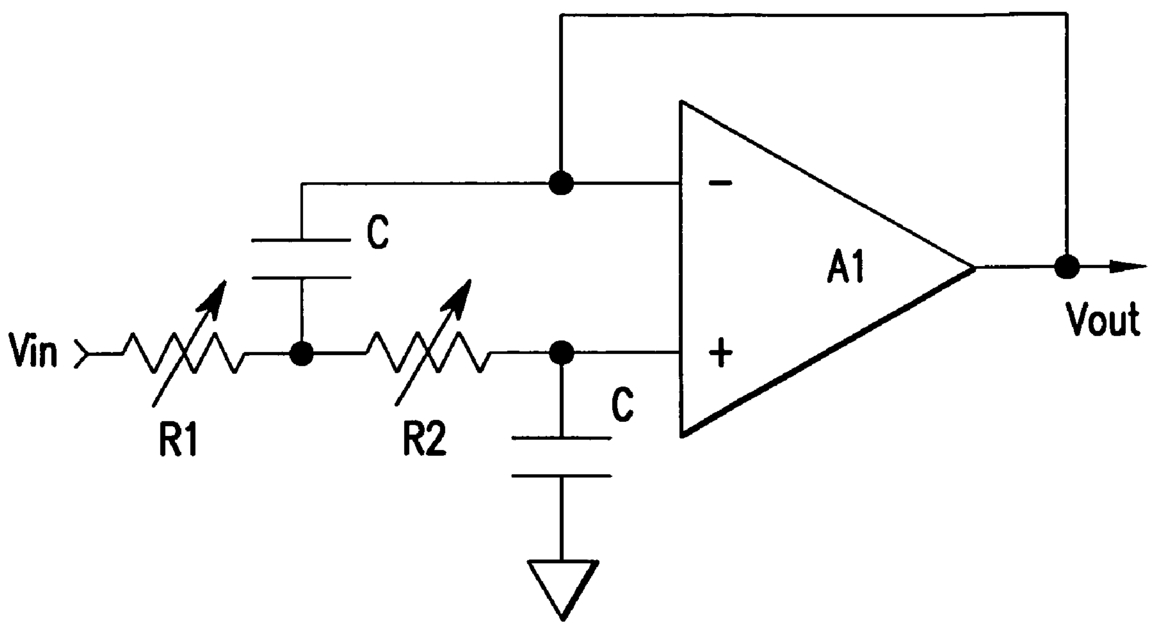
FIG. 22 is a diagram of a preferred two-pole lowpass filter used in an ASIC.

Each filter stage is preferably implemented as a two-pole lowpass filter with two external capacitors. A preferred filter is shown in FIG. 22.

Filter Alignment: Filter alignment is the process of tuning the corner frequencies of each of the four filter stages to the desired frequency by means of phase shift detection. The alignment process injects a test signal with a Square Wave Generator U2. U2 also outputs the phase of the square wave to be latched in by a Phase Shift Detector U1.

The microprocessor selects the desired frequency for U2 and routes the square wave through M2 to the input to filter. This square wave signal passes into all four stages of the filter. The microprocessor selects the filter stage output to pass through M1. The signal undergoes phase shift in the filter stages and its rising edge becomes the latch clock for U1, latching across the phase difference between the filtered signal and the test signal. For the two-pole lowpass stage, the phase at the corner frequency is 90°.

The ADC monitors the signal strength of the PLC signal to adjust attenuators A1–A4 for adequate clocking of the phase capture latch. The following is the filter alignment process:

(1) Place Fine Adjust of Stage 1 at the midpoint value.

(2) Set the Coarse Adjust Register to the highest frequency setting and lowest attenuation. Observe signal strength with the ADC. Decrease Coarse Adjust until there is valid signal strength. Adjust attenuators so that filter input does not saturate. Check phase difference. Continue adjusting Coarse Adjust and Attenuator 1 until there is a 90° difference.

(3) Tune Stage 1: (A) start with Fine Adjust 1 at the midpoint; (B) modify Attenuator 1 for valid signal strength; (C) check filter phase; (D) change Fine Adjust in the direction that leads the filter phase to 90° (a binary search algorithm is suggested); and (E) repeat (B) to (D) until filter phase is 90°.

(4) Tune Stages 2 thru 4. Note that the Phase Capture value is the phase difference between the square wave input and the output of the filter stage. Therefore Stage 2 seeks a 180° difference, Stage 3 seeks a 270° difference, and Stage 4 seeks a 0° difference.

Similarly, if the filters were designed with true bandpass filters with the same roll-off, the phase difference across stages would be 180 degrees.

Digital Demodulator: The filtered signal enters the demodulator circuit. The digital demodulator uses a digital phase lock loop to identify the binary data stream.

PLC Transmitter

A preferred embodiment uses ASIC control circuitry to control the PLC transmitter. There are two outputs that can be driven in parallel or opposite, depending on whether the design is for a bridge circuit or for a single-ended circuit.

A preferred transmitter circuit is found in the 10 series schematic drawing in FIG. 11A. Because the switching time differs between off and on, there is some overlapping period of time when both Q2 and Q3 are both active. This overlap short-circuits the power supply through Q2 and Q3 for a brief moment creating transition heat. The hardware can be designed so that neither Q2 nor Q3 will be active at the same time. This is illustrated in Table 7, which lists a Transistor Switching Sequence. The interval when both Q2 and Q3 are off is called Dead Space. Here are some benefits: (1) transition heat of the Q2 and Q3 is reduced or eliminated; and (2) output transmitter wave shape becomes more sinusoidal, and therefore reduces harmonic injection to the line. The dead zone makes the transition step more gradual at the edges. And since the load is inductive, current continues to flow through the bridge through the bridge clamping diodes (D22, D23, D32, and D33) during the dead period, creating rounder edges and therefore more a sinusoid effect.

TABLE 7

| Duration | Q2 | Q3 |
|---|---|---|
| 12 us | ON | off |
| 3 us (dead space) | off | off |
| 12 us | off | ON |
| 3 us (dead space) | off | off |
| 12 us | ON | off |

TABLE 7-continued

| Duration | Q2 | Q3 |
|---|---|---|
| 3 us (dead space) | off | off |
| 12 us | off | ON |
| 3 us (dead space) | off | off |

Dead Space can be implemented in ASIC hardware or in discrete circuitry. The ASIC can use a binary counter and specify certain count states as "off" states. Discrete circuitry can be designed so that the base drive has a delayed turn on but synchronized turn-off.

The overall design of the transmitter circuit is to drive a toroid coil using a transistor bridge circuit using transistors Q2, Q3, Q4, and Q5. The control signals are PLCX1 and PLCX2.

The base drive design for Q2 is explained below. Since the base drives of Q2, Q3, Q4, and Q5 are identical or complementary, it is sufficient to discuss only the base drive of Q2. Capacitor C9 provides AC coupling between the transistor base and the control signal.

This serves at least two functions:

(1) Transistor protection due to control signal failure. If PLCX1 was temporarily stuck in high impedance or at some intermediate voltage level (2.5V for example), Q2 and Q3 would turn on. This short-circuits the power supply through these devices and quickly damages these devices. The AC coupling deactivates the circuit under any situation where PLCX1 or PLCX2 gets locked into any static state.

(2) The AC coupling also reduces transition heat. In the absence of Dead Space hardware, the AC coupling reduces transition heat by forcing a faster switch off time for Q2 and Q3. When PLCX1 transitions from high to low, the opposite side of C9 transitions below ground. This negative voltage is impressed upon the base of Q2 through D28. Charge is pulled out of the base of Q2 making the switch off far more rapid.

PLC Line Injection

PLC is injected into the line through series capacitors C4, C5, and C6 (see FIG. 11A). These capacitors block the generated PLC signal from high voltage. But unless C4/C5/C6 is very large, the impedance of the series capacitance weakens the signal substantially. Unfortunately, capacitors of large values, high AC voltage blocking, and board mount size are rare and expensive. Therefore, an inductor L3 is placed in series with the capacitor to cancel some of its impedance. For lower voltage applications (e.g., 120V), only one capacitor is required for line blockage allowing for a smaller inductance to be used. For medium level voltages (e.g., 220V, 347V), C4 and C5 must be used. For the highest level of voltages (e.g., 480V, 600V), all three capacitors must be used. Therefore, by building the PLC injection circuit to match the line voltage requirement, signal strength can be maximized while costs are minimized.

C4, C5, C6, and L3 also act as an LC filter. For narrow band applications, a larger capacitance and smaller inductance is used. For broader band, smaller capacitance and larger inductance is used. Furthermore, another capacitor (not shown) can be placed at the CV/CN inputs. This offers yet another pole of filtering, if desired. This part can be mounted on the PCB or placed in the wiring harness.

Pulse Circuit

The Pulse Circuit controls external relays and counts contact closures. External relay control gives the utilities access to external events such as turning off power to the house or controlling other appliances. Contact closure reading enables other metering quantities such as gas and water to be monitored. The Pulse Circuit monitors these quantities in the absence of electric service. Normally, all services (such as gas, water and electricity) are active. Because of a battery-backed supply, gas and water are still accurately monitored in the absence of electric service. The circuit is shown in the central portion of FIG. 11A.

Contact Closure Read:

The contact points are isolated from the main circuit through optical isolators and a pulse transformer. A remote microprocessor U4 polls the contact closures through a pulse transformer. Any contacts that are closed will activate the corresponding optical isolator (OPT3–OPT6) and shorts out the capacitors (C11–C14). The microprocessor reads the voltage on these capacitors to know which contacts were closed.

The pulse circuit is normally powered by +5VDC (through D5). But when +5VDC is not available, the battery supply (through D8) becomes the power supply of the pulse circuit. Because the minimum required voltage of the microprocessor is very close to the system battery voltage, care is preferably taken to maximize supply voltage. A schottky diode (D8) is used to minimize drop. A separate power feed (D6 and D7) is used to power the pulse charger, whose voltage is held by C19. This capacitor is charged through a current limiting resistor R52 to minimize voltage dips due to battery resistance. When the microprocessor activates Q1, C19 dumps charge into the pulse transformer, thereby providing the interrogating voltage.

Relay Control Output: The Pulse Circuit also outputs relay control through OPTA and OPTB. An optical triac, optical dry contact output, or +5VDC output are optional output controllers.

Communication to Pulse Circuit: The microprocessor performs serial communication with the ASIC by means of the lines PO2, PO1, and PI1. The main processor therefore has access to each of the accumulator registers and has control of the output relay channels.

Figure 17C:
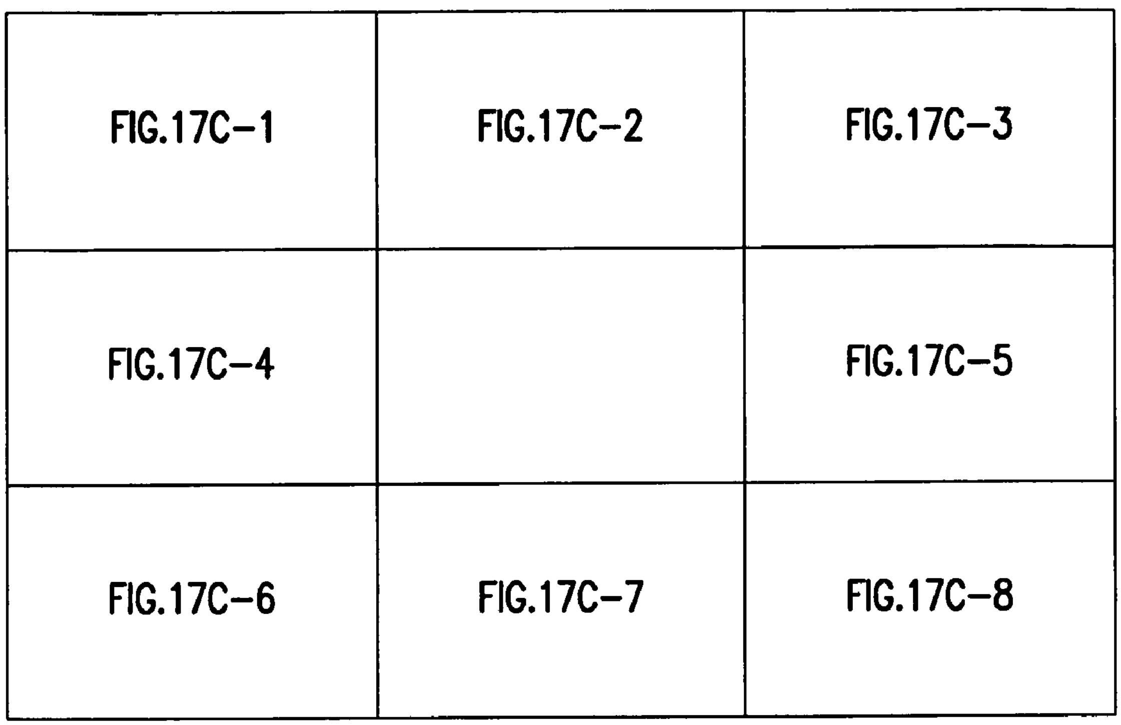
FIG. 17C shows a schematic of the pulse expansion circuit.
Figures 1, 17C:
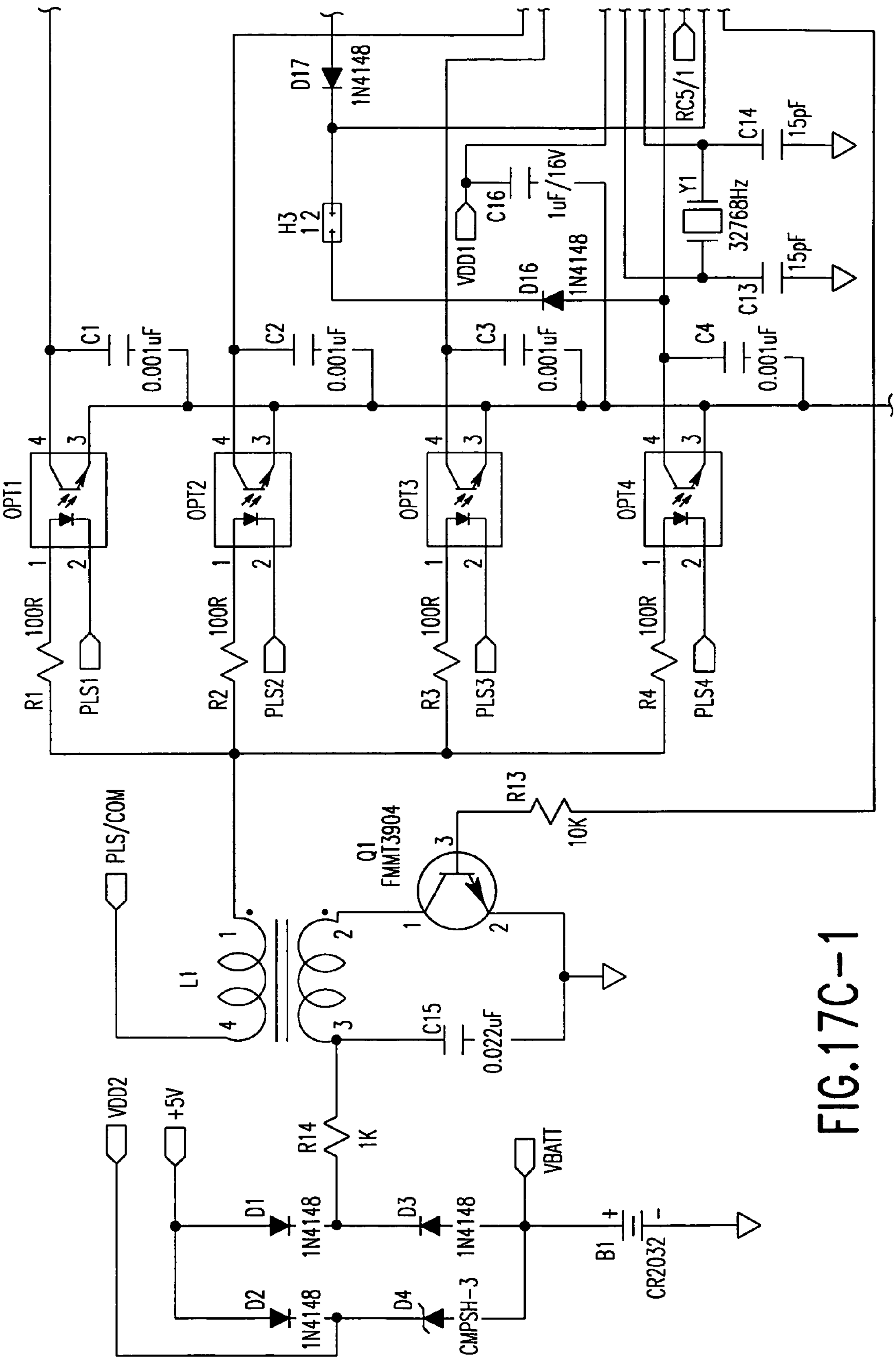
Figures 2, 17C:
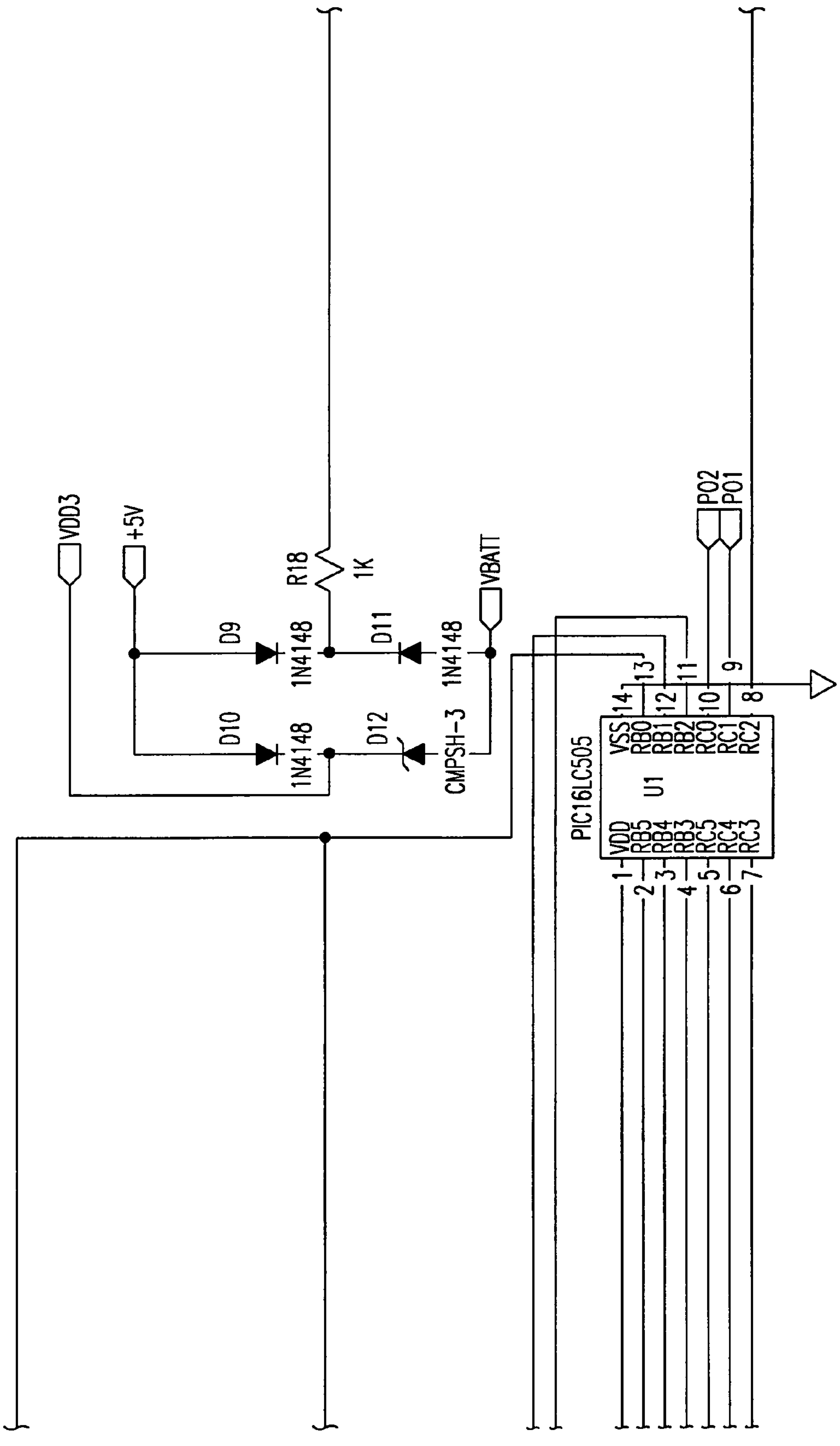
Figures 3, 17C:
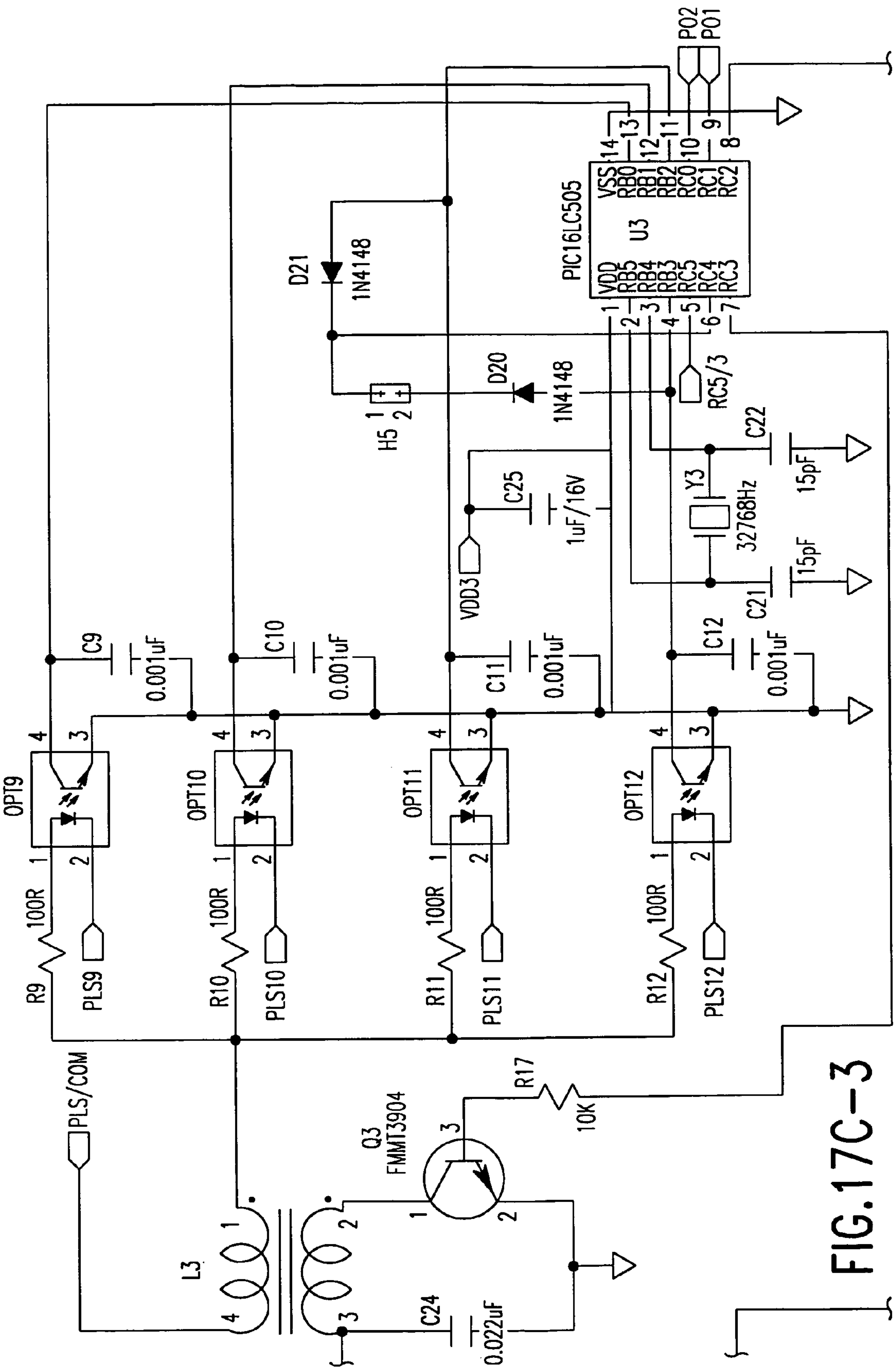
Figures 4, 17C:
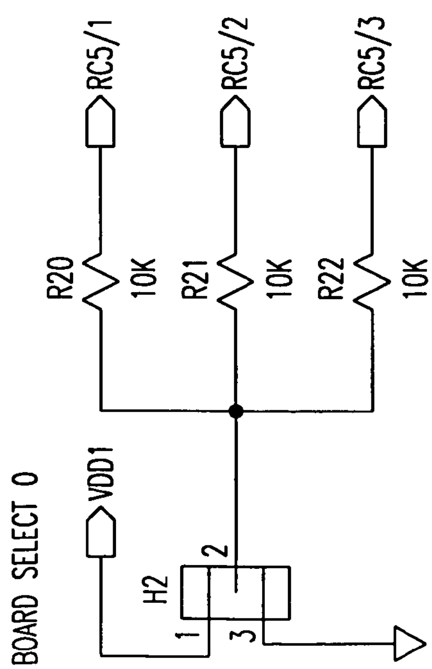
Figures 5, 17C:
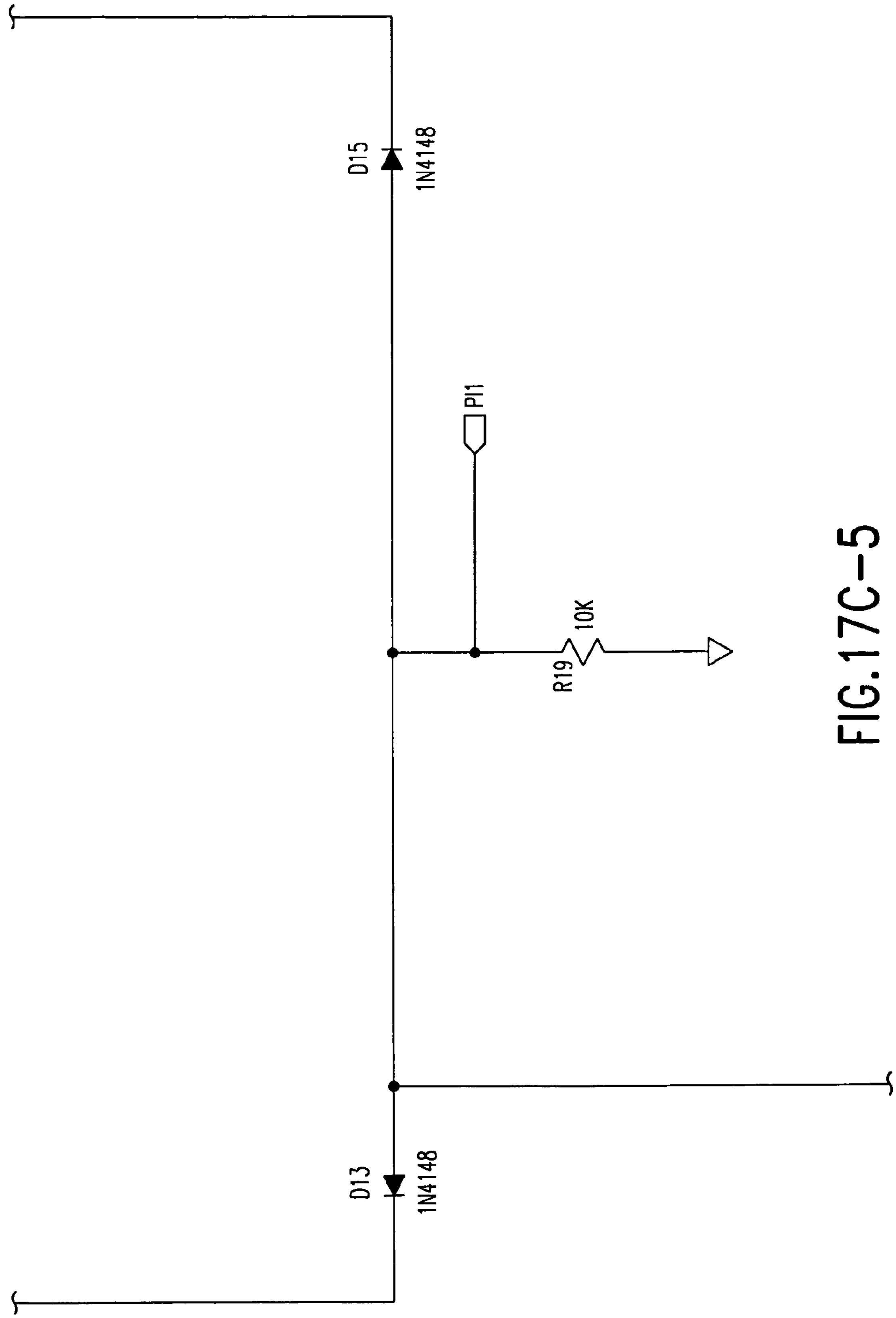
Figures 6, 17C:
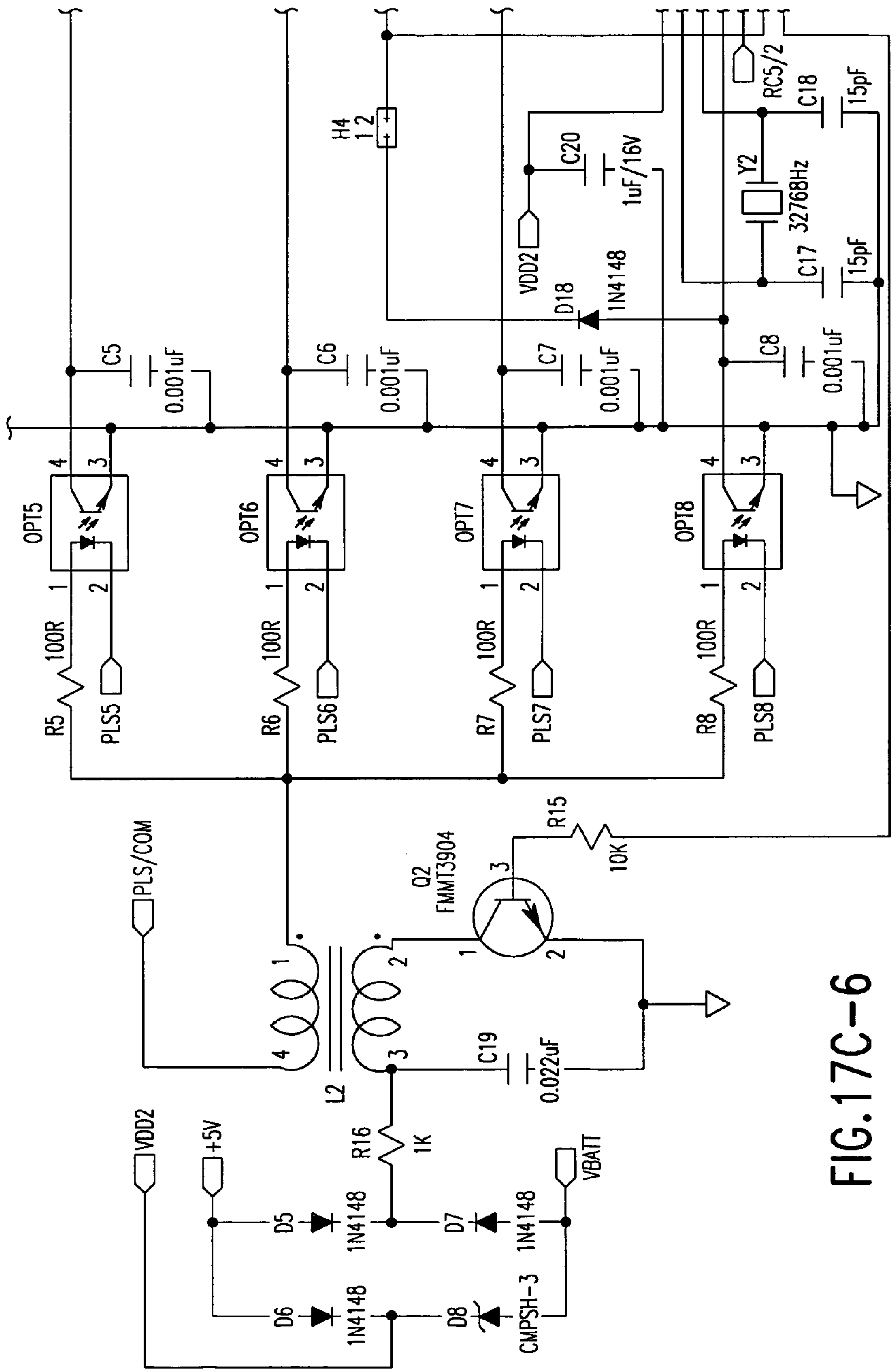
Figures 7, 17C:
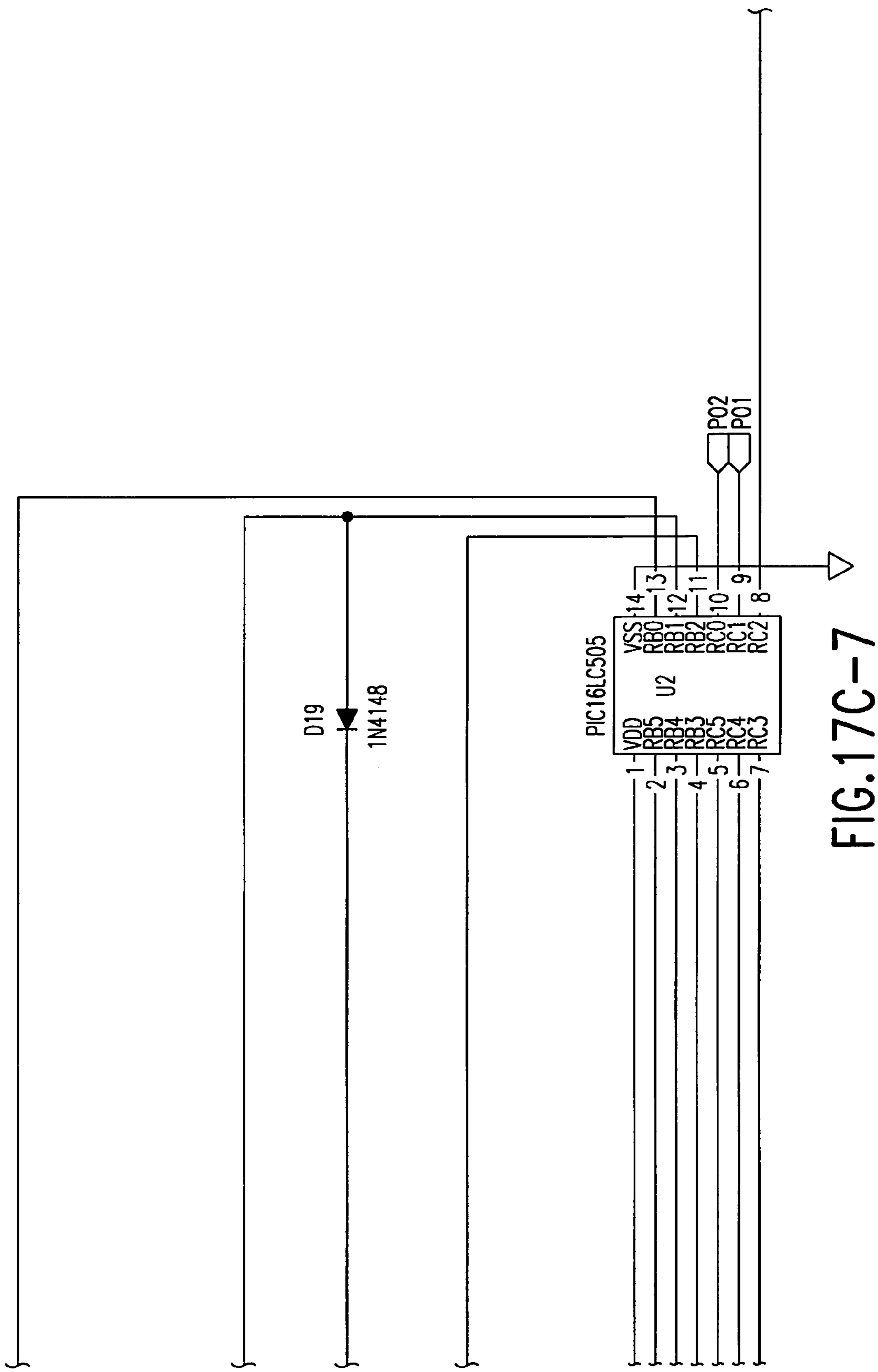
Figures 8, 17C:
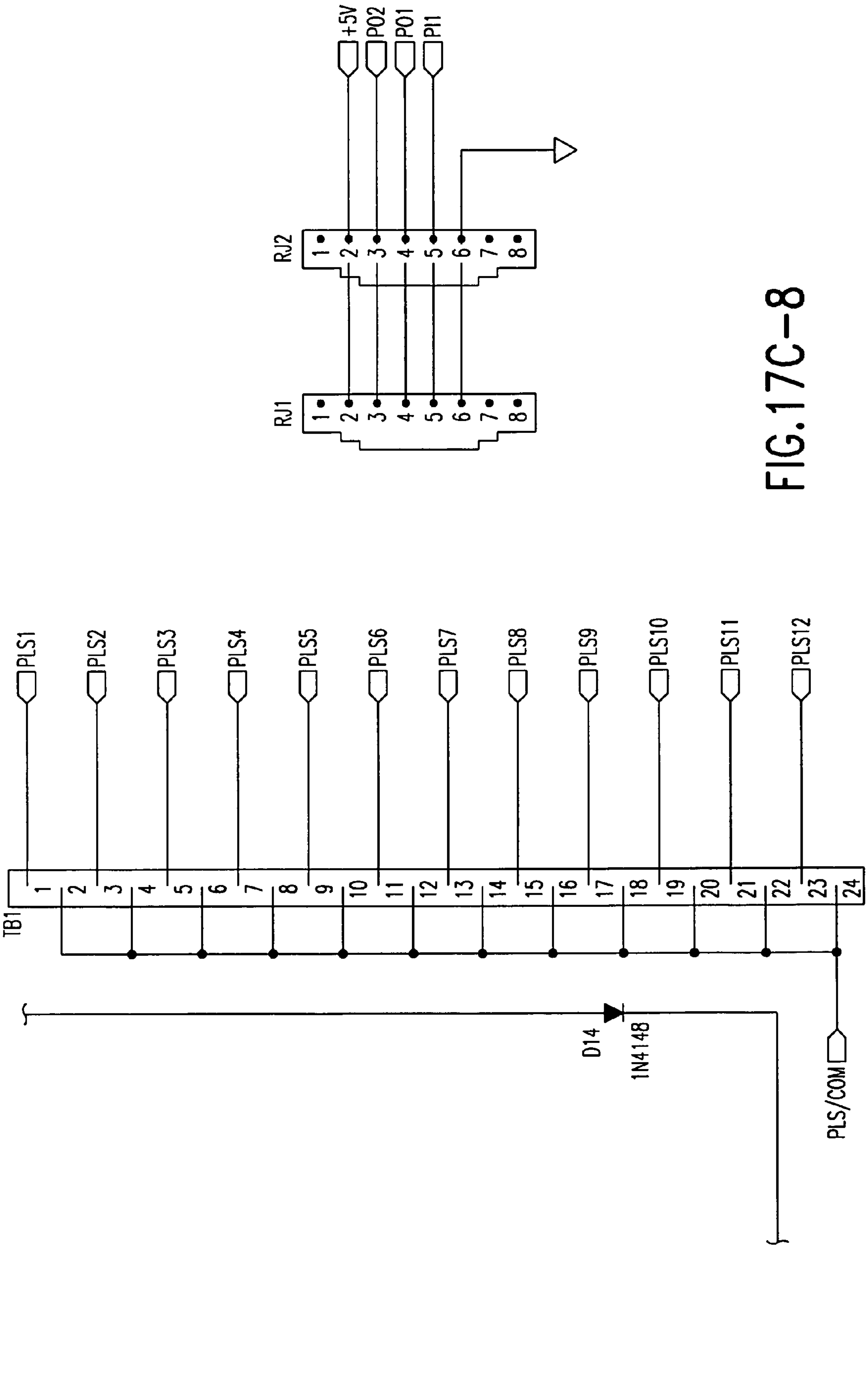
Figure 18:
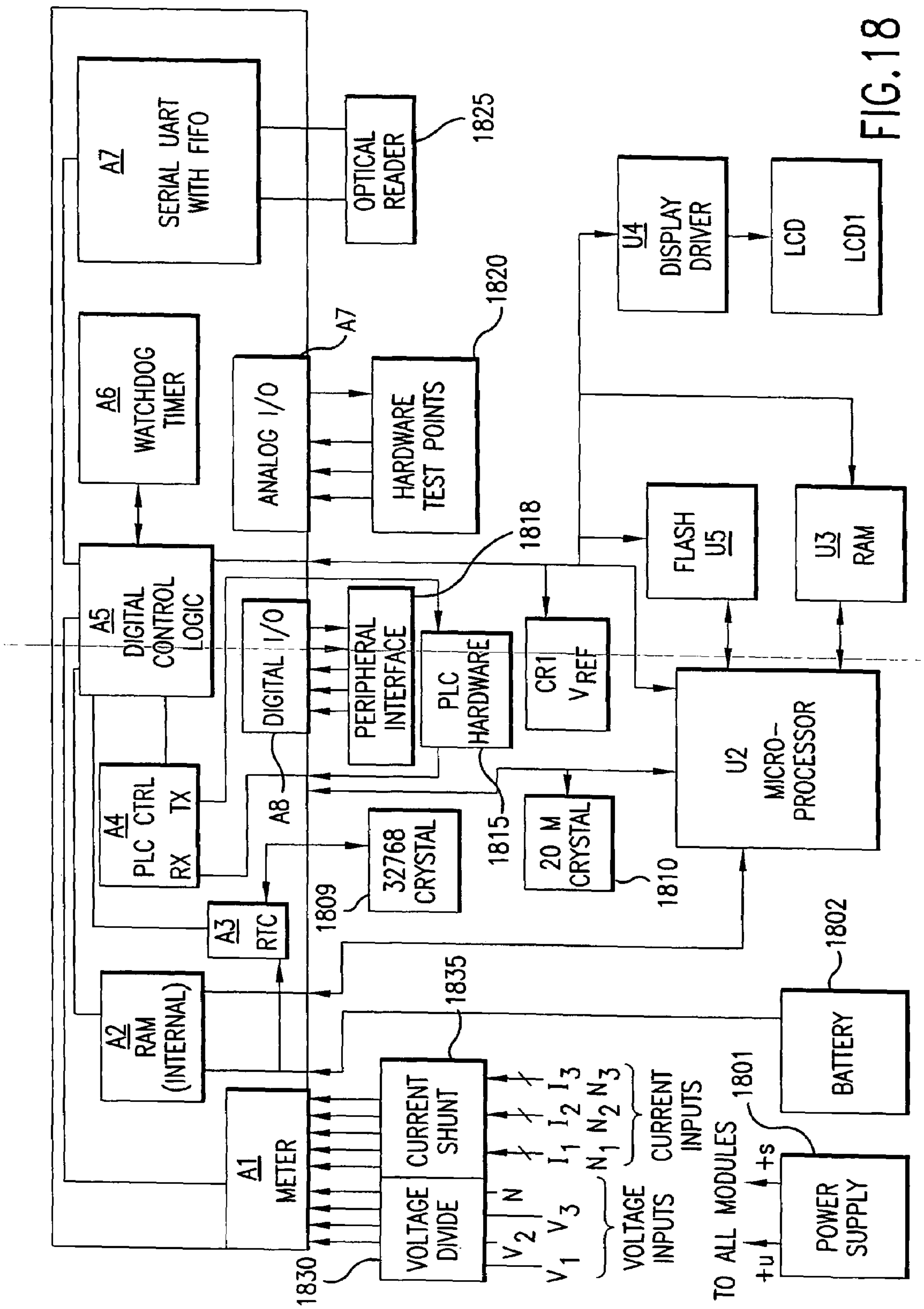
Figure 19:
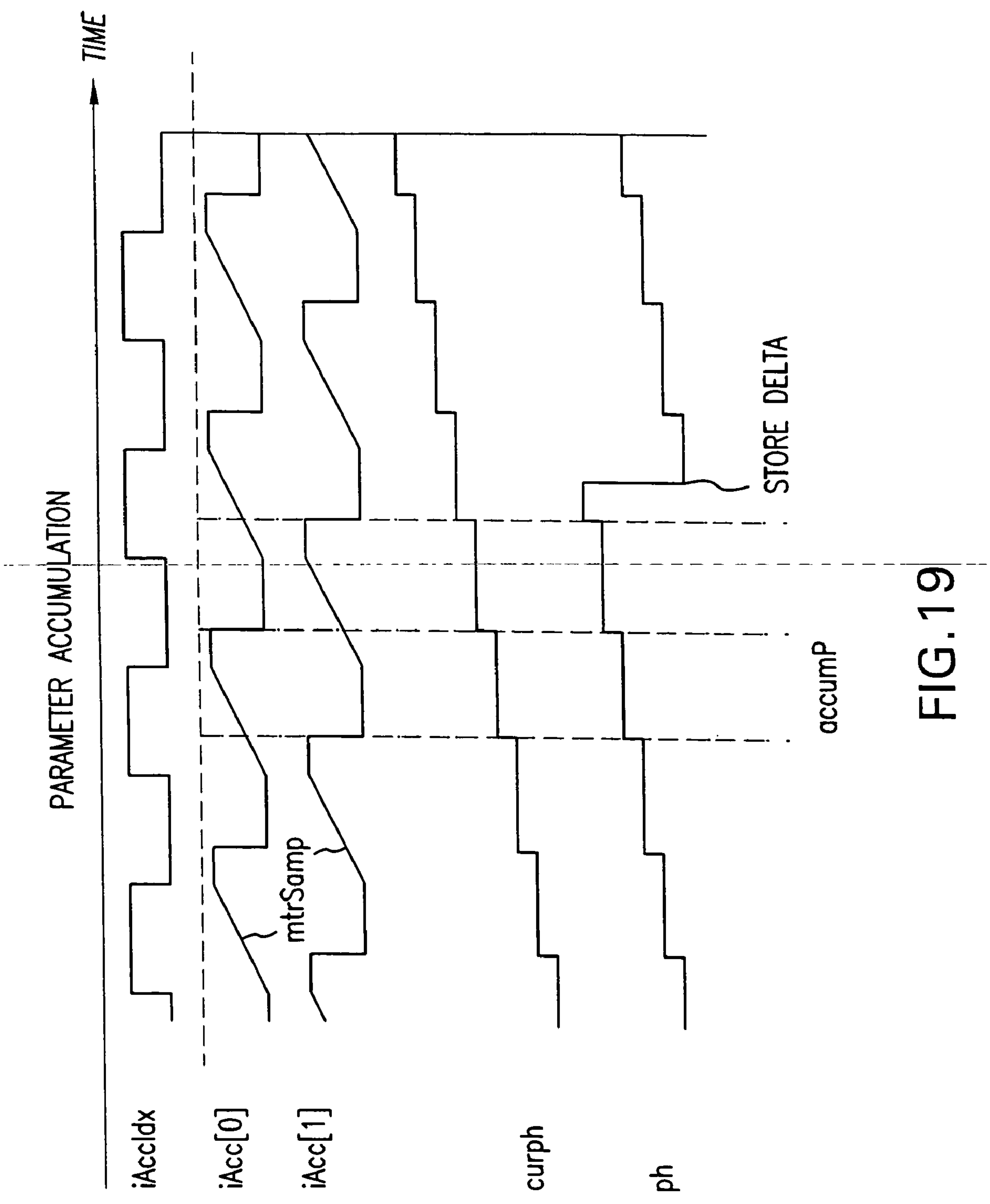

Expanded Pulse Readers: FIG. 17C shows a schematic of a preferred pulse expansion circuit. The input circuits are duplicated three times on the board for expanded metering capability. To distinguish one processor from the next, diodes D17, D19, and D21 serve to uniquely identify position. This allows all 12 inputs to be unique. In addition, four pulse boards can be serially chained to create 48 independent inputs. To distinguish the four boards, jumpers are placed in H2, H3, H4, and H5 for the processor to identify.

KYZ circuit

The KYZ circuit provides an equivalent dry contact closure that can handle 1 20VAC at the input. To prevent any momentary short circuits across the terminals Y and Z, circuitry enforces a dead period between transitions. FIG. 11B provides a KYZ schematic diagram.

The metering quantity is output through the LED signal and buffered through U2C. This waveform passes through an RC filter which slopes the edges of the square signal. This signal passes to comparators U2A and U2B. Only when the signal has traveled above 4.5V will U2B trigger causing Y to contact K. Only when the signal has traveled below 0.5V will U2A trigger causing Z to contact K. In the 0.5V to 4.5V zone, no contact is made, thereby enforcing the dead period and preventing momentary short circuits.

Mini-Closet (5A)

The Minicloset(MC) monitors a mass number of electrical metering points, saving cost and space. The price per metering point is much cheaper. Also in high-rise installations, often entire rooms are required in order to hold all the electrical meters. Because of the compact design of the MC, only a small closet is required for all the metering points. This frees up for building management extra rooms that would have otherwise been allocated for meter mounting.

Figure 15C:
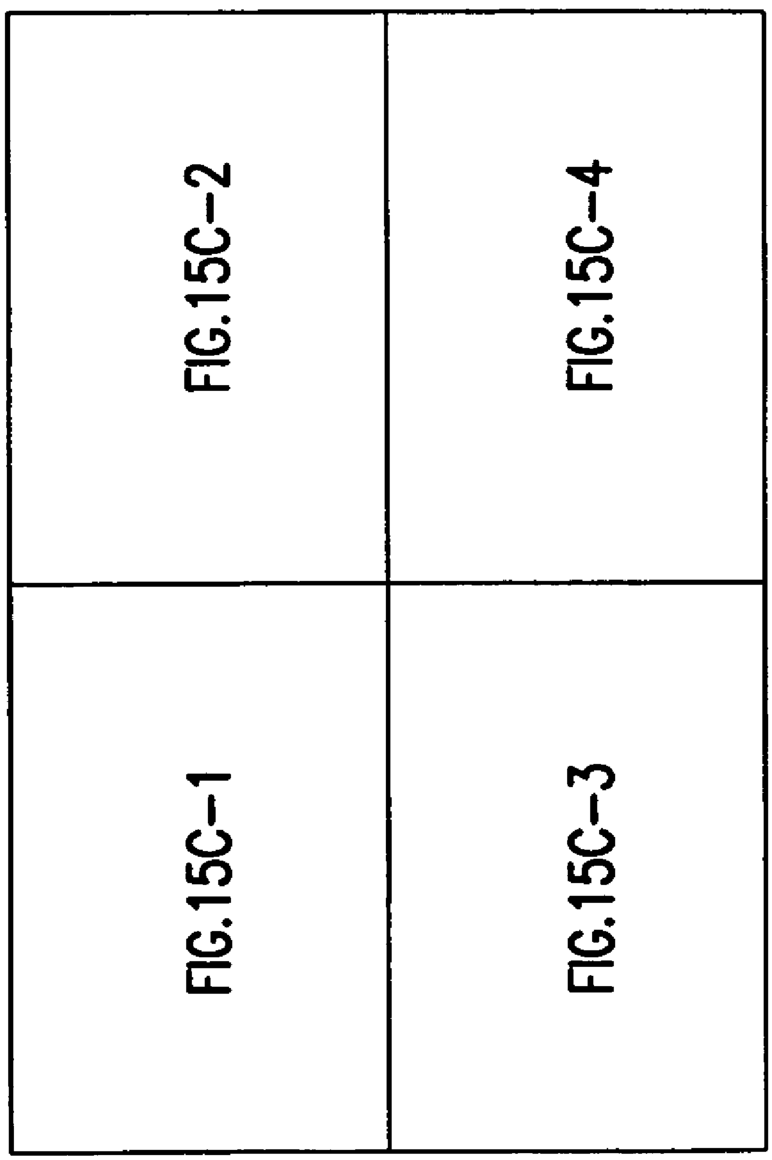
Figures 1, 15C:
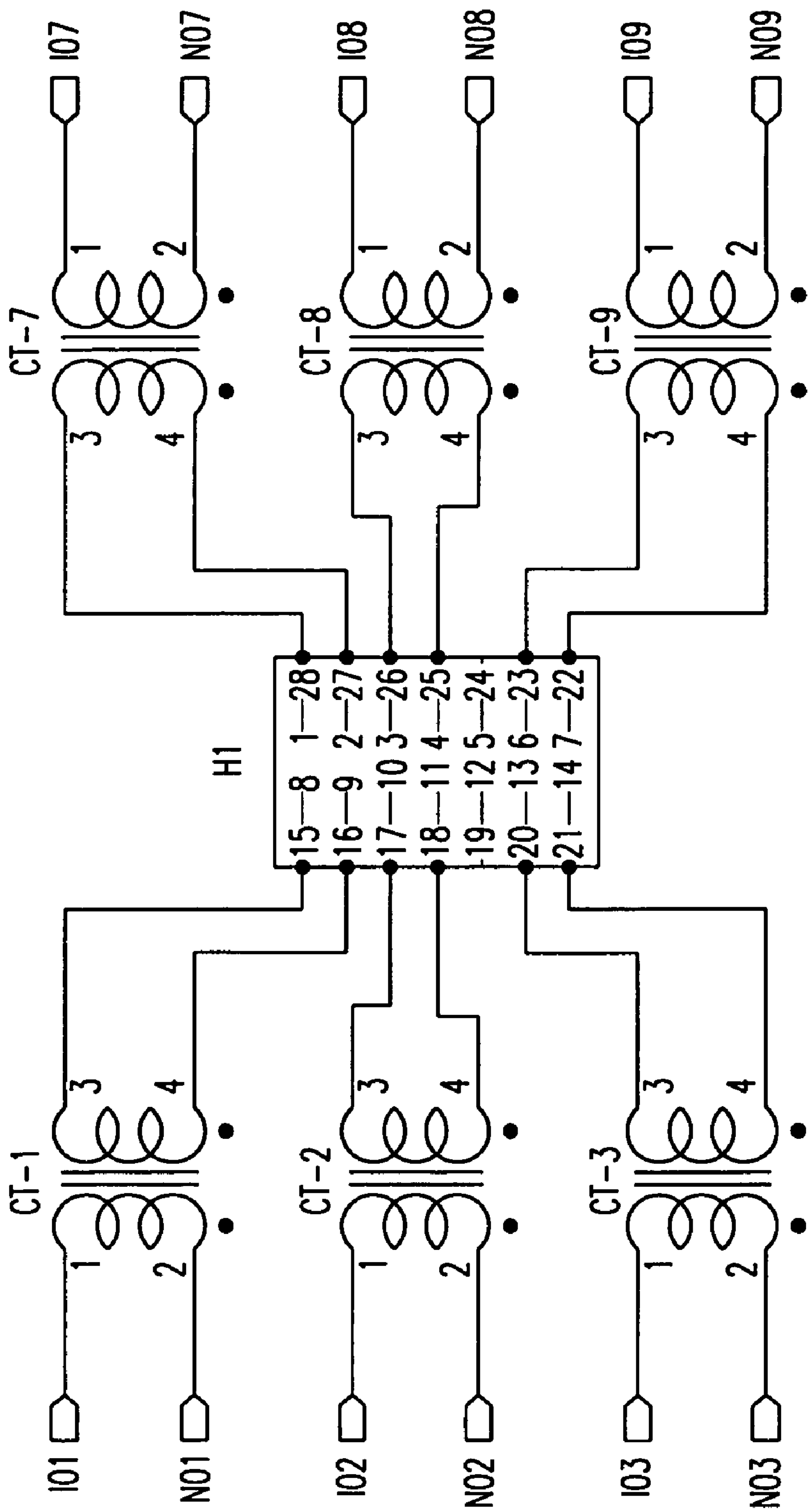
Figures 2, 15C:
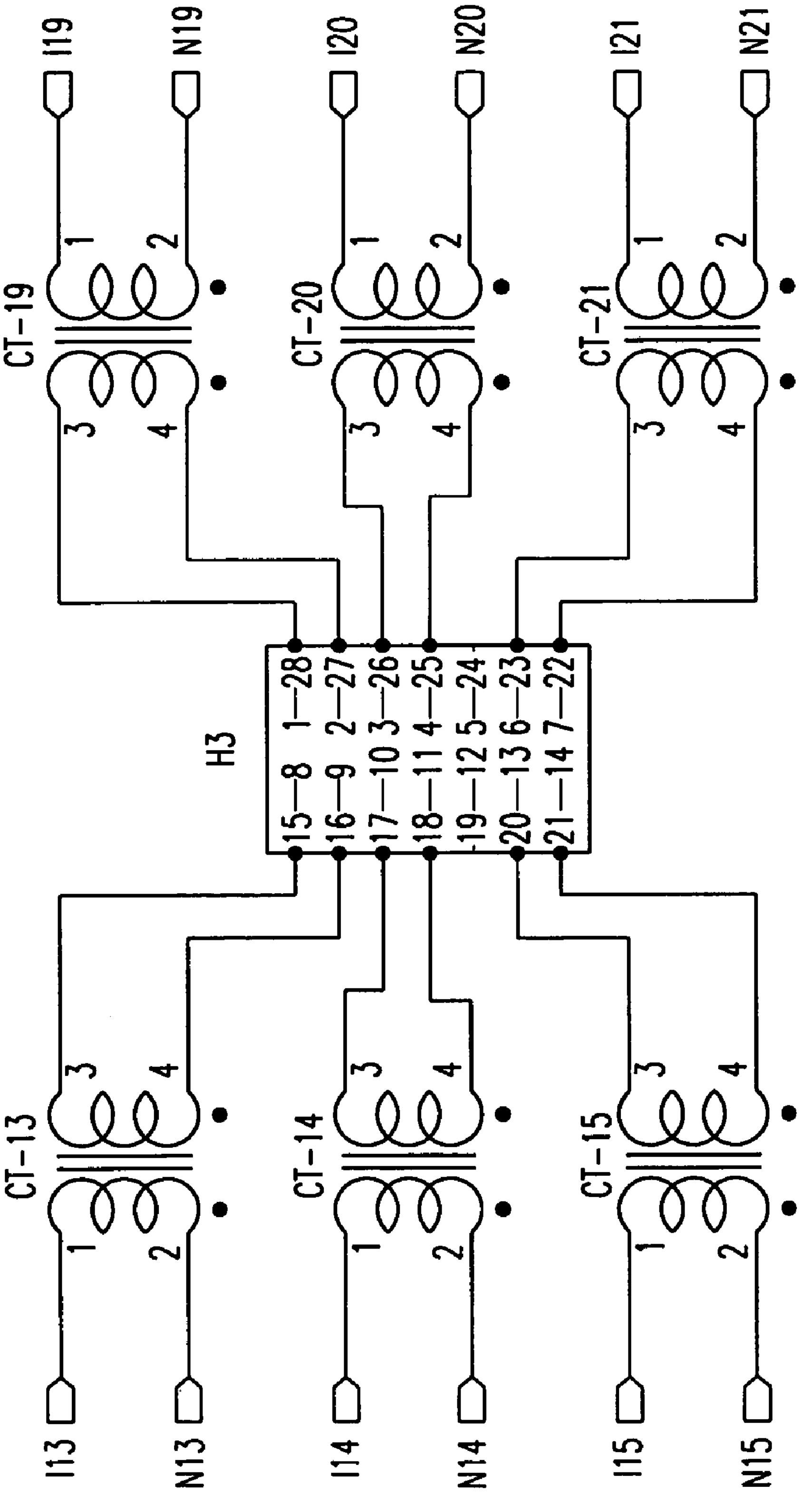
Figures 3, 15C:
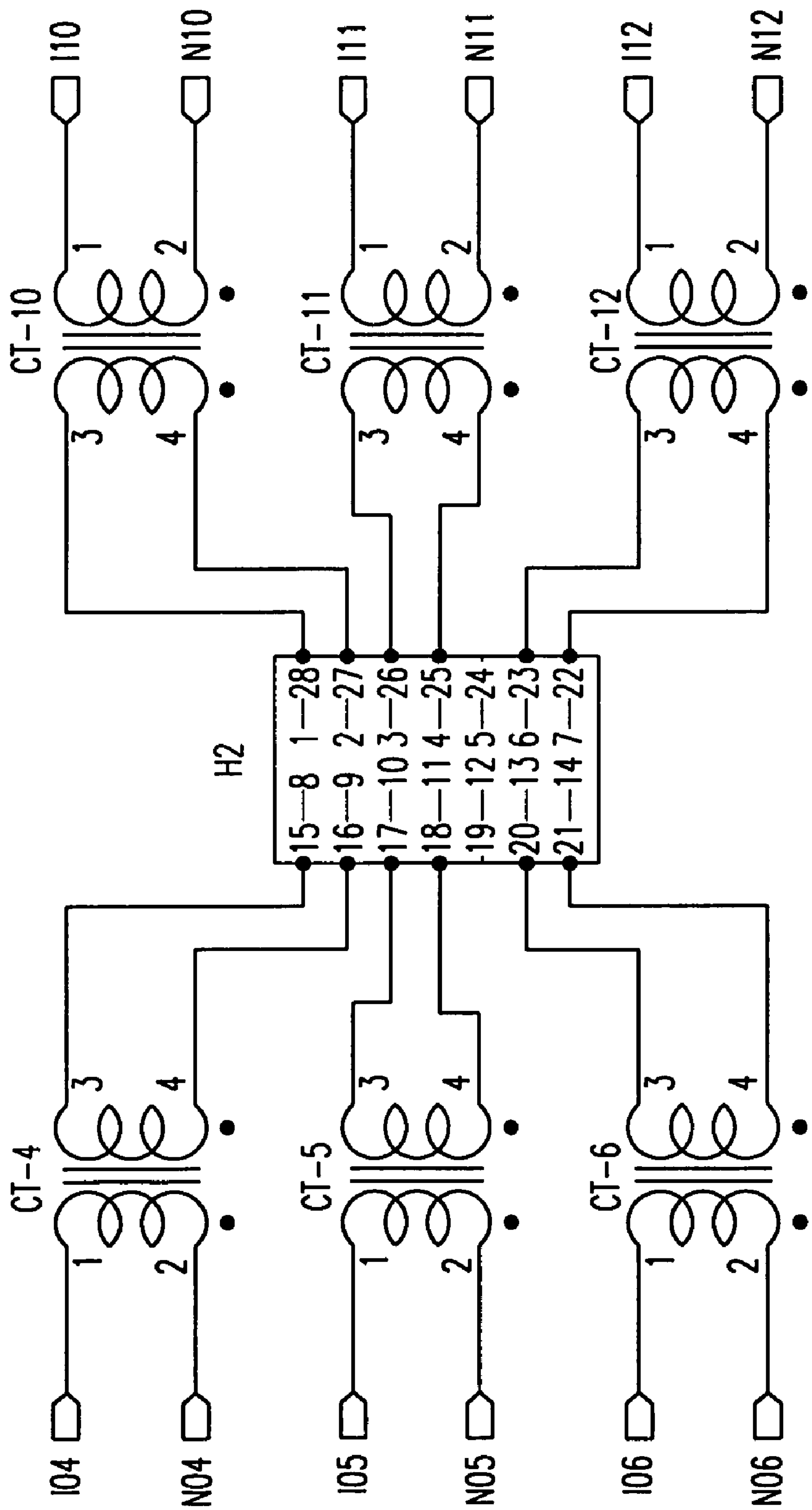
Figures 4, 15C:
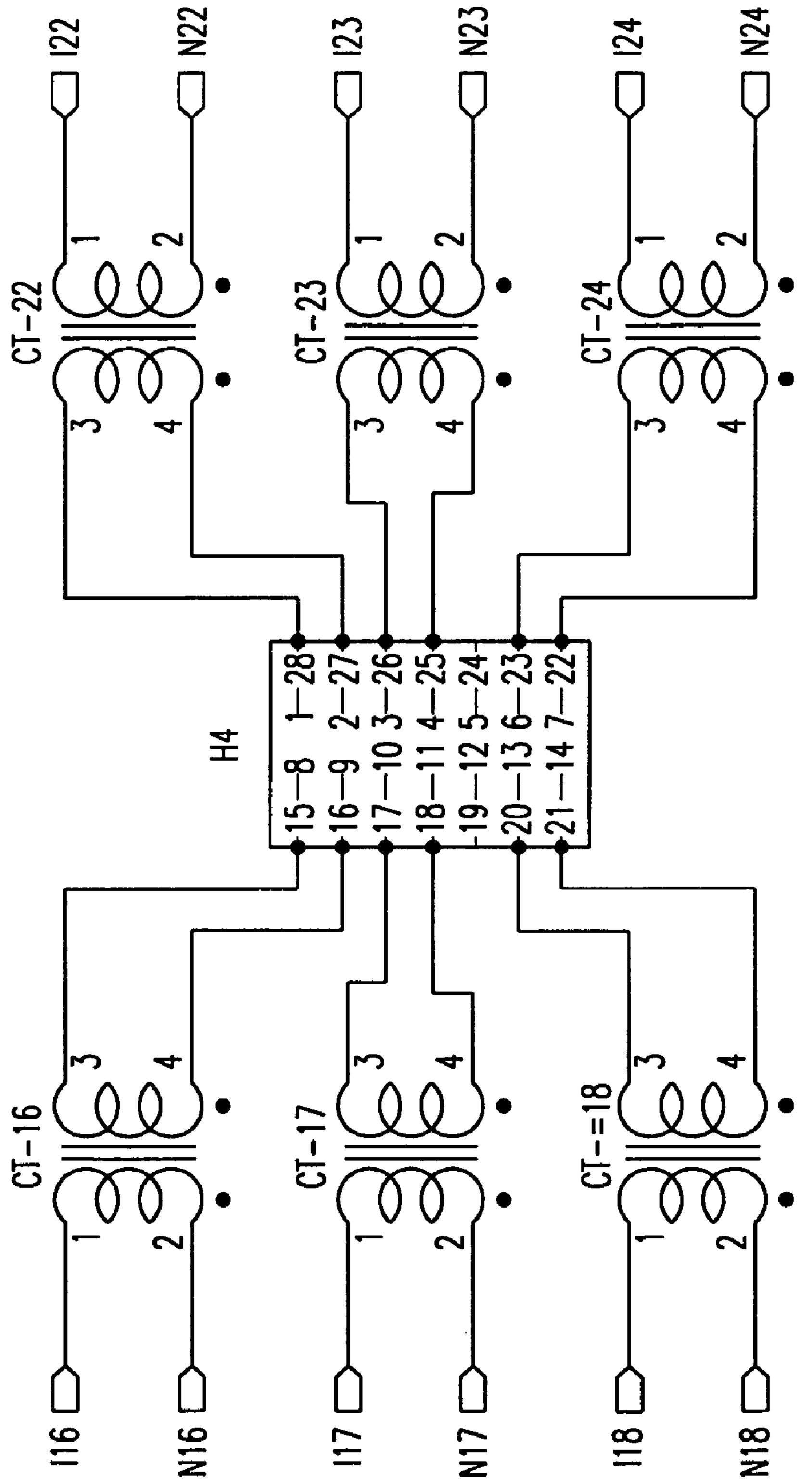
Figure 16:
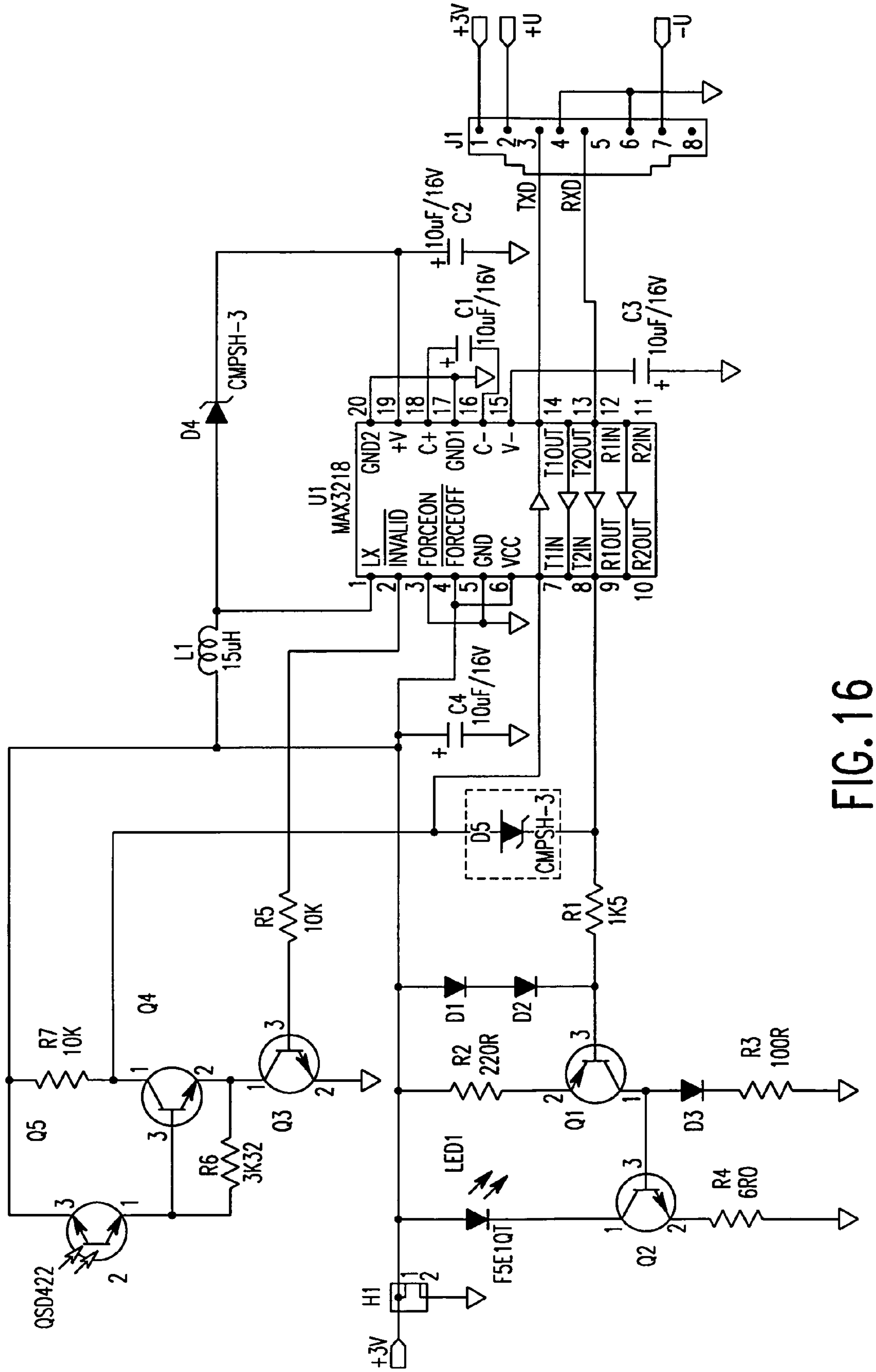

The 5A minicloset (MC) preferably monitors 24 metering points from one device. With internal 5A to 0.1 A current transformers, the MC receives current as high as 5 A. The MC also utilizes Internal Metering and stores its data in FLASH memory. The schematic diagram of the minicloset interface (MCI) board is shown in FIGS. 15B and 15C.

The main processor communicates to a remote microprocessor U1 and specifies which current channels to read. U1 controls the analog multiplexer (U2–U7) and gates in the desired CT outputs to the current sensing circuit.

The MC can also monitor higher current levels if external CTs are used to step down the current.

Scan Transponders

A Scan Transponder (ST) is used to communicate to each of the meters in a PLC system to collect data. The Transponder Power Board Circuit can be found in FIG. 11A. The transponder consists of four PLC communication channels: three channels to communicate along the three phases of the distribution transformer and a fourth phase to communicate along a medium tension line. The main processor communicates to the remote processor U1 through PO1, PO2, and PI1 to control the gating of the transmitters and the receivers.

The Scan Transponder collects data from the meters by sequentially polling each meter on a scheduled basis and copying the data to its memory. The ST can be optionally equipped with a large memory display board. The transponder can monitor electricity as well (i.e., function as an end user meter). The transponder has the ability to store additional data with an optional larger FLASH memory display board. The transponder can also periodically dump data to an even larger memory source such as a personal computer by means of a modem or a serial connection.

The ST requires that the serial numbers of each meter be cross referenced in its memory. This enables the ST to identify any meter in its cross reference table that is non-communicating. The ST also seeks optimal transfer by searching all phase, speed, and modulation combinations.

Optical Reader

An Optical Reader circuit is shown in FIG. 16. This circuit is designed for a battery source. The design uses a two stage constant current source to provide increased communication rate with transistor circuitry (Q1 and Q2).

Theft Detection

Reports indicate energy theft of 10% to 30% in some areas. A theft detection embodiment of the present invention is based on the hypothesis that theft is not evenly spread among end users. Instead, there are probably some customers who steal 50% of their energy, some who steal 100%, and many who do not steal at all. Each distribution transformer in a power distribution network can easily supply energy to hundreds of customers. Theft detection meters are preferably placed at strategic points to narrow the theft detection zone in the following ways: (1) based on the population of end users—to pinpoint known customers who are stealing; and (2) geographical area—to narrow the search area for illegal tapping.

Furthermore, in a 300 customer service area, a non-paying customer with average usage represents only a 0.3% variation in the total energy. Narrowing the theft detection zone increases the detection sensitivity. If 20 equal zones are monitored, the 0.3% variation suddenly registers as a 6% variation in one theft detection zone.

Figure 23:
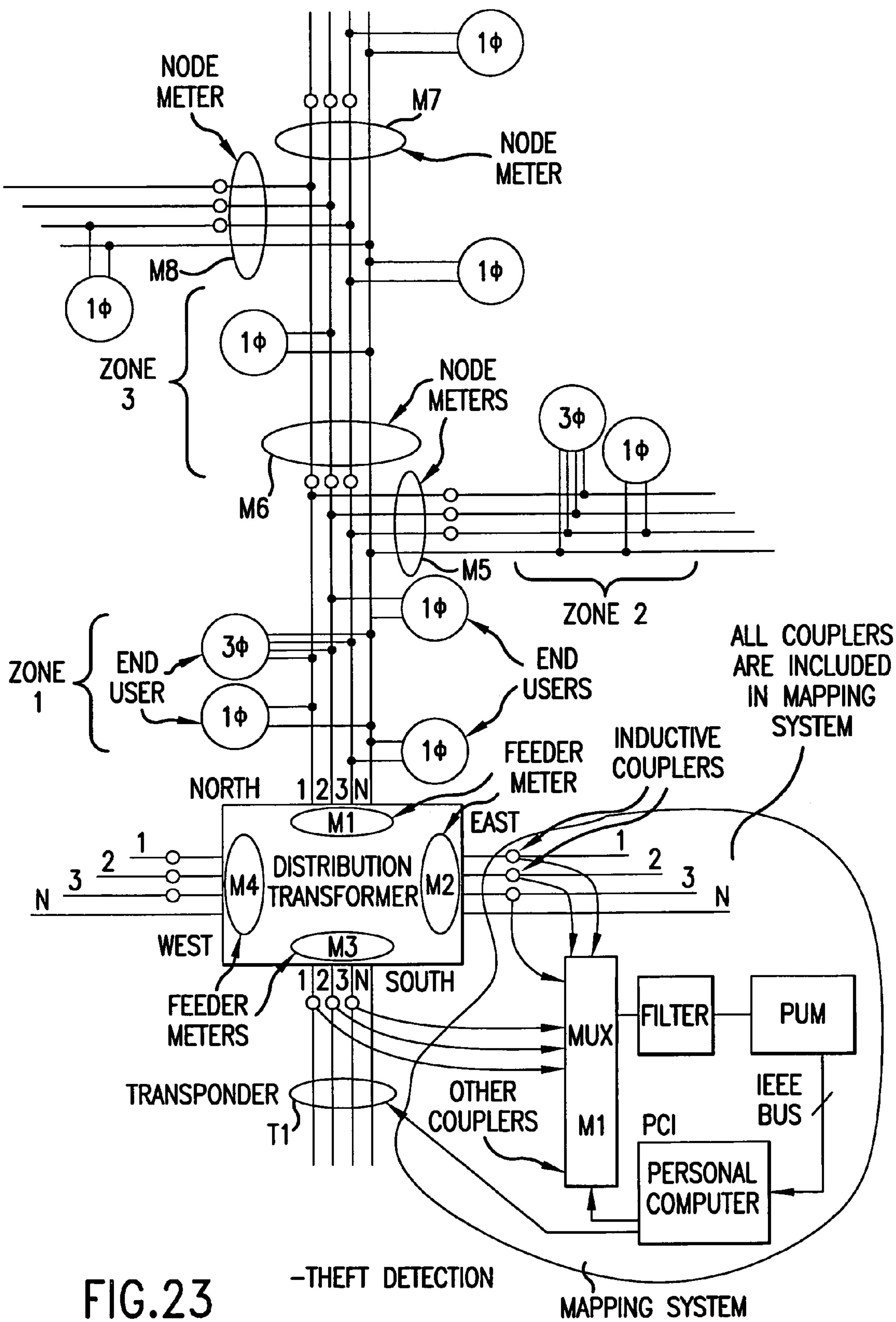
FIG. 23 depicts a preferred embodiment of the present invention used to address electricity theft.

The distribution transformer in FIG. 23 has twelve monitoring points coming from the four feeders and each of the three phases. The meters M1–M4 that monitor these points and are called Feeder Meters. By metering these 12 points, the theft detection zone reduces to 1/12 of the original metering points. In addition, Node Meters M5, M6, M7, and M8 further section the North branch into more detection zones. If all four feeders were sectioned into just three zones, there would be 36 different detection regions, sectioning 300 customers into 8 or 9 customer portions. For example, theft is determined in Zone 1 if energy theft is detected in M1 but not M5 and M6.

For the purpose of theft detection, a three phase (3ϕ) customer is treated as a customer with three 1ϕ services. This isolates the energy measurement cleanly between the phases. But for the sake of accurate demand billing, 3ϕ customers must be 3ϕ metered. If separate phases achieved equal peak demand but in non-coincident demand intervals, the customer who was billed as three 1ϕ could be overcharged for demand. Thus, a preferred 3ϕ meter is capable of being read either as three 1ϕ meters or one 3ϕ meter, thereby satisfying both conditions. Likewise a minicloset can be considered as twenty-four 1ϕ meters and a 2ϕ meter can be considered as two 1ϕ as well. This enables the Theft Detection system to work with customers of 1ϕ, 2ϕ, and 3ϕ meters and of 24ϕ Mini-closets, including any combination of such customers.

A transponder T1, located at the distribution transformer, gathers meter data from all Feeder Meters $P_F$, Node Meters $P_N$, and the End User Meters.

This system accomplishes the following: (1) isolation of theft location to a very small circuit branch; and (2) isolation of theft instance in time.

Isolation of theft location comprises the following steps:

(1) Check node meters that are furthest out, ones that have no other node meters in their branch. Here, M7, M8, and M5. A node meter consumption that registers higher than the sum of its end user meters indicates theft.

(2) Check node branches that are closer to the generator. Here, M6. Consumption in M6 that registers higher than the sum of M5, M6, and any end users in this zone indicates theft.

(3) Keep checking node branches down until node branches are the feeder wires themselves from the generator.

Isolation of Theft Instance in time: Using interval metering, theft detection can be applied to each metering interval to isolate the theft instance. The precision of time identification is determined by the metering interval.

Theft Network Mapping: theft detection requires a network map of all meters interconnections. However since an accurate electrical routing diagram from the distribution transformer is not always available, there is need for a mapping scheme. A Theft Detection Mapping System of a preferred embodiment performs the following tasks: (1) stores data identifying all Feeder, Node, and End User Meters; (2) associates End User Meters to Node branch and Feeder Meters; and (3) identifies the phase arrangement of multi-phase meters. For example, in a three-phase meter, phase 1 of the distribution transformer output might not be connected to phase 1 of the meter. This too needs to be recorded in the network map.

The network mapping system does not have to be included in the permanent installation. After mapping is done, the transponder remembers the position of all of the meters, and the mapping system can be recycled to map other distribution transformers. A personal computer (PC1) is preferably the master controller of the mapping process. Inductive couplers are place on feeder wires and node wires to identify return PLC signal strength. The outputs of these inductors are multiplexed (under control of PC1) through a sharp bandpass filter and into a DVM (such as HP34401A). PC1 reads the signal level from the DVM through the IEEE bus.

Meter Identification: PC1 instructs the transponder to gather the serial numbers of all meters that exist on the network. The transponder sequentially requests an echo from the active meters on all three phases. When a meter receives the request from the transponder, it sends back its serial number to the transponder.

End User Meter (Phase) Mapping: 1ϕ meter—The phase that the transponder reads with the greatest signal strength is metering phase of this meter. Alternatively, the phase can be determined in another way. The bit rate must be set equal to the line frequency. Because of phase lock, the bit transitions occur at the zero crossings of the line voltage. If the return signal from the meter has zero-crossings with the transponder metering phases, then the meter is said to be on transponder phase A (TϕA). If there is a +120° shift, it is said to be on transponder phase B (TϕB). And the remaining phase is transponder phase C (TϕC).

3ϕ meter—Because Phase 1 of the meter might not be connected to Phase 1 of its Node Meter, mapping is required to identify phase arrangement. Like the 1ϕ meter, the transponder sends out a PLC signal with the bit rate equaling the line frequency. But this time it is the 3ϕ meter that compares the PLC bit-transitions to the zero crossings of each of their metering phases. From these comparisons, the meter determines which metering phases are connected to TϕA, TϕB, and TϕC. The Node Meter repeats the process to identify the phase mapping relationship. These relationships are transmitted back to the transponder to correlate the phases of the Node meters with its 3ϕ meter.

Feeder Mapping: PC1 communicates to the transponder through its optical port to instruct a meter to send a 30-second message. The computer PC1 polls each of the couplers for signal strength. The coupler with the strongest signal indicates feeder position.

Node Mapping: Starting at the farthest node meters, couplers are placed at these meters and checked for signal strength returning from the meter. If a signal is not present, couplers are moved down one node at a time and are again tested for return signal strength. The process repeats until all nodes are mapped.

In a further embodiment, mapping the locations of meters is used to locate line breakages. This embodiment comprises a method of determining the location of a break in a powerline electricity distribution network that has microprocessor-controlled end user electricity meters operative to communicate with a remotely located computer. The method comprises the steps of: (1) mapping the location of each end user meter; (2) periodically receiving data from each end user meter in response to a query to that meter; (3) when a plurality of meters in the same branch of the network fail to report during a given period, querying meters in neighboring branches to pinpoint the location of a break. Such queries, used in conjunction with the network map, will locate the break (at least to the resolution provided by the locations of the query-able meters) in a few seconds, thus reducing the time typically required to find a break by having line repair personnel visually inspect the lines until the break is spotted.

In a further embodiment, a personal computer (PC) is connected to a Scan Transponder and issues commands to the ST to continuously sequentially poll each meter for an echo. When multiple meters fail to echo, the ST correlates the serial numbers of these meters on an electrical distribution map (obtained by the Theft Detection mapping scheme, for example). If the non-communicating meters lie on the same distribution path, the PC hypothesizes that there is power line breakage at the point on the map where the meters fail to communicate.

Virtual Meter

Figure 24:
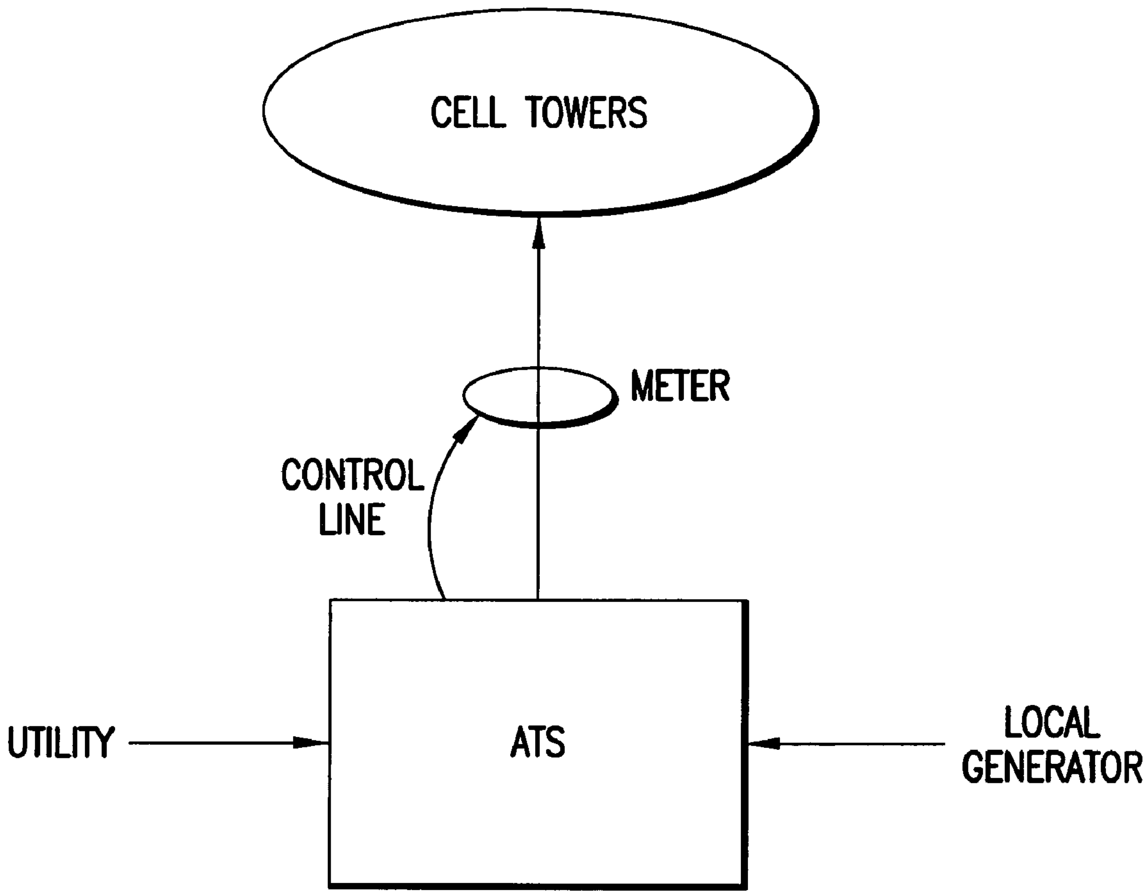
FIG. 24 depicts a system configuration for preferred embodiment of a virtual meter.

In a preferred embodiment (an example using an Automatic Transfer Switch (ATS) is depicted in FIG. 24), a single meter can monitor consumption from two or more sources—for example, a utility and a local generator—and store the data into separate corresponding sets of data registers. In the example illustrated in FIG. 24, a logical control signal line from the ATS is connected to the meter. When power comes from the utility, the meter stores metering data into a first set of data registers. When utility power is interrupted and the ATS delivers power from the local generator, the control line from the ATS triggers the meter to store metering data into a second set of data registers. When utility service is restored, the ATS switches the power source back to the utility and releases the control line; metering data is once again stored in the first set of data registers. Those skilled in the art will recognize that this embodiment can be applied to more general situations wherein there are multiple power sources and the meter receives a signal indicating when to switch metering data storage to another set of data registers.

Credit and Prepay Meters

Credit and Prepay meters of a preferred embodiment address the problems with present credit and prepay systems. No operator is needed to enter the house since all transactions are performed by PLC. Fraud-prone swipe cards are not needed since a remote utility operator handles the energy purchase and deposits the amount to the meter by PLC.

Prepay Meters: In a prepay embodiment of a preferred system, energy is purchased by an end user customer from a system operator (typically, a utility operator) in advance. The operator deposits the purchased energy to the customer's meter by PLC. When the customer has reached his prepaid limit, the meter cuts power to the household. The LCD display preferably alternates (i.e., displays each for a pre-defined period, then displays another) between the following displays, for example: (1) "Deposit $50 01/23/01"; (2) "Remaining $23.45" (present amount remaining); and (3) "Estimated Cutoff 11:43 02/28/01" (based on present consumption).

Credit Meters: In a credit embodiment of a preferred system, energy is purchased on credit. When the customer fails to pay his bill, an operator can terminate power by instructing the meter through PLC. The LCD display alternates between displaying the following quantities, for example: (1) "Last Bill: $ 62.53 Dec. 15, 2000"; (2) "Consumption: 45623.453 kwhr" (consumption on last bill); (3) "Projected Bill: $ 59.35 Jan. 23, 2001" (Jan. 23, 2001 is end of present billing cycle); and (4) "Cost per kWhr $0.15."

In a preferred embodiment, an operator also, when desired, remotely programs meters to cut off power when certain parameters are met or exceeded. For example, a customer with inferior credit may have his power temporarily discontinued when he uses 10 amps, when he uses 5 amps, or when his allotted consumption level is exceeded. The hardware and methodology for such remote programming are disclosed above.

Printing Meter

In a further embodiment, submeters are equipped with printers. In this embodiment, the utility still polls the meters for data through PLC and therefore has control over billing information. The utility calculates the bill and data is downloaded to the meter for local printing. Since the local printer is under utility control, the utility can initiate the printing of other messages through PLC as well. Such other messages may include billing receipts, rate changes, and usage profiles.

This is a useful feature in situations where it is inconvenient for a meter reader to enter the house to read the meter (for example, in countries or cultures where a male meter reader is not permitted to read the meter if the husband is not at home), or where local mail service is not reliable for sending invoices.

Disabling Customers Using GFI

This embodiment allows a utility to inexpensively disconnect a customer by taking advantage of an existing Ground Fault Interrupt (GFI) capable of interrupting power to the customer. For example, in Europe most residential customers are equipped with a whole-home GFI. The GFI is a protective circuit that shuts down power during anomalous current flow. In a preferred embodiment, when the utility wants to remove service to a customer, the utility sends a PLC signal to the meter. The meter then activates the GFI with onboard circuitry. The utility may want to deactivate customers for demand-side management applications or when customers fail to pay their bills.

Figure 25:
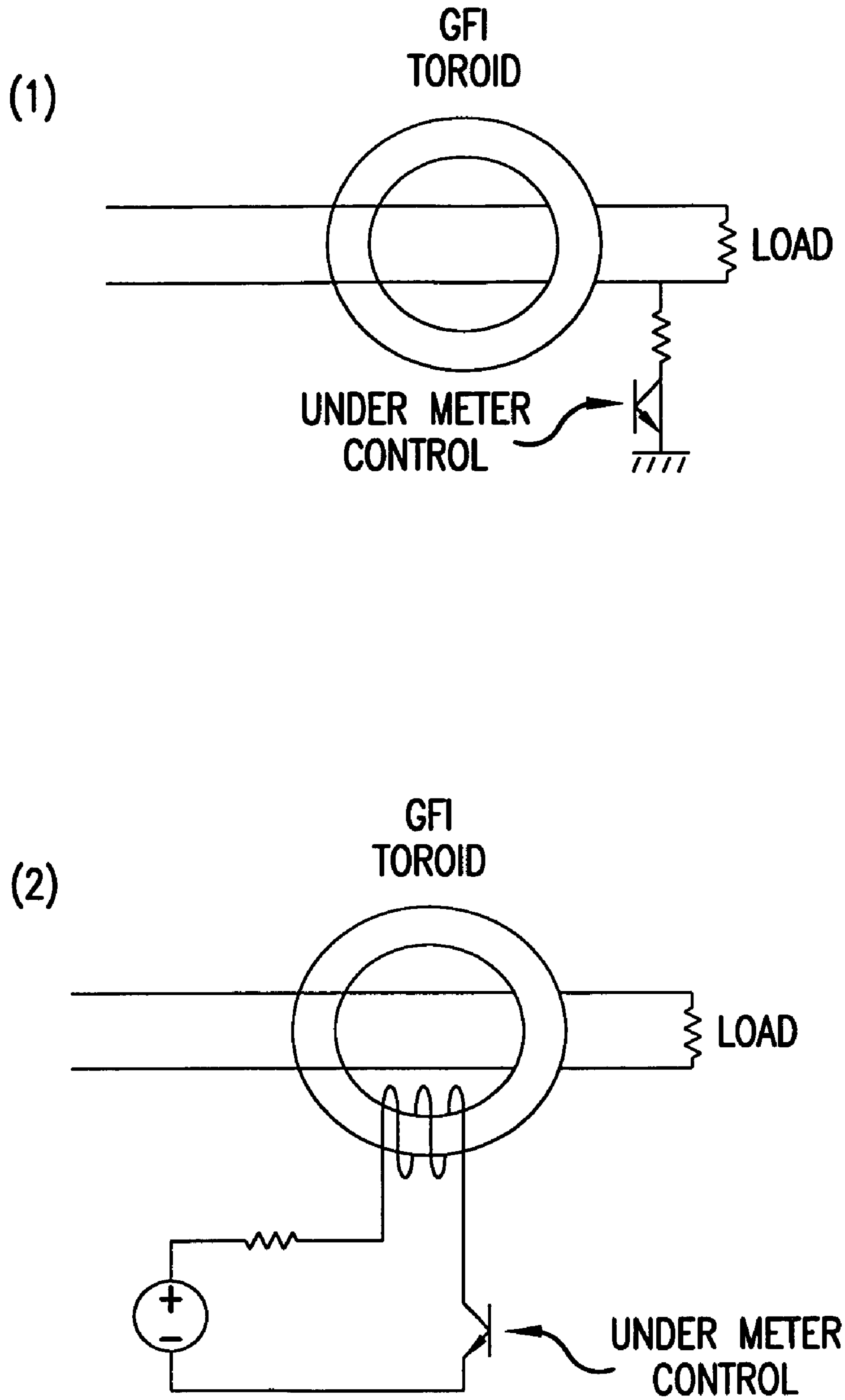
FIG. 25 depicts two preferred configurations for power interruption using GFI.

The meter preferably trips the GFI (see FIG. 25) either by (1) initiating a small leakage to earth ground, or (2) coupling a small amount of current into the GFI toroid.

What is claimed is:

1. A method of detecting unauthorized usage of electricity transmitted over power lines, comprising the steps of:

(a) mapping a network of phase feeders, nodes, and end users that receive electricity from a distribution transformer to determine which feeder supplies each node and which feeders and nodes supply each end user;

(b) for an interval of time, metering the electricity transmitted along each phase feeder feeding from said distribution transformer;

(c) for said interval of time, metering the electricity transmitted through each node;

(d) for said interval of time, metering the electricity consumed by each end user; and (e) for said interval of time, identifying all feeders for which the total amount of electricity metered at all nodes and end users for the feeder is unacceptably less than the amount of electricity metered at said feeder.

2. The method of claim 1, wherein said end user meters are three-phase meters.

3. The method of claim 1, wherein said step of mapping a network comprises:

(a) storing data identifying feeder meters, node meters, and end user meters serviced by a distribution transformer;

(b) identifying which end user meters are supplied by each node;

(c) identifying which end user meters and which nodes are supplied by each feeder; and (d) for multi-phase end users, identifying the phase arrangement of each end user meter.

4. The method of claim 3, wherein end user meters are one-phase meters and wherein said step of identifying the phase arrangement of each end user meter is determined by measuring signal strength on each phase by a transponder.

5. The method of claim 3, wherein end user meters are one-phase meters and wherein said step of identifying the phase arrangement of each end user meter is determined by having a transponder send out a PLC signal with a bit rate equaling the line frequency, comparing a return signal from each end user meter with the transponder metering phases, and measuring any shifts found in said comparison.

6. The method of claim 3, wherein end user meters are multi-phase meters and wherein said step of identifying the phase arrangement of each end user meter is determined by having a transponder send out a PLC signal with a bit rate equaling the line frequency, then having the end user meter compare PLC bit transitions to zero crossings of each of its metering phases to determine which metering phases are connected which transponder phase.

7. The method of claim 1, further comprising the step of, for each said interval of time, identifying all nodes for which the total amount of electricity, for the phase supplied through said node, metered at all end users for said node is unacceptably less than the amount of electricity metered at said node.

* * * * *